(12) United States Patent
Yamazaki et al.

(10) Patent No.: US 11,004,961 B2
(45) Date of Patent: May 11, 2021

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP);
Toshihiko Takeuchi, Kanagawa (JP);
Naoto Yamade, Kanagawa (JP);
Hiroshi Fujiki, Yamaguchi (JP);
Tomoaki Moriwaka, Kanagawa (JP);
Shunsuke Kimura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 65 days.

(21) Appl. No.: 16/492,282

(22) PCT Filed: Feb. 28, 2018

(86) PCT No.: PCT/IB2018/051253
§ 371 (c)(1),
(2) Date: Sep. 9, 2019

(87) PCT Pub. No.: WO2018/167591
PCT Pub. Date: Sep. 20, 2018

(65) Prior Publication Data
US 2020/0052099 A1    Feb. 13, 2020

(30) Foreign Application Priority Data

Mar. 13, 2017 (JP) .............................. JP2017-047420
Mar. 31, 2017 (JP) .............................. JP2017-072177

(51) Int. Cl.
*H01L 29/66* (2006.01)
*H01L 29/10* (2006.01)
*H01L 29/49* (2006.01)

(52) U.S. Cl.
CPC .... *H01L 29/66969* (2013.01); *H01L 29/1054* (2013.01); *H01L 29/4966* (2013.01)

(58) Field of Classification Search
None
See application file for complete search history.

(56) References Cited

U.S. PATENT DOCUMENTS 8,547,771 B2    10/2013 Koyama
8,629,437 B2    1/2014 Ishida et al.
(Continued)

FOREIGN PATENT DOCUMENTS

CN         105659369 A    6/2016
JP         2011-210744 A    10/2011
(Continued)

OTHER PUBLICATIONS

International Search Report (Application No. PCT/IB2018/051253) dated May 15, 2018.
(Continued)

*Primary Examiner* — Robert K Carpenter
(74) *Attorney, Agent, or Firm* — Fish & Richardson P.C.

(57) ABSTRACT

A semiconductor device that can be miniaturized or highly integrated is provided.

The semiconductor device includes a first conductor, a second conductor over the first conductor, a first insulator covering the second conductor, a first oxide over the first insulator, and a second oxide over the first oxide, an opening overlapping with at least part of the first conductor is
(Continued)

provided in the first oxide and the first insulator, and the second oxide is electrically connected to the first conductor through the opening.

17 Claims, 70 Drawing Sheets

(56) References Cited

U.S. PATENT DOCUMENTS

| | | | |
|---|---|---|---|
| 8,835,918 | B2 | 9/2014 | Yamazaki et al. |
| 9,082,663 | B2 | 7/2015 | Isobe et al. |
| 9,123,632 | B2 | 9/2015 | Yamazaki et al. |
| 9,431,435 | B2 | 8/2016 | Ando et al. |
| 9,455,349 | B2 | 9/2016 | Suzawa et al. |
| 9,466,615 | B2 | 10/2016 | Miyairi et al. |
| 9,780,201 | B2 | 10/2017 | Ando et al. |
| 9,887,295 | B2 | 2/2018 | Suzawa et al. |
| 10,103,271 | B2 | 10/2018 | Suzawa et al. |
| 10,186,604 | B2 | 1/2019 | Ando et al. |
| 10,204,898 | B2 | 2/2019 | Momo et al. |
| 2012/0068179 | A1 | 3/2012 | Ishida et al. |
| 2013/0075722 | A1 | 3/2013 | Yamazaki et al. |
| 2015/0108472 | A1 | 4/2015 | Suzawa et al. |
| 2015/0108475 | A1 | 4/2015 | Ando et al. |
| 2015/0187814 | A1 | 7/2015 | Miyairi et al. |
| 2016/0043070 | A1 | 2/2016 | Momo et al. |
| 2019/0157262 | A1 | 5/2019 | Momo et al. |
| 2020/0052099 | A1* | 2/2020 | Yamazaki ......... H01L 29/66969 |

FOREIGN PATENT DOCUMENTS

| | | |
|---|---|---|
| JP | 2012-257187 A | 12/2012 |
| JP | 2015-109425 A | 6/2015 |
| JP | 2015-109429 A | 6/2015 |
| JP | 2015-144271 A | 8/2015 |
| JP | 2016-039375 A | 3/2016 |
| KR | 2016-0073374 A | 6/2016 |
| KR | 2016-0102295 A | 8/2016 |
| TW | 201222733 | 6/2012 |
| TW | 201523885 | 6/2015 |
| TW | 201532248 | 8/2015 |
| WO | WO-2015/060318 | 4/2015 |
| WO | WO-2015/097589 | 7/2015 |

OTHER PUBLICATIONS

Written Opinion (Application No. PCT/IB2018/051253) dated May 15, 2018.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium.Gallium. Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

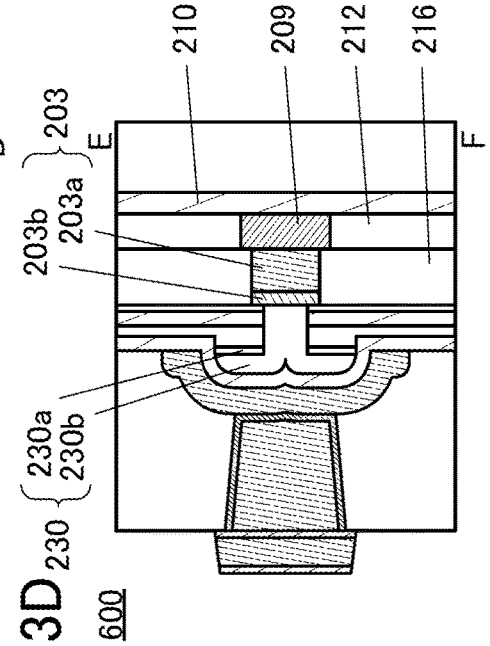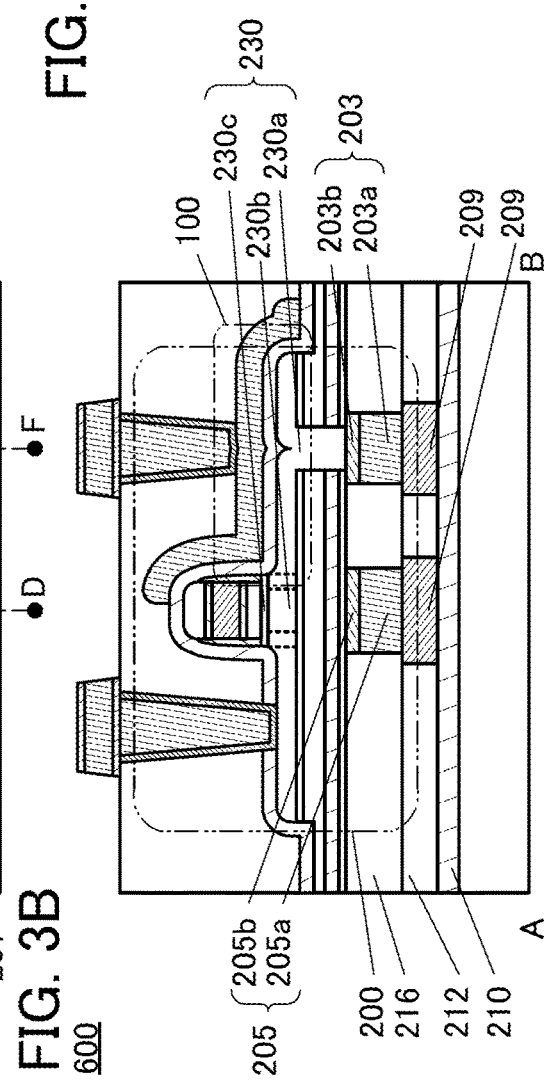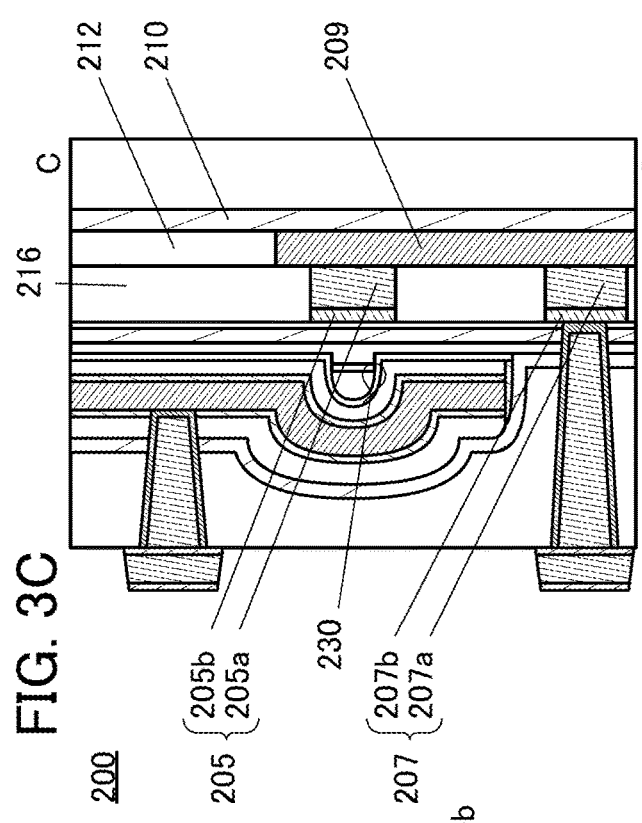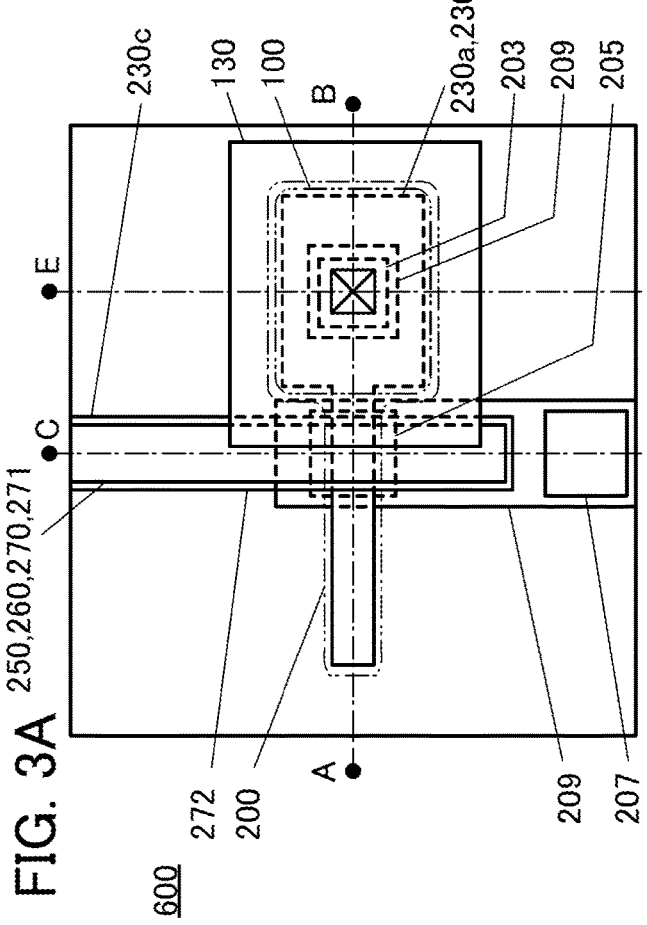

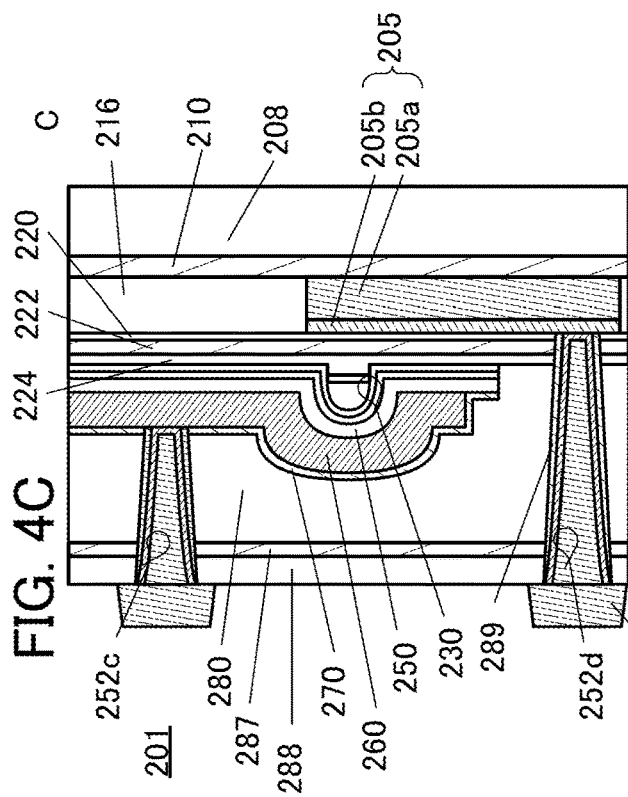
FIG. 4A
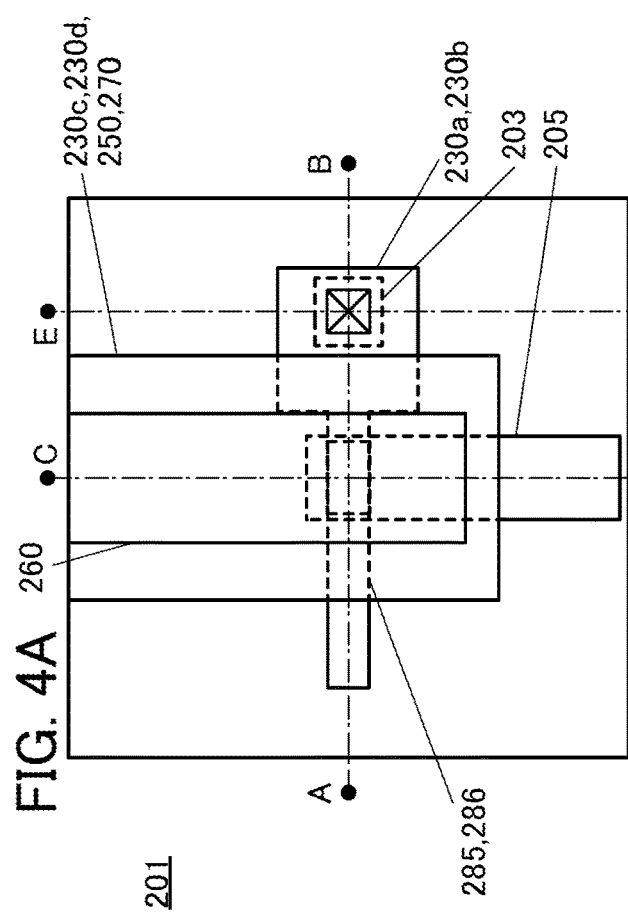
FIG. 4C
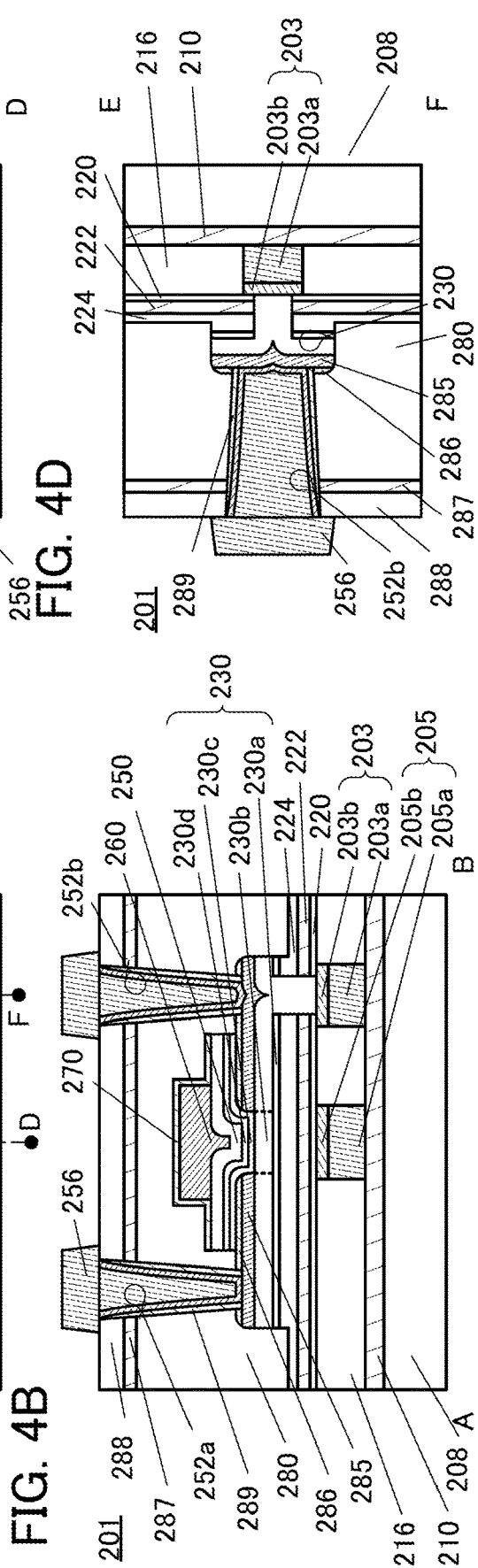
FIG. 4B
FIG. 4D

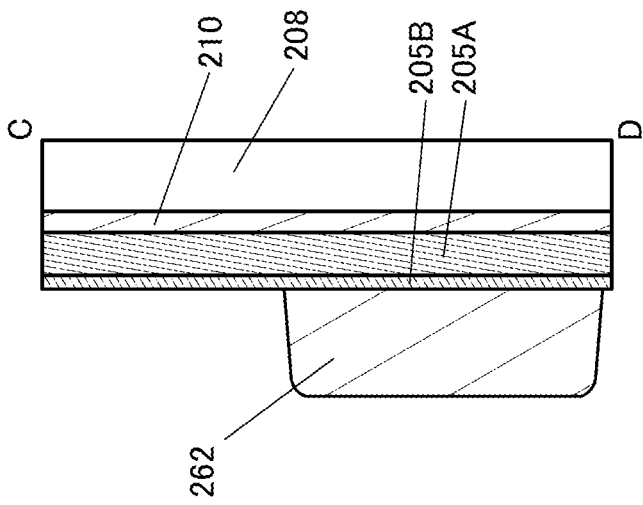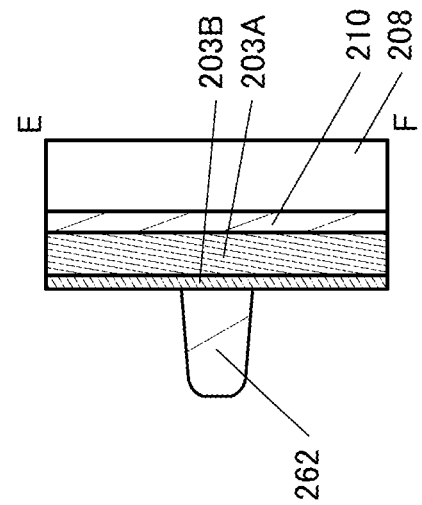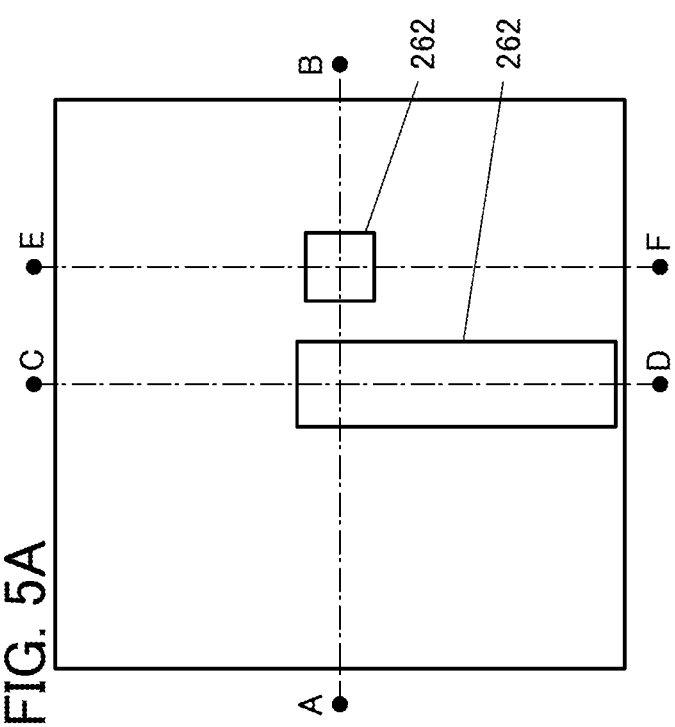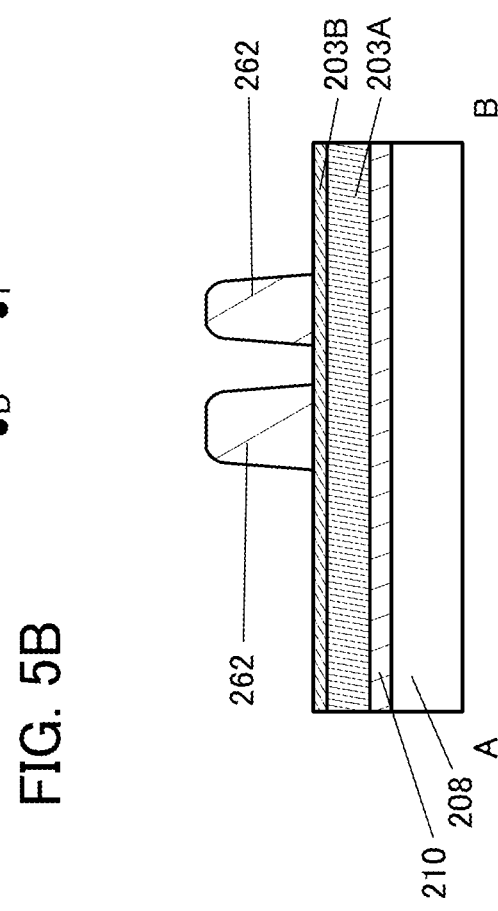
FIG. 5A
FIG. 5B
FIG. 5C
FIG. 5D

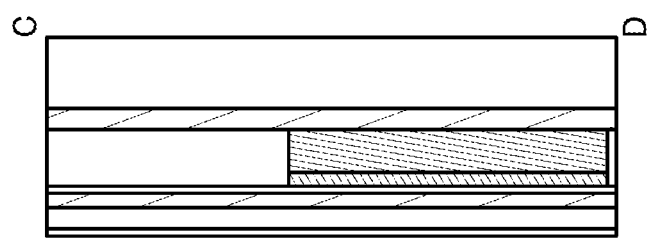
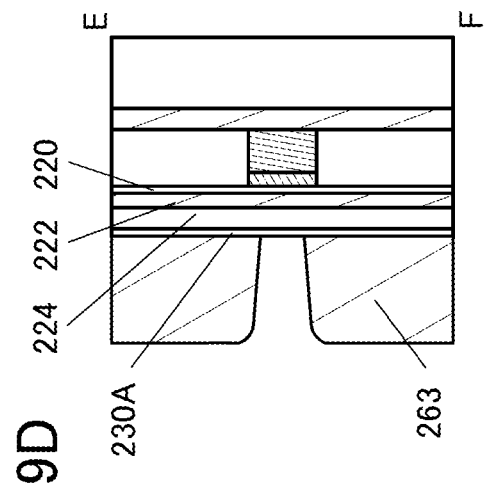
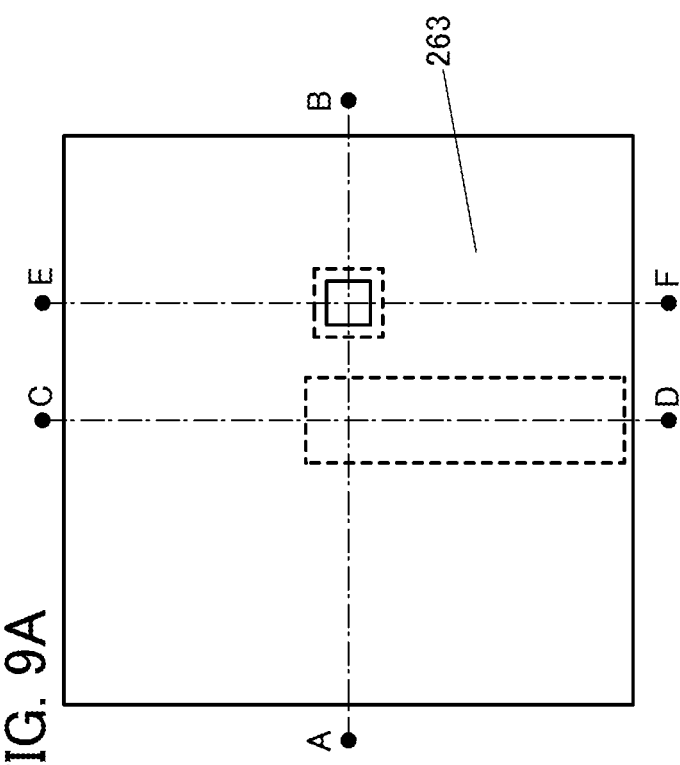
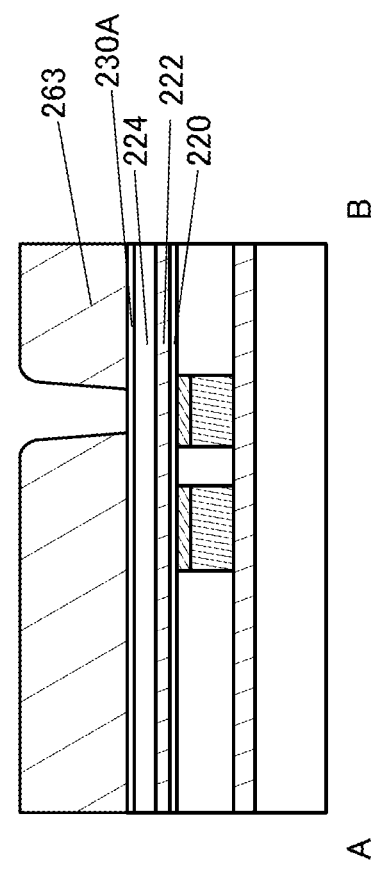

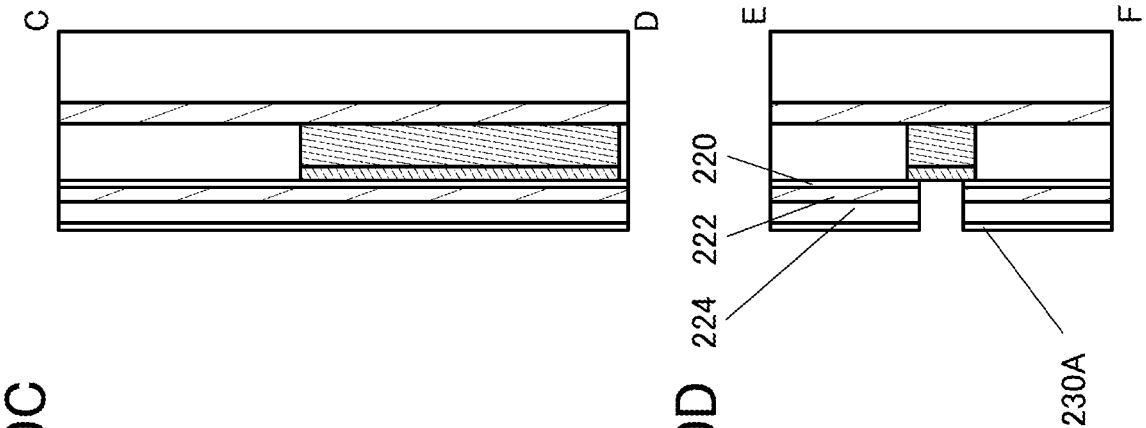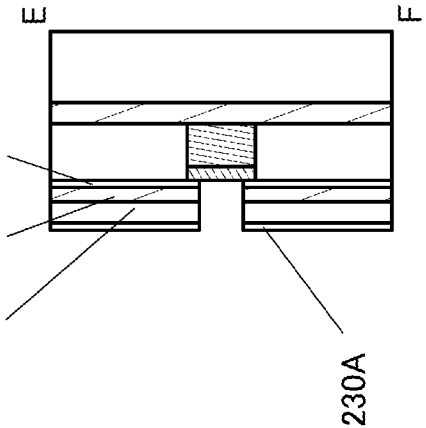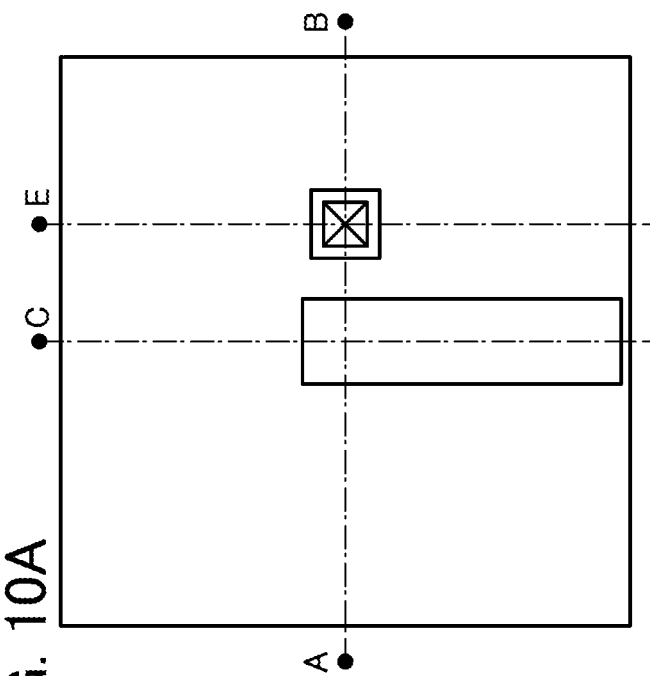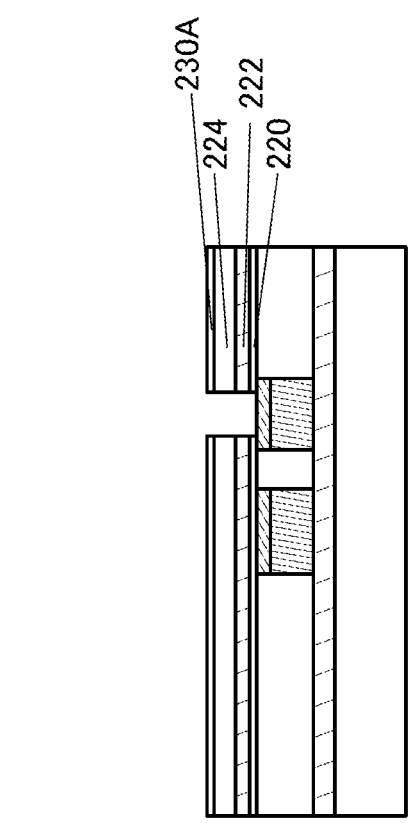

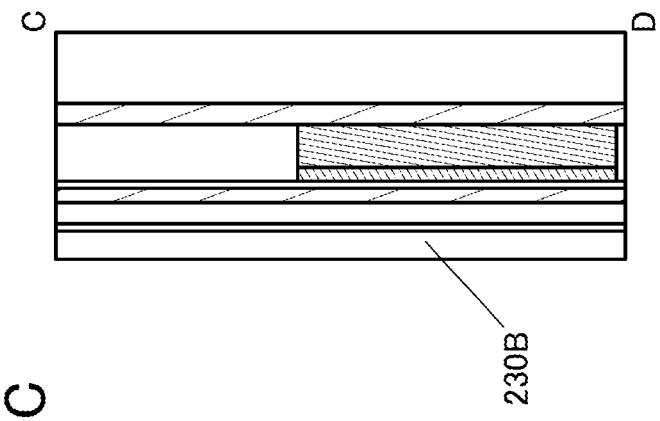
FIG. 11C
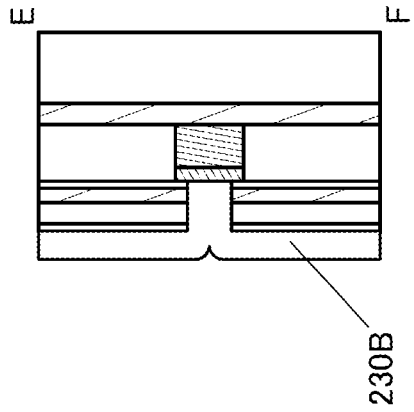
FIG. 11D
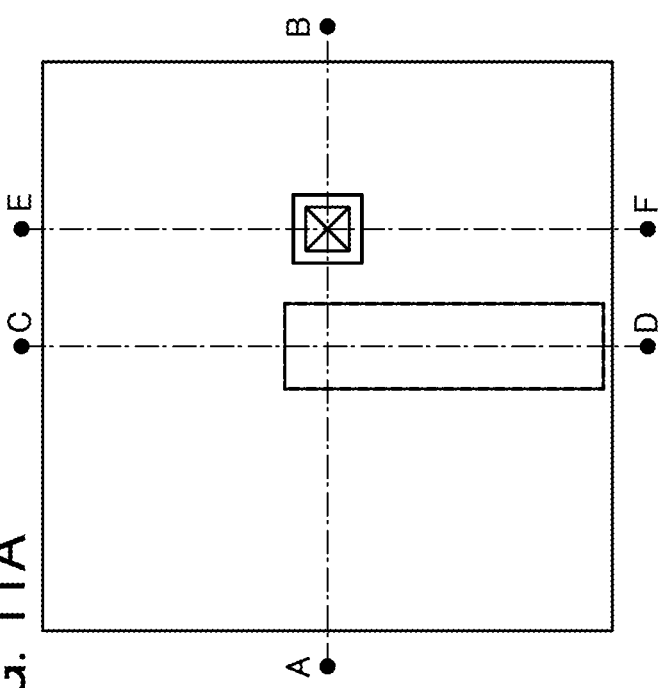
FIG. 11A
FIG. 11B
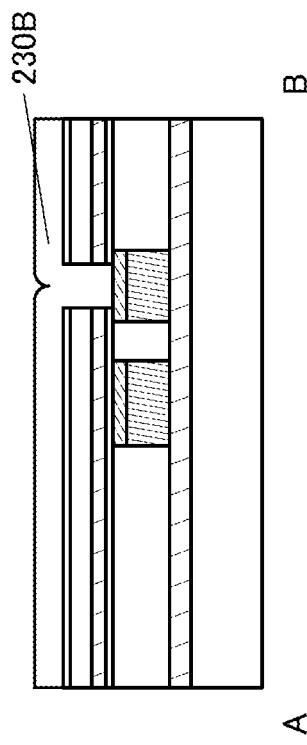

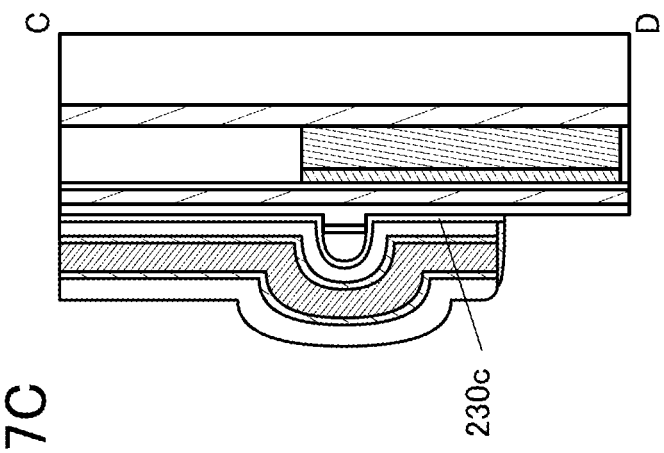
FIG. 17C
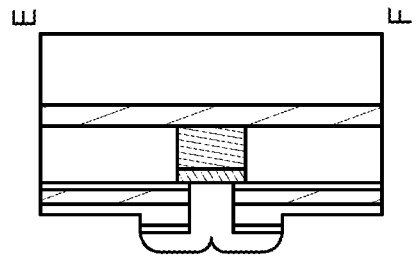
FIG. 17D
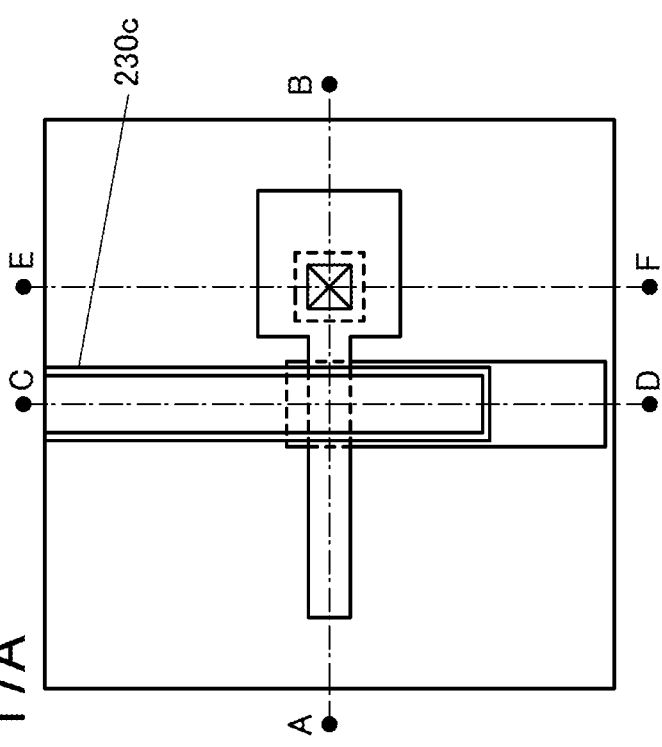
FIG. 17A
FIG. 17B
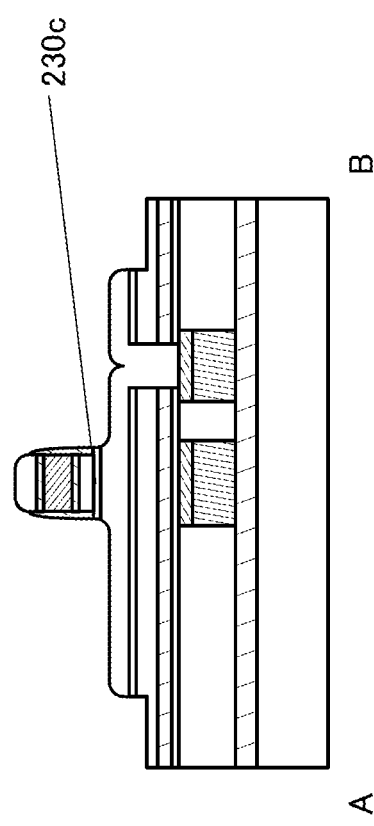

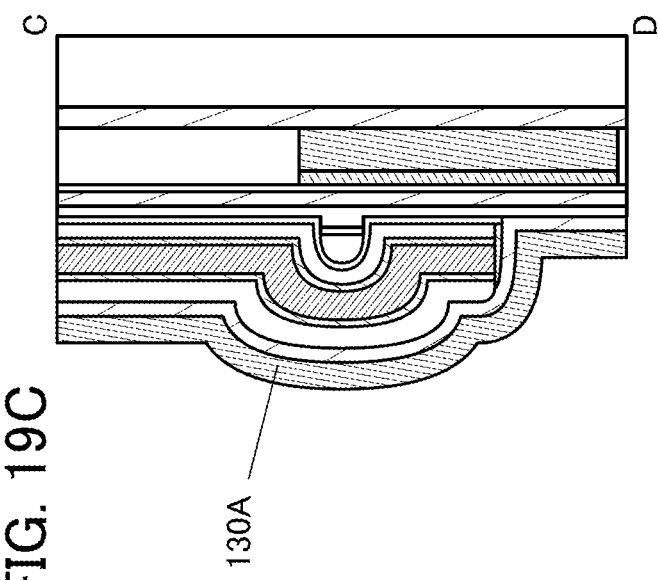
FIG. 19C
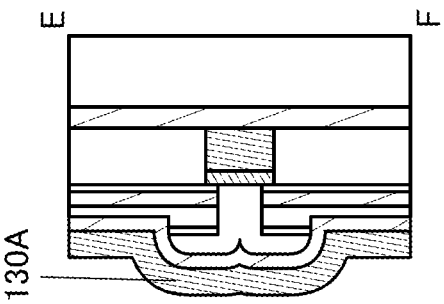
FIG. 19D
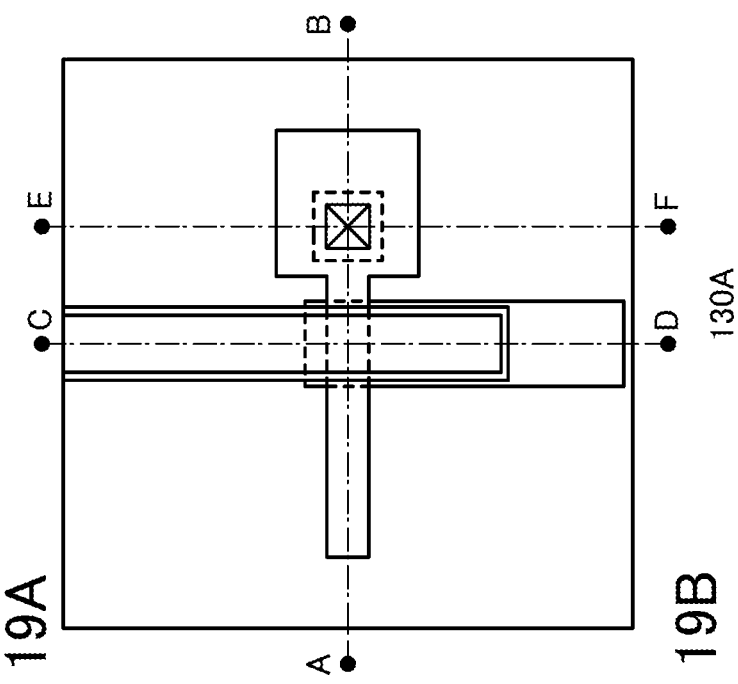
FIG. 19A
FIG. 19B
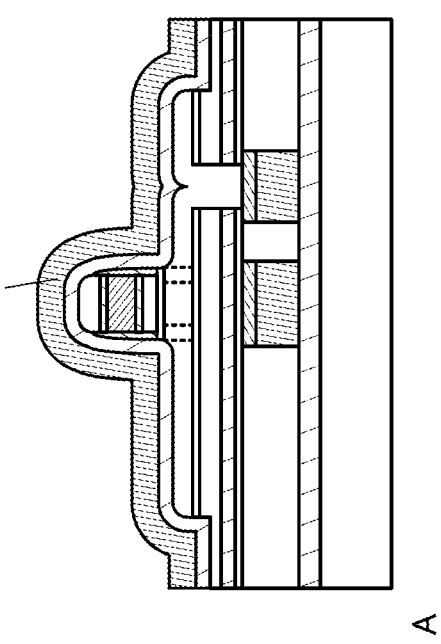

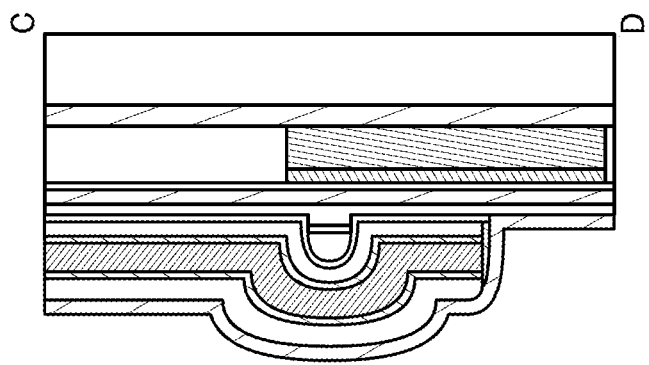
FIG. 20C
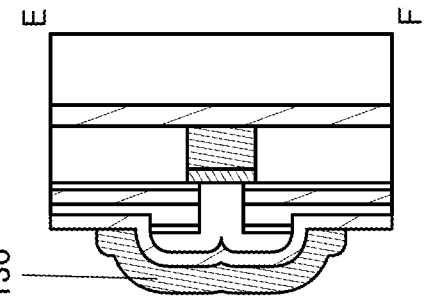
FIG. 20D
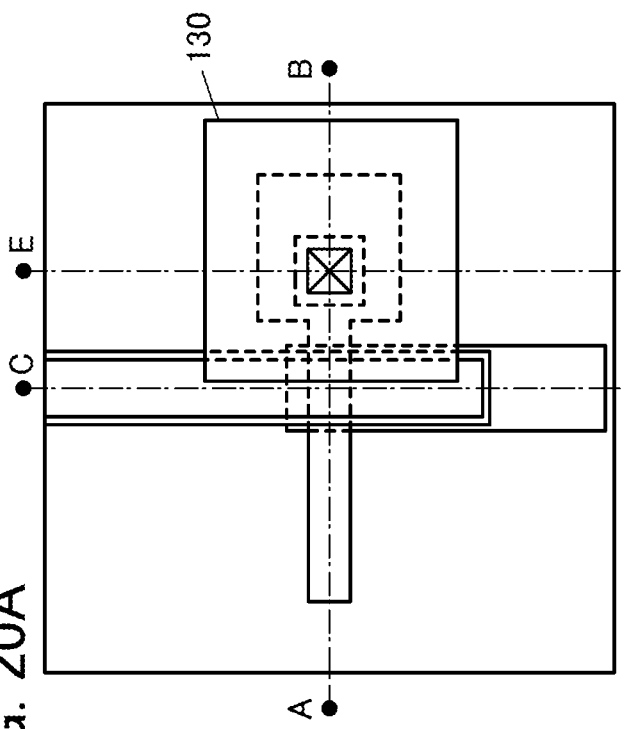
FIG. 20A
FIG. 20B
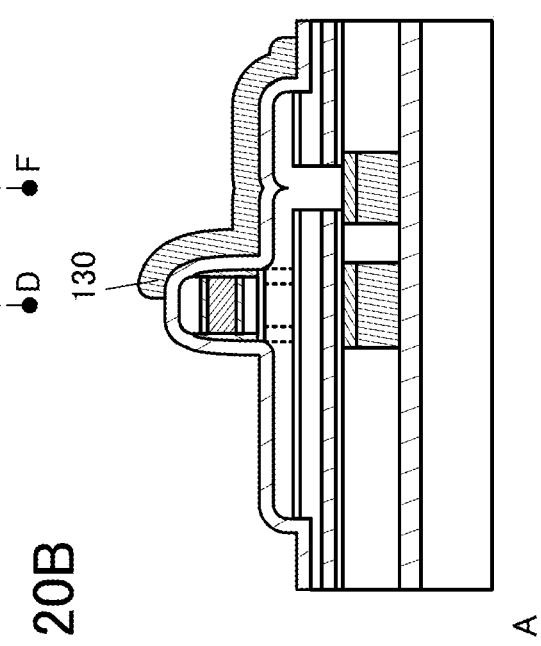

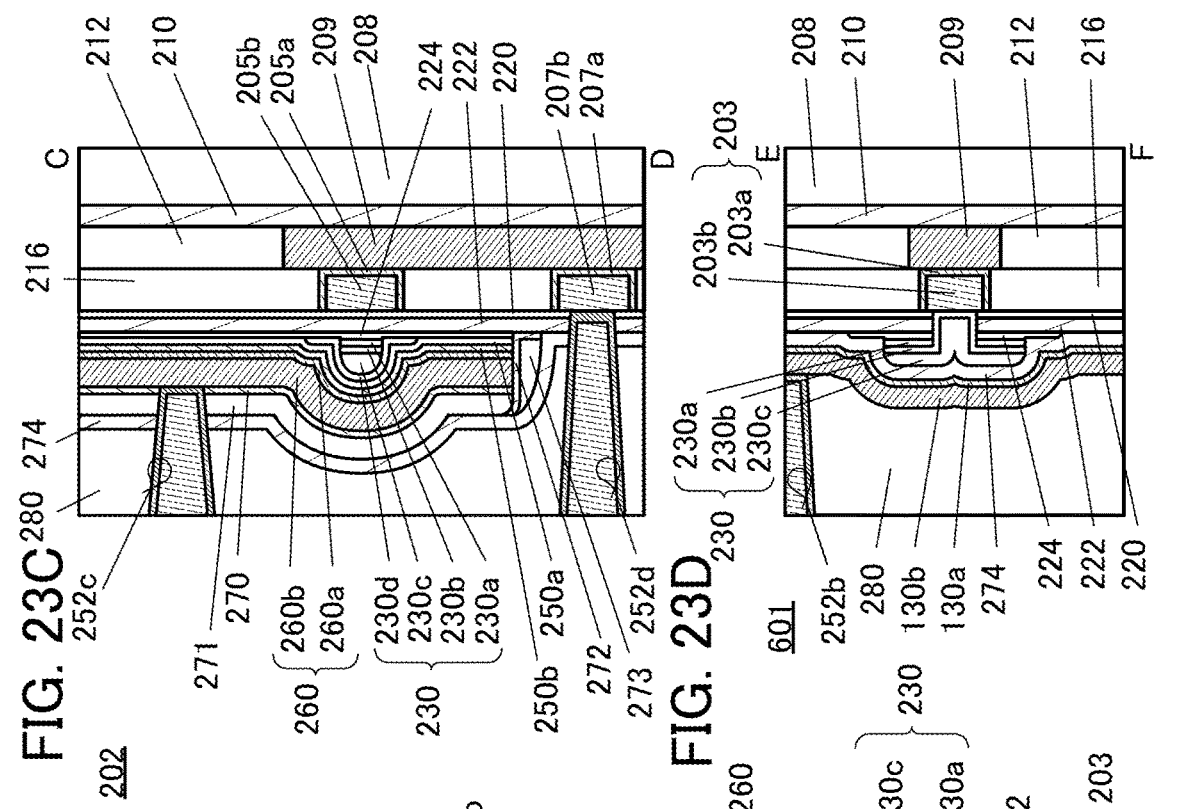
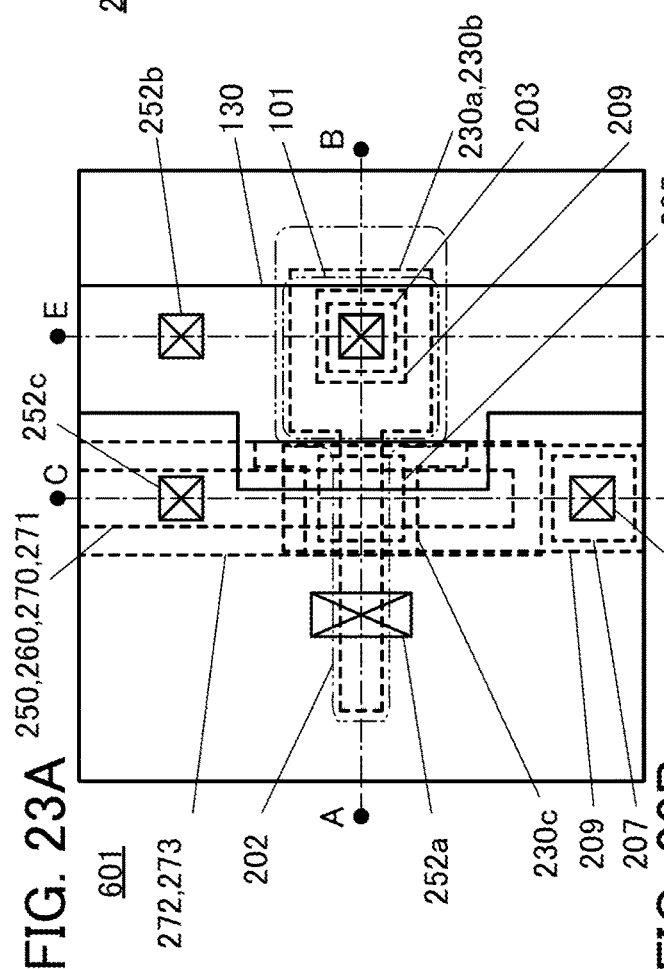
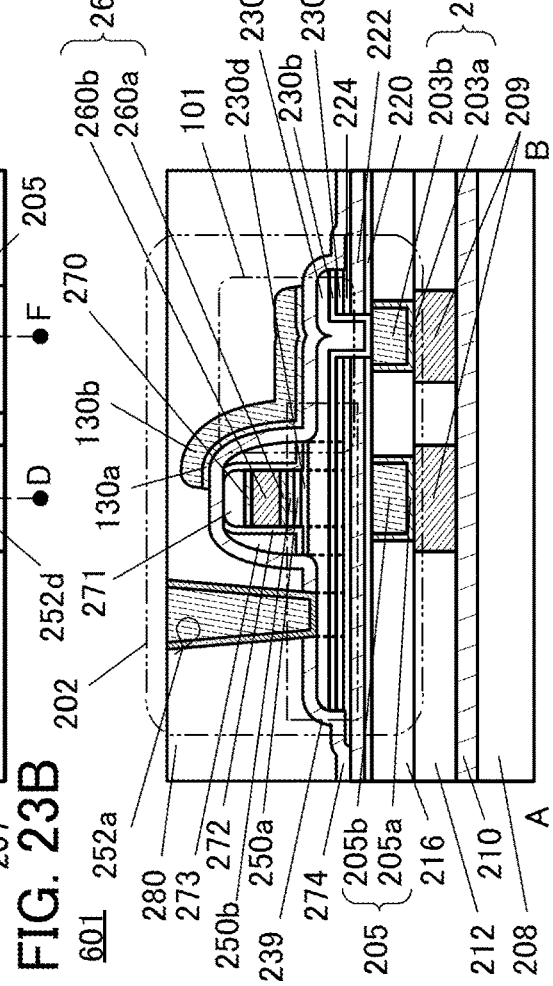

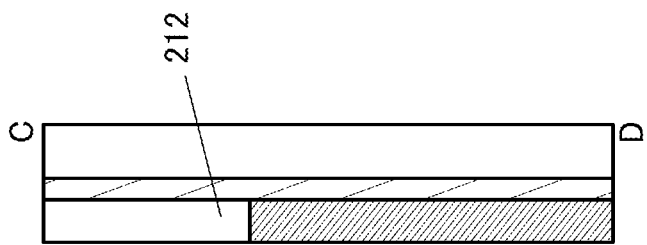
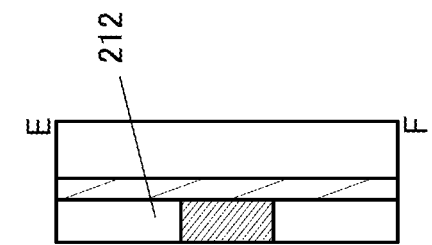
FIG. 33C
FIG. 33D
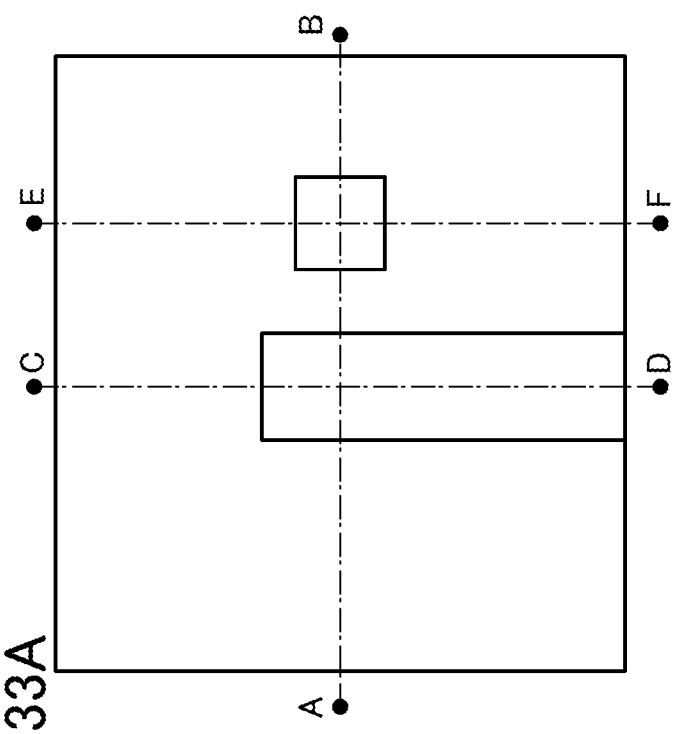
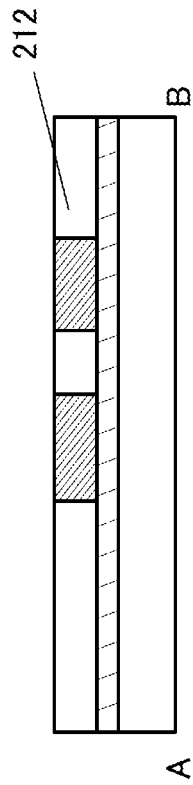
FIG. 33A
FIG. 33B

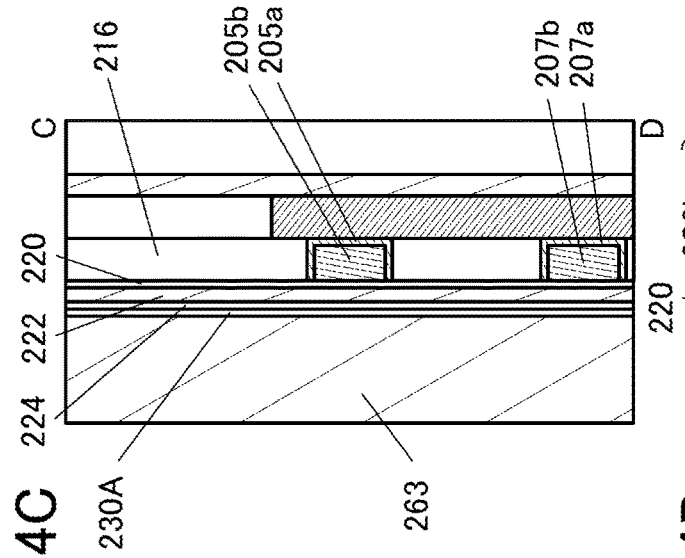
FIG. 34C
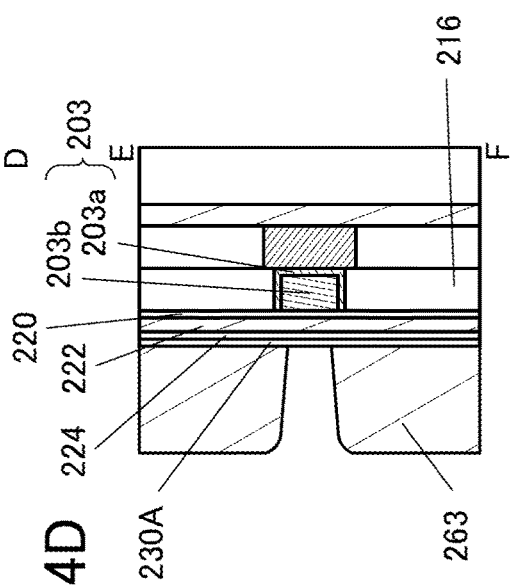
FIG. 34D
FIG. 34A
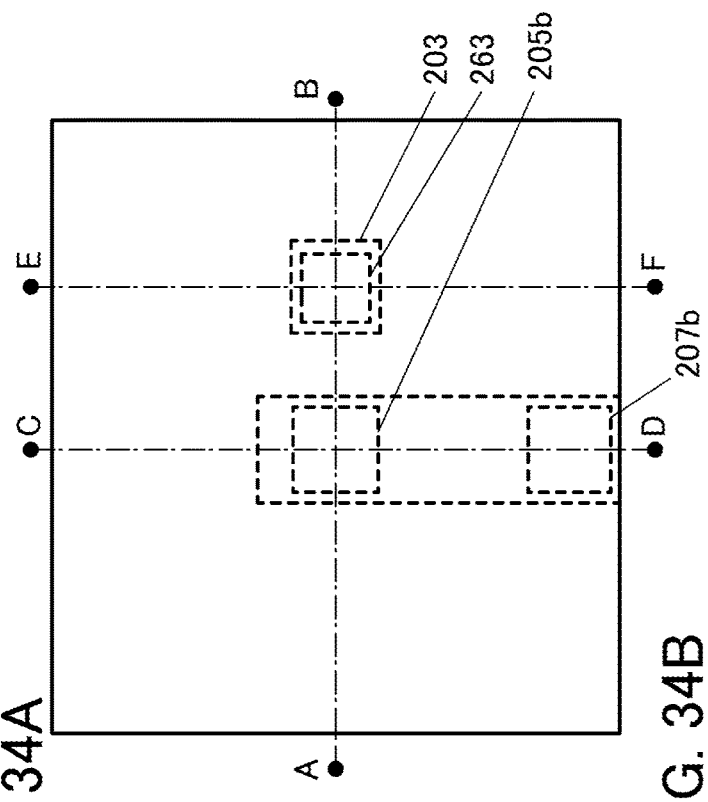
FIG. 34B

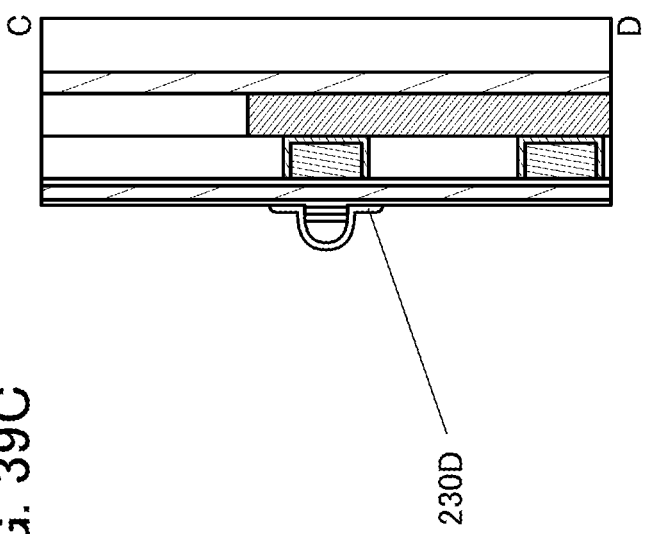
FIG. 39C
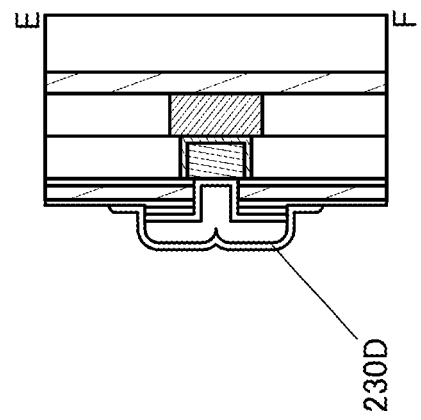
FIG. 39D
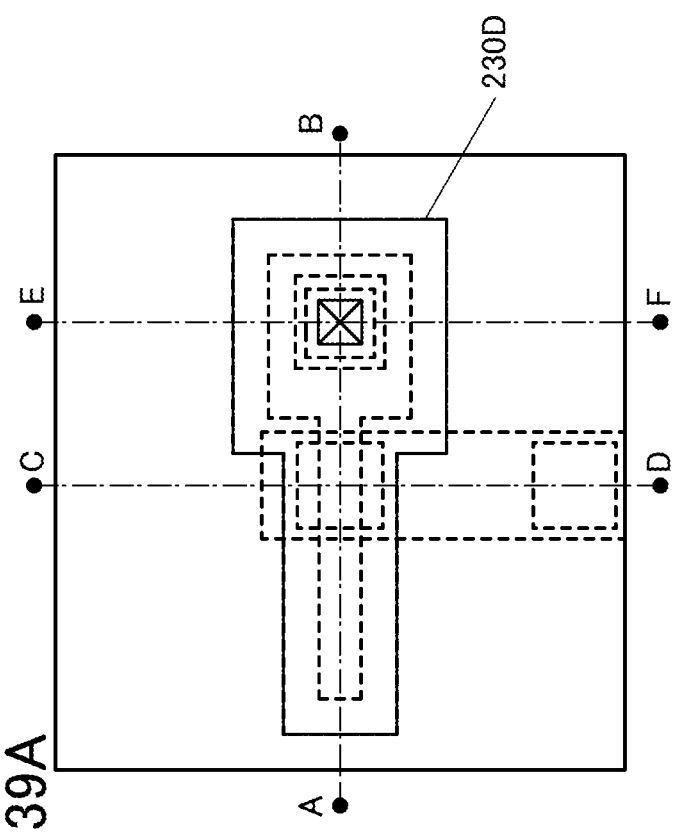
FIG. 39A
FIG. 39B
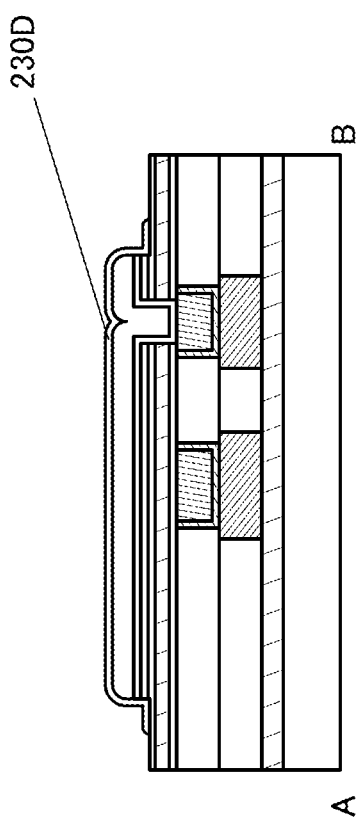

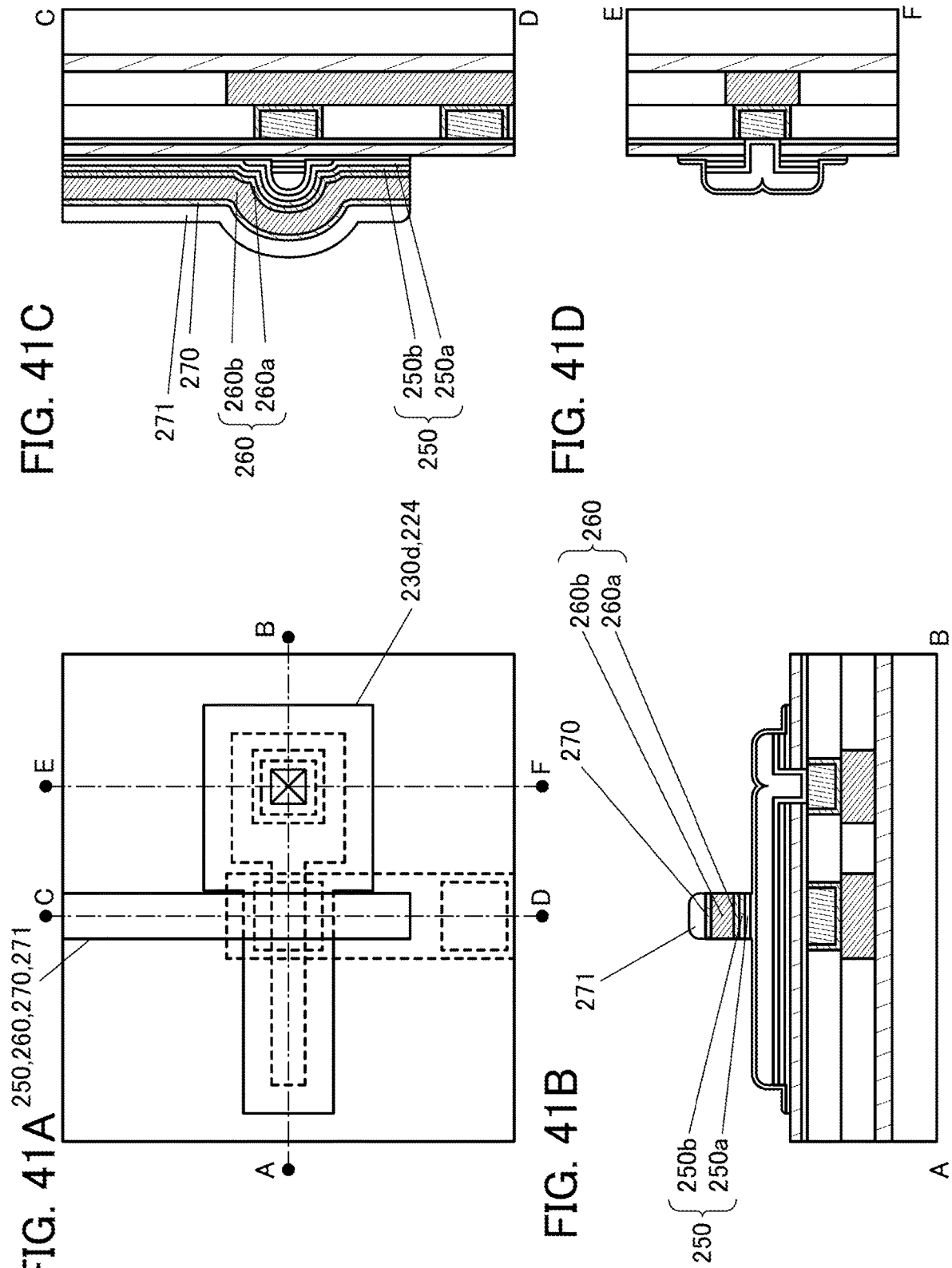

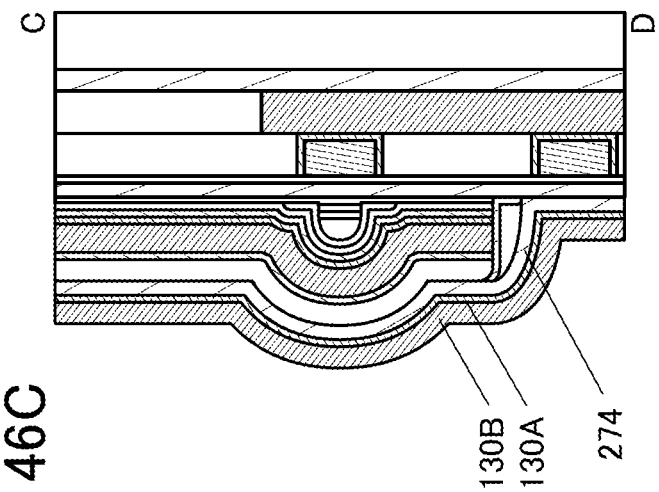
FIG. 46C
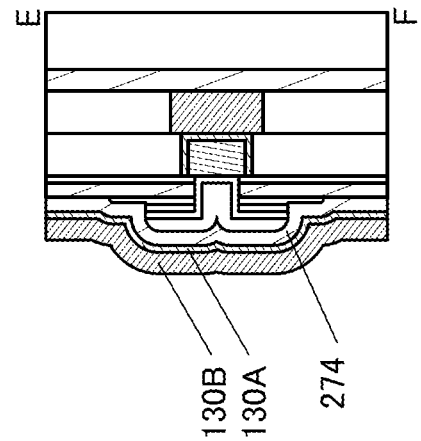
FIG. 46D
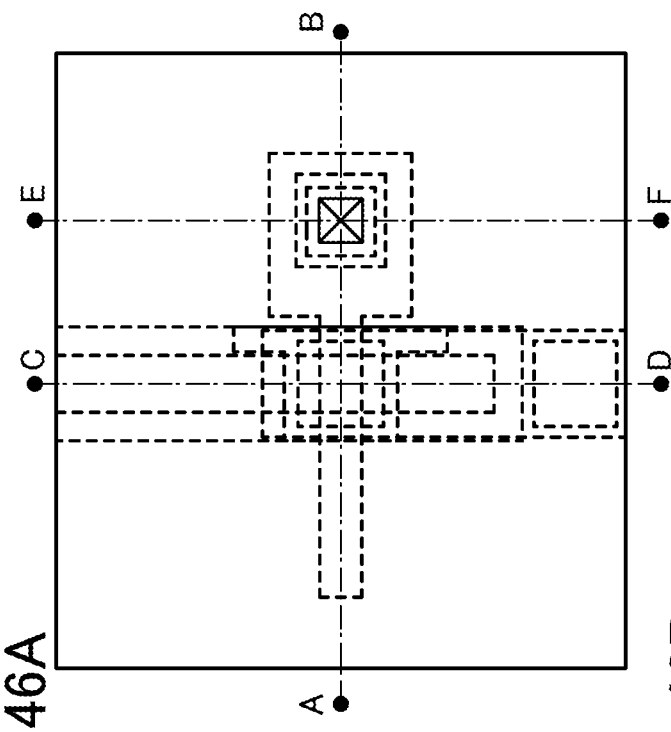
FIG. 46A
FIG. 46B
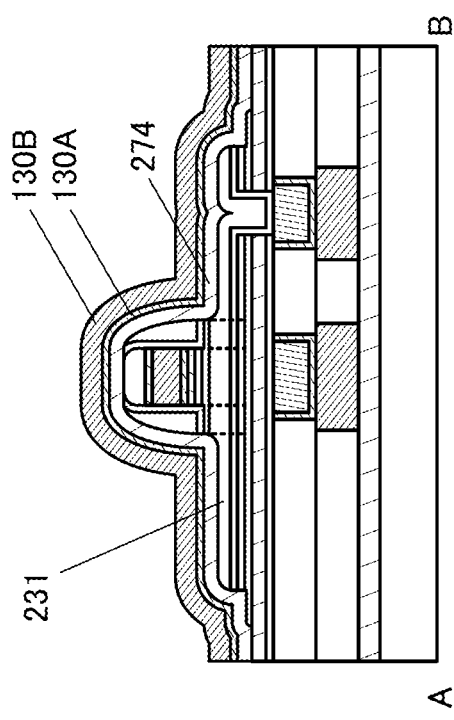

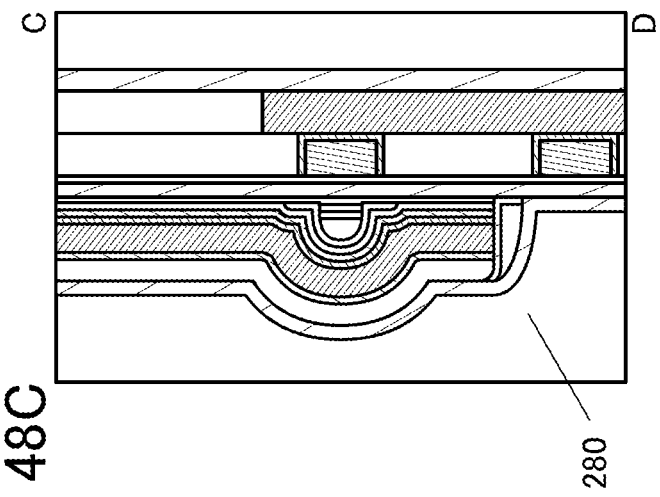
FIG. 48C
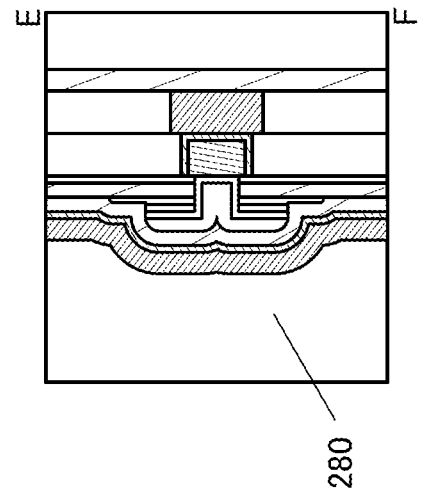
FIG. 48D
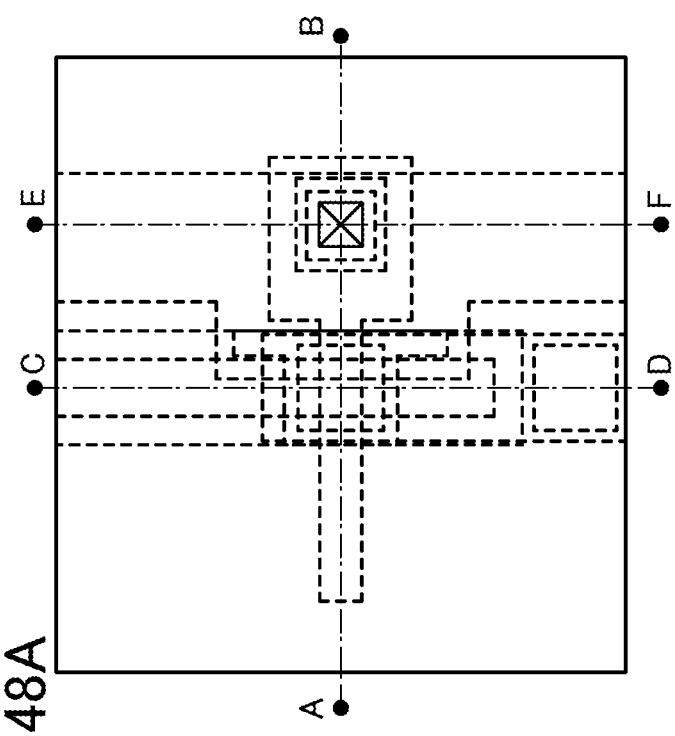
FIG. 48A
FIG. 48B

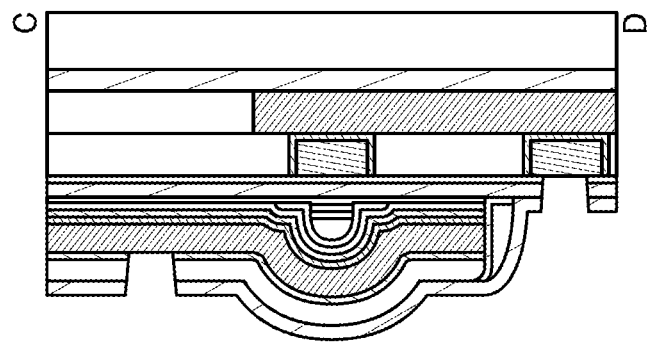
FIG. 49C
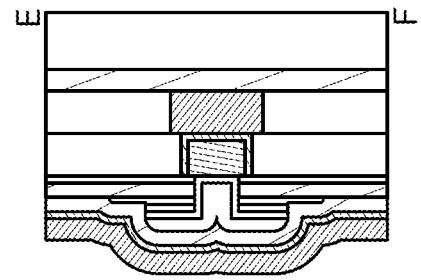
FIG. 49D
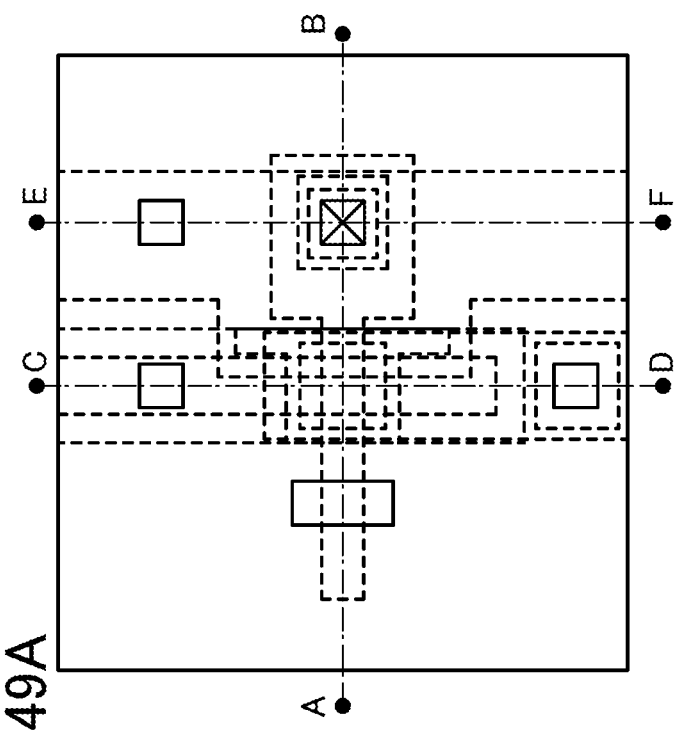
FIG. 49A
FIG. 49B

SEMICONDUCTOR DEVICE AND METHOD FOR MANUFACTURING SEMICONDUCTOR DEVICE

CROSS REFERENCE TO RELATED APPLICATIONS

This application is a U.S. National Phase Application under 35 U.S.C. § 371 of International Application PCT/IB2018/051253, filed on Feb. 28, 2018, which is incorporated by reference and claims the benefit of two foreign priority applications filed in Japan as Application No. 2017-047420 and 2017-072177 on Mar. 13, 2017 and Mar. 31, 2017.

TECHNICAL FIELD

One embodiment of the present invention relates to a semiconductor device and a manufacturing method of a semiconductor device. One embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. In some cases, it can be said that a display device (a liquid crystal display device, a light-emitting display device, and the like), a projection device, a lighting device, an electro-optical device, a power storage device, a memory device, a semiconductor circuit, an imaging device, an electronic device, and the like each include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

Integrated circuits (IC) using semiconductor elements have been developed. A CPU and a memory have been developed and manufactured with technology for an LSI including a highly integrated IC or an ultra LSI. Such an IC is mounted on a circuit board, for example, a printed wiring board, to be used as one of components of a variety of electronic devices included in a computer, an information terminal, a display device, an automobile, and the like. Moreover, utilization of these ICs for an artificial intelligence (AI) system has been studied.

As computers and information terminals, desktop computers, laptop computers, tablet computers, smartphones, cell phones, and the like are known.

A silicon-based semiconductor material is widely known as a semiconductor material used for a semiconductor element; in addition, an oxide semiconductor has attracted attention as another material.

Moreover, it is known that a transistor including an oxide semiconductor has an extremely low leakage current in a non-conduction state. For example, a low-power consumption CPU utilizing a characteristic of low leakage current of the transistor including an oxide semiconductor has been disclosed (see Patent Document 1).

Furthermore, in recent years, demand for an integrated circuit with higher density has risen with reductions in the size and weight of electronic devices. In addition, the productivity of semiconductor devices including an integrated circuit is required to be improved.

Here, not only single-component metal oxides, such as indium oxide and zinc oxide, but also multi-component metal oxides are known as an oxide semiconductor. Among the multi-component metal oxides, in particular, an In—Ga—Zn oxide (hereinafter also referred to as IGZO) has been actively studied.

From the studies on IGZO, in the oxide semiconductor, a CAAC (c-axis aligned crystalline) structure and an nc (nanocrystalline) structure, which are not single crystal nor amorphous, have been found (see Non-Patent Document 1 to Non-Patent Document 3). Non-Patent Document 1 and Non-Patent Document 2 disclose a technique for forming a transistor by using an oxide semiconductor having a CAAC structure. Moreover, Non-Patent Document 4 and Non-Patent Document 5 disclose that even an oxide semiconductor which has lower crystallinity than those of the CAAC structure and the nc structure includes a minute crystal.

In addition, a transistor which includes IGZO as an active layer has an extremely low off-state current (see Non-Patent Document 6), and an LSI and a display utilizing the characteristic have been reported (see Non-Patent Document 7 and Non-Patent Document 8).

REFERENCES

Patent Documents

[Patent Document 1] Japanese Published Patent Application No. 2012-257187

Non-Patent Documents

[Non-Patent Document 1] S. Yamazaki et al., "SID Symposium Digest of Technical Papers", 2012, volume 43, issue 1, pp. 183-186
[Non-Patent Document 2] S. Yamazaki et al., "Japanese Journal of Applied Physics", 2014, volume 53, Number 4S, pp. 04ED18-1-04ED18-10
[Non-Patent Document 3] S. Ito et al., "The Proceedings of AM-FPD'13 Digest of Technical Papers", 2013, pp. 151-154
[Non-Patent Document 4] S. Yamazaki et al., "ECS Journal of Solid State Science and Technology", 2014, volume 3, issue 9, pp. Q3012-Q3022
[Non-Patent Document 5] S. Yamazaki, "ECS Transactions", 2014, volume 64, issue 10, pp. 155-164
[Non-Patent Document 6] K. Kato et al., "Japanese Journal of Applied Physics", 2012, volume 51, pp. 021201-1-021201-7
[Non-Patent Document 7] S. Matsuda et al., "2015 Symposium on VLSI Technology Digest of Technical Papers", 2015, pp. T216-T217
[Non-Patent Document 8] S. Amano et al., "SID Symposium Digest of Technical Papers", 2010, volume 41, issue 1, pp. 626-629

SUMMARY OF THE INVENTION

Problems to be Solved by the Invention

One object of one embodiment of the present invention is to provide a semiconductor device with favorable electrical characteristics and a manufacturing method thereof. One object of one embodiment of the present invention is to provide a highly reliable semiconductor device and a manufacturing method thereof. One object of one embodiment of the present invention is to provide a semiconductor device that can be miniaturized or highly integrated and a manufacturing method thereof. One object of one embodiment of the present invention is to provide a semiconductor device with high productivity and a manufacturing method thereof.

One object of one embodiment of the present invention is to provide a semiconductor device that has suppressed variation in electrical characteristics, stable electrical characteristics, and improved reliability. Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a novel semiconductor device.

One object of one embodiment of the present invention is to provide a semiconductor device with high design flexibility. Another object of one embodiment of the present invention is to provide a semiconductor device with reduced power consumption.

One object of one embodiment of the present invention is to provide a semiconductor device whose manufacturing process is simplified and a manufacturing method thereof. Another object of one embodiment of the present invention is to provide a semiconductor device with reduced area and a manufacturing method thereof.

Note that the descriptions of these objects do not disturb the existence of other objects. Note that one embodiment of the present invention does not have to solve all of these objects. Note that objects other than these objects will be apparent and can be derived from the descriptions of the specification, the drawings, the claims, and the like.

Means for Solving the Problems

One embodiment of the present invention is a semiconductor device including a first conductor; a second conductor over the first conductor; a first insulator covering the second conductor; a first oxide over the first insulator; and a second oxide over the first oxide. An opening overlapping with at least part of the first conductor is provided in the first oxide and the first insulator, and the second oxide is electrically connected to the first conductor through the opening.

In the above, an end portion of the second oxide is preferably substantially aligned with an end portion of the first oxide.

In the above, the semiconductor device may further include a third conductor; a fourth conductor over the third conductor; a third oxide over the second oxide; a second insulator over the third oxide; and a fifth conductor over the second insulator, and it is preferable that the fourth conductor be covered with the first insulator, and the fifth conductor overlap with the third conductor and the fourth conductor with the first insulator, the first oxide, the second oxide, the third oxide, and the second insulator interposed therebetween.

In the above, the first conductor and the third conductor preferably contain the same material and the second conductor and the fourth conductor preferably contain the same material.

In the above, the second conductor preferably includes a metal nitride.

In the above, the metal nitride is preferably titanium nitride or tantalum nitride.

One embodiment of the present invention is a method for manufacturing a semiconductor device in which a first conductive film is formed over an insulating surface; a second conductive film is formed over the first conductive film; the second conductive film and the first conductive film are patterned to form a first conductor and a second conductor over the first conductor; a first insulating film is formed to cover the first conductor and the second conductor; the first insulating film is processed to expose the second conductor so that the first insulator is formed; a second insulator is formed over the first insulator and the second conductor; a first oxide film is formed over the second insulator; an opening overlapping with at least part of the first conductor is formed in the first oxide film and the second insulator; a second oxide film is formed over the first oxide film; the second oxide film and the first oxide film are patterned to form a first oxide and a second oxide over the first oxide; and the second oxide is electrically connected to the first conductor through the opening.

In the above, the second conductive film and the first conductive film may be patterned to further form a third conductor and a fourth conductor over the third conductor; a third oxide film may be formed over the second oxide; a second insulating film may be formed over the third oxide film; a third conductive film may be formed over the second insulating film; the third conductive film may be patterned to form a fifth conductor; the second insulating film may be patterned to form a third insulator; and the third oxide film may be patterned to form a third oxide, and it is preferable that the fifth conductor overlap with the third conductor and the fourth conductor with the second insulator, the first oxide, the second oxide, the third oxide, and the third insulator interposed therebetween.

In the above, the second conductive film preferably includes a metal nitride.

In the above, the metal nitride is preferably titanium nitride or tantalum nitride.

One embodiment of the present invention is a semiconductor device including a first conductor; a first insulator over the first conductor; a first oxide over the first insulator; a second oxide over the first oxide; a third oxide over the second oxide; a second insulator over the third oxide; a second conductor over the second insulator; a third insulator provided on a side surface of the second insulator and a side surface of the second conductor; and a fourth insulator provided on a side surface of the third insulator, an opening overlapping with part of the first conductor is provided in the first oxide and the first insulator, and the second oxide is electrically connected to the first conductor through the opening.

In the above, a side surface of the second oxide and a side surface of the third oxide are preferably on the same plane as a side surface of the first oxide.

In the above, an end portion of the second oxide and an end portion of the third oxide are preferably substantially aligned with an end portion of the first oxide.

In the above, the semiconductor device may further include a third conductor and a fourth oxide, and it is preferable that the fourth oxide be provided between the third oxide and the second insulator, and the third conductor overlap with the second conductor with the first insulator, the first oxide, the second oxide, the third oxide, the fourth oxide, and the second insulator interposed therebetween.

In the above, the first conductor and the third conductor preferably include the same material.

One embodiment of the present invention is a method for manufacturing a semiconductor device in which a first insulating film is formed over a first conductor and a second conductor; a first oxide film is formed over the first insulating film; an opening overlapping with at least part of the first conductor is formed in the first oxide film and the first insulating film; a second oxide film is formed over the first oxide film and the first conductor; a third oxide film is formed over the second oxide film; the third oxide film, the second oxide film, and the first oxide film are patterned to form a first oxide, a second oxide over the first oxide, and a third oxide over the second oxide; a second insulating film is formed to cover the first oxide, the second oxide, and the third oxide; a first conductive film is formed over the second insulating film; the first conductive film and the second insulating film are patterned to form a third conductor and a first insulator; a third insulating film is formed to cover the third conductor and the first insulator; a fourth insulating film is formed over the third insulating film; and the fourth insulating film and the third insulating film are processed by etching to form a second insulator on a side surface of the third conductor and a side surface of the first insulator, and a third insulator on a side surface of the second insulator.

In the above, the third conductor preferably overlaps with the second conductor with the first insulating film, the first oxide, the second oxide, the third oxide, and the first insulator interposed therebetween.

Effect of the Invention

According to one object of one embodiment of the present invention, a semiconductor device with favorable electrical characteristics and a manufacturing method thereof can be provided. According to one object of one embodiment of the present invention, a highly reliable semiconductor device and a manufacturing method thereof can be provided. According to one embodiment of the present invention, a semiconductor device that can be miniaturized or highly integrated and a manufacturing method thereof can be provided. According to one embodiment of the present invention, a semiconductor device with high productivity and a manufacturing method thereof can be provided.

According to one embodiment of the present invention, a semiconductor device that has suppressed variation in electrical characteristics, stable electrical characteristics, and improved reliability can be provided. A semiconductor device capable of retaining data for a long time can be provided. A semiconductor device capable of high-speed data writing can be provided. A novel semiconductor device can be provided.

According to one embodiment of the present invention, a semiconductor device with high design flexibility can be provided. A semiconductor device with reduced power consumption can be provided.

According to one embodiment of the present invention, a semiconductor device whose manufacturing process is simplified and a manufacturing method thereof can be provided. According to one embodiment of the present invention, a semiconductor device with reduced area and a manufacturing method thereof can be provided.

Note that the descriptions of these effects do not disturb the existence of other effects. Note that one embodiment of the present invention does not have to have all of these effects. Note that effects other than these effects will be apparent and can be derived from the descriptions of the specification, the drawings, the claims, and the like.

BRIEF DESCRIPTION OF DRAWINGS

FIGS. 3A-3D A top view and cross-sectional views illustrating a semiconductor device of one embodiment of the present invention.

FIGS. 4A-4D A top view and cross-sectional views illustrating a semiconductor device of one embodiment of the present invention.

FIGS. 5A-5D A top view and cross-sectional views illustrating a method for manufacturing a semiconductor device of one embodiment of the present invention.

FIGS. 9A-9D A top view and cross-sectional views illustrating a method for manufacturing a semiconductor device of one embodiment of the present invention.

FIGS. 10A-10D A top view and cross-sectional views illustrating a method for manufacturing a semiconductor device of one embodiment of the present invention.

FIGS. 11A-11D A top view and cross-sectional views illustrating a method for manufacturing a semiconductor device of one embodiment of the present invention.

FIGS. 17A-17D A top view and cross-sectional views illustrating a method for manufacturing a semiconductor device of one embodiment of the present invention.

FIGS. 19A-19D A top view and cross-sectional views illustrating a method for manufacturing a semiconductor device of one embodiment of the present invention.

FIGS. 20A-20D A top view and cross-sectional views illustrating a method for manufacturing a semiconductor device of one embodiment of the present invention.

FIGS. 23A-23D A top view and cross-sectional views of a semiconductor device of one embodiment of the present invention.

FIGS. 33A-33D A top view and cross-sectional views illustrating a method for manufacturing a semiconductor device of one embodiment of the present invention.

FIGS. 34A-34D A top view and cross-sectional views illustrating a method for manufacturing a semiconductor device of one embodiment of the present invention.

FIGS. 39A-39D A top view and cross-sectional views illustrating a method for manufacturing a semiconductor device of one embodiment of the present invention.

FIGS. 41A-41D A top view and cross-sectional views illustrating a method for manufacturing a semiconductor device of one embodiment of the present invention.

FIGS. 46A-46D A top view and cross-sectional views illustrating a method for manufacturing a semiconductor device of one embodiment of the present invention.

FIGS. 48A-48D A top view and cross-sectional views illustrating a method for manufacturing a semiconductor device of one embodiment of the present invention.

FIGS. 49A-49D A top view and cross-sectional views illustrating a method for manufacturing a semiconductor device of one embodiment of the present invention.

MODE FOR CARRYING OUT THE INVENTION

Figure 1:
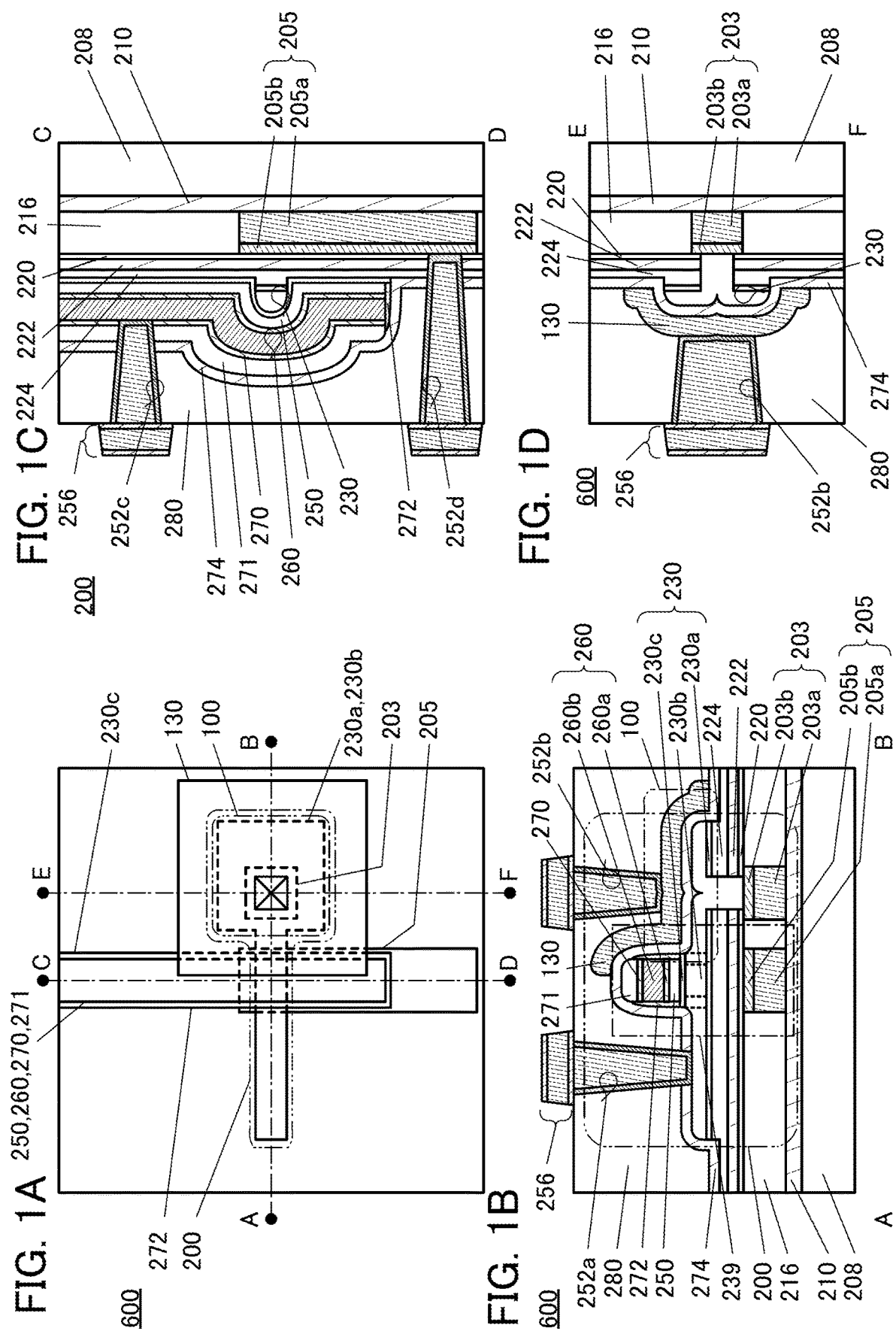
FIGS. 1A-1D A top view and cross-sectional views illustrating a semiconductor device of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope. Thus, the present invention should not be interpreted as being limited to the following description of the embodiments.

In the drawings, the size, the layer thickness, or the region is exaggerated for clarity in some cases. Therefore, they are not limited to the scale. Note that the drawings are schematic views showing ideal examples, and shapes, values or the like are not limited to shapes, values or the like shown in the drawings. For example, in the actual manufacturing process, a layer or a resist mask might be unintentionally reduced in size by treatment such as etching, which is omitted in some cases for easy understanding. In the drawings, the same portions or portions having similar functions are denoted by the same reference numerals in different drawings, and explanation thereof is not repeated in some cases. Furthermore, the same hatching pattern is applied to portions having similar functions, and the portions are not particularly denoted by reference numerals in some cases.

Furthermore, particularly in a top view (also referred to as a "plan view"), a perspective view, or the like, illustration of some components might be omitted for easy understanding of the invention. In addition, illustration of some hidden lines and the like might be omitted.

The ordinal numbers such as first and second in this specification and the like are used for convenience and do not denote the order of steps or the stacking order of layers. Therefore, for example, "first" can be replaced with "second" or "third" as appropriate for description. In addition, the ordinal numbers in this specification and the like do not correspond to the ordinal numbers that are used to specify one embodiment of the present invention in some cases.

In this specification, terms for describing arrangement, such as "over" and "under", are used for convenience to describe a positional relation between components with reference to drawings. Furthermore, the positional relation between components is changed as appropriate in accordance with a direction in which each component is illustrated. Thus, there is no limitation on terms described in this specification, and the terms can be changed appropriately depending on the situation.

In the case where there is an explicit description X and Y are connected in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is included in the drawings or the texts.

Here, X and Y each denote an object (for example, a device, an element, a circuit, a wiring, an electrode, a terminal, a conductive film, or a layer).

An example of the case where X and Y are directly connected as follows: an element that allows an electrical connection between X and Y (for example, a switch, a transistor, a capacitor, an inductor, a resistor, a diode, a display element, a light-emitting element, or a load) is not connected between X and Y, or the case where X and Y are connected without the element that allows the electrical connection between X and Y (for example, a switch, a transistor, a capacitor, an inductor, a resistor, a diode, a display element, a light-emitting element, or a load) provided therebetween.

An example of the case where X and Y are electrically connected as follows: one or more elements that allow an electrical connection between X and Y (for example, a switch, a transistor, a capacitor, an inductor, a resistor, a diode, a display element, a light-emitting element, or a load) can be connected between X and Y. Note that the switch has a function of being controlled to be turned on or off. That is, the switch has a function of being in a conduction state (on state) or a non-conduction state (off state) to control a path where current flows. The switch has a function of selecting and changing a current path. Note that the case where X and Y are electrically connected includes the case where X and Y are directly connected.

An example of the case where X and Y are functionally connected as follows: one or more circuits that allow a functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (a step-up circuit, a step-down circuit, or the like), a level shifter circuit for changing the potential level of a signal, or the like), a voltage source, a current source, a switching circuit, an amplifier circuit (a circuit that can increase signal amplitude, the amount of current, or the like, an operational amplifier, a differential amplifier circuit, a source follower circuit, a buffer circuit, or the like), a signal generation circuit, a memory circuit, or a control circuit) can be connected between X and Y. Note that, for example, when another circuit is interposed between X and Y and a signal output from X is transmitted to Y, X and Y are regarded as being functionally connected. Note that the case where X and Y are functionally connected includes the case where X and Y are directly connected and the case where X and Y are electrically connected.

In this specification and the like, a transistor is an element having at least three terminals including a gate, a drain, and a source. The transistor has a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or the direction of current flow is changed in circuit operation, for example. Therefore, the terms "source" and "drain" can be switched in some cases in this specification and the like.

Note that a channel length refers to, for example, the distance between a source (a source region or a source electrode) and a drain (a drain region or a drain electrode) in a region where a semiconductor (or a portion where current flows in a semiconductor when a transistor is on) and a gate electrode overlap with each other or a region where a channel is formed in a top view of the transistor. Note that in one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

The channel width refers to, for example, the length of a portion where a source and a drain face each other in a region where a semiconductor (or a portion where current flows in a semiconductor when a transistor is on) and a gate electrode overlap with each other, or a region where a channel is formed in a top view of the transistor. Note that in one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter also referred to as an "effective channel width") is different from a channel width shown in a top view of a transistor (hereinafter also referred to as an "apparent channel width") in some cases. For example, in the case where a gate electrode covers a side surface of a semiconductor, an effective channel width is larger than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is larger than an apparent channel width.

In such a case, an effective channel width might be difficult to estimate by actual measurement. For example, estimation of an effective channel width from a design value requires an assumption that the shape of a semiconductor is known. Accordingly, in the case where the accurate shape of a semiconductor is not known, it is difficult to measure an effective channel width accurately.

Thus, in this specification, an apparent channel width is referred to as a "surrounded channel width (SCW)" in some cases. Furthermore, in this specification, the simple term "channel width" refers to a surrounded channel width or an apparent channel width in some cases. Alternatively, in this specification, the simple term "channel width" refers to an effective channel width in some cases. Note that a channel length, a channel width, an effective channel width, an apparent channel width, a surrounded channel width, and the like can be determined by, for example, analyzing a cross-sectional TEM image.

Note that an impurity in a semiconductor refers to, for example, an element other than the main components of the semiconductor. For example, an element with a concentration lower than 0.1 atomic % can be regarded as an impurity. When an impurity is contained, for example, the DOS (Density of States) in a semiconductor may be increased, or the crystallinity may be decreased. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In addition, in the case of an oxide semiconductor, entry of impurities may form oxygen vacancies, for example. When the semiconductor is silicon, examples of an impurity which changes the characteristics of the semiconductor include oxygen, Group 1 elements except hydrogen, Group 2 elements, Group 13 elements, and Group 15 elements.

Note that in this specification and the like, a silicon oxynitride film contains more oxygen than nitrogen in its composition. A silicon oxynitride film preferably contains, for example, oxygen in the range of 55 atomic % to 65 atomic %, nitrogen in the range of 1 atomic % to 20 atomic %, silicon in the range of 25 atomic % to 35 atomic %, and hydrogen in the range of 0.1 atomic % to 10 atomic %. A silicon nitride oxide film contains more nitrogen than oxygen in its composition. A silicon nitride oxide film preferably contains nitrogen in the range of 55 atomic % to 65 atomic %, oxygen in the range of 1 atomic % to 20 atomic %, silicon in the range of 25 atomic % to 35 atomic %, and hydrogen in the range of 0.1 atomic % to 10 atomic %, for example.

In this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In addition, in this specification and the like, the term "insulator" can be replaced with "insulating film" or "insulating layer". Moreover, the term "conductor" can be replaced with "conductive film" or "conductive layer". Furthermore, the term "semiconductor" can be replaced with "semiconductor film" or "semiconductor layer".

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "Vth") is higher than 0 V.

In this specification and the like, "parallel" refers to a state where two straight lines are arranged such that the angle formed therebetween is greater than or equal to −10° and less than or equal to 10°. Accordingly, the case where the angle is greater than or equal to −5° and less than or equal to 5° is also included. In addition, "substantially parallel" indicates a state where two straight lines are arranged such that the angle formed therebetween is greater than or equal to −30° and less than or equal to 30°. Moreover, "perpendicular" indicates a state where two straight lines are arranged such that the angle formed therebetween is greater than or equal to 80° and less than or equal to 100°. Accordingly, the case where the angle is greater than or equal to 85° and less than or equal to 95° is also included. In addition, "substantially perpendicular" indicates a state where two straight lines are arranged such that the angle formed therebetween is greater than or equal to 60° and less than or equal to 120°.

In this specification, trigonal and rhombohedral crystal systems are included in a hexagonal crystal system.

Note that in this specification, a barrier film refers to a film having a function of inhibiting passage of oxygen and impurities such as hydrogen, and in the case where the barrier film has conductivity, it may be referred to as a conductive barrier film.

In this specification and the like, a metal oxide means an oxide of metal in a broad expression. Metal oxides are classified into an oxide insulator, an oxide conductor (including a transparent oxide conductor), an oxide semiconductor (also simply referred to as an OS), and the like. For example, when a metal oxide is used in an active layer of a transistor, the metal oxide is called an oxide semiconductor in some cases. In other words, when an OS FET is stated, it can be replaced with a transistor including an oxide or an oxide semiconductor.

Embodiment 1

Structure Example 1 of Semiconductor Device

An example of a semiconductor device including a transistor 200 of one embodiment of the present invention will be described below.

Note that in this embodiment, an example in which a capacitor 100 is provided in the same layer as the transistor 200 is described. In addition, an example of using part of a structure of the transistor 200 as part of a structure of the capacitor 100 is described.

In this case, part or the whole of the capacitor 100 can overlap with the transistor 200, so that the total area of the projected area of the transistor 200 and the projected area of the capacitor 100 can be reduced, which is preferable.

However, this embodiment is not limited thereto. The capacitor 100 and the transistor 200 may be provided in different layers, and for example, the capacitor 100 may be provided over an insulator (interlayer film) provided to cover the transistor 200. Furthermore, the capacitor 100 is not necessarily provided when the semiconductor device operation or the circuit structure does not require a capacitor.

FIG. 1(A), FIG. 1(B), FIG. 1(C), and FIG. 1(D) are a top view and cross-sectional views of the transistor 200 of one embodiment of the present invention, the capacitor 100, and the periphery of the transistor 200. Note that in this specification, a semiconductor device including one capacitor and at least one transistor is referred to as a cell.

FIG. 1(A) is a top view of a cell 600 including the transistor 200 and the capacitor 100. FIG. 1(B), FIG. 1(C), and FIG. 1(D) are cross-sectional views of the cell 600. Here, FIG. 1(B) is a cross-sectional view of a portion denoted by dashed-dotted line A-B in FIG. 1(A), and is also a cross-sectional view of the transistor 200 in the channel length direction. FIG. 1(C) is a cross-sectional view of a portion denoted by dashed-dotted line C-D in FIG. 1(A), and is also a cross-sectional view of the transistor 200 in the channel width direction. FIG. 1(D) is a cross-sectional view of a portion denoted by dashed-dotted line E-F in FIG. 1(A), and is also a cross-sectional view of a connection portion between an oxide 230 and a conductor 203, the capacitor 100, and the like. For simplification of the drawing, some components are omitted in the top view in FIG. 1(A).

[Cell 600]

The semiconductor device of one embodiment of the present invention includes the transistor 200, the capacitor 100, and an insulator 280 functioning as an interlayer film. Furthermore, a conductor 252 (a conductor 252a, a conductor 252b, a conductor 252c, and a conductor 252d) functions as a plug that is electrically connected to the transistor 200 is included.

The conductor 252 is formed in contact with an inner wall of an opening in the insulator 280. Here, a top surface of the conductor 252 can be substantially level with a top surface of the insulator 280. Note that although the conductor 252 in the transistor 200 has a two-layer structure, the present invention is not limited thereto. For example, the conductor 252 may be a single layer or have a stacked-layer structure of three or more layers.

[Transistor 200]

As illustrated in FIG. 1, the transistor 200 includes an insulator 208 placed over a substrate (not illustrated); an insulator 210; a conductor 203 (a conductor 203a and a conductor 203b) and a conductor 205 (a conductor 205a and a conductor 205b) that are placed over the insulator 210; an insulator 216 provided between the conductor 203 and the conductor 205 and around the conductors; an insulator 220 placed over the insulator 216, the conductor 203, and the conductor 205; an insulator 222 placed over the insulator 220; an insulator 224 placed over the insulator 222; an oxide 230 (an oxide 230a, an oxide 230b, and an oxide 230c) placed over the insulator 224; an insulator 250 placed over the oxide 230; a conductor 260 (a conductor 260a and a conductor 260b) placed over the insulator 250; an insulator 270 and an insulator 271 that are placed over the conductor 260; an insulator 272 placed in contact with at least side surfaces of the insulator 250 and the conductor 260; and an insulator 274 placed in contact with the oxide 230 and the insulator 272.

Note that the insulator 216 can be formed by polishing an insulating film placed to cover the conductor 203 and the conductor 205 by a CMP method or the like to expose the conductor 203 and the conductor 205. Thus, surfaces of the insulator 216, the conductor 203, and the conductor 205 have high planarity.

The insulator 220, the insulator 222, the insulator 224, and the oxide 230a have an opening. The oxide 230b is electrically connected to the conductor 203 through the opening. When the oxide 230b is connected to the conductor 203 without through the oxide 230a, the series resistance and the contact resistance can be reduced. With such a structure, a semiconductor device with favorable electrical characteristics can be obtained. More specifically, a transistor with an increased on-state current and a semiconductor device including the transistor can be obtained.

Moreover, the conductor 203 and the conductor 205 preferably have a stacked-layer structure. Furthermore, a material that is less likely to be oxidized, that is, has a higher oxidation resistance, than a material for the conductor 203a and the conductor 205a is preferably used for the conductor 203b and the conductor 205b. When a material that is less likely to be oxidized is used for the conductor 203b and the conductor 205b, oxidation of the conductor 203 and the conductor 205 can be inhibited at the formation of an insulating film to be the insulator 216, at the formation of the insulator 216, at the formation of the insulator 220, at the formation of the opening provided in the insulator 220, the insulator 222, the insulator 224, and the oxide 230a, and at the formation of an oxide to be the oxide 230b. Thus, an increase in the electrical resistance due to oxidation of the conductor 203 and the conductor 205 can be inhibited. In particular, since oxidation of a top surface of the conductor 203 is inhibited, the contact between the conductor 203 and the oxide 230b becomes favorable.

For the conductor 203a and the conductor 205a, a material having a lower resistance than the conductor 203b and the conductor 205b is preferably used. The conductor 203b and the conductor 205b which are formed of a material with a high oxidation resistance are provided over the conductor 203a and the conductor 205a, respectively. Therefore, an increase in the electrical resistance due to oxidation of the conductor 203a and the conductor 205a or the like can be inhibited in the manufacturing process of the transistor 200 or the like.

Note that although the transistor 200 has, as illustrated in FIG. 1, a structure in which the oxide 230a, the oxide 230b, and the oxide 230c are stacked, the present invention is not limited thereto. For example, a two-layer structure of the oxide 230a and the oxide 230b or a stacked-layer structure of four or more layers may be employed. Alternatively, a single layer of only the oxide 230b or only the oxide 230b and the oxide 230c may be provided. Although the transistor 200 has a structure in which the conductor 260a and the conductor 260b are stacked, the present invention is not limited thereto. For example, a single layer or a stacked-layer structure of three or more layers may be employed.

Figure 2:
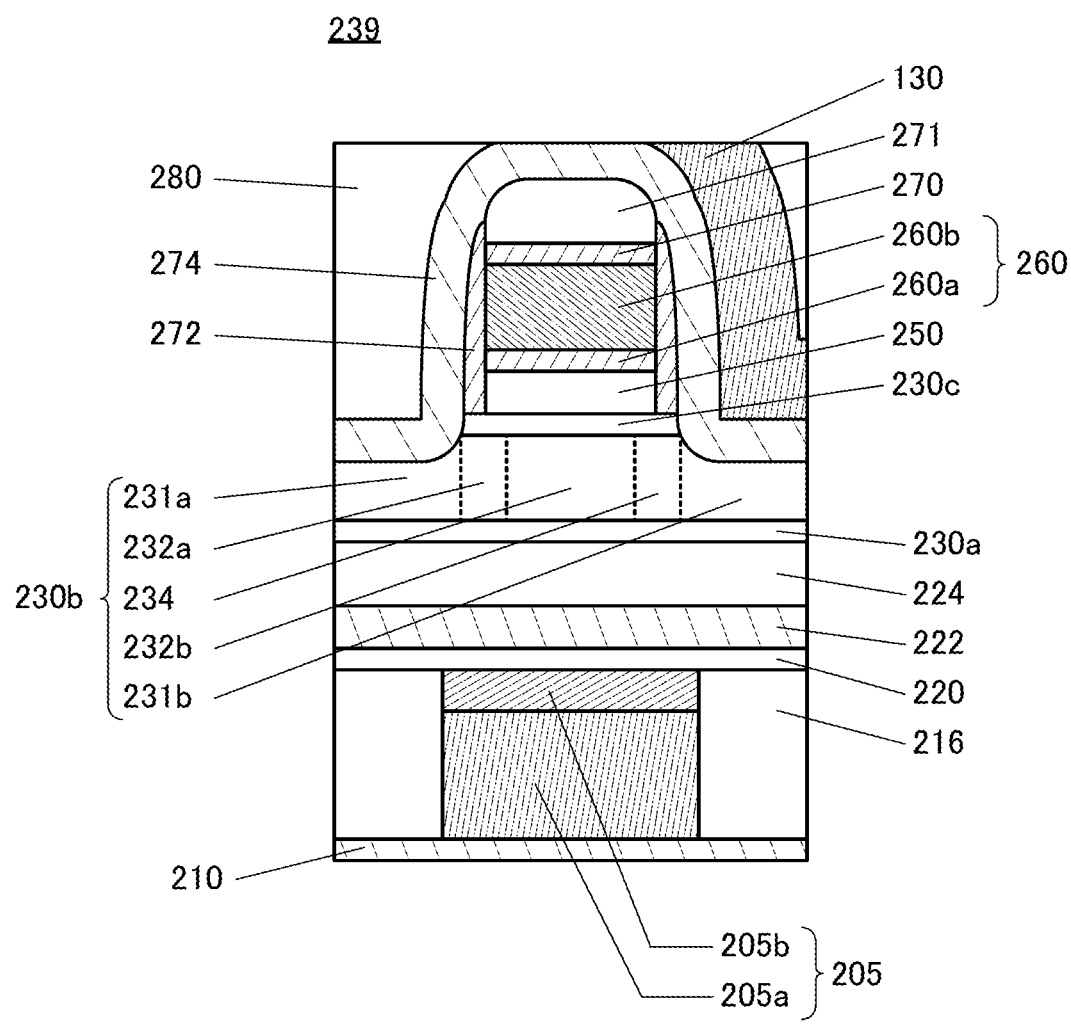
FIG. 2 A cross-sectional view illustrating a semiconductor device of one embodiment of the present invention.
Figure 6A:
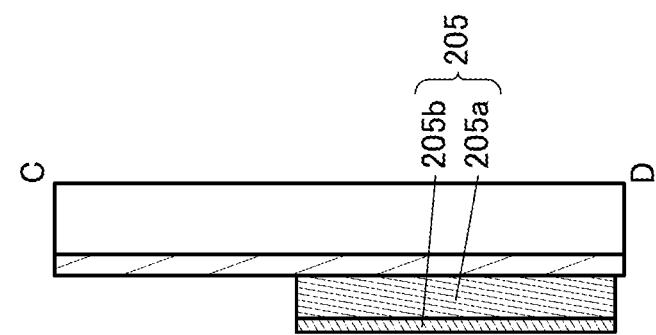
FIGS. 6A-6D A top view and cross-sectional views illustrating a method for manufacturing a semiconductor device of one embodiment of the present invention.
Figure 6C:
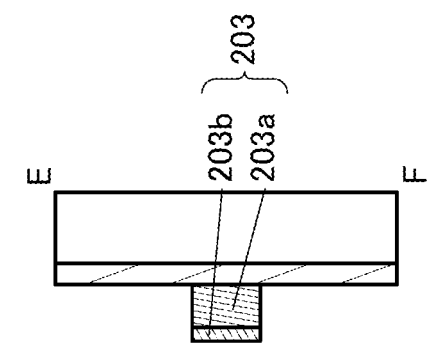
Figure 6B:
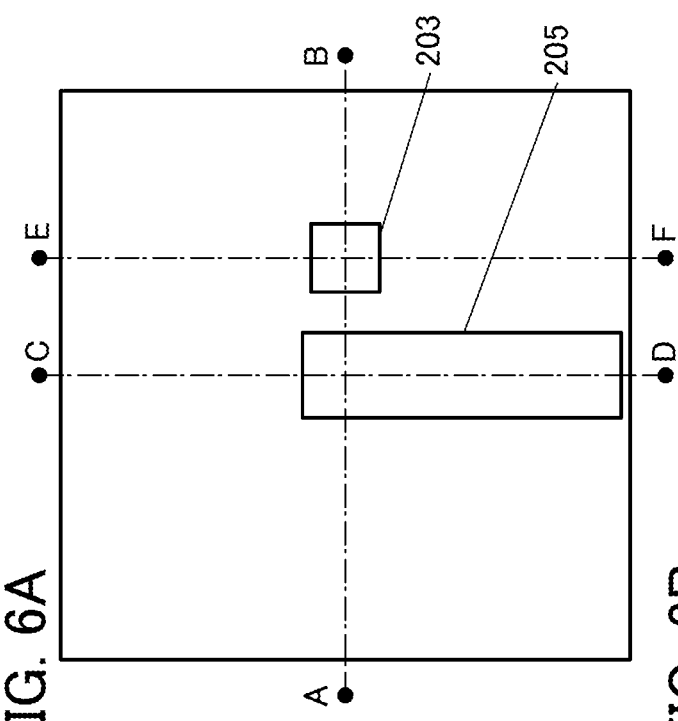
Figure 6D:
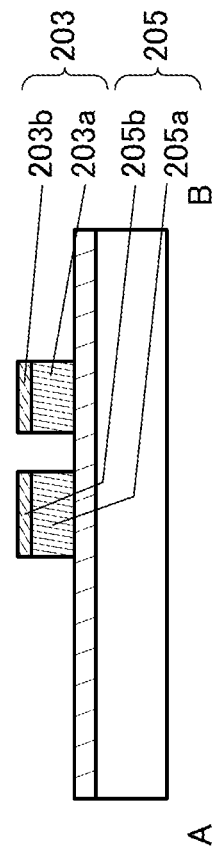
Figure 7C:
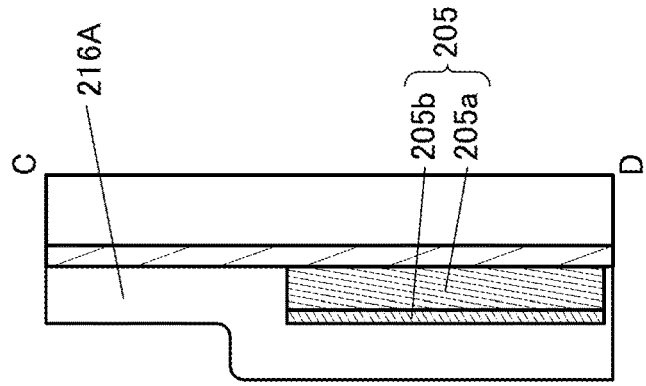
FIGS. 7A-7D A top view and cross-sectional views illustrating a method for manufacturing a semiconductor device of one embodiment of the present invention.
Figure 7D:
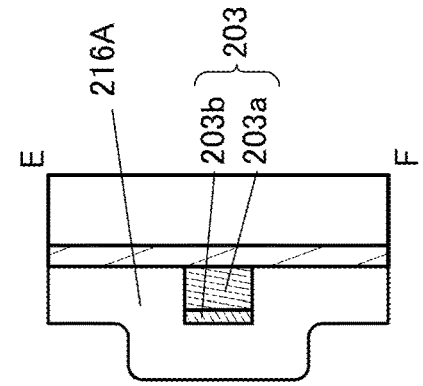
Figure 7A:
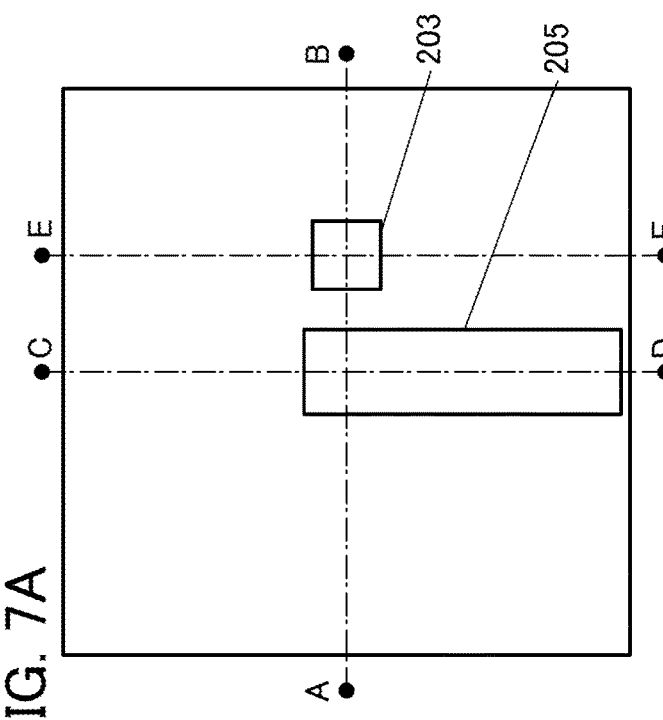
Figure 7B:
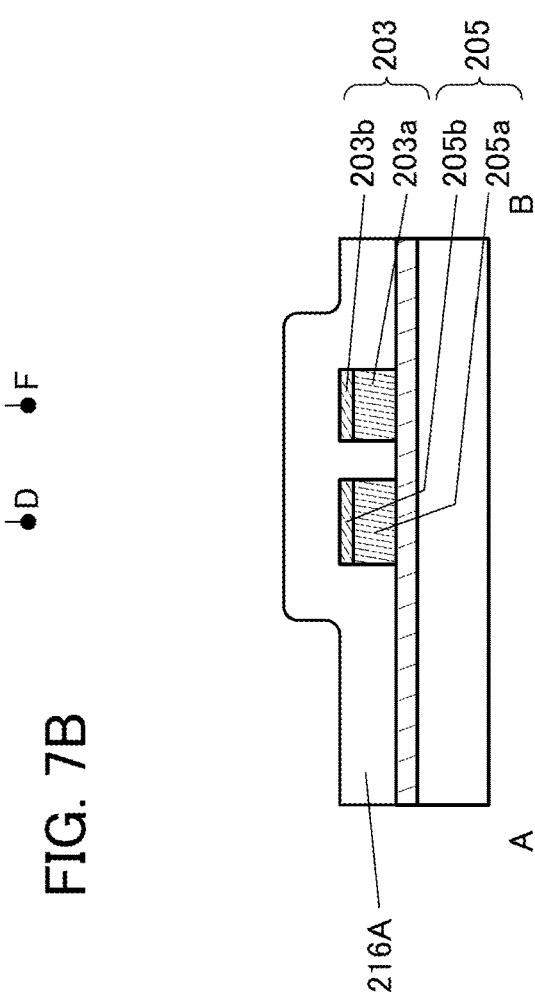
Figure 8A:
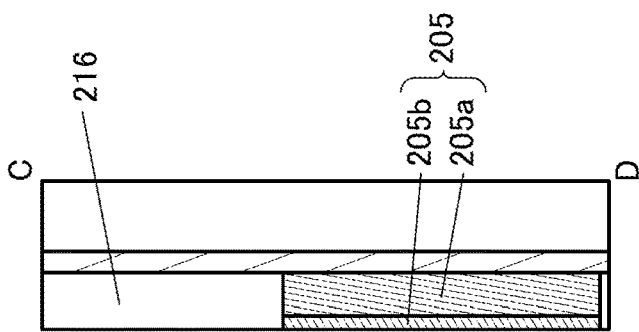
FIGS. 8A-8D A top view and cross-sectional views illustrating a method for manufacturing a semiconductor device of one embodiment of the present invention.
Figure 8B:
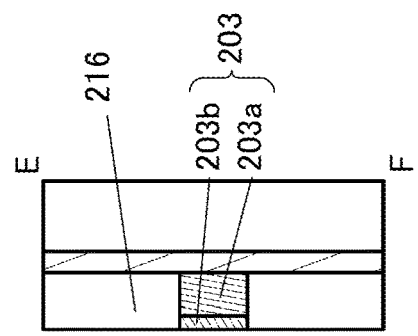
Figure 8C:
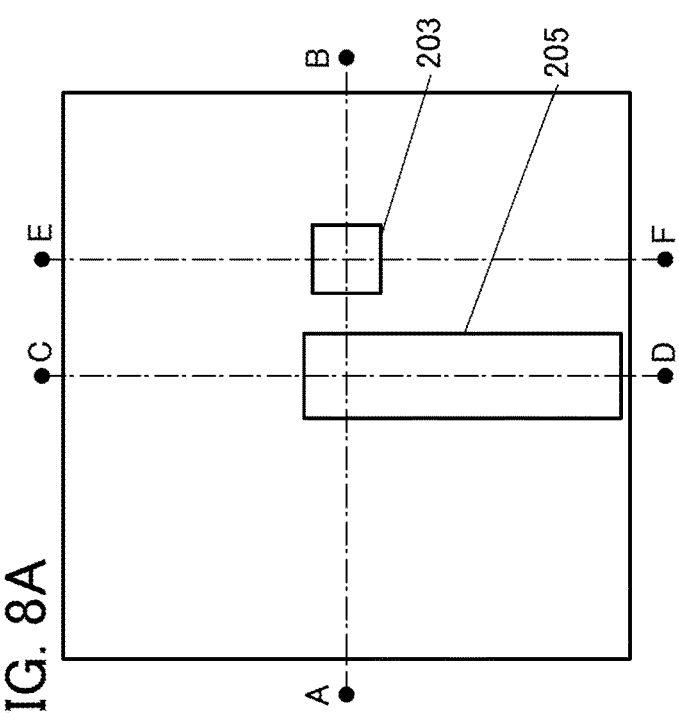
Figure 8D:
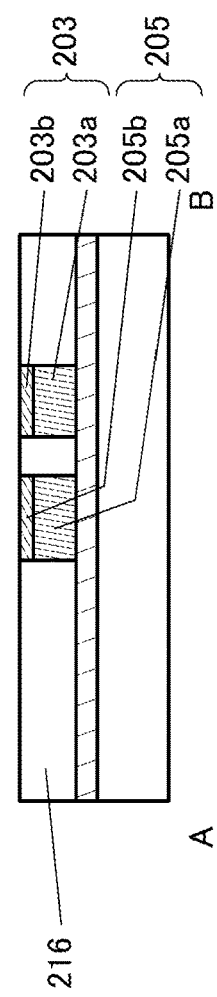

Here, an enlarged view of a region 239 in the vicinity of a channel, which is surrounded by a dashed-dotted line in FIG. 1(B), is illustrated in FIG. 2.

As illustrated in FIG. 1(B) and FIG. 2, the oxide 230 includes a region 232 (a region 232a and a region 232b) between a region 234 functioning as a channel formation region of the transistor 200 and a region 231 (a region 231a and a region 231b) functioning as a source region or a drain region. The region 231 functioning as the source region or the drain region is a region having a high carrier density and reduced resistance. In addition, the region 234 functioning as the channel formation region is a region having a lower carrier density than the region 231 functioning as the source region or the drain region. Moreover, the region 232 is a region having a lower carrier density than the region 231 functioning as the source region or the drain region and having a higher carrier density than the region 234 functioning as the channel formation region. That is, the region 232 functions as a junction region between the channel formation region and the source region or the drain region.

When the junction region is provided, a high-resistance region is not formed between the region 231 functioning as the source region or the drain region and the region 234 functioning as the channel formation region, thereby increasing on-state current of the transistor.

The region 232 includes a region overlapping with the conductor 260 functioning as a gate electrode. In particular, the region overlapping with the conductor 260 functioning as the gate electrode in the region 232 sometimes functions as a so-called overlap region (also referred to as an Lov region).

The region 231 is preferably in contact with the insulator 274. Furthermore, the concentration of at least one of a metal element such as indium and an impurity element such as hydrogen or nitrogen in the region 231 is preferably higher than that in each of the region 232 and the region 234.

The region 232 includes a region overlapping with the insulator 272. The concentration of at least one of a metal element such as indium and an impurity element such as hydrogen or nitrogen in the region 232 is preferably higher than that in the region 234. On the other hand, the concentration of at least one of a metal element such as indium and an impurity element such as hydrogen or nitrogen is preferably lower than that in the region 231.

The region 234 overlaps with the conductor 260. The region 234 is placed between the region 232a and the region 232b, and the concentration of at least one of a metal element such as indium and an impurity element such as hydrogen or nitrogen in the region 234 is preferably lower than that in each of the region 231 and the region 232.

In addition, in the oxide 230, boundaries between the region 231, the region 232, and the region 234 cannot be observed clearly in some cases. The concentration of a metal element such as indium and an impurity element such as hydrogen or nitrogen, which is detected in each region, may be gradually changed (such a change is also referred to as gradation) not only between the regions but also in each region. That is, the region closer to the region 234, from the region 231 to the region 232, preferably has a lower concentration of a metal element such as indium and an impurity element such as hydrogen or nitrogen.

Furthermore, in FIG. 1(B) and FIG. 2, the region 234, the region 231, and the region 232 are formed in the oxide 230b; however, the present invention is not limited thereto, and these regions may be formed in the oxide 230a or the oxide 230c, for example. Although the boundaries between the regions are indicated substantially perpendicularly to a top surface of the oxide 230 in the drawings, this embodiment is not limited thereto. For example, the region 232 may project to the conductor 260 side in the vicinity of the surface of the oxide 230b, and recede to the conductor 252a side or the conductor 252b side in the vicinity of a bottom surface of the oxide 230b.

Note that in the transistor 200, a metal oxide functioning as an oxide semiconductor (hereinafter, also referred to as an oxide semiconductor) is preferably used for the oxide 230. A transistor including an oxide semiconductor has an extremely low leakage current (off-state current) in a non-conduction state; thus, a semiconductor device with low power consumption can be provided. Moreover, an oxide semiconductor can be deposited by a sputtering method or the like and thus can be used for a transistor included in a highly integrated semiconductor device.

Meanwhile, the transistor including an oxide semiconductor is likely to have its electrical characteristics changed by impurities and oxygen vacancies in the oxide semiconductor; as a result, the reliability is reduced, in some cases. Hydrogen in an oxide semiconductor reacts with oxygen bonded to a metal atom to be water, and thus causes an oxygen vacancy, in some cases. Entry of hydrogen into the oxygen vacancy generates an electron serving as a carrier in some cases. Accordingly, a transistor including an oxide semiconductor containing oxygen vacancies in a channel formation region is likely to have normally-on characteristics. Thus, it is preferable that oxygen vacancies in the channel formation region be reduced as much as possible.

In particular, when oxygen vacancies exist at an interface between the region 234 of the oxide 230 where a channel is formed and the insulator 250 functioning as a gate insulating film, a variation in the electrical characteristics is likely to occur and the reliability is reduced in some cases.

In view of the above, the insulator 250 overlapping with the region 234 of the oxide 230 preferably contains oxygen at a higher proportion than oxygen in the stoichiometric composition (also referred to as excess oxygen). That is, excess oxygen in the insulator 250 is diffused into the region 234, whereby oxygen vacancies in the region 234 can be reduced.

The insulator 272 is preferably provided in contact with the insulator 250. For example, the insulator 272 preferably has a function of inhibiting diffusion of oxygen (for example, at least one of oxygen atoms and oxygen molecules), that is, the above oxygen is preferably less likely to pass through the insulator 272. When the insulator 272 has a function of inhibiting diffusion of oxygen, oxygen in an excess-oxygen region is not diffused to the insulator 274 side and is supplied to the region 234 efficiently. Thus, the formation of oxygen vacancies at the interface between the oxide 230 and the insulator 250 is inhibited, leading to an improvement in the reliability of the transistor 200.

Furthermore, the transistor 200 is preferably covered with the insulator which has a barrier property and prevents entry of impurities such as water and hydrogen. The insulator having a barrier property is an insulator containing an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (an insulating material through which the above impurities are less likely to pass). Moreover, it is preferable to use an insulating material having a function of inhibiting diffusion of oxygen (for example, at least one of oxygen atoms and oxygen molecules), that is, an insulating material through which the above oxygen is less likely to pass.

The structure of a semiconductor device including the transistor 200 of one embodiment of the present invention will be described in detail below.

In the transistor 200, the conductor 260 functions as a first gate electrode in some cases. Furthermore, the conductor 205 functions as a second gate electrode in some cases. In that case, by changing a potential applied to the conductor 205 not in synchronization with but independently of a potential applied to the conductor 260, the threshold voltage of the transistor 200 can be controlled. In particular, by applying a negative potential to the conductor 205, the threshold voltage of the transistor 200 can be higher than 0 V, and the off-state current can be reduced. Accordingly, a drain current when a voltage applied to the conductor 260 is 0 V can be reduced.

The conductor 205 functioning as the second gate electrode is placed to overlap with the oxide 230 and the conductor 260.

Here, the conductor 205 is preferably provided to be long so that the length in the channel width direction is greater than that of the region 234 of the oxide 230. It is particularly preferable that the conductor 205 extend beyond an end portion of the region 234 of the oxide 230 that intersects with the channel width direction. That is, the conductor 205 and the conductor 260 preferably overlap with each other with the insulator therebetween on a side surface of the oxide 230 in the channel width direction.

The conductor 203 can be formed in the same step as the conductor 205. The conductor 203 functions as an electrode or a wiring that is electrically connected to the region 231 of the oxide 230.

The insulator 216 is formed between the conductor 203 and the conductor 205 and around these conductors. Here, the top surfaces of the conductor 203 and the conductor 205 can be substantially level with a top surface of the insulator 216.

Here, a conductive material that is less likely to be oxidized, that is, has a higher oxidation resistance, than a material for the conductor 203a and the conductor 205a is preferably used for the conductor 203b and the conductor 205b. As such a conductive material, a metal nitride such as tantalum nitride or titanium nitride can be used.

By using a material with a high oxidation resistance for the conductor 203b and the conductor 205b, the conductivity of the conductor 203 and the conductor 205 can be prevented from being reduced because of oxidation. Furthermore, oxidation of the top surface of the conductor 203 is inhibited, so that the contact between the oxide 230b and the conductor 203 becomes favorable.

In addition, a conductive material containing tungsten, copper, or aluminum as its main component is preferably used for the conductor 203a and the conductor 205a. In this embodiment, tungsten is used for the conductor 203a and the conductor 205a.

As illustrated in FIG. 3, a conductor 209 electrically connected to the conductor 205 may be provided. An insulator 212 is provided over the insulator 210, and the conductor 209 can be formed to be embedded in an opening provided in the insulator 212. In that case, the conductor 209 may have a stacked-layer structure of a first conductor provided in contact with a side surface and a bottom surface of the opening provided in the insulator 212 and a second conductor provided over the first conductor. In this case, the first conductor is preferably a conductive barrier. Alternatively, the conductor 209 may have a single-layer structure or a stacked-layer structure of three or more layers. In the case where the conductor 209 has a stacked-layer structure of three or more layers, two or more conductive barriers may be provided. As the conductive barrier, one or more barrier films selected from a barrier film inhibiting passage of impurities such as hydrogen, water, and nitrogen, a barrier film inhibiting passage of oxygen, and a barrier film inhibiting passage of a metal component can be provided.

Alternatively, the conductor 209 may be formed by a lithography method or an etching method after a conductive film that is formed of a single layer or two or more layers is provided over the insulator 210. Furthermore, an insulating film may be formed over the insulator 210 to cover the conductor 209 and the insulating film is processed by a CMP method or an etching method, so that the insulator 212 is formed.

The conductor 209 can function as an electrode or a wiring. When the conductor 205 is used as the second gate electrode of the transistor 200, part of the conductor 209 can function as a gate wiring. In that case, the conductor 205 and the conductor 252d may be electrically connected to each other through a conductor 207 including a conductor 207a and a conductor 207b formed over the conductor 207a, and the conductor 209. The conductor 207 can be formed in the same step as the conductor 203 and the conductor 205.

The conductor 209 is electrically connected to the oxide 230b through the conductor 203, and can function as a source wiring or a drain wiring of the transistor 200. The conductor 209 may be used as an electrode for electrical connection with an element or a wiring positioned below the insulator 210.

The insulator 210 preferably functions as an insulating barrier film for preventing impurities such as water and hydrogen from entering the transistor from the substrate side. Accordingly, an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (an insulating material through which the above impurities are less likely to pass) is preferably used for the insulator 210. Moreover, it is preferable to use an insulating material having a function of inhibiting diffusion of oxygen (for example, at least one of oxygen atoms and oxygen molecules), that is, an insulating material through which the above oxygen is less likely to pass.

For example, aluminum oxide or silicon nitride is preferably used for the insulator 210. Thus, impurities such as hydrogen and water can be inhibited from being diffused to the transistor side from the insulator 210. In addition, oxygen in the insulator 224 and the like can be inhibited from being diffused to the substrate side from the insulator 210.

Moreover, the insulator 208, the insulator 216, and the insulator 280 functioning as interlayer films preferably have a lower permittivity than the insulator 210. In the case where a material with a low permittivity is used for an interlayer film, the parasitic capacitance generated between wirings can be reduced.

For example, for the insulator 208, the insulator 216, and the insulator 280 functioning as interlayer films, a single layer or stacked layers of any of insulators such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

The insulator 220, the insulator 222, and the insulator 224 each function as a gate insulator.

Here, as the insulator 224 in contact with the oxide 230, an oxide insulator that contains more oxygen than that in the stoichiometric composition is preferably used. That is, an excess-oxygen region is preferably formed in the insulator 224. When such an insulator containing excess oxygen is provided in contact with the oxide 230, oxygen vacancies in the oxide 230 can be reduced, leading to an improvement in reliability.

As the insulator including the excess-oxygen region, specifically, an oxide material that releases part of oxygen by heating is preferably used. An oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS (Thermal Desorption Spectroscopy) analysis. Note that the temperature of the film surface in the TDS analysis is preferably in a range higher than or equal to 100° C. and lower than or equal to 700° C., or higher than or equal to 100° C. and lower than or equal to 400° C.

Furthermore, in the case where the insulator 224 includes an excess-oxygen region, the insulator 222 preferably has a function of inhibiting diffusion of oxygen (for example, at least one of oxygen atoms and oxygen molecules), that is, the above oxygen is preferably less likely to pass through the insulator 222.

When the insulator 222 has a function of inhibiting diffusion of oxygen, oxygen in the excess-oxygen region is not diffused to the insulator 220 side and can be supplied to the oxide 230 efficiently. The conductor 205 can be inhibited from reacting with oxygen in the excess-oxygen region of the insulator 224.

For the insulator 222, a single layer or stacked layers of an insulator containing what is called a high-k material such as aluminum oxide, hafnium oxide, hafnium aluminate, tantalum oxide, zirconium oxide, lead zirconate titanate (PZT), strontium titanate ($SrTiO_3$), or $(Ba,Sr)TiO_3$ (BST) are preferably used, for example. When a high-k material is used for the insulator functioning as a gate insulator, miniaturization and high integration of the transistor become possible. It is particularly preferable to use an insulating material having a function of inhibiting diffusion of impurities such as aluminum oxide and hafnium oxide, and hafnium aluminate, oxygen, and the like (an insulating material through which the above oxygen is less likely to pass). The insulator 222 formed using such a material functions as a layer that prevents release of oxygen from the oxide 230 and entry of impurities such as hydrogen from the periphery of the transistor 200.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulator 220 be thermally stable. Because silicon oxide and silicon oxynitride are thermally stable, combination of silicon oxide or silicon oxynitride with an insulator which is a high-k material allows the stacked-layer structure to be thermally stable and have a high relative permittivity, for example.

Note that the insulator 220, the insulator 222, and the insulator 224 may each have a stacked-layer structure of two or more layers. In this case, the stacked-layer structure is not limited to a stacked-layer structure including the same material but may be a stacked-layer structure including different materials. The insulator 220, the insulator 222, and the insulator 224 functioning as gate insulators in the transistor 200 are described; however, this embodiment is not limited thereto. For example, two layers or one layer of any of the insulator 220, the insulator 222, and the insulator 224 may be provided as a gate insulator.

The oxide 230 includes the oxide 230a, the oxide 230b over the oxide 230a, and the oxide 230c over the oxide 230b. The oxide 230 also includes the region 231, the region 232, and the region 234. Note that at least part of the region 231 is preferably in contact with the insulator 274. Moreover, it is preferable that the concentration of at least one of hydrogen, nitrogen, and a metal element such as indium in at least part of the region 231 be higher than that in the region 234.

When the transistor 200 is turned on, the region 231a or the region 231b functions as the source region or the drain region. In addition, at least part of the region 234 functions as a region where a channel is formed.

The insulator 220, the insulator 222, the insulator 224, and the oxide 230a have an opening, and the region 231 of the oxide 230b is electrically connected to the conductor 203. That is, one of a source and a drain of the transistor 200 is electrically connected to the conductor 203 through the opening provided in the insulator 220, the insulator 222, the insulator 224, and the oxide 230a, and the conductor 203 can function as one of a source electrode and a drain electrode, or one of a source wiring and a drain wiring.

As illustrated in FIG. 1(A) and FIG. 1(D), in order to cover the opening formed in the insulator 220, the insulator 222, the insulator 224, and the oxide 230a, the oxide 230a and the oxide 230b are each preferably formed to have a wider width in the E-F direction than the opening in the region overlapping with the opening. Therefore, the widths of the oxide 230a and the oxide 230b in the E-F direction in that region may be wider than the widths of the oxide 230a and the oxide 230b in the C-D direction in a region where a channel is formed or a region on the A side. With such a structure, contact between the oxide 230b and the conductor 203 can be assured. Furthermore, the area of the capacitor 100 can be increased, and an increase in the capacity of the capacitor 100 can be expected.

Here, as illustrated in FIG. 2, the oxide 230 preferably includes the region 232. With this structure, the transistor 200 can have a high on-state current and a low leakage current (off-state current) in a non-conduction state.

When the oxide 230b is provided over the oxide 230a, impurities can be inhibited from being diffused into the oxide 230b from the components formed below the oxide 230a. Moreover, when the oxide 230b is below the oxide 230c, impurities can be inhibited from being diffused into the oxide 230b from the components formed above the oxide 230c.

The oxide 230 has a curved surface between the side surface and the top surface. That is, an end portion of the side surface and an end portion of the top surface are preferably curved (hereinafter also referred to as a round shape). The radius of curvature of the curved surface at an end portion of the oxide 230b is greater than or equal to 3 nm and less than or equal to 10 nm, preferably greater than or equal to 5 nm and less than or equal to 6 nm, for example.

As the oxide 230, a metal oxide functioning as an oxide semiconductor (hereinafter, also referred to as an oxide semiconductor) is preferably used. For example, a metal oxide having an energy gap of 2 eV or more, preferably 2.5 eV or more is preferably used for the metal oxide to be the region 234. With the use of a metal oxide having such a wide energy gap, the off-state current of the transistor can be reduced.

Note that in this specification and the like, a metal oxide containing nitrogen is also called a metal oxide in some cases. Alternatively, a metal oxide containing nitrogen may be called a metal oxynitride.

A transistor including an oxide semiconductor has an extremely low leakage current in a non-conduction state; thus, a semiconductor device with low power consumption can be provided. Moreover, an oxide semiconductor can be deposited by a sputtering method or the like and thus can be used for a transistor included in a highly integrated semiconductor device.

For example, as the oxide 230, a metal oxide such as an In-M-Zn oxide (the element M is one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like) is used. An In—Ga oxide or an In—Zn oxide may be used as the oxide 230.

Here, the region 234 of the oxide 230 will be described.

The region 234 preferably has a stacked-layer structure of oxides which differ in the atomic ratio of metal elements. Specifically, in the case of the stacked-layer structure of the oxide 230a and the oxide 230b, the atomic ratio of the element M to constituent elements in the metal oxide used as the oxide 230a is preferably greater than the atomic ratio of the element M to constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Moreover, the atomic ratio of In to the element M in the metal oxide used as the oxide 230b is preferably greater than the atomic ratio of In to the element M in the metal oxide used as the oxide 230a. As the oxide 230c, a metal oxide which can be used as the oxide 230a or the oxide 230b can be used.

As the oxide 230a, for example, a metal oxide having a composition of In:Ga:Zn=1:3:4, In:Ga:Zn=1:3:2, or In:Ga:Zn=1:1:1 can be used. As the oxide 230b, for example, a metal oxide having a composition of In:Ga:Zn=4:2:3, In:Ga:Zn=1:1:1, or In:Ga:Zn=5:1:6 can be used. As the oxide 230c, for example, a metal oxide having a composition of In:Ga:Zn=1:3:4, In:Ga:Zn=1:3:2, In:Ga:Zn=4:2:3, or In:Ga:Zn=1:1:1 can be used. Note that the above composition represents the atomic ratio of an oxide formed over a substrate or the atomic ratio of a sputtering target.

A combination of a metal oxide having a composition of In:Ga:Zn=1:3:4 as the oxide 230a, a metal oxide having a composition of In:Ga:Zn=4:2:3 as the oxide 230b, and a metal oxide having a composition of In:Ga:Zn=1:3:4 as the oxide 230c, or a combination of a metal oxide having a composition of In:Ga:Zn=1:3:4 as the oxide 230a, a metal oxide having a composition of In:Ga:Zn=4:2:3 as the oxide 230b, and a metal oxide having a composition of In:Ga:Zn=1:1:1 as the oxide 230c is particularly preferable because the oxide 230b can be interposed between the oxide 230a and the oxide 230c each having a wider energy gap. Here, each of the oxide 230a and the oxide 230c having a wide energy gap is referred to as a wide gap, and the oxide 230b having a relatively narrow energy gap is referred to as a narrow gap in some cases. The wide gap and the narrow gap are described in [Composition of metal oxide].

Next, the region 231 and the region 232 which are included in the oxide 230 will be described.

The region 231 and the region 232 are regions whose resistance is reduced by addition of a metal atom such as indium or impurities to a metal oxide provided as the oxide 230. Note that each of the regions has higher conductivity than at least the oxide 230b in the region 234. Note that for addition of impurities to the region 231 and the region 232, for example, a dopant which is at least one of a metal element such as indium and impurities is added by plasma treatment, an ion implantation method by which an ionized source gas is subjected to mass separation and then added, an ion doping method by which an ionized source gas is added without mass separation, a plasma immersion ion implantation method, or the like.

That is, when the content of a metal atom such as indium in the region 231 and the region 232 of the oxide 230 is increased, the electron mobility can be increased and the resistance can be reduced.

Furthermore, when the insulator 274 containing impurity elements is deposited in contact with the oxide 230, impurities can be added to the region 231 and the region 232.

That is, the resistance of the region 231 and the region 232 to which an element that forms an oxygen vacancy or an element trapped by an oxygen vacancy is added is reduced. Typical examples of the element are hydrogen, boron, carbon, nitrogen, fluorine, phosphorus, sulfur, chlorine, titanium, and a rare gas. Typical examples of the rare gas element are helium, neon, argon, krypton, and xenon. Accordingly, the region 231 and the region 232 are made to contain one or more of the above elements.

Alternatively, as the insulator 274, a film which extracts and absorbs oxygen in the region 231 and the region 232 may be used. When oxygen is extracted, oxygen vacancies are generated in the region 231 and the region 232. Hydrogen, boron, carbon, nitrogen, fluorine, phosphorus, sulfur, chlorine, titanium, a rare gas, or the like is trapped by oxygen vacancies, whereby the resistance of the region 231 and the region 232 is reduced.

The insulator 274 may be formed of a single layer or may have a stacked-layer structure of two or more layers. The insulator 274 can be formed by a CVD method, an ALD method, a sputtering method, or the like. An ALD method is favorable for deposition on a step portion formed by the oxide 230 or the conductor 260 because of its excellent step coverage, excellent thickness uniformity, and excellent thickness controllability. An insulator with a thickness of greater than or equal to 0.5 nm and less than or equal to 5.0 nm may be formed by an ALD method, and then an insulator with a thickness of greater than or equal to 1.0 nm and less than or equal to 10.0 nm may be stacked thereover by a plasma CVD method, so that the insulator 274 may be formed. For example, over aluminum oxide, hafnium oxide, or an oxide containing aluminum and hafnium (hafnium aluminate) formed by an ALD method, silicon nitride, silicon nitride oxide, silicon oxynitride, or silicon oxide formed by a plasma CVD method is stacked, so that the insulator 274 may be formed. Alternatively, an insulator with a thickness of greater than or equal to 1.0 nm and less than or equal to 10.0 nm may be formed to be a single-layer insulator 274 by a plasma CVD method. For example, silicon nitride, silicon nitride oxide, silicon oxynitride, or silicon oxide formed by a plasma CVD method may be the insulator 274.

When the region 232 is provided in the transistor 200, a high-resistance region is not formed between the region 231 functioning as the source region or the drain region and the region 234 where a channel is formed, so that the on-state current and the mobility of the transistor can be increased. Since the gate does not overlap with the source region and the drain region in the channel length direction owing to the region 232, formation of unnecessary capacitance can be inhibited. Furthermore, leakage current in a non-conduction state can be reduced by including the region 232.

Thus, by appropriately selecting the area of the region 232, a transistor having electrical characteristics necessary for the circuit design can be easily provided.

The insulator 250 functions as a gate insulating film. The insulator 250 is preferably placed in contact with a top surface of the oxide 230c. The insulator 250 is preferably formed using an insulator from which oxygen is released by heating. The insulator 250 is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy analysis (TDS analysis), for example. Note that the temperature of the film surface in the TDS analysis is preferably in a range higher than or equal to 100° C. and lower than or equal to 700° C., or higher than or equal to 100° C. and lower than or equal to 500° C.

When an insulator from which oxygen is released by heating is provided as the insulator 250 in contact with the top surface of the oxide 230c, oxygen can be effectively supplied to the region 234 of the oxide 230b. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

The conductor 260 functioning as the first gate electrode includes the conductor 260a and the conductor 260b over the conductor 260a.

Titanium nitride or the like is preferably used for the conductor 260a. Moreover, a metal with high conductivity such as tungsten can be used for the conductor 260b, for example.

Alternatively, a conductor formed of a conductive oxide may be provided between the insulator 250 and the conductor 260a. For example, the metal oxide that can be used as the oxide 230a or the oxide 230b can be used. In particular, an In—Ga—Zn-based oxide with a metal atomic ratio of [In]:[Ga]:[Zn]=4:2:3 to 4.1 or in the neighborhood thereof, which has high conductivity, is preferably used. When such a conductor is provided over the insulator 250, oxygen can be inhibited from entering the conductor 260a, and an increase in electric resistance value of the conductor 260a due to oxidation can be prevented.

When the above conductive oxide is deposited by a sputtering method, oxygen can be added to the insulator 250, so that oxygen can be supplied to the oxide 230b. Thus, oxygen vacancies in the region 234 of the oxide 230 can be reduced.

Alternatively, the insulator 270 functioning as a barrier film may be placed over the conductor 260c. For the insulator 270, an insulating material that has a function of inhibiting passage of oxygen and impurities such as water and hydrogen is preferably used. For example, an insulator containing oxides of one or both of aluminum and hafnium can be used. Aluminum oxide, hafnium oxide, an oxide containing aluminum and hafnium (hafnium aluminate), or the like is preferably used for the insulator containing oxides of one or both of aluminum and hafnium. Thus, oxidation of the conductor 260 can be prevented. This can also prevent entry of impurities such as water and hydrogen into the oxide 230 through the conductor 260 and the insulator 250.

Furthermore, the insulator 271 functioning as a hard mask is preferably placed over the insulator 270. By provision of the insulator 270, in processing the conductor 260, the side surface of the conductor 260 can be substantially perpendicular, specifically, an angle formed by the side surface of the conductor 260 and a surface of the substrate can be greater than or equal to 75° and less than or equal to 100°, preferably greater than or equal to 80° and less than or equal to 95°. When the conductor is processed into such a shape, the insulator 272 that is subsequently formed can be formed into a desired shape.

The insulator 272 functioning as a barrier film is provided in contact with the side surfaces of the insulator 250, the conductor 260, and the insulator 270.

Here, for the insulator 272, an insulating material that has a function of inhibiting passage of oxygen and impurities such as water and hydrogen is preferably used. For example, an insulator containing oxides of one or both of aluminum and hafnium can be used. Aluminum oxide, hafnium oxide, an oxide containing aluminum and hafnium (hafnium aluminate), or the like is preferably used for the insulator containing oxides of one or both of aluminum and hafnium. In this manner, oxygen in the insulator 250 can be prevented from being diffused to the outside. In addition, impurities such as hydrogen and water can be inhibited from entering the oxide 230 from the end portion of the insulator 250 or the like.

By provision of the insulator 272, a top surface and the side surface of the conductor 260 and the side surface of the insulator 250 can be covered with the insulator having a function of inhibiting passage of oxygen and impurities such as water and hydrogen. This can prevent entry of impurities such as water and hydrogen into the oxide 230 through the conductor 260 and the insulator 250. Thus, the insulator 272 functions as a side barrier for protecting the side surfaces of the gate electrode and the gate insulating film.

In the case where the transistor is miniaturized and formed so that a channel length is approximately greater than or equal to 10 nm and less than or equal to 30 nm, impurity elements in the structure bodies provided in the vicinity of the transistor 200 might be diffused, and the region 231a and the region 231b, or the region 232a and the region 232b might be electrically connected to each other.

In view of the above, the insulator 272 is formed as described in this embodiment so that impurities such as hydrogen and water can be inhibited from entering the insulator 250 and the conductor 260, and oxygen in the insulator 250 can be prevented from being diffused to the outside. Accordingly, when a first gate voltage is 0 V, the source region and the drain region can be prevented from being electrically connected to each other directly or through the region 232 or the like.

The insulator 274 is provided to cover the insulator 271, the insulator 272, the oxide 230, the insulator 224, and the like.

Moreover, for the insulator 274, an insulating material having a function of inhibiting passage of oxygen and impurities such as water and hydrogen is preferably used. For example, for the insulator 274, silicon nitride, silicon nitride oxide, silicon oxynitride, aluminum nitride, or aluminum nitride oxide is preferably used. Alternatively, the insulating material may be stacked over aluminum oxide, hafnium oxide, or an oxide containing aluminum and hafnium (hafnium aluminate), so that the insulator 274 may be formed. When such an insulator 274 is formed, entry of oxygen through the insulator 274 and supply of oxygen to oxygen vacancies in the region 231a and the region 231b, which decrease the carrier density, can be prevented. Furthermore, it is possible to prevent impurities such as water and hydrogen from passing through the insulator 274 and the region 231a and the region 231b from excessively enlarging to the region 234 side.

Note that when the region 231 and the region 232 are formed by deposition of the insulator 274, the insulator 274 preferably contains an element that forms an oxygen vacancy in the oxide 230 or an element trapped by the oxygen vacancy in the oxide 230. Typical examples of the element are hydrogen, boron, carbon, nitrogen, fluorine, phosphorus, sulfur, chlorine, titanium, and a rare gas. Typical examples of the rare gas element are helium, neon, argon, krypton, and xenon. When an insulator containing such an element is used as the insulator 274, the element is added to the oxide 230, so that the region 231 and the region 232 can be formed in the oxide 230.

Alternatively, as the insulator 274, a film which extracts and absorbs oxygen in the region 231 and the region 232 may be used. When oxygen is extracted, oxygen vacancies are generated in the region 231 and the region 232. Hydrogen, boron, carbon, nitrogen, fluorine, phosphorus, sulfur, chlorine, titanium, a rare gas, or the like is trapped by oxygen vacancies, whereby the resistance of the region 231 and the region 232 is reduced.

In the case where the capacitor 100 is provided in the same layer as the transistor 200, a conductor 130 is provided to overlap with the region 231 of the oxide 230 that functions as one electrode of the capacitor with the insulator 274 interposed therebetween.

The insulator 280 functioning as an interlayer film is preferably provided over the insulator 274, or over the insulator 274 and the conductor 130 in the case where the conductor 130 is provided over the insulator 274. As in the insulator 224 or the like, the concentration of impurities such as water and hydrogen in the insulator 280 is preferably reduced. Note that the insulator 280 may have a stacked-layer structure of similar insulators.

Next, the conductor 252 (the conductor 252a, the conductor 252b, the conductor 252c, and the conductor 252d) electrically connected to the transistor 200 is provided. The conductor 252a electrically connected to the oxide 230 is placed in an opening formed in the insulator 280 and the insulator 274, the conductor 252b electrically connected to the conductor 130 is placed in the opening formed in the insulator 280, the conductor 252c electrically connected to the conductor 260 functioning as the first gate is placed in the opening formed in the insulator 280, the insulator 274, the insulator 271, and the insulator 270, and the conductor 252d electrically connected to the conductor 205 functioning as the second gate is placed in an opening formed in the insulator 280, the insulator 274, the insulator 224, the insulator 222, and the insulator 220. Note that in the case where the conductor 130 is not provided, the conductor 252b can be electrically connected to the oxide 230 through the opening formed in the insulator 280 and the insulator 274. Note that top surfaces of the conductor 252a, the conductor 252b, the conductor 252c, and the conductor 252d may be on the same plane as the top surface of the insulator 280.

The opening provided with the conductor 252b is preferably provided to overlap with at least part of the conductor 203 and at least part of the opening provided in the insulator 220, the insulator 222, the insulator 224, and the oxide 230a, in which case miniaturization and high integration of the semiconductor device can be achieved.

Note that the conductor 252 can be formed by a damascene method.

The conductor 252a is in contact with the region 231a functioning as one of a source region and a drain region of the transistor 200. In addition, the conductor 203 is in contact with the region 231b functioning as the other of the source region and the drain region of the transistor 200. Because the resistance of the region 231a and the region 231b is reduced, the contact resistance between the conductor 252a and the region 231a and the contact resistance between the conductor 203 and the region 231b are reduced, leading to a high on-state current of the transistor 200.

Here, the conductor 252a is in contact with at least the top surface of the oxide 230, preferably also in contact with the side surface of the oxide 230. It is particularly preferable that the conductor 252a be in contact with one or both of the side surface on the C side and the side surface on the D side, which intersect with the channel width direction of the oxide 230. Moreover, the conductor 252a may be in contact with the side surface on the A side, which intersects with the channel width direction of the oxide 230. When the conductor 252a is in contact with the side surface of the oxide 230 in addition to the top surface of the oxide 230 as described above, the contact area of the contact portion of the conductor 252a and the oxide 230 can be increased without an increase in the area of a top surface of the contact portion, so that the contact resistance between the conductor 252a and the oxide 230 can be reduced. Accordingly, miniaturization of the source electrode and the drain electrode of the transistor can be achieved and, in addition, the on-state current can be increased.

FIG. 1(D) illustrates a cross section of a connection portion between the conductor 203 and the oxide 230, and the capacitor 100. The conductor 130 is preferably wider in the E-F direction than the oxide 230. Accordingly, capacitance can be formed not only by the top surface of the oxide 230 and the conductor 130 but also by the side surface of the oxide 230 and the conductor 130, and thus capacitance can be increased.

The conductor 252 can be formed of a first conductor in contact with the inner wall of the opening and a second conductor provided on the inner side. Here, top surfaces of the first conductor and the second conductor can be substantially level with the top surface of the insulator 280. Note that although an example in which a two-layer conductor is used as the conductor 252 is described in this embodiment, the conductor is not limited thereto. The conductor 252 may be formed using a single layer or a stacked film of three or more layers.

Here, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (a conductive material through which the above impurities are less likely to pass) is preferably used for the first conductor used for the conductor 252. Moreover, it is preferable to use a conductive material having a function of inhibiting diffusion of oxygen (for example, at least one of oxygen atoms and oxygen molecules), that is, a conductive material through which the above oxygen is less likely to pass. Note that in this specification, a function of inhibiting diffusion of impurities or oxygen means a function of inhibiting diffusion of any one or all of the above impurities and the above oxygen. In this specification, a conductor having such a function is referred to as a conductive barrier film in some cases.

When the first conductor used for the conductor 252 has a function of inhibiting diffusion of oxygen, it is possible to prevent absorption of oxygen in the insulator 280 by the second conductor used for the conductor 252 and a decrease in the conductivity due to oxidation. For the conductive material having a function of inhibiting diffusion of oxygen, for example, titanium, titanium nitride, tantalum, tantalum nitride, ruthenium, or ruthenium oxide is preferably used. Thus, the first conductor used for the conductor 252 is a single layer or stacked layers of the above conductive materials. Furthermore, when the first conductor used for the conductor 252 has a function of preventing diffusion of impurities such as hydrogen, water, and nitrogen, entry of impurities such as hydrogen and water into the transistor 200 from above the insulator 280 through the conductor 252. In this embodiment, titanium nitride is used as the first conductor used for the conductor 252.

Moreover, for the second conductor used for the conductor 252, a conductive material containing tungsten, copper, or aluminum as its main component is preferably used. In this embodiment, tungsten is used for the second conductor used for the conductor 252.

An insulator having a function of inhibiting passage of impurities such as water and hydrogen may be provided in contact with the inner wall of the opening in the insulator 274 and the insulator 280 in which the conductor 252 is embedded. As such an insulator, an insulator which can be used as the insulator 270 or the insulator 272, such as aluminum oxide is preferably used, for example. Accordingly, impurities such as hydrogen and water can be inhibited from entering the oxide 230 through the conductor 252 from the insulator 280 or the like. Moreover, for example, the insulator can be deposited with good coverage by using an ALD method or a CVD method.

Furthermore, conductors 256 functioning as wirings may be placed in contact with the top surface of the conductor 252. A conductive material containing tungsten, copper, or aluminum as its main component is preferably used for the conductors 256 functioning as the wirings.

[Capacitor 100]

As illustrated in FIG. 1, the capacitor 100 shares some components with the transistor 200. This embodiment shows an example in which at least part of the region 231b provided in the oxide 230 of the transistor 200 functions as one electrode of the capacitor 100.

The capacitor 100 includes at least part of the region 231b of the oxide 230, the insulator 274 over the region 231, and the conductor 130 over the insulator 274. At least part of the conductor 130 is preferably placed over the insulator 274 to overlap with the region 231b.

At least the part of the region 231b of the oxide 230 functions as one electrode of the capacitor 100 and the conductor 130 functions as the other electrode of the capacitor 100. That is, the region 231b functions as one of the source and the drain of the transistor 200 and as one electrode of the capacitor 100. The insulator 274 functions as a dielectric of the capacitor 100.

The insulator 280 is preferably provided to cover the insulator 274 and the conductor 130.

For the conductor 130, a conductive material containing tungsten, copper, or aluminum as its main component is preferably used. Moreover, although not illustrated, the conductor 130 may have a stacked-layer structure, and for example, may be a stack of titanium, titanium nitride, and the above-described conductive material.

Furthermore, the conductor 252b is in contact with the conductor 130 which is one electrode of the capacitor 100. The conductor 252b can be formed at the same time as the conductor 252a, the conductor 252c, and the conductor 252d; thus, the process can be shortened.

<Material for Semiconductor Device>

Materials that can be used for a semiconductor device will be described below.

<<Substrate>>

Examples of a substrate over which the transistor 200 is formed include an insulator substrate, a semiconductor substrate, and a conductor substrate. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, and gallium oxide. Moreover, a semiconductor substrate in which an insulator region is provided in the above semiconductor substrate, for example, an SOI (Silicon On Insulator) substrate is given. Examples of the conductor substrate include a graphite substrate, a metal substrate, an alloy substrate, and a conductive resin substrate. In addition, a substrate including a metal nitride, a substrate including a metal oxide, or the like is given. Furthermore, a substrate which is an insulator substrate provided with a conductor or a semiconductor, a substrate which is a semiconductor substrate provided with a conductor or an insulator, a substrate which is a conductor substrate provided with a semiconductor or an insulator, or the like may be used. Alternatively, any of these substrates over which an element is provided may be used. Examples of the element provided over the substrate include a capacitor, a resistor, a switching element, a light-emitting element, and a memory element.

Alternatively, a flexible substrate may be used as the substrate. Note that as a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact or the like applied to the semiconductor device over the substrate due to dropping or the like can be reduced. That is, a durable semiconductor device can be provided.

For the substrate which is a flexible substrate, metal, an alloy, resin, glass, or fiber thereof can be used, for example. As the substrate, a sheet, a film, a foil, or the like containing a fiber may be used. The substrate which is a flexible substrate preferably has a lower coefficient of linear expansion because deformation due to an environment is inhibited. For the substrate which is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K is used. Examples of the resin include polyester, polyolefin, polyamide (nylon, aramid, or the like), polyimide, polycarbonate, and acrylic. In particular, aramid is favorably used for the flexible substrate because of its low coefficient of linear expansion.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

Here, when a high-k material having a high relative permittivity is used for the insulator functioning as the gate insulator, miniaturization and high integration of the transistor can be achieved. In contrast, when a material having a low relative permittivity is used for the insulator functioning as an interlayer film, the parasitic capacitance generated between the wirings can be reduced. Therefore, a material is preferably selected depending on the function of an insulator.

Moreover, examples of the insulator having a high relative permittivity include aluminum oxide, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Furthermore, examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In particular, silicon oxide and silicon oxynitride are thermally stable. Accordingly, a stacked-layer structure which is thermally stable and has a low relative permittivity can be obtained by combination with a resin, for example. Examples of the resin include polyester, polyolefin, polyamide (nylon, aramid, or the like), polyimide, polycarbonate, and acrylic. Furthermore, combination of silicon oxide or silicon oxynitride with an insulator with a high relative permittivity allows the stacked-layer structure to be thermally stable and have a high relative permittivity, for example.

In addition, when the transistor including an oxide semiconductor is surrounded by an insulator that has a function of inhibiting passage of oxygen and impurities such as hydrogen, the electrical characteristics of the transistor can be stabilized.

As the insulator that has a function of inhibiting passage of oxygen and impurities such as hydrogen, for example, a single layer or stacked layers of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide, silicon nitride oxide, silicon nitride, or the like can be used.

For example, an insulator that has a function of inhibiting passage of oxygen and impurities such as hydrogen is used as each of the insulator 222 and the insulator 210. Note that an insulator containing oxides of one or both of aluminum and hafnium can be used as the insulator 222 and the insulator 210. Aluminum oxide, hafnium oxide, an oxide containing aluminum and hafnium (hafnium aluminate), or the like is preferably used for the insulator containing oxides of one or both of aluminum and hafnium.

As the insulator 220, the insulator 224, the insulator 250, and the insulator 271, for example, a single layer or stacked layers of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, the insulators preferably contain silicon oxide, silicon oxynitride, or silicon nitride.

For example, when aluminum oxide, gallium oxide, hafnium aluminate, or hafnium oxide in each of the insulator 224 and the insulator 250 functioning as gate insulators, is in contact with the oxide 230, entry of silicon in silicon oxide or silicon oxynitride into the oxide 230 can be inhibited. In contrast, when silicon oxide or silicon oxynitride in each of the insulator 224 and the insulator 250 is in contact with the oxide 230, trap centers might be formed at the interface between aluminum oxide, gallium oxide, hafnium aluminate, or hafnium oxide and silicon oxide or silicon oxynitride. The trap centers can shift the threshold voltage of the transistor in the positive direction by trapping electrons in some cases.

For the insulator 274 functioning as a dielectric, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or hafnium aluminate is used, and the insulator is provided as stacked layers or a single layer. For example, a stacked-layer structure of a high-k material such as aluminum oxide and a material with high dielectric strength such as silicon oxynitride is preferably employed. With such a structure, the capacitor 100 can have sufficient capacitance owing to a high-k material and increased dielectric strength owing to a material with high dielectric strength; thus, the electrostatic breakdown of the capacitor 100 can be inhibited, which leads to improvement in the reliability of the capacitor 100.

The insulator 208, the insulator 212, the insulator 216, and the insulator 280 preferably include an insulator with a low relative permittivity. For example, the insulator 208, the insulator 212, the insulator 216, and the insulator 280 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. Alternatively, the insulator 208, the insulator 212, the insulator 216, and the insulator 280 preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride are thermally stable, combination of silicon oxide or silicon oxynitride with a resin allows the stacked-layer structure to be thermally stable and have a low relative permittivity. Examples of the resin include polyester, polyolefin, polyamide (nylon, aramid, or the like), polyimide, polycarbonate, and acrylic.

As the insulator 270 and the insulator 272, an insulator having a function of inhibiting passage of oxygen and impurities such as hydrogen is used. For the insulator 270 and the insulator 272, a metal oxide such as aluminum oxide, hafnium oxide, hafnium aluminate, magnesium oxide, gallium oxide, germanium oxide, yttrium oxide, zirconium oxide, lanthanum oxide, neodymium oxide, or tantalum oxide; silicon nitride oxide; or silicon nitride may be used, for example.

<<Conductor>>

For the conductors, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity typified by polycrystalline silicon containing an impurity element such as phosphorus, or silicide such as nickel silicide may be used.

Furthermore, a stack of a plurality of conductive layers formed with the above materials may be used. For example, a stacked-layer structure in which a material containing the above-described metal element and a conductive material containing oxygen are combined may be used. Alternatively, a stacked-layer structure in which a material containing the above-described metal element and a conductive material containing nitrogen are combined may be used. Alternatively, a stacked-layer structure in which a material containing the above-described metal element, a conductive material containing oxygen, and a conductive material containing nitrogen are combined may be used.

Note that when oxide is used for the channel formation region of the transistor, a stacked-layer structure in which a material containing the above-described metal element and a conductive material containing oxygen are combined is preferably used for the conductor functioning as the gate electrode. In this case, the conductive material containing oxygen is preferably formed on the channel formation region side. When the conductive material containing oxygen is provided on the channel formation region side, oxygen released from the conductive material is easily supplied to the channel formation region.

It is particularly preferable to use a conductive material containing oxygen and a metal element in the metal oxide in which a channel is formed for the conductor functioning as the gate electrode. Moreover, a conductive material containing the above-described metal element and nitrogen may be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. By using such a material, hydrogen in the metal oxide in which a channel is formed can be trapped in some cases. Alternatively, hydrogen entering from an external insulator or the like can be trapped in some cases.

For the conductor 260, the conductor 205, the conductor 203, the conductor 207, the conductor 209, the conductor 130, the conductor 252, and the conductor 256, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity typified by polycrystalline silicon containing an impurity element such as phosphorus, or silicide such as nickel silicide may be used.

<<Metal Oxide>>

As the oxide 230, a metal oxide functioning as an oxide semiconductor (hereinafter, also referred to as an oxide semiconductor) is preferably used. A metal oxide that can be used as the oxide 230 of the present invention will be described below.

An oxide semiconductor preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, an element M, and zinc is considered. Note that the element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that a plurality of elements described above may be combined as the element M.

Note that in this specification and the like, a metal oxide containing nitrogen is also called a metal oxide in some cases. Alternatively, a metal oxide containing nitrogen may be called a metal oxynitride.

Oxide semiconductors are classified into a single-crystal oxide semiconductor and a non-single-crystal oxide semiconductor. Examples of a non-single-crystal oxide semiconductor include a polycrystalline oxide semiconductor and an amorphous oxide semiconductor.

As an oxide semiconductor used for a semiconductor of a transistor, a thin film having high crystallinity is preferably used. With the thin film, the stability or the reliability of the transistor can be improved. Examples of the thin film include a thin film of a single-crystal oxide semiconductor and a thin film of a polycrystalline oxide semiconductor.

However, for forming the thin film of a single-crystal oxide semiconductor or the thin film of a polycrystalline oxide semiconductor over a substrate, high temperature or a laser heating process is needed. Thus, the manufacturing process cost is increased, and moreover, the throughput is decreased.

Non-Patent Document 1 and Non-Patent Document 2 have reported that, in 2009, an In—Ga—Zn oxide having a CAAC structure (referred to as CAAC-IGZO) was found. Here, it has been reported that CAAC-IGZO has c-axis alignment, a grain boundary is not clearly observed, and CAAC-IGZO can be formed over a substrate at low temperatures. It has also been reported that a transistor including CAAC-IGZO has excellent electrical characteristics and reliability.

In addition, in 2013, an In—Ga—Zn oxide having an nc structure (referred to as nc-IGZO) was found (see Non-Patent Document 3). Here, it has been reported that nc-IGZO has periodic atomic arrangement in a microscopic region (for example, a region with a size greater than or equal to 1 nm and less than or equal to 3 nm) and no regularity of crystal orientation is observed between different regions.

Non-Patent Document 4 and Non-Patent Document 5 have shown a change in average crystal size due to irradiation of thin films of the above-described CAAC-IGZO with an electron beam, nc-IGZO, and IGZO having low crystallinity. In the thin film of IGZO having low crystallinity, crystalline IGZO with a thickness of approximately 1 nm was observed even before the electron beam irradiation. Thus, here, it has been reported that in IGZO, a completely amorphous structure could not be observed. In addition, it has been shown that the thin film of CAAC-IGZO and the thin film of nc-IGZO each have higher stability against electron beam irradiation than the thin film of IGZO having low crystallinity. Thus, as the semiconductor of the transistor, the thin film of CAAC-IGZO or the thin film of nc-IGZO is preferably used.

Non-Patent Document 6 discloses that a transistor including an oxide semiconductor has an extremely low leakage current in a non-conduction state; specifically, the off-state current per micrometer of the channel width of the transistor is in the order of yA/μm ($10^{-24}$ A/μm). For example, a CPU with low-power consumption utilizing a characteristic of low leakage current of the transistor including an oxide semiconductor has been disclosed (see Non-Patent Document 7).

Furthermore, the use of the transistor for the display device which utilizes a characteristic of low leakage current of the transistor including an oxide semiconductor has been reported (see Non-Patent Document 8). In the display device, a displayed image is changed several tens of times per second. The number of times an image is changed per second is called a refresh rate. The refresh rate is also referred to as driving frequency. Such high-speed screen switching that is hard for human eyes to recognize is considered as a cause of eye strain. Thus, it has been proposed that the refresh rate of a display device is lowered to reduce the number of image rewriting operations. Moreover, driving with a lowered refresh rate enables the power consumption of the display device to be reduced. Here, such a driving method is referred to as idling stop (IDS) driving.

The discovery of the CAAC structure and the nc structure has contributed to an improvement in electrical characteristics and reliability of the transistor including an oxide semiconductor having the CAAC structure or the nc structure, a reduction in manufacturing process cost, and an improvement in throughput. Furthermore, studies of applications of the transistor to the display device and LSI utilizing a characteristic of low leakage current of the transistor have been developed.

[Composition of Metal Oxide]

Described below is the composition of a CAC (Cloud-Aligned Composite)-OS applicable to a transistor disclosed in one embodiment of the present invention.

Note that in this specification and the like, CAAC (c-axis aligned crystal) and CAC (Cloud-Aligned Composite) might be stated. Note that CAAC refers to an example of a crystal structure, and CAC refers to an example of a function or a material composition.

A CAC-OS or a CAC-metal oxide has a conducting function in a part of the material and has an insulating function in another part of the material, and has a function of a semiconductor as the whole material. Note that in the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC-metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

Moreover, the CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current drive capability in the on state of the transistor, that is, a high on-state current and high field-effect mobility, can be obtained.

In other words, the CAC-OS or the CAC-metal oxide can also be called a matrix composite or a metal matrix composite.

[Structure of Metal Oxide]

Oxide semiconductors are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the plurality of nanocrystals are connected.

The nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear crystal grain boundary (also referred to as a grain boundary) cannot be observed even in the vicinity of distortion in the CAAC-OS. That is, formation of a crystal grain boundary is inhibited by the distortion of a lattice arrangement. This is probably because the CAAC-OS can tolerate distortion owing to a low density of oxygen atom arrangement in the a-b plane direction, a change in interatomic bond distance by substitution of a metal element, and the like.

In addition, the CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be represented as an (In, M, Zn) layer. When indium of the In layer is replaced by the element M, the layer can also be represented as an (In, M) layer.

The CAAC-OS is an oxide semiconductor having high crystallinity. In contrast, it can be said that in the CAAC-OS, a reduction in electron mobility due to the crystal grain boundary is less likely to occur because a clear crystal grain boundary cannot be observed. Since the crystallinity of an oxide semiconductor might be decreased due to entry of impurities, formation of defects, or the like, it can be said that the CAAC-OS is an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor depending on an analysis method.

The a-like OS is an oxide semiconductor that has a structure intermediate between those of the nc-OS and the amorphous oxide semiconductor. The a-like OS has a void or a low-density region. That is, the a-like OS has low crystallinity as compared with the nc-OS and the CAAC-OS.

Oxide semiconductors have various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

[Transistor including Oxide Semiconductor]

Next, the case where the oxide semiconductor is used for a transistor will be described.

Note that when the oxide semiconductor is used for a transistor, the transistor can have high field-effect mobility. In addition, a transistor with high reliability can be achieved.

Moreover, an oxide semiconductor with low carrier density is preferably used for the transistor. In the case where the carrier density of an oxide semiconductor film is reduced, the concentration of impurities in the oxide semiconductor film is reduced so that the density of defect states is reduced. In this specification and the like, a state with a low impurity concentration and a low density of defect states is referred to as a highly purified intrinsic or substantially highly purified intrinsic. The oxide semiconductor has, for example, a carrier density lower than $8 \times 10^{11}/cm^3$, preferably lower than $1 \times 10^{11}/cm^3$, and further preferably lower than $1 \times 10^{10}/cm^3$, and higher than or equal to $1 \times 10^{-9}/cm^3$.

Furthermore, a highly purified intrinsic or substantially highly purified intrinsic oxide semiconductor film has a low density of defect states and accordingly has a low density of trap states in some cases.

In addition, charges trapped by the trap states in the oxide semiconductor take a long time to disappear and may behave like fixed charges. Thus, a transistor whose channel is formed in the oxide semiconductor having a high density of trap states has unstable electrical characteristics in some cases.

Thus, in order to stabilize electrical characteristics of the transistor, it is effective to reduce the concentration of impurities in the oxide semiconductor. In addition, in order to reduce the concentration of impurities in the oxide semiconductor, the concentration of impurities in an adjacent film is also preferably reduced. Examples of the impurities include hydrogen, nitrogen, alkali metal, alkaline earth metal, iron, nickel, and silicon.

[Impurity]

Here, the influence of impurities in the oxide semiconductor will be described.

When silicon or carbon that is one of Group 14 elements is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) is set to be lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated, in some cases. Thus, a transistor including an oxide semiconductor that contains an alkali metal or an alkaline earth metal is likely to have normally-on characteristics. Therefore, it is preferable to reduce the concentration of an alkali metal or an alkaline earth metal in the oxide semiconductor. Specifically, the concentration of alkali metal or alkaline earth metal in the oxide semiconductor, which is measured by SIMS, is lower than or equal to $1 \times 10^{18}$ atoms/cm$^3$, preferably lower than or equal to $2 \times 10^{16}$ atoms/cm$^3$.

Furthermore, when the oxide semiconductor contains nitrogen, the oxide semiconductor easily becomes n-type by generation of electrons serving as carriers and an increase in carrier density. As a result, a transistor including an oxide semiconductor that contains nitrogen as a semiconductor is likely to have normally-on characteristics. For this reason, nitrogen in the oxide semiconductor is preferably reduced as much as possible. For example, the concentration of nitrogen in the oxide semiconductor measured by SIMS is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Accordingly, a transistor including an oxide semiconductor that contains hydrogen is likely to have normally-on characteristics. For this reason, hydrogen in the oxide semiconductor is preferably reduced as much as possible. Specifically, the hydrogen concentration of the oxide semiconductor measured by SIMS is lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide semiconductor with sufficiently reduced impurities is used for a channel formation region of a transistor, the transistor can have stable electrical characteristics.

Structure Example 2 of Semiconductor Device

An example of a semiconductor device of one embodiment of the present invention is described below with reference to FIG. 4.

FIG. 4(A) is a top view of a transistor 201. Furthermore, FIGS. 4(B), 4(C), and 4(D) are cross-sectional views of the transistor 201. Here, FIG. 4(B) is a cross-sectional view of a portion denoted by dashed-dotted line A-B in FIG. 4(A), and is also a cross-sectional view of the transistor 200 in the channel length direction. FIG. 4(C) is a cross-sectional view of a portion denoted by dashed-dotted line C-D in FIG. 4(A), and is also a cross-sectional view of the transistor 200 in the channel width direction. FIG. 4(D) is a cross-sectional view of a portion denoted by dashed-dotted line E-F in FIG. 4(A), and is also a cross-sectional view illustrating a connection portion between the oxide 230 and the conductor 203 and a connection portion between the conductor 252b and the oxide 230. For simplification of the drawing, some components are omitted in the top view in FIG. 4(A).

Note that in the semiconductor device illustrated in FIG. 4, components having the same functions as the components included in the semiconductor device described in <Structure example 1 of semiconductor device> are denoted by the same reference numerals.

A structure of the transistor 201 will be described with reference to FIG. 4 below. Note that also in this section, the materials described in detail in <Structure example 1 of semiconductor device> can be used as materials of the transistor 201.

In the transistor 201, a conductor 285 functioning as a source electrode or a drain electrode is provided over the oxide 230b. An insulator 286 is provided over the conductor 285. For the conductor 285, a material similar to that for the conductor 203, the conductor 205, or the conductor 260 can be used. It is particularly preferable to use tantalum nitride or tungsten for the conductor 285. For the insulator 286, a material similar to that for the insulator 270 or the insulator 272 can be used. By provision of the insulator 286, oxidation of the conductor 285 can be inhibited, and an increase in the electrical resistance of the conductor 285 can be inhibited. In particular, aluminum oxide is preferably used for the insulator 286. In addition, although the channel length of the transistor 201 is determined depending on the length between the conductors 285, a problem in that the channel length of the transistor 201 becomes unintentionally long might be caused due to oxidation of end portions of the conductors 285 facing each other. The insulator 286 is preferably provided in order to prevent such a defect.

As illustrated in FIG. 4(B), a region of the oxide 230b that is in contact with the conductor 285 and indicated by a dotted line becomes an n-type low-resistance region. This is probably because the conductor 285 extracts oxygen in the oxide 230b and generates an oxygen vacancy in the oxide 230b. Impurities existing inside or outside the oxide 230b are trapped by the oxygen vacancy in the oxide 230b, and the resistance of the region is reduced.

The low-resistance region of the oxide 230b is electrically connected to the conductor 203 through the opening provided in the insulator 220, the insulator 222, the insulator 224, and the oxide 230a.

The oxide 230c, an oxide 230d, the insulator 250, the conductor 260, and the insulator 270 are provided to cover part of the oxide 230b, part of the conductor 285, and part of the insulator 286. Note that the width in the A-B direction and the length in the C-D direction of the conductor 260 are less than those of the oxide 230c, the oxide 230d, the insulator 250, and the insulator 270 as illustrated in FIG. 4(A), FIG. 4(B), and FIG. 4(C). Thus, the insulator 270 covers the top surface and the side surface of the insulator 250 and is in contact with the insulator 250 outside the conductor 260. Since a material that inhibits passage of oxygen is used for the insulator 270, oxidation of the conductor 260 is inhibited owing to the insulator 270 provided in such a manner, so that an increase in the electrical resistance can be inhibited.

A material similar to that for the oxide 230b can be used for the oxide 230c. A material similar to that for the oxide 230c can be used for the oxide 230d. Note that the oxide 230c is not necessarily formed.

In the transistor 201, a channel is formed in a region interposed between the pair of conductors 285 or the pair of low-resistance regions of the oxide 230b and the oxide 230c.

An insulator 287 and an insulator 288 are formed over the insulator 280. For the insulator 287, an oxide insulator that is deposited by a sputtering method is preferably used, and for example, aluminum oxide, hafnium oxide, or hafnium aluminate is preferably used. With such an insulator 287, oxygen can be added to the insulator 280 through a surface of the insulator 280 that is in contact with the insulator 287, so that the insulator 280 can be in an oxygen excess state. Oxygen that has been supplied to the insulator 280 is supplied to the oxide 230.

Furthermore, when an insulating material that is less likely to pass oxygen, such as aluminum oxide, hafnium oxide, or hafnium aluminate is used for the insulator 287, oxygen added to the insulator 224 and the insulator 280 can be inhibited from being diffused upward during the deposition. Accordingly, oxygen can be added to the insulator 280 further efficiently.

A material similar to that for the insulator 208, the insulator 216, and the insulator 280 can be used for the insulator 288.

As illustrated in FIG. 4(B), FIG. 4(C), and FIG. 4(D), an opening is provided in insulators such as the insulator 280, the insulator 287, and the insulator 288, and the conductor 252 (the conductor 252a, the conductor 252b, the conductor 252c, and the conductor 252d) is provided in the opening. An insulator 289 is provided between the conductor 252 and the insulators such as the insulator 280, the insulator 287, and the insulator 288. A material similar to that for the insulator 270 can be used for the insulator 289, whereby entry of impurities from the insulator 280 and an insulator or a conductor thereover to the oxide 230 is inhibited.

Here, it is preferable that the conductor 252a be electrically connected to the oxide 230 by being not only in contact with the conductor 285 over the oxide 230 but also in contact with the side surface of the oxide 230. It is particularly preferable that the conductor 252a be in contact with one or both of the side surface on the C side and the side surface on the D side, which intersect with the channel width direction of the oxide 230. Moreover, the conductor 252a may be in contact with the side surface on the A side, which intersects with the channel length direction of the oxide 230. When the conductor 252a is in contact with the side surface of the oxide 230 in addition to the conductor 285 as described above, the contact area of the contact portion of the conductor 252a and the oxide 230 can be increased without an increase in the area of the top surface of the contact portion, so that the contact resistance between the conductor 252a and the oxide 230 can be reduced. Accordingly, miniaturization of the source electrode and the drain electrode of the transistor can be achieved and, in addition, the on-state current can be increased.

FIG. 4(D) illustrates a cross section of a connection portion between the oxide 230 and the conductor 203 and a connection portion between the conductor 252b and the oxide 230. The oxide 230b is electrically connected to the conductor 203 through the opening provided in the insulator 220, the insulator 222, the insulator 224, and the oxide 230a. Note that like the above-described conductor 252a, the conductor 252b may be in contact with not only a top surface of the conductor 285 but also the side surface of the oxide 230.

As illustrated in FIG. 4(A) and FIG. 4(D), in order to cover the opening formed in the insulator 220, the insulator 222, the insulator 224, and the oxide 230a, the oxide 230a and the oxide 230b are each preferably formed to have a wider width in the E-F direction than the opening in the region overlapping with the opening. Therefore, the widths of the oxide 230a and the oxide 230b in the E-F direction in that region may be wider than the widths of the oxide 230a and the oxide 230b in the C-D direction in a region where a channel is formed or a region on the A side. With such a structure, contact between the oxide 230b and the conductor 203 can be assured.

<Method for Manufacturing Transistor>

Next, a method for manufacturing a semiconductor device including the transistor 200 of the present invention will be described with reference to FIG. 5 to FIG. 22. In FIG. 5 to FIG. 22, (A) of each drawing is a top view. Moreover, (B) of each drawing is a cross-sectional view corresponding to a portion denoted by dashed-dotted line A-B in (A). Furthermore, (C) of each drawing is a cross-sectional view corresponding to a portion denoted by dashed-dotted line C-D in (A). Furthermore, (D) of each drawing is a cross-sectional view corresponding to a portion denoted by dashed-dotted line E-F in (A).

First, a substrate (not illustrated) is prepared, and the insulator 208 is deposited over the substrate. The insulator 208 can be deposited by a sputtering method, a chemical vapor deposition (CVD) method, a molecular beam epitaxy (MBE) method, a pulsed laser deposition (PLD) method, an ALD (Atomic Layer Deposition) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

The PECVD method is a deposition method that can provide a high-quality film at a relatively low temperature. Furthermore, a thermal CVD method does not use plasma and thus can reduce plasma damage to an object. For example, a wiring, an electrode, or an element (a transistor, a capacitor, or the like) included in a semiconductor device might be charged up by receiving charges from plasma. In that case, accumulated charges might break the wiring, electrode, element, or the like included in the semiconductor device. In contrast, in the case of a thermal CVD method not using plasma, such plasma damage is not caused and the yield of the semiconductor device can be increased. A thermal CVD method does not cause plasma damage during deposition, so that a film with few defects can be obtained.

An ALD method is also a deposition method that can reduce plasma damage to an object. Also an ALD method does not cause plasma damage during deposition, so that a film with few defects can be obtained.

Unlike a deposition method in which particles ejected from a target or the like are deposited, a CVD method and an ALD method are deposition methods in which a film is formed by reaction at a surface of an object. Thus, a CVD method and an ALD method are deposition methods which are less likely to be influenced by the shape of an object and enable favorable step coverage. In particular, an ALD method enables excellent step coverage and excellent thickness uniformity and can be favorably used for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

By a CVD method or an ALD method, composition of a film to be obtained can be controlled with a flow rate ratio of the source gases. For example, by a CVD method or an ALD method, a film with a certain composition can be deposited depending on a flow rate ratio of the source gases. Moreover, in a CVD method or an ALD method, by changing the flow rate ratio of the source gases while depositing the film, a film whose composition is continuously changed can be deposited, for example. In the case where the film is deposited while changing the flow rate ratio of the source gases, as compared to the case where the film is deposited using a plurality of deposition chambers, time taken for the deposition can be shortened because time taken for transfer and pressure adjustment is omitted. Thus, the productivity of semiconductor devices can be improved in some cases.

In this embodiment, as the insulator 208, silicon oxide is deposited by a CVD method.

Next, the insulator 210 is formed over the insulator 208. In this embodiment, aluminum oxide is deposited as the insulator 210 by a sputtering method. The insulator 210 may have a multilayer structure. For example, aluminum oxide may be deposited by a sputtering method and aluminum oxide may be deposited over the aluminum oxide by an ALD method. Alternatively, aluminum oxide may be deposited by an ALD method and aluminum oxide may be deposited over the aluminum oxide by a sputtering method.

Next, a conductive film 203A and a conductive film 203B are sequentially deposited over the insulator 210. The conductive film 203A and the conductive film 203B can be formed by a sputtering method, a CVD method, an MBE method, a PLD method, an ALD method, or the like. In this embodiment, tungsten is deposited by a sputtering method as the conductive film 203A and titanium nitride is deposited by a sputtering method as the conductive film 203B. Note that as the conductive film 203A, a conductor such as aluminum or copper can be used as well as tungsten. A material that has a higher oxidation resistance (that is less likely to be oxidized) than the conductive film 203A is preferably used for the conductive film 203B, and a metal nitride can be used, for example. As the metal nitride, tantalum nitride or the like can be used as well as titanium nitride.

Next, masks 262 are formed over the conductive film 203B by a lithography method (see FIG. 5).

Note that in the lithography method, first, a resist is exposed to light through a mask. Next, a region exposed to light is removed or left using a developing solution, so that a resist mask is formed. Then, etching treatment is performed through the resist mask, whereby a conductor, a semiconductor, an insulator, or the like can be processed into a desired shape. The resist mask is formed by, for example, exposure of the resist to light using KrF excimer laser light, ArF excimer laser light, or EUV (Extreme Ultraviolet) light. Alternatively, a liquid immersion technique may be employed in which a portion between a substrate and a projection lens is filled with liquid (for example, water) to perform light exposure. An electron beam or an ion beam may be used instead of the above-described light. Note that a mask is not necessary in the case of using an electron beam or an ion beam. To remove the resist mask, dry etching treatment such as ashing or wet etching treatment can be performed, wet etching treatment can be performed after dry etching treatment, or dry etching treatment can be performed after wet etching treatment.

A hard mask formed of an insulator or a conductor may be used instead of the resist mask. In the case where a hard mask is used, a hard mask with a desired shape can be formed by forming an insulating film or a conductive film to be the material of the hard mask over the conductive film 203B, forming a resist mask thereover, and then etching the material of the hard mask.

Then, the conductive film 203A and the conductive film 203B are processed using the masks 262 to form the conductor 203 including the conductor 203a and the conductor 203b over the conductor 203a, and the conductor 205 including the conductor 205a and the conductor 205b over the conductor 205a (see FIG. 6).

For the processing, a dry etching method or a wet etching method can be employed. A processing employing a dry etching method is suitable for microfabrication.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure in which different high-frequency powers are applied to one of the parallel plate type electrodes may be employed. Alternatively, a structure in which high-frequency powers with the same frequency are applied to the parallel plate type electrodes may be employed. Alternatively, a structure in which high-frequency powers with different frequencies are applied to the parallel plate type electrodes may be employed. Alternatively, a dry etching apparatus including a high-density plasma source can be used. As the dry etching apparatus including a high-density plasma source, an inductively coupled plasma (ICP) etching apparatus can be used, for example.

In the case where a hard mask is used for etching of the conductive film 203A and the conductive film 203B, the etching treatment may be performed after the resist mask used for formation of the hard mask is removed or may be performed while the resist mask remains. In the latter case, the resist mask is removed during the etching in some cases. The hard mask may be removed by etching after the etching of the conductive film. In contrast, the hard mask does not need to be removed in the case where the hard mask material does not affect the following process or can be utilized in the following process.

Next, an insulating film 216A is formed over the insulator 210, the conductor 203, and the conductor 205 (see FIG. 7). The insulating film 216A can be formed by a sputtering method, a CVD method, an MBE method, a PLD method, an ALD method, or the like. In this embodiment, as the insulating film 216A, silicon oxide is formed by a CVD method.

Next, part of the insulating film 216A is removed by CMP treatment, so that the conductor 203 and the conductor 205 are exposed. As a result, the insulator 216 remains between the conductor 203 and the conductor 205 and around these conductors. In this way, the insulator 216, the conductor 203, and the conductor 205 with flat top surfaces can be formed (see FIG. 8). Note that by the CMP treatment, the conductor 203b and the conductor 205b are partly removed in some cases.

Next, the insulator 220 is deposited over the insulator 216, the conductor 203, and the conductor 205. The insulator 220 can be deposited by a sputtering method, a CVD method, an MBE method, a PLD method, an ALD method, or the like.

Then, the insulator 222 is deposited over the insulator 220. The insulator 222 can be deposited by a sputtering method, a CVD method, an MBE method, a PLD method, an ALD method, or the like.

In particular, an insulator containing oxides of one or both of aluminum and hafnium is preferably used as the insulator 222. Aluminum oxide, hafnium oxide, an oxide containing aluminum and hafnium (hafnium aluminate), or the like is preferably used for the insulator containing oxides of one or both of aluminum and hafnium. The insulator 222 is preferably formed by an ALD method. The insulator 222 deposited by an ALD method has a barrier property against oxygen, hydrogen, and water. When the insulator 222 has a barrier property against hydrogen and water, hydrogen and water in structure bodies provided around the transistor 200 are not diffused into the transistor 200, and generation of oxygen vacancies in the oxide 230 can be inhibited.

Then, the insulator 224 is deposited over the insulator 222. The insulator 224 can be deposited by a sputtering method, a CVD method, an MBE method, a PLD method, an ALD method, or the like (see FIG. 9).

Subsequently, heat treatment is preferably performed. The heat treatment is performed at a temperature higher than or equal to 250° C. and lower than or equal to 650° C., preferably higher than or equal to 300° C. and lower than or equal to 500° C., and further preferably higher than or equal to 320° C. and lower than or equal to 450° C. The first heat treatment is performed in a nitrogen atmosphere, an inert gas atmosphere, or an atmosphere containing an oxidizing gas at 10 ppm or more, 1% or more, or 10% or more. The first heat treatment may be performed under a reduced pressure. Alternatively, the first heat treatment may be performed by performing heat treatment in a nitrogen atmosphere or an inert gas atmosphere, and then performing heat treatment in an atmosphere containing an oxidizing gas at 10 ppm or more, 1% or more, or 10% or more in order to compensate for released oxygen.

By the above heat treatment, impurities such as hydrogen and water in the insulator 224 can be removed, for example.

Alternatively, as the heat treatment, plasma treatment using oxygen may be performed under a reduced pressure. For the plasma treatment using oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be generated, and application of the RF to the substrate side allows oxygen radicals generated by the high-density plasma to be efficiently introduced into the insulator 224. Alternatively, after plasma treatment using an inert gas is performed with this apparatus, plasma treatment using oxygen may be performed to compensate for released oxygen. Note that first heat treatment is not necessarily performed in some cases.

This heat treatment can also be performed after deposition of the insulator 220 and after deposition of the insulator 222. Although the heat treatment can be performed under the above-described heat treatment conditions, heat treatment after deposition of the insulator 220 is preferably performed in an atmosphere containing nitrogen.

In this embodiment, as the heat treatment, treatment is performed in a nitrogen atmosphere at 400° C. for one hour after deposition of the insulator 224.

Next, an oxide film 230A to be the oxide 230a is formed over the insulator 224.

The oxide film 230A can be formed by a sputtering method, a CVD method, an MBE method, a PLD method, an ALD method, or the like.

In the case where the oxide film 230A is formed by a sputtering method, for example, oxygen or a mixed gas of oxygen and a rare gas is used as a sputtering gas. By increasing the proportion of oxygen in the sputtering gas, the amount of excess oxygen in the oxide film to be deposited can be increased. In the case where the oxide film is formed by a sputtering method, the above-described In-M-Zn oxide target can be used.

In particular, part of oxygen in the sputtering gas is supplied to the insulator 224 in some cases, at the formation of the oxide film 230A. Note that the proportion of oxygen in the sputtering gas for the oxide film 230A is higher than or equal to 70%, preferably higher than or equal to 80%, and further preferably 100%.

In this embodiment, the oxide film 230A is formed using a target of In:Ga:Zn=1:3:4 [atomic ratio] by a sputtering method. Note that the oxide film is preferably formed by appropriate selection of deposition conditions and an atomic ratio to have characteristics required for the oxide 230.

Next, an opening reaching the conductor 203 is formed in the insulator 220, the insulator 222, the insulator 224, and the oxide film 230A by a lithography method. First, a mask 263 is formed over the oxide film 230A (see FIG. 9). The mask 263 used for forming the opening may be a resist mask or a hard mask.

Next, the insulator 220, the insulator 222, the insulator 224, and the oxide film 230A are processed using the mask 263 to expose the surface of the conductor 203, so that the opening is formed (see FIG. 10). For the processing, a dry etching method or a wet etching method can be used. A dry etching method is suitable for microfabrication. Note that the insulator 220, the insulator 222, and the insulator 224 are processed through the oxide film 230A. Specifically, when the surface of the conductor 203 is partly exposed, a mask formed of a resist mask, a hard mask, or the like is formed over the oxide film 230A, and then the insulator 220, the insulator 222, the insulator 224, and the oxide film 230A are processed. In other words, the mask is not formed on a surface of the insulator (the insulator 220, the insulator 222, and the insulator 224) functioning as the gate insulating film. Therefore, the mask is not attached to the surface of the insulator functioning as the gate insulating film; thus, the gate insulating film can be prevented from being contaminated and damaged by an impurity in the resist mask and the like, a component in the hard mask, and components in plasma and a chemical solution used for removal of the mask. Through such a process, a method for manufacturing a highly reliable semiconductor device can be provided.

Next, an oxide film 230B is formed over the oxide film 230A (see FIG. 11). At this time, the oxide film 230B is also formed in the opening and electrically connected to the conductor 203 through the opening. When the oxide 230b is connected to the conductor 203 without through the oxide 230a, the series resistance and the contact resistance can be reduced. With such a structure, a semiconductor device with favorable electrical characteristics can be obtained. More specifically, a transistor with an increased on-state current and a semiconductor device including the transistor can be obtained.

The oxide film 230B can be formed by a sputtering method, a CVD method, an MBE method, a PLD method, an ALD method, or the like.

In the case where the oxide film 230B is formed by a sputtering method, for example, oxygen or a mixed gas of oxygen and a rare gas is used as a sputtering gas. By increasing the proportion of oxygen in the sputtering gas, the amount of excess oxygen in the oxide film to be deposited can be increased. In the case where the oxide film is formed by a sputtering method, the above-described In-M-Zn oxide target can be used.

In the case where the oxide film 230B is formed by a sputtering method and the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have relatively high field-effect mobility.

In this embodiment, the oxide film 230B is deposited using a target of In:Ga:Zn=4:2:4.1 [atomic ratio] by a sputtering method. Note that the oxide film is preferably formed by appropriate selection of deposition conditions and an atomic ratio to have characteristics required for the oxide 230.

Next, heat treatment may be performed. For the heat treatment, the above-described heat treatment conditions can be used. By the heat treatment, impurities such as water and hydrogen in the oxide film 230A and the oxide film 230B can be removed, for example. In this embodiment, treatment is performed in a nitrogen atmosphere at 400° C. for one hour, and treatment is successively performed in an oxygen atmosphere at 400° C. for one hour.

Then, the oxide film 230A and the oxide film 230B are processed into island shapes to form the oxide 230a and the oxide 230b (see FIG. 12).

Figure 12C:
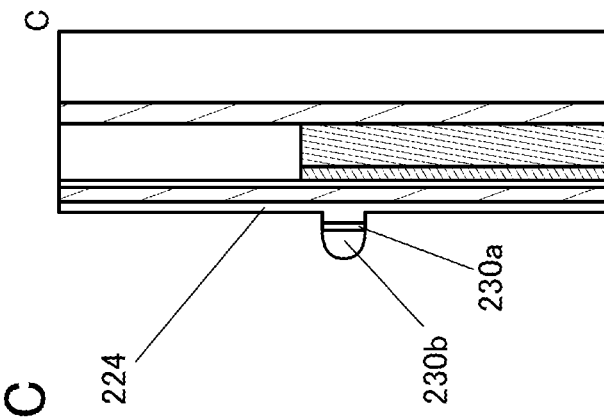
FIGS. 12A-12D A top view and cross-sectional views illustrating a method for manufacturing a semiconductor device of one embodiment of the present invention.
Figure 12D:
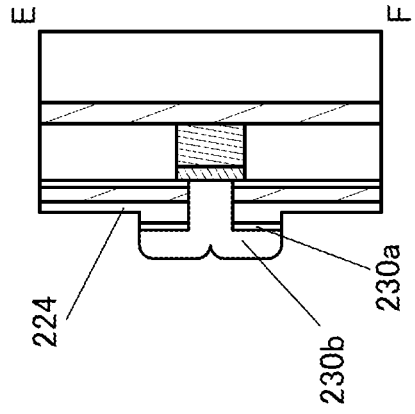
Figure 12A:
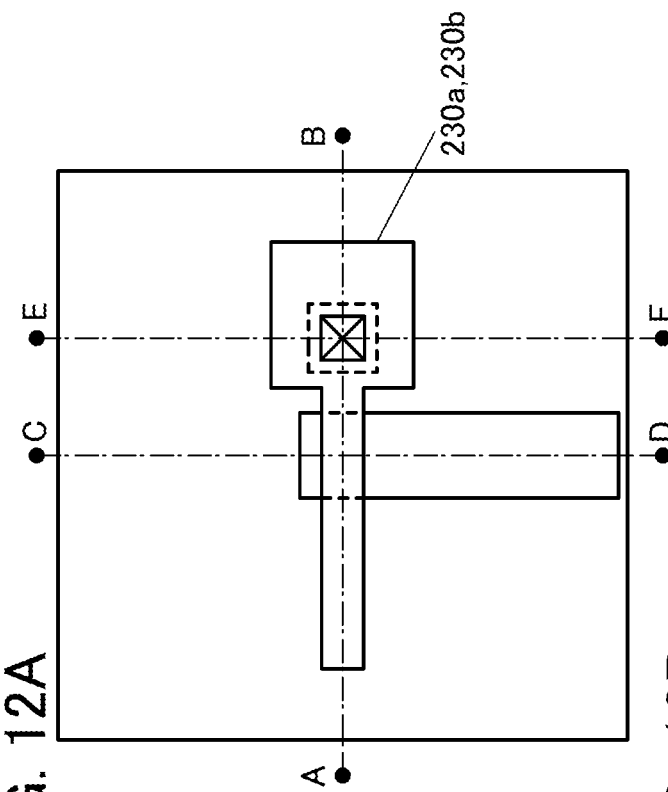
Figure 12B:
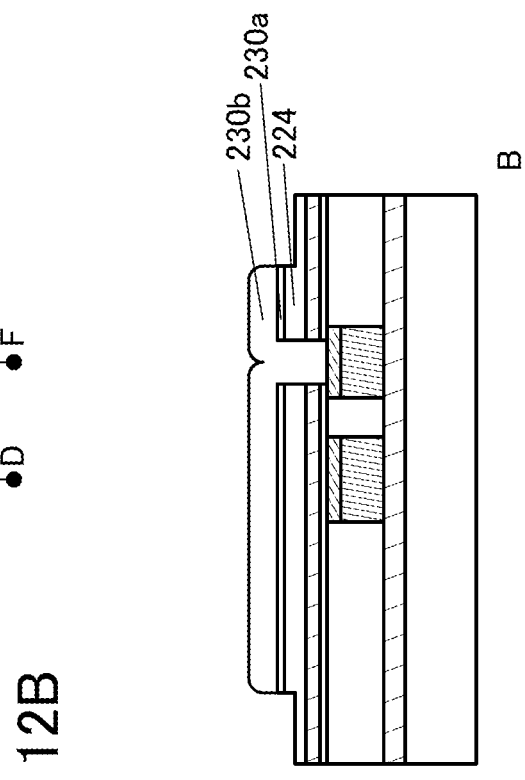
Figure 13C:
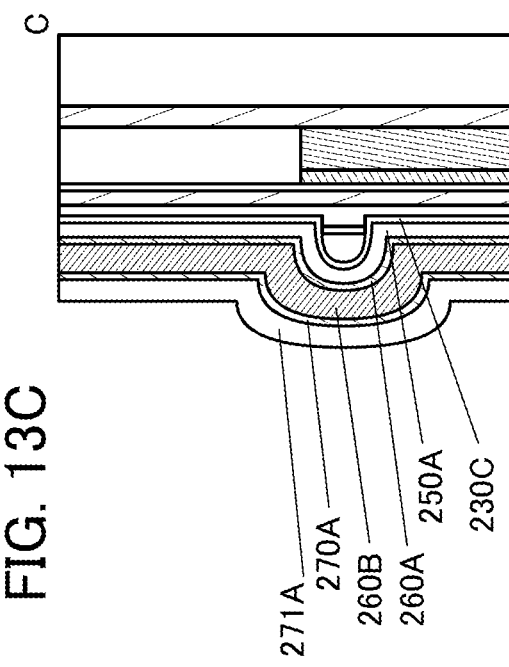
FIGS. 13A-13D A top view and cross-sectional views illustrating a method for manufacturing a semiconductor device of one embodiment of the present invention.
Figure 13D:
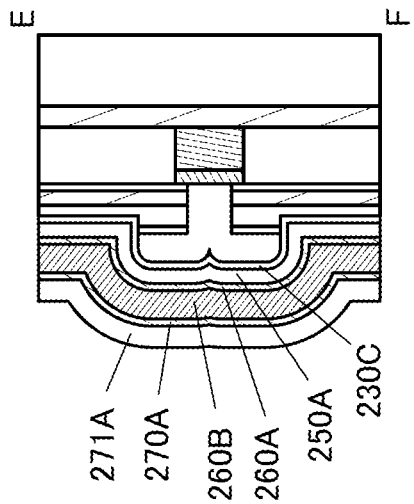
Figure 13A:
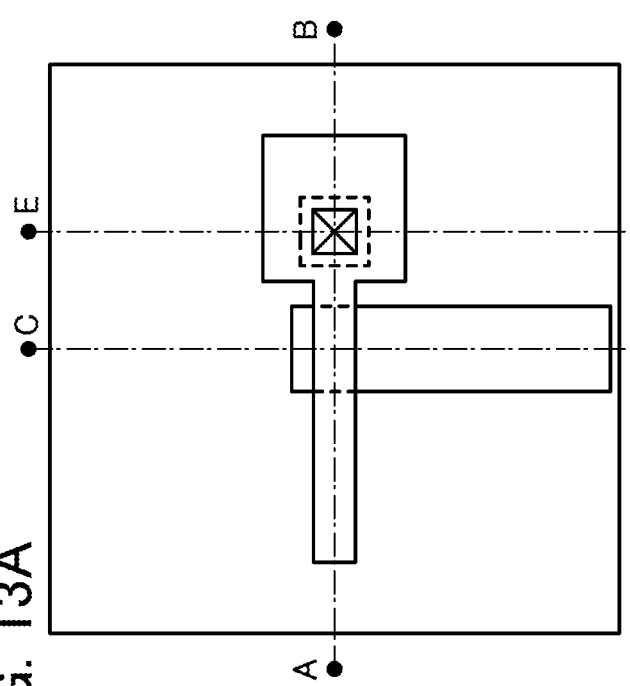
Figure 13B:
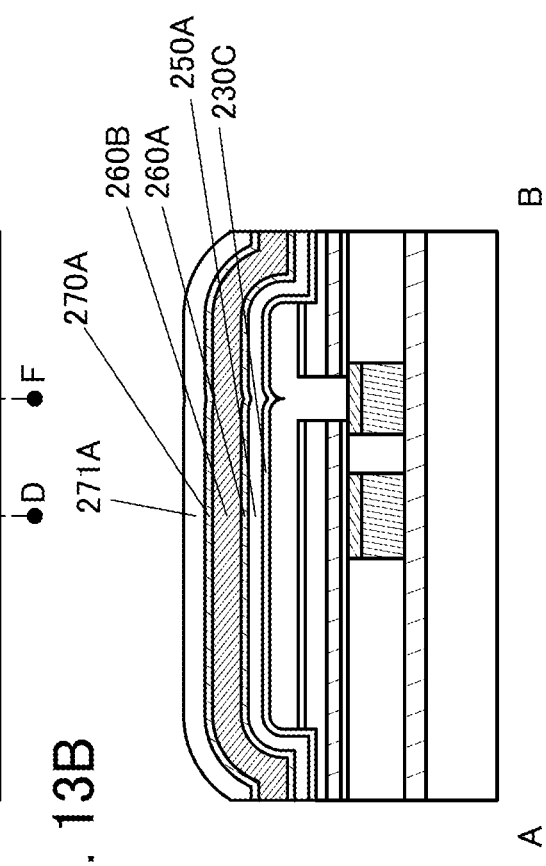
Figure 14A:
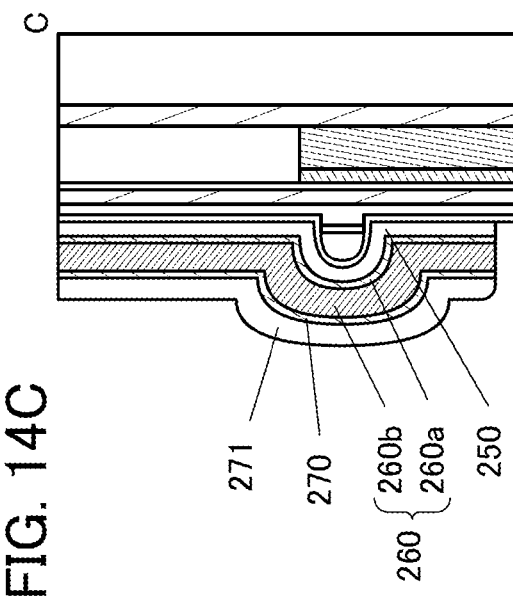
FIGS. 14A-14D A top view and cross-sectional views illustrating a method for manufacturing a semiconductor device of one embodiment of the present invention.
Figure 14B:
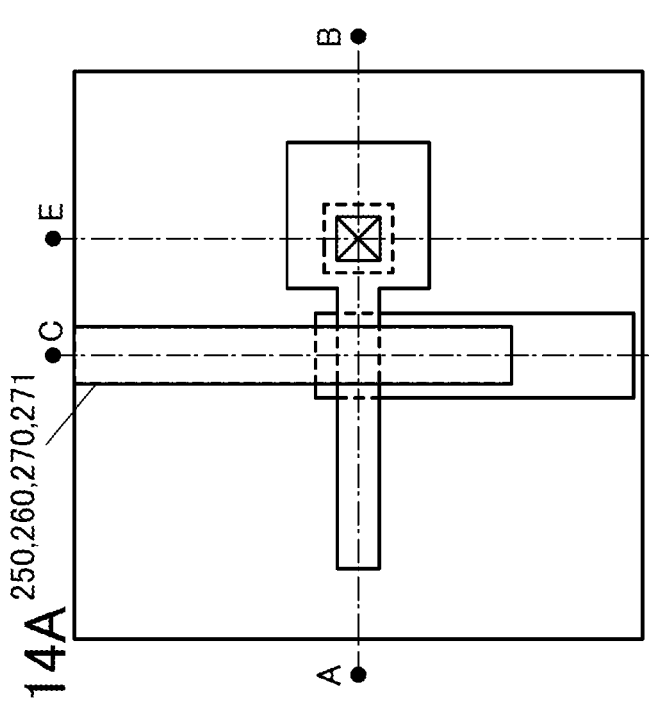
Figure 14C:
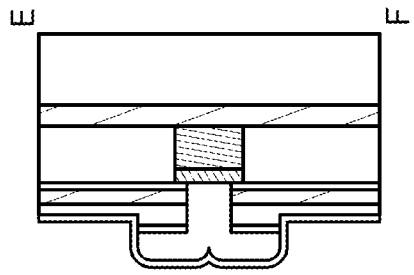
Figure 14D:
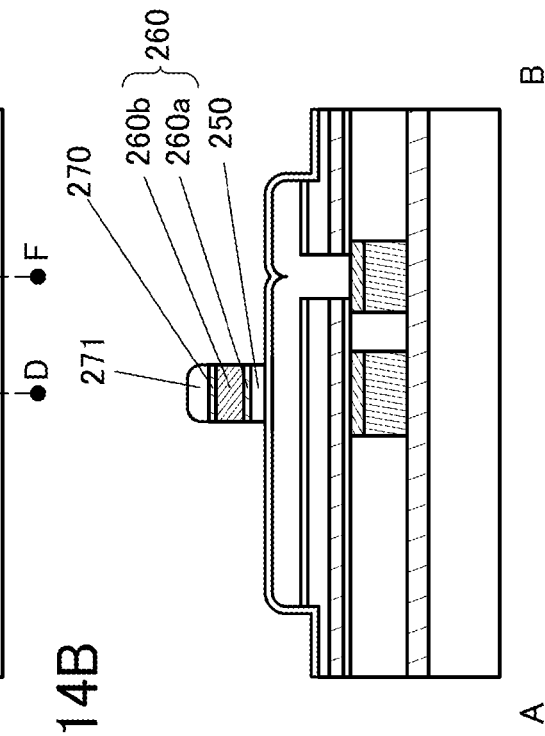
Figure 15A:
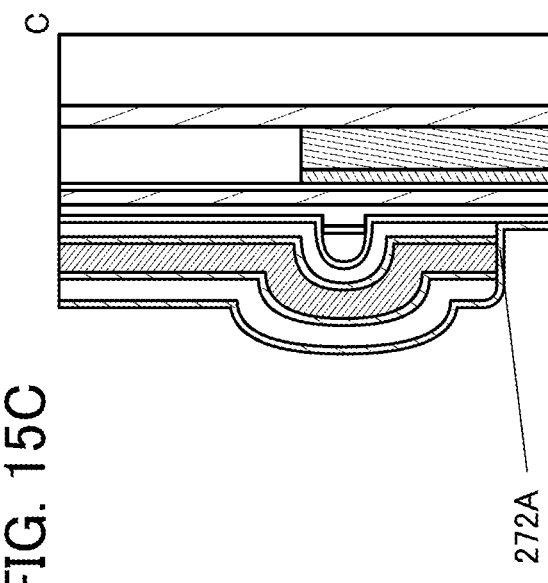
FIGS. 15A-15D A top view and cross-sectional views illustrating a method for manufacturing a semiconductor device of one embodiment of the present invention.
Figure 15C:
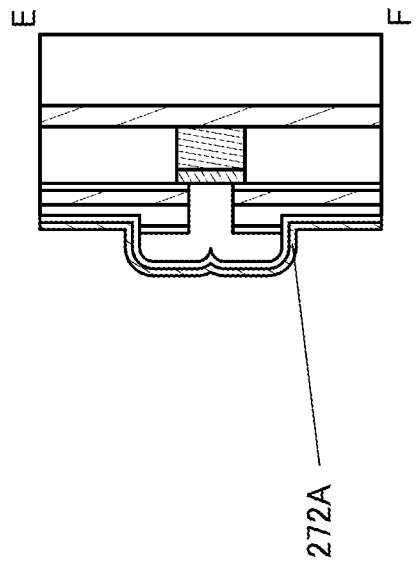
Figure 15B:
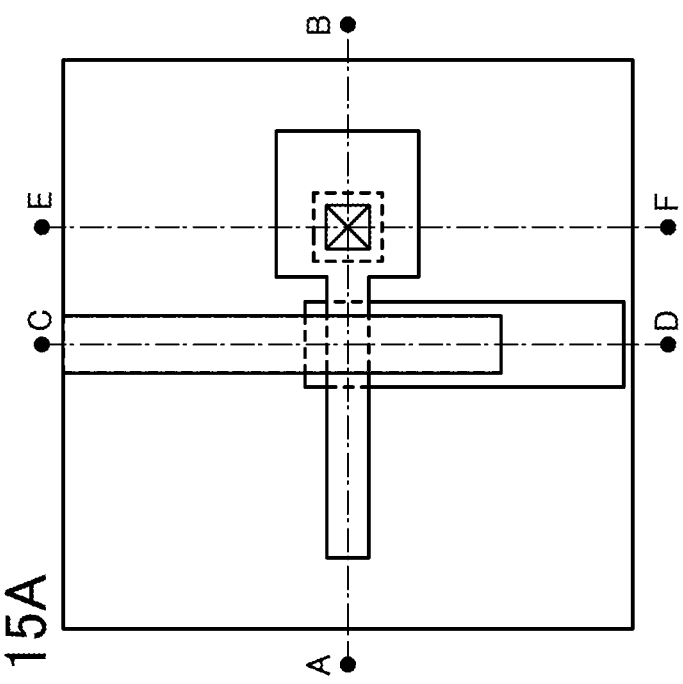
Figure 15D:
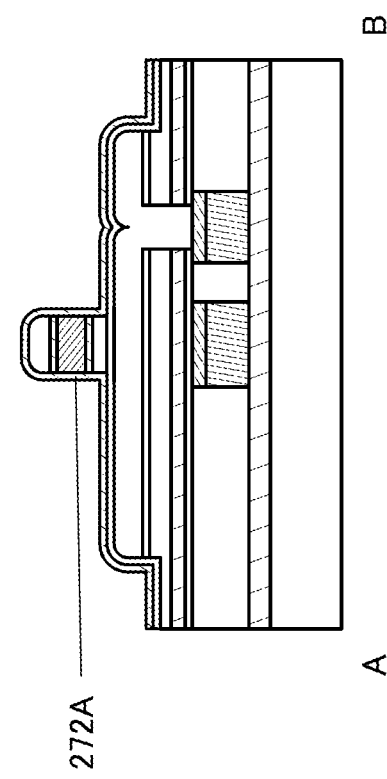
Figure 16C:
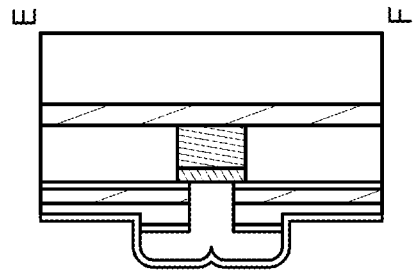
FIGS. 16A-16D A top view and cross-sectional views illustrating a method for manufacturing a semiconductor device of one embodiment of the present invention.
Figure 16D:
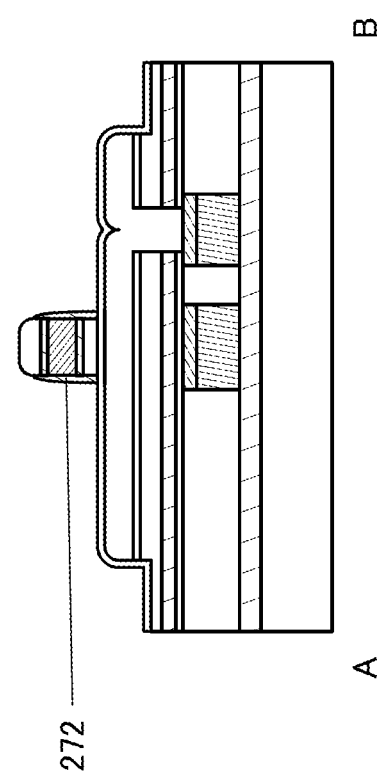
Figure 16A:
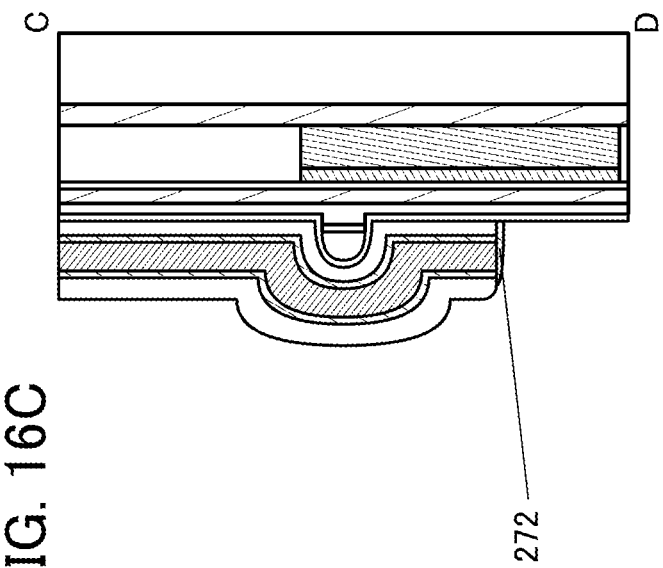
Figure 16B:
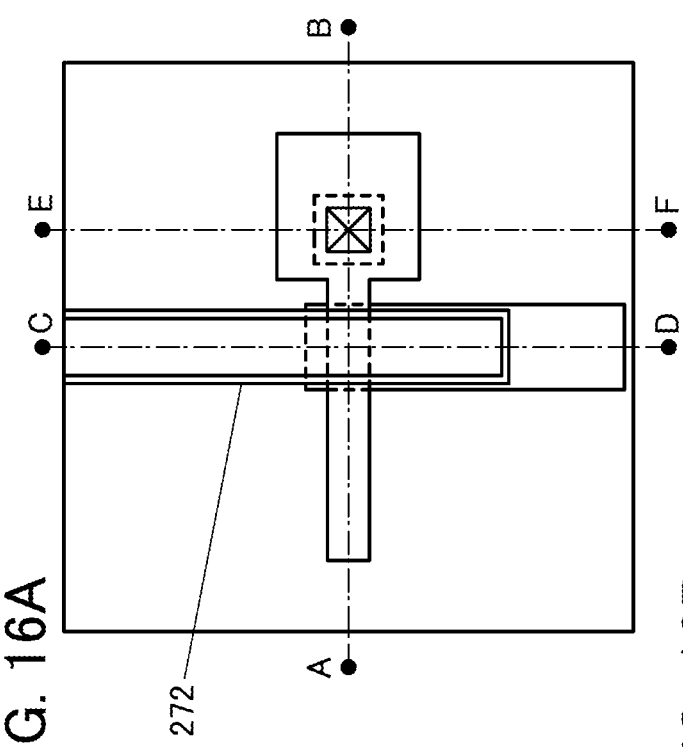
Figure 18C:
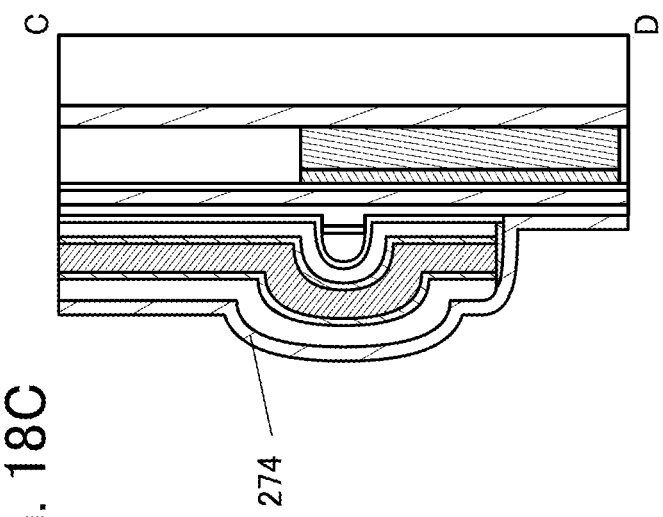
FIGS. 18A-18D A top view and cross-sectional views illustrating a method for manufacturing a semiconductor device of one embodiment of the present invention.
Figure 18D:
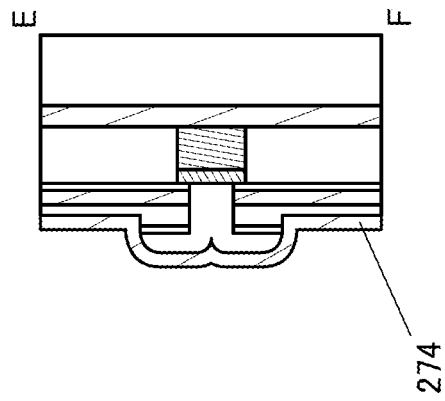
Figure 18A:
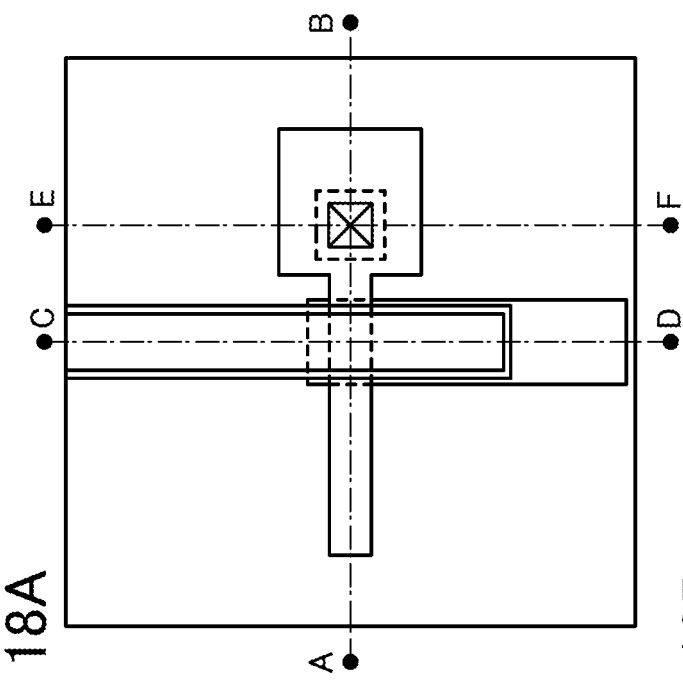
Figure 18B:
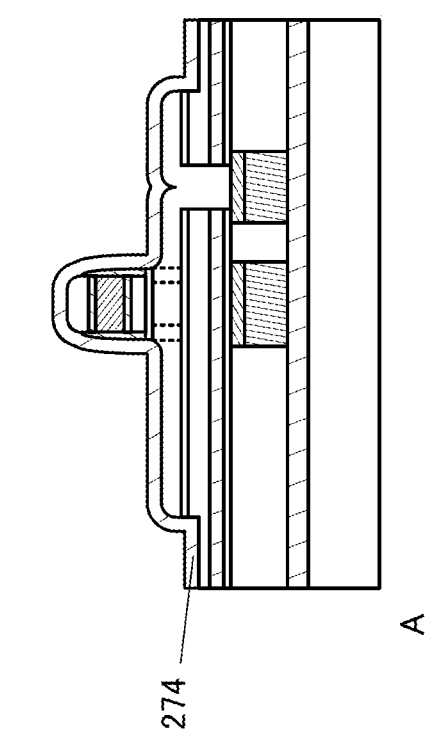
Figure 21C:
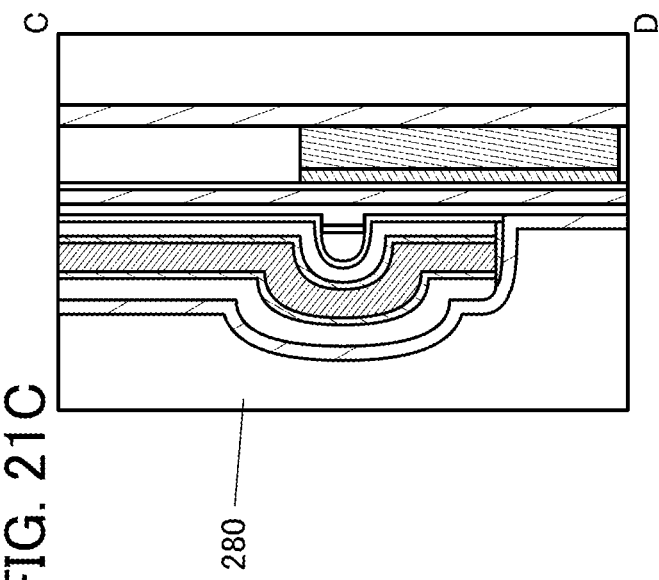
FIGS. 21A-21D A top view and cross-sectional views illustrating a method for manufacturing a semiconductor device of one embodiment of the present invention.
Figure 21D:
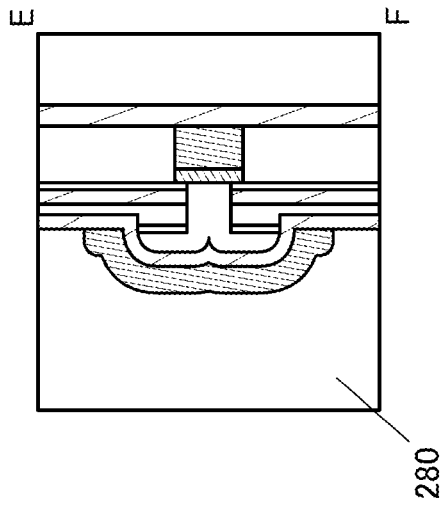
Figure 21A:
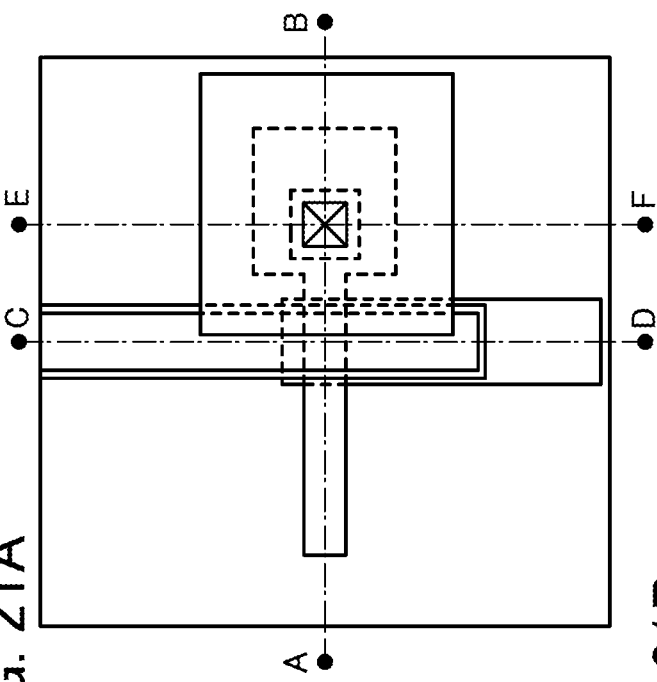
Figure 21B:
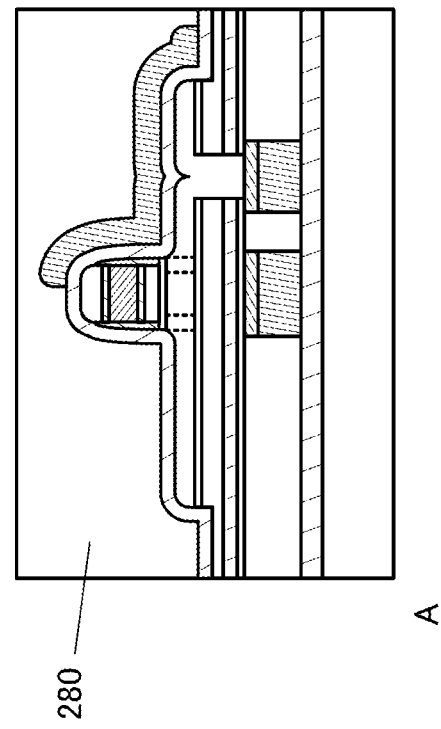
Figure 22A:
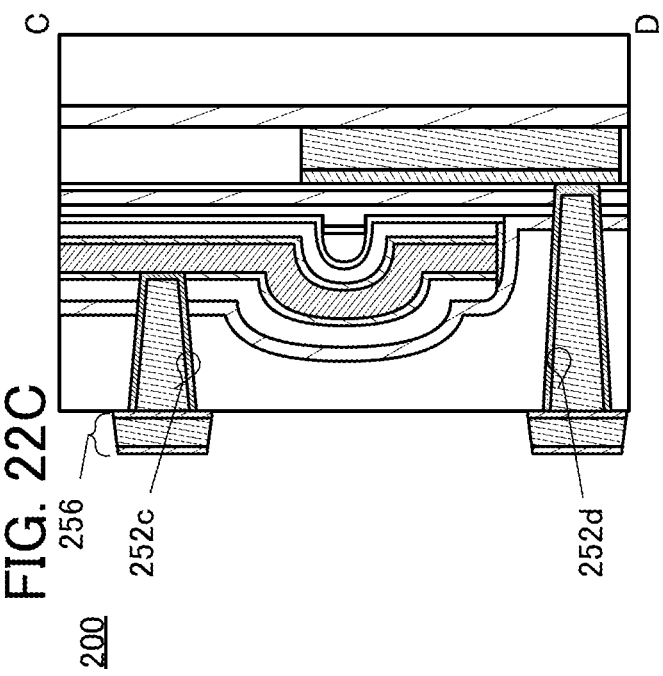
FIGS. 22A-22D A top view and cross-sectional views illustrating a method for manufacturing a semiconductor device of one embodiment of the present invention.
Figure 22C:
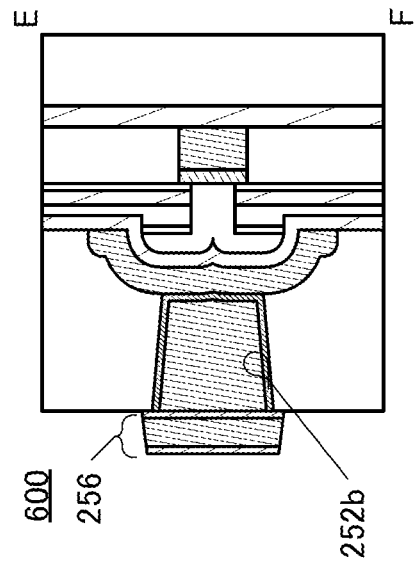
Figure 22B:
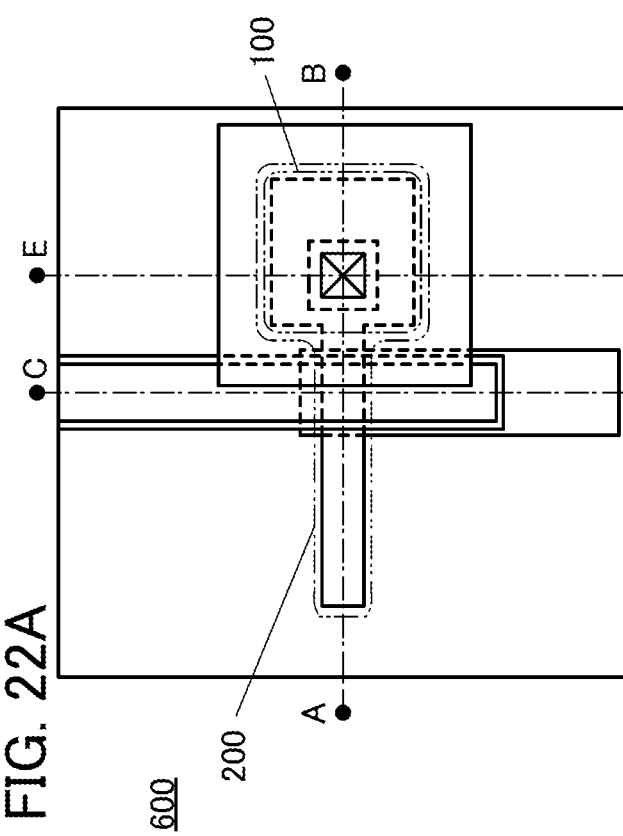
Figure 22D:
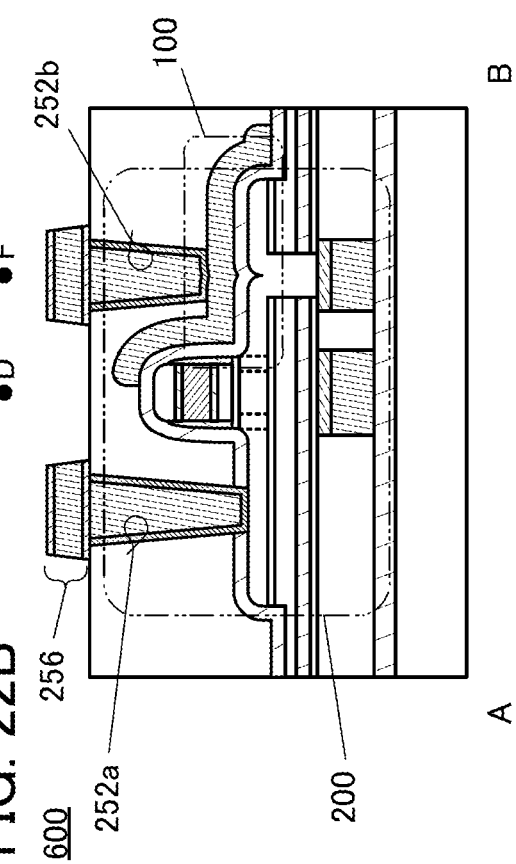

As illustrated in FIG. 12(A) and FIG. 12(D), the oxide 230a and the oxide 230b are each preferably formed to have a wider width in the E-F direction than the opening in the region overlapping with the opening formed in the insulator 220, the insulator 222, the insulator 224, and the oxide 230a. Therefore, the widths of the oxide 230a and the oxide 230b in the E-F direction in that region may be wider than the widths of the oxide 230a and the oxide 230b in the C-D direction in a region where a channel is formed or a region on the A side. With such a structure, contact between the oxide 230b and the conductor 203 can be assured. Furthermore, the area of the capacitor 100 can be increased, and an increase in the capacity of the capacitor 100 can be expected.

Note that in the above step, the insulator 224 may be processed into an island shape. Furthermore, the insulator 224 may be subjected to half-etching. In the case where the insulator 224 is subjected to half-etching, the insulator 224 remains also under the oxide 230c to be formed in a later step. Note that the insulator 224 can be processed into an island shape when an insulating film 272A is processed in a later step. In this case, the insulator 222 may be used as an etching stopper film.

Here, the oxide 230a and the oxide 230b are formed to at least partly overlap with the conductor 205. It is preferable that side surfaces of the oxide 230a and the oxide 230b be substantially perpendicular to the insulator 222. When the side surfaces of the oxide 230a and the oxide 230b are substantially perpendicular to the insulator 222, a plurality of transistors 200 can be provided in a small area with high density. Note that an angle formed by the side surfaces of the oxide 230a and the oxide 230b and a top surface of the insulator 222 may be an acute angle. In that case, the angle formed by the side surfaces of the oxide 230a and the oxide 230b and the top surface of the insulator 222 is preferably larger.

There is a curved surface between the side surfaces of the oxide 230a and the oxide 230b and a top surface of the oxide 230b. That is, an end portion of the side surface and an end portion of the top surface are preferably curved (hereinafter also referred to as a round shape). The radius of curvature of the curved surface at end portions of the oxide 230a and the oxide 230b is greater than or equal to 3 nm and less than or equal to 10 nm, preferably greater than or equal to 5 nm and less than or equal to 6 nm, for example.

Note that when the end portions are not angular, the coverage with films in later deposition process is improved.

Note that the oxide film is processed by a lithography method. For the processing, a dry etching method or a wet etching method can be employed. A processing employing a dry etching method is suitable for microfabrication.

Note that in the lithography method, first, a resist is exposed to light through a mask. Next, a region exposed to light is removed or left using a developing solution, so that a resist mask is formed. Then, etching treatment is performed through the resist mask, whereby a conductor, a semiconductor, an insulator, or the like can be processed into a desired shape. The resist mask is formed by, for example, exposure of the resist to light using KrF excimer laser light, ArF excimer laser light, or EUV (Extreme Ultraviolet) light. Alternatively, a liquid immersion technique may be employed in which a portion between a substrate and a projection lens is filled with liquid (for example, water) to perform light exposure. An electron beam or an ion beam may be used instead of the above-described light. Note that a mask is not necessary in the case of using an electron beam or an ion beam. To remove the resist mask, dry etching treatment such as ashing or wet etching treatment can be performed, wet etching treatment can be performed after dry etching treatment, or dry etching treatment can be performed after wet etching treatment.

A hard mask formed of an insulator or a conductor may be used instead of the resist mask. In the case where a hard mask is used, a hard mask with a desired shape can be formed by forming an insulating film or a conductive film to be the material of the hard mask over the oxide film 230B, forming a resist mask thereover, and then etching the material of the hard mask. The etching of the oxide film 230A and the oxide film 230B may be performed after the resist mask is removed or with the resist mask left. In the latter case, the resist mask is removed during the etching in some cases. The hard mask may be removed by etching after the etching of the oxide film. In contrast, the hard mask does not need to be removed in the case where the hard mask material does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure in which different high-frequency powers are applied to one of the parallel plate type electrodes may be employed. Alternatively, a structure in which high-frequency powers with the same frequency are applied to the parallel plate type electrodes may be employed. Alternatively, a structure in which high-frequency powers with different frequencies are applied to the parallel plate type electrodes may be employed. Alternatively, a dry etching apparatus including a high-density plasma source can be used. As the dry etching apparatus including a high-density plasma source, an inductively coupled plasma (ICP) etching apparatus can be used, for example.

In some cases, the treatment such as dry etching causes the attachment or diffusion of impurities due to an etching gas or the like to a surface or an inside of the oxide 230a, the oxide 230b, or the like. Examples of the impurities include fluorine and chlorine.

In order to remove the impurities or the like, cleaning is performed. Examples of the cleaning method include wet cleaning using a cleaning solution or the like, plasma treatment using plasma, and cleaning by heat treatment, and the cleaning methods may be performed in appropriate combination.

As the wet cleaning, cleaning treatment may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, ultrasonic cleaning using pure water or carbonated water is performed.

Next, heat treatment may be performed. As the conditions for the heat treatment, the above-described heat treatment conditions can be used.

Then, an oxide film 230C, an insulating film 250A, a conductive film 260A, a conductive film 260B, an insulating film 270A, and an insulating film 271A are deposited sequentially over the insulator 224, the oxide 230a, and the oxide 230b (see FIG. 13).

The oxide film 230C can be deposited by a sputtering method, a CVD method, an MBE method, a PLD method, an ALD method, or the like. The oxide film 230C is deposited by a deposition method similar to that of the oxide film 230A or the oxide film 230B in accordance with characteristics required for the oxide 230c. In this embodiment, the oxide film 230C is deposited using a target of In:Ga:Zn=1:3:4 [atomic ratio] by a sputtering method.

The insulating film 250A can be deposited by a sputtering method, a CVD method, an MBE method, a PLD method, an ALD method, or the like.

Note that oxygen is excited by microwaves to generate high-density oxygen plasma, and the insulating film 250A is exposed to the oxygen plasma, whereby oxygen can be supplied to the insulating film 250A, the oxide 230a, the oxide 230b, and the oxide film 230C.

Furthermore, heat treatment may be performed. For the heat treatment, the above-described heat treatment conditions can be used. The heat treatment can reduce the moisture concentration and the hydrogen concentration in the insulating film 250A.

The conductive film 260A can be deposited by a sputtering method, a CVD method, an MBE method, a PLD method, an ALD method, or the like. In this embodiment, as the conductive film 260A, titanium nitride is formed by a sputtering method.

The conductive film 260B can be deposited by a sputtering method, a CVD method, an MBE method, a PLD method, an ALD method, or the like. When a low-resistance metal film is stacked as the conductive film 260B, a transistor with a low driving voltage can be provided. In this embodiment, as the conductive film 260B, tungsten is formed by a sputtering method.

Another conductor may be provided between the insulating film 250A and the conductive film 260A. The conductor can be deposited by a sputtering method, a CVD method, an MBE method, a PLD method, an ALD method, or the like. Here, when an oxide semiconductor that can be used as the oxide 230 is subjected to treatment for reducing resistance, for example, the oxide semiconductor becomes a conductive oxide. Accordingly, an oxide that can be used as the oxide 230 may be deposited and the resistance of the oxide may be reduced in a later step. Note that when an oxide that can be used as the oxide 230 is deposited over the insulating film 250A in an atmosphere containing oxygen by a sputtering method, oxygen can be added to the insulating film 250A. When oxygen is added to the insulating film 250A, the added oxygen can be supplied to the oxide 230 through the insulating film 250A.

Subsequently, heat treatment can be performed. For the heat treatment, the above-described heat treatment conditions can be used. Note that the heat treatment is not necessarily performed in some cases. In this embodiment, the treatment is performed in a nitrogen atmosphere at 400° C. for one hour.

The insulating film 270A can be deposited by a sputtering method, a CVD method, an MBE method, a PLD method, an ALD method, or the like. Since the insulating film 270A functions as a barrier film, an insulating material having a function of inhibiting passage of oxygen and impurities such as water and hydrogen is used. For example, aluminum oxide, hafnium oxide, or hafnium aluminate is preferably used. Thus, oxidation of the conductor 260 can be prevented. This can also prevent entry of impurities such as water and hydrogen into the oxide 230 through the conductor 260 and the insulator 250.

The insulating film 271A can be deposited by a sputtering method, a CVD method, an MBE method, a PLD method, an ALD method, or the like. Here, the thickness of the insulating film 271A is preferably greater than the thickness of the insulating film 272A to be formed in a later step. In that case, when the insulator 272 is formed in the later step, the insulator 271 can remain easily over the conductor 260.

The insulator 271 functions as a hard mask. The provision of the insulator 271 makes it possible for the side surface of the insulator 250, a side surface of the conductor 260a, a side surface of the conductor 260b, a side surface of the conductor 260c, and the side surface of the insulator 270 to be formed substantially perpendicular to the substrate.

Next, the insulating film 271A is etched to form the insulator 271. Then, using the insulator 271 as a mask, the insulating film 250A, the conductive film 260A, the conductive film 260B, and the insulating film 270A are etched to form the insulator 250, the conductor 260 (the conductor 260a and the conductor 260b), and the insulator 270 (see FIG. 14). Note that after the processing, the following process may be performed without removal of the hard mask. The hard mask can also function as a hard mask used in for adding a dopant, which is to be performed in the following process.

The side surface of the insulator 250, the side surface of the conductor 260, and the side surface of the insulator 270 are preferably on the same surface. It is preferable that the surface shared by the side surface of the insulator 250, the side surface of the conductor 260, and the side surface of the insulator 270 be substantially perpendicular to the substrate. That is, in a cross-sectional shape, an angle between the top surface of the oxide 230 and the insulator 250, the conductor 260, and the insulator 270 is preferably an acute angle and larger. Note that the angle formed by the top surface of the oxide 230, which is in contact with the insulator 250, and the side surfaces of the insulator 250, the conductor 260, and the insulator 270 may be an acute angle in the cross-sectional shape. In that case, the angle formed by the top surface of the oxide 230, which is in contact with the insulator 250, and the side surfaces of the insulator 250, the conductor 260, and the insulator 270 is preferably larger.

The insulator 250, the conductor 260, and the insulator 270 are formed to at least partly overlap with the conductor 205 and the oxide 230.

An upper portion of the oxide film 230C in a region not overlapping with the insulator 250 may be etched by the above etching. In that case, the oxide film 230C may be thicker in a region overlapping with the insulator 250 than in the region not overlapping with the insulator 250.

Next, the insulating film 272A is deposited to cover the oxide film 230C, the insulator 250, the conductor 260, the insulator 270, and the insulator 271 (see FIG. 15). The insulating film 272A is preferably deposited by an ALD method, which enables good coverage. By using an ALD method, the insulating film 272A having a uniform thickness can be formed on the side surfaces of the insulator 250, the conductor 260, and the insulator 270 even in a step portion formed by the conductor 260 and the like.

Next, the insulating film 272A is subjected to anisotropic etching treatment, whereby the insulator 272 is formed in contact with the side surfaces of the insulator 250, the conductor 260, and the insulator 270 (see FIG. 16). Dry etching treatment is preferably performed as the anisotropic etching treatment. In this manner, the insulating film deposited on a plane substantially parallel to the surface of the substrate can be removed, so that the insulator 272 can be formed in a self-aligned manner.

The insulator 271 is formed over the insulator 270 here, whereby the insulator 270 can be left even when the insulating film 272A in a portion above the insulator 270 are removed. The height of a structure body composed of the insulator 250, the conductor 260, the insulator 270, and the insulator 271 is made greater than the total height of the oxide 230a, the oxide 230b, and the oxide film 230C, whereby the insulating film 272A on the side surfaces of the oxide 230a and the oxide 230b with the oxide film 230C therebetween can be removed. Furthermore, when the end portions of the oxide 230a and the oxide 230b have a round shape, time taken to remove the insulating film 272A deposited on the side surfaces of the oxide 230a and the oxide 230b with the oxide film 230C therebetween can be shortened, leading to easier formation of the insulator 272.

Next, the oxide film 230C is etched using the insulator 250, the conductor 260, the insulator 270, the insulator 271, and the insulator 272 as masks to remove part of the oxide film 230C, so that the oxide 230c is formed (see FIG. 17). Note that through the present process, the top surface and the side surfaces of the oxide 230b and the side surfaces of the oxide 230a are partly removed in some cases.

Here, the region 231, the region 232, and the region 234 may be formed in the oxide 230a, the oxide 230b, and the oxide 230c. The region 231 and the region 232 are regions whose resistance is reduced by addition of a metal atom such as indium or impurities to metal oxides provided as the oxide 230a, the oxide 230b, and the oxide 230c. Note that each of the regions has higher conductivity than at least the oxide 230b in the region 234.

In order to reduce the resistance of the region 231 and the region 232, a dopant which is at least one of the metal element such as indium and the impurities is added, for example.

Note that as a method for adding the dopant, an ion implantation method by which an ionized source gas is subjected to mass separation and then added, an ion doping method by which an ionized source gas is added without mass separation, a plasma immersion ion implantation method, or the like can be used. In the case of performing mass separation, ion species to be added and its concentration can be controlled properly. On the other hand, in the case of not performing mass separation, ions at a high concentration can be added in a short time. Alternatively, an ion doping method in which atomic or molecular clusters are generated and ionized may be employed. Note that a dopant may also be referred to as an ion, a donor, an acceptor, an impurity, an element, or the like.

Alternatively, a dopant may be added by plasma treatment. In that case, the plasma treatment can be performed with a plasma CVD apparatus, a dry etching apparatus, or an ashing apparatus to add a dopant to the oxide 230a, the oxide 230b, and the oxide 230c.

Furthermore, in the case where an impurity is added as a dopant, a film containing a dopant may be deposited in contact with the region 231. For example, the insulator 274 containing hydrogen, boron, carbon, nitrogen, fluorine, or phosphorus as a dopant is deposited in contact with the region 231 of the oxide 230 (see FIG. 18). Owing to the deposition of the insulator 274 or the heat treatment after the deposition, the resistance of the region 231 is reduced, and the region 232 is formed. It is considered that the dopant in the insulator 274 is diffused into the region 231 and the region 232 and the resistance of the region is reduced.

When the indium content in the oxide 230a, the oxide 230b, and the oxide 230c is increased, the carrier density can be increased and the resistance can be reduced. Accordingly, a metal element that improves the carrier density of the oxide 230a, the oxide 230b, and the oxide 230c, such as indium, can be used as a dopant.

That is, when the content of a metal atom such as indium in the oxide 230a, the oxide 230b, and the oxide 230c is increased in the region 231 and the region 232, the electron mobility can be increased and the resistance can be reduced.

Accordingly, the atomic ratio of indium to the element M at least in the region 231 is larger than the atomic ratio of indium to the element M in the region 234.

As the dopant, the element forming an oxygen vacancy, the element trapped by an oxygen vacancy, or the like may be used. Typical examples of the element are hydrogen, boron, carbon, nitrogen, fluorine, phosphorus, sulfur, chlorine, titanium, and a rare gas. Typical examples of the rare gas element are helium, neon, argon, krypton, and xenon.

When the region 232 is provided in the transistor 200, a high-resistance region is not formed between the region 231 functioning as the source region or the drain region and the region 234 where a channel is formed, so that the on-state current and the mobility of the transistor can be increased. Since the gate does not overlap with the source region and the drain region in the channel length direction owing to the region 232, formation of unnecessary capacitance can be inhibited. Furthermore, leakage current in a non-conduction state can be reduced by including the region 232.

Thus, by appropriately selecting the areas of the region 231a and the region 231b, a transistor having electrical characteristics necessary for the circuit design can be easily provided.

In this embodiment, the insulator 274 is deposited to cover the insulator 224, the oxide 230, the insulator 271, and the insulator 272 (see FIG. 18).

For the insulator 274, silicon nitride, silicon nitride oxide, or silicon oxynitride which is deposited by a CVD method can be used, for example. In this embodiment, silicon nitride oxide is used for the insulator 274. In the case where the insulator 274 is used as a dielectric of the capacitor 100, its thickness is greater than or equal to 1 nm and less than or equal to 20 nm, preferably greater than or equal to 3 nm and less than or equal to 10 nm.

When the insulator 274 containing an element serving as an impurity such as nitrogen is deposited in contact with the oxide 230, impurity elements such as hydrogen and nitrogen, which are contained in a deposition atmosphere of the insulator 274, are added to the region 231a and the region 231b. Oxygen vacancies are formed because of the added impurity elements, and the impurity elements enter the oxygen vacancies mainly in a region of the oxide 230 which is in contact with the insulator 274, thereby increasing the carrier density and reducing the resistance. At this time, the impurities are diffused also into the region 232 that is not in contact with the insulator 274, whereby the resistance of the region 232 is reduced.

Therefore, the region 231a and the region 231b preferably have a higher concentration of at least one of hydrogen and nitrogen than the region 234. The concentration of hydrogen or nitrogen is measured by secondary ion mass spectrometry (SIMS) or the like. Here, the concentration of hydrogen or nitrogen in the middle of the region of the oxide 230b that overlaps with the insulator 250 (for example, a portion of the oxide 230b which is located nearly equidistant from both side surfaces in the channel length direction of the insulator 250) is measured as the concentration of hydrogen or nitrogen in the region 234.

Note that the resistance of the region 231 and the region 232 to which an element that forms an oxygen vacancy or an element trapped by an oxygen vacancy is added is reduced. Typical examples of the element are hydrogen, boron, carbon, nitrogen, fluorine, phosphorus, sulfur, chlorine, titanium, and a rare gas. Typical examples of the rare gas element are helium, neon, argon, krypton, and xenon.

Accordingly, the region 231 and the region 232 are made to contain one or more of the above elements.

Alternatively, as the insulator 274, a film which extracts and absorbs oxygen in the region 231 and the region 232 may be used. When oxygen is extracted, oxygen vacancies are generated in the region 231 and the region 232. Hydrogen, boron, carbon, nitrogen, fluorine, phosphorus, sulfur, chlorine, titanium, a rare gas, or the like is trapped by oxygen vacancies, whereby the resistance of the region 231 and the region 232 is reduced.

To deposit the insulator 274 as an insulator containing an element serving as an impurity or an insulator extracting oxygen from the oxide 230, a sputtering method, a CVD method, an MBE method, a PLD method, an ALD method, or the like can be used for the deposition of the insulator 274.

The insulator 274 containing an element serving as an impurity is preferably deposited in an atmosphere containing at least one of nitrogen and hydrogen. When deposition is performed in such an atmosphere, oxygen vacancies are formed mainly in regions not overlapping with the insulator 250 of the oxide 230b and the oxide 230c and the oxygen vacancies and impurity elements such as nitrogen and hydrogen are bonded to each other, leading to an increase in carrier density. In this manner, the region 231a and the region 231b with reduced resistance can be formed. For the insulator 274, for example, silicon nitride, silicon nitride oxide, or silicon oxynitride formed by a CVD method can be used. In this embodiment, silicon nitride oxide is used for the insulator 274.

The insulator 274 may have a stacked-layer structure of two or more layers of an insulator. The insulator 274 can be formed by a CVD method, an ALD method, a sputtering method, or the like. An ALD method is favorable for deposition on a step portion formed by the oxide 230 or the conductor 260 because of its excellent step coverage, excellent thickness uniformity, and excellent thickness controllability. An insulator with a thickness of greater than or equal to 0.5 nm and less than or equal to 5.0 nm may be formed by an ALD method, and then an insulator with a thickness of greater than or equal to 1 nm and less than or equal to 20 nm, preferably greater than or equal to 3 nm and less than or equal to 10 nm may be stacked thereover by a plasma CVD method, so that the insulator 274 may be formed. For example, over aluminum oxide, hafnium oxide, or an oxide containing aluminum and hafnium (hafnium aluminate) formed by an ALD method, silicon nitride, silicon nitride oxide, silicon oxynitride, or silicon oxide formed by a plasma CVD method is stacked, so that the insulator 274 may be formed. Alternatively, an insulator with a thickness of greater than or equal to 1 nm and less than or equal to 20 nm, preferably greater than or equal to 3 nm and less than or equal to 10 nm may be formed to be a single-layer insulator 274 by a plasma CVD method. For example, silicon nitride, silicon nitride oxide, silicon oxynitride, or silicon oxide formed by a plasma CVD method may be the insulator 274.

Accordingly, the source region and the drain region can be formed in a self-aligned manner owing to the deposition of the insulator 274. Thus, minute or highly integrated semiconductor devices can also be manufactured with high yield.

Here, the top surfaces and the side surfaces of the conductor 260 and the insulator 250 are covered with the insulator 270 and the insulator 272, whereby impurity elements such as nitrogen and hydrogen can be prevented from entering the conductor 260 and the insulator 250. Thus, the impurity elements such as nitrogen and hydrogen can be prevented from entering the region 234 functioning as the channel formation region of the transistor 200 through the conductor 260 and the insulator 250. Accordingly, the transistor 200 having favorable electrical characteristics can be provided.

Note that although the region 231, the region 232, and the region 234 are formed by the reduction in the resistance of the oxide 230 owing to the deposition of the insulator 274 in the above, this embodiment is not limited thereto. For example, each region and the like may be formed by dopant addition treatment or plasma treatment, or the combination of these treatments.

For example, plasma treatment may be performed on the oxide 230 using the insulator 250, the conductor 260, the insulator 272, the insulator 270, and the insulator 271 as masks. The plasma treatment is performed in, for example, an atmosphere containing the above-described element forming an oxygen vacancy or the above-described element trapped by an oxygen vacancy. For example, the plasma treatment is performed using an argon gas and a nitrogen gas.

Subsequently, heat treatment can be performed. For the heat treatment, the above-described heat treatment conditions can be used. The heat treatment allows diffusion of the added dopant into the region 232 of the oxide 230, resulting in an increase in on-state current.

Next, a conductive film 130A is formed to cover the insulator 274 (see FIG. 19). The conductive film 130A can be deposited by a sputtering method, a CVD method, an MBE method, a PLD method, an ALD method, or the like.

Then, the conductive film 130A is processed by a lithography method to form the conductor 130 (see FIG. 20). For processing the conductive film 130A, a dry etching method, a wet etching method, or a combination of these methods can be used. A dry etching method in which anisotropic etching can be achieved is preferable because of its excellent microfabrication. In contrast, by using wet etching, which allows isotropic etching, the conductive film 130A on the side surfaces of the oxide 230, the side surfaces of the insulator 250, and side surfaces of the insulator 272 is easily removed. Thus, processing in which the dry etching method and the wet etching method are combined is preferable because the conductor 130 with favorable shape can be formed.

In this embodiment, as illustrated in FIG. 20(B) and FIG. 20(D), part of the conductor 130 provided over the oxide 230 is provided to extend outward from the oxide 230. Specifically, the conductor 130 is provided to extend beyond the oxide 230 to the B side in FIG. 20(B), and the conductor 130 is provided to extend beyond the oxide 230 to the E side and the F side in FIG. 20(D).

Such a shape is preferable because the capacitor 100 can form capacitance not only between the top surface of the oxide 230 and the conductor 130 but also between the side surface of the oxide 230 and the conductor 130. In contrast, when there is a limitation on the area occupied by the cell 600, the conductor 130 is formed so as to extend beyond the oxide 230 as little as possible; thus, the cell 600 can be miniaturized, so that the semiconductor device can be highly integrated.

Then, the insulator 280 is deposited over the insulator 274 and the conductor 130 (see FIG. 21). The insulator 280 can be deposited by a sputtering method, a CVD method, an MBE method, a PLD method, an ALD method, or the like. Alternatively, the insulator 280 can be deposited by a spin coating method, a dipping method, a droplet discharging method (such as an ink-jet method), a printing method (such as screen printing or offset printing), a doctor knife method, a roll coater method, a curtain coater method, or the like. In this embodiment, silicon oxynitride is used for the insulating film.

Note that the insulator 280 is preferably formed such that its top surface has planarity. For example, the insulator 280 may have a flat top surface right after the deposition of the insulating film to be the insulator 280. Alternatively, for example, the insulator 280 may have a flat top surface by removing the insulator from the top surface after the deposition so that the top surface becomes parallel to a reference surface such as a rear surface of the substrate. Such treatment is referred to as planarization treatment. Examples of the planarization treatment include CMP treatment and dry etching treatment. In this embodiment, CMP treatment is used as the planarization treatment. Note that the top surface of the insulator 280 does not necessarily have planarity.

Then, an opening reaching the region 231 of the oxide 230, an opening reaching the conductor 130, an opening reaching the conductor 260, and an opening reaching the conductor 205 are formed in the insulator 280 and the insulator 274, in the insulator 280, in the insulator 280, the insulator 274, the insulator 271, and the insulator 270, and in the insulator 280, the insulator 274, the insulator 224, the insulator 222, and the insulator 220, respectively. The openings are formed by a lithography method.

Note that in order that the conductor 252a may be provided in contact with the side surface of the oxide 230, the opening reaching the oxide 230 is formed such that the side surface of the oxide 230 is exposed in the opening.

Next, the conductor 252 (the conductor 252a, the conductor 252b, the conductor 252c, and the conductor 252d) is formed (see FIG. 22). Furthermore, the conductor 256 electrically connected to the conductor 252 may be formed as needed (see FIG. 22).

Through the above process, the semiconductor device including the transistor 200 and the capacitor 100 can be manufactured. As illustrated in FIG. 5 to FIG. 22, by using the method for manufacturing a semiconductor device described in this embodiment, the transistor 200 and the capacitor 100 can be manufactured.

According to one embodiment of the present invention, a semiconductor device that can be miniaturized or highly integrated can be provided. Alternatively, according to one embodiment of the present invention, a semiconductor device with favorable electrical characteristics can be provided. Alternatively, according to one embodiment of the present invention, a semiconductor device with a low off-state current can be provided. Alternatively, according to one embodiment of the present invention, a transistor with a high on-state current can be provided. Alternatively, according to one embodiment of the present invention, a highly reliable semiconductor device can be provided. Alternatively, according to one embodiment of the present invention, a semiconductor device with low power consumption can be provided. Alternatively, according to one embodiment of the present invention, a semiconductor device with high productivity can be provided.

The structures, methods, and the like in this embodiment described above can be combined as appropriate with the structures, methods, and the like described in the other embodiments.

Embodiment 2

An example of a semiconductor device including a transistor 202 of one embodiment of the present invention will be described below.

In the semiconductor device of this embodiment, materials similar to those in Embodiment 1 can be used for components with the same reference numerals as the semiconductor device in Embodiment 1. Unless otherwise specified, the components formed in this embodiment can obtain structural characteristics and effects similar to those of the components described in Embodiment 1, and description thereof is omitted.

Structure Example 3 of Semiconductor Device

FIG. 23(A), FIG. 23(B), FIG. 23(C), and FIG. 23(D) are a top view and cross-sectional views of the transistor 202 of one embodiment of the present invention.

FIG. 23(A) is a top view of the transistor 202. FIG. 23(B), FIG. 23(C), and FIG. 23(D) are cross-sectional views of the transistor 202. Here, FIG. 23(B) is a cross-sectional view of a portion denoted by dashed-dotted line A-B in FIG. 23(A), and is also a cross-sectional view of the transistor 202 in the channel length direction. FIG. 23(C) is a cross-sectional view of a portion denoted by dashed-dotted line C-D in FIG. 23(A), and is also a cross-sectional view of the transistor 202 in the channel width direction. FIG. 23(D) is a cross-sectional view of a portion denoted by dashed-dotted line E-F in FIG. 23(A). For simplification of the drawing, some components are omitted in the top view in FIG. 23(A).

[Transistor 202]

As illustrated in FIG. 23, the transistor 202 includes the insulator 208 placed over the substrate (not illustrated); the conductor 209 over the insulator 210 placed over the insulator 208; the insulator 212 placed to be embedded between the conductors 209; the insulator 216 placed over the conductor 209 and the insulator 212; the conductor 203 and the conductor 205 that are placed to be embedded in the insulator 216; the insulator 220 placed over the insulator 216, the conductor 203, and the conductor 205; the insulator 222 placed over the insulator 220; the insulator 224 placed over the insulator 222; the oxide 230 (the oxide 230a, the oxide 230b, the oxide 230c, and the oxide 230d) placed over the insulator 224; the insulator 250 (an insulator 250a and an insulator 250b) placed over the oxide 230; the conductor 260 (the conductor 260a and the conductor 260b) placed over the insulator 250; the insulator 270 placed over the conductor 260; the insulator 271 placed over the insulator 270; the insulator 272 placed in contact with at least the side surface of the insulator 250 and the side surface of the conductor 260; an insulator 273 placed in contact with part of the top surface and part of the side surface of the insulator 272; and the insulator 274 placed to cover at least the oxide 230, the insulator 271, the insulator 272, and the insulator 273.

The insulator 280 is placed to cover the transistor 202.

Note that the insulator 212 can be formed by polishing of an insulating film placed to cover the conductor 209 by a CMP method or the like to expose the conductor 209. Thus, surfaces of the insulator 212 and the conductor 209 have high planarity.

The conductor 203 and the conductor 205 are formed to be embedded in the opening portions provided in the insulator 216. The conductors can be formed by polishing a conductive film placed to cover the insulator 216 and the opening portions by a CMP method or the like to expose the insulator 216. Thus, surfaces of the insulator 216, the conductor 203, and the conductor 205 have high planarity.

The insulator 220, the insulator 222, the insulator 224, and the oxide 230a have an opening. The oxide 230b and the oxide 230c are electrically connected to the conductor 203 through the opening. When the oxide 230b and the oxide 230c are connected to the conductor 203 without through the oxide 230a, the series resistance and the contact resistance can be reduced. With such a structure, a semiconductor device with favorable electrical characteristics can be obtained. Specifically, a transistor with an increased on-state current and a semiconductor device including the transistor are obtained.

The conductor 209 may have a stacked-layer structure. In that case, a conductor having a better oxidation resistance than a conductor in a lower layer is preferably placed over a conductor having better conductivity than a conductor in an upper layer. When a material that is hardly oxidized is used for the upper layer in the conductor 209, oxidation of the conductor 209 can be inhibited at the time of forming the insulator 216, at the time of forming the opening portion to be provided in the insulator 216, and at the time of forming the conductor 205. Thus, an increase in the electrical resistance due to oxidation of the conductor 209 can be inhibited. That is, the contact between the conductor 209 and the conductor 205 becomes favorable.

Note that although the transistor 202 has, as illustrated in FIG. 23, a structure in which the oxide 230a, the oxide 230b, the oxide 230c, and the oxide 230d are stacked, the present invention is not limited thereto. For example, a two-layer structure of the oxide 230a and the oxide 230c, a two-layer structure of the oxide 230b and the oxide 230c, a three-layer structure of the oxide 230a, the oxide 230c, and the oxide 230d, or a three-layer structure of the oxide 230b, the oxide 230c, and the oxide 230d may be employed. That is, one of the oxide 230a and the oxide 230b is not necessarily provided. Alternatively, the oxide 230d is not necessarily provided. Alternatively, a stacked-layer structure of five or more layers may be employed. Alternatively, a single layer of only the oxide 230c or only the oxide 230c and the oxide 230d may be provided. Although the transistor 202 has a structure in which the conductor 260a and the conductor 260b are stacked, the present invention is not limited thereto. For example, a single layer or a stacked-layer structure of three or more layers may be employed.

Figure 24:
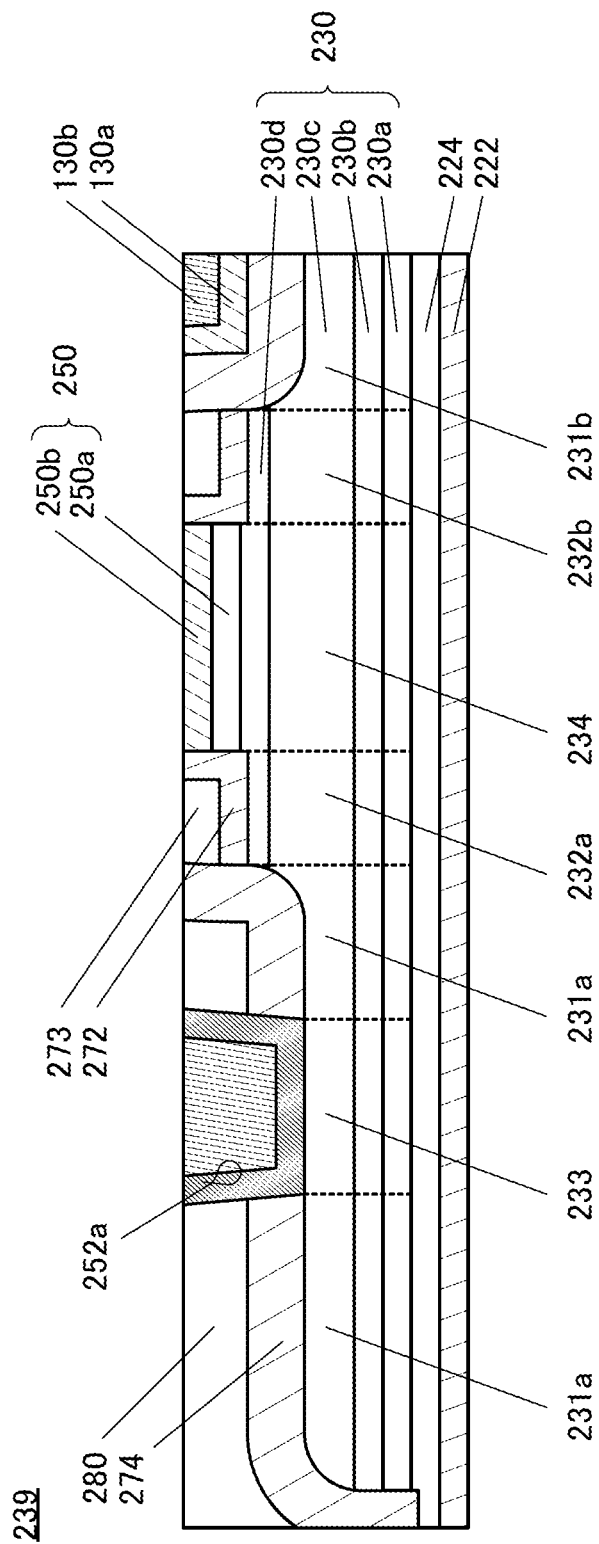
FIG. 24 A cross-sectional view of a semiconductor device of one embodiment of the present invention.

Here, an enlarged view of the region 239 in the vicinity of a channel, which is surrounded by a dashed line in FIG. 23(B), is illustrated in FIG. 24.

As illustrated in FIG. 23(B) and FIG. 24, the oxide 230 includes the region 232 (the region 232a and the region 232b) between the region 234 functioning as a channel formation region of the transistor 202 and the region 231 (the region 231a and the region 231b) functioning as a source region or a drain region. The region 231 functioning as the source region or the drain region is a region having a high carrier density and reduced resistance. In addition, the region 234 functioning as the channel formation region is a region having a lower carrier density than the region 231 functioning as the source region or the drain region. Moreover, the region 232 is a region having a lower carrier density than the region 231 functioning as the source region or the drain region and having a higher carrier density than the region 234 functioning as the channel formation region.

In the region 231, a region 233 connected to the conductor 252a preferably has a higher carrier density and a lower resistance than the region 231. The region 233 is provided in the region 231, so that contact resistance between the oxide 230 and the conductor 252a can be reduced and the transistor 202 can have favorable electrical characteristics. The region 233 can be referred to as a contact region.

The region 231, the region 232, and the region 233 can be provided by addition of a rare gas typified by helium or argon to the oxide 230. For the addition of the rare gas, for example, an ion implantation method by which an ionized source gas is subjected to mass separation and then added, an ion doping method by which an ionized source gas is added without mass separation, a plasma immersion ion implantation method, or plasma treatment can be used.

It can be considered that when the rare gas is added to the oxide 230, a bond between a metal element and an oxygen atom in the oxide 230 is broken, and oxygen vacancies are generated in the oxide 230. When impurities such as hydrogen are trapped by the oxygen vacancies, carriers are generated, and the resistance of the oxide 230, that is, the resistance of the region 231, the region 232, and the region 233 is reduced. Impurities such as hydrogen exist in the oxide 230 in some cases. In that case, the impurities may exist without being connected to a metal element or an oxygen atom. The impurities can be supplied from an insulator provided in contact with the oxide 230, for example, from the insulator 274.

The region 234 is a highly purified region where oxygen vacancies and impurities such as hydrogen are reduced as much as possible. The highly purified oxide becomes a substantially intrinsic region, and the region 234 can function as a channel formation region.

Although FIG. 23 and FIG. 24 illustrate a state where the region 232 overlaps with the conductor 260 functioning as a gate electrode, this embodiment is not limited thereto. Depending on the formation method of the region 231 and the region 232, the region 232 does not overlap with the conductor 260 functioning as a gate electrode in some cases.

The region 232 can be a region having a lower carrier density than the region 231 functioning as the source region or the drain region and having a higher carrier density than the region 234 functioning as the channel formation region. In that case, the region 232 functions as a junction region between the channel formation region and the source region or the drain region.

The provision of the junction region is preferable because a high-resistance region is not formed between the region 231 functioning as the source region or the drain region and the region 234 functioning as the channel formation region, thereby increasing on-state current of the transistor.

The region 234 overlaps with the conductor 260. The region 234 is placed between the region 232a and the region 232b, and the concentration of at least one of a metal element such as indium and an impurity element such as hydrogen or nitrogen in the region 234 is preferably lower than that in each of the region 231 and the region 232.

In addition, in the oxide 230, boundaries between the region 231, the region 232, the region 233, and the region 234 cannot be observed clearly in some cases. The concentrations of a metal element such as indium and an impurity element such as hydrogen or nitrogen, which are detected in each region, may be not only gradually changed between the regions but also continuously changed in each region (also referred to as gradation). That is, the region closer to the region 234, from the region 231 to the region 232, preferably has a lower concentration of a metal element such as indium and an impurity element such as hydrogen or nitrogen.

Furthermore, in FIG. 23(B) and FIG. 24, the region 234, the region 231, the region 232, and the region 233 are formed in the oxide 230a, the oxide 230b, the oxide 230c, and the oxide 230d; however, the present invention is not limited thereto, and these regions are formed at least in the oxide 230c. Alternatively, these regions may be formed only in the oxide 230c and the oxide 230d, for example. Although the boundaries between the regions are indicated substantially perpendicularly to the interface between the insulator 224 and the oxide 230 in the drawings, this embodiment is not limited thereto. For example, the region 232 may project to the region 234 side in the vicinity of the surface of the oxide 230c, and recede to the region 231 side in the vicinity of a bottom surface of the oxide 230c.

When the insulator 250 has a stacked-layer structure including the insulator 250a and the insulator 250b, and the insulator 250b is formed over the insulator 250a in an atmosphere containing oxygen, for example, a larger amount of oxygen, that is, excess oxygen can be contained in 250a.

The insulator 272 is preferably provided in contact with the side surface of the insulator 250.

Furthermore, the transistor 202 is preferably surrounded by an insulator which has a barrier property and prevents entry of impurities such as water and hydrogen.

The structure of a semiconductor device including the transistor 202 of one embodiment of the present invention will be described in detail below.

In the transistor 202, the conductor 260 functions as the first gate electrode in some cases. Furthermore, the conductor 205 functions as a second gate electrode in some cases. In that case, by changing a potential applied to the conductor 205 not in synchronization with but independently of a potential applied to the conductor 260, the threshold voltage of the transistor 202 can be controlled. In particular, by applying a negative potential to the conductor 205, the threshold voltage of the transistor 202 can be substantially shifted positively. In addition, when the threshold voltage of the transistor 202 is higher than 0 V, the off-state current can be reduced. Accordingly, a drain current when a voltage applied to the conductor 260 is 0 V can be reduced.

The conductor 205 functioning as a second gate electrode is placed to overlap with the oxide 230 and the conductor 260.

That is, the channel formation region in the region 234 can be electrically surrounded by the electric field of the conductor 260 functioning as the first gate electrode and the electric field of the conductor 205 functioning as the second gate electrode. In this specification, a transistor structure in which the channel formation region is electrically surrounded by the electric fields of the first gate electrode and the second gate electrode is referred to as a surrounded channel (S-channel) structure.

In the conductor 205, the conductor 205a is formed in contact with an inner wall of the opening in an insulator 214 and the insulator 216 and the conductor 205b is formed on the inner side. Here, top surfaces of the conductor 205a and the conductor 205b can be substantially level with the top surface of the insulator 216. Note that although the transistor 202 has a structure in which the conductor 205a and the conductor 205b are stacked, the present invention is not limited thereto. For example, only the conductor 205b may be provided.

Here, for the conductor 205a, a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, and the like), and a copper atom (a conductive material through which the above impurities are less likely to pass) is preferably used. Moreover, it is preferable to use a conductive material having a function of inhibiting diffusion of oxygen (for example, at least one of oxygen atoms and oxygen molecules), that is, a conductive material through which the above oxygen is less likely to pass. Note that in this specification, a function of inhibiting diffusion of impurities or oxygen means a function of inhibiting diffusion of any one or all of the above impurities and the above oxygen.

When the conductor 205a has a function of inhibiting diffusion of oxygen, the conductivity of the conductor 205b can be prevented from being reduced because of oxidation. As a conductive material having a function of inhibiting diffusion of oxygen, for example, tantalum, tantalum nitride, ruthenium, or ruthenium oxide is preferably used. Accordingly, the conductor 205a may be a single layer or stacked layers of the above conductive materials. Thus, impurities such as hydrogen and water can be prevented from being diffused to the transistor 202 side through the conductor 205 from the substrate side from the insulator 214.

Furthermore, for the conductor 205b, a conductive material containing tungsten, copper, or aluminum as its main component is preferably used. Note that the conductor 205b is a single layer in the drawing but may have a stacked-layer structure, and for example, stacked layers of titanium, titanium nitride, and any of the above conductive materials may be used.

The conductor 209 can function as an electrode or a wiring. When the conductor 205 is used as the second gate electrode of the transistor 202, part of the conductor 209 can function as a gate wiring. In that case, the conductor 205 and the conductor 252d may be electrically connected to each other through the conductor 207 including the conductor 207a and the conductor 207b formed over the conductor 207a, and the conductor 209. The conductor 207 can be formed in the same step as the conductor 203 and the conductor 205.

The conductor 209 is electrically connected to the oxide 230 through the conductor 203, and can function as a source wiring or a drain wiring of the transistor 202. The conductor 209 may be used as an electrode for electrical connection with the element or the wiring positioned below the insulator 210.

The conductor 203 and the conductor 209 are provided under the oxide 230 to overlap with each other, so that a plug or an electrode for connecting the transistor 202 and the element or the wiring positioned below the insulator 210 can be provided to overlap with the transistor 202. Thus, the cell size can be reduced, which is preferable.

A material similar to that for the insulator 210 described in Embodiment 1 can be used for the insulator 210.

Moreover, the insulator 212 and the insulator 216 functioning as interlayer films preferably have a lower permittivity than the insulator 210. In the case where a material with a low permittivity is used for an interlayer film, the parasitic capacitance generated between wirings can be reduced. A material similar to that for the insulator 208, the insulator 216, and the insulator 280 described in Embodiment 1 can be used for the insulator 212 and the insulator 216 functioning as interlayer films.

The insulator 220, the insulator 222, and the insulator 224 each function as a gate insulator. A material similar to that for the insulator 220, the insulator 222, and the insulator 224 described in Embodiment 1 can be used for the insulator 220, the insulator 222, and the insulator 224.

The oxide 230 includes the oxide 230a, the oxide 230b over the oxide 230a, the oxide 230c over the oxide 230b, and the oxide 230d over the oxide 230c. The oxide 230 also includes the region 231, the region 232, the region 233, and the region 234. Note that at least part of the region 231 is preferably in contact with the insulator 274. Moreover, it is preferable that the concentration of at least one of hydrogen, nitrogen, and a metal element such as indium in at least part of the region 231 be higher than that in the region 234.

When the transistor 202 is turned on, the region 231*a* or the region 231*b* functions as the source region or the drain region. In addition, at least part of the region 234 functions as a region where a channel is formed.

Here, as illustrated in FIG. 24, the oxide 230 preferably includes the region 232. When the region 232 is a junction region, on-state current can be increased and leakage current (off-state current) in a non-conduction state can be reduced.

When the oxide 230*c* is provided over the oxide 230*a* and the oxide 230*b*, impurities can be inhibited from being diffused into the oxide 230*b* from the components formed below the oxide 230*a*. Moreover, when the oxide 230*c* is below the oxide 230*d*, impurities can be inhibited from being diffused into the oxide 230*c* from the components formed above the oxide 230*d*.

That is, the region 234 provided in the oxide 230*c* is surrounded by the oxide 230*a*, the oxide 230*b*, and the oxide 230*d*, the concentration of impurities such as hydrogen and nitrogen in the region can be kept low, and the oxygen concentration can be kept high. A semiconductor device using the oxide 230 having such a structure has favorable electrical characteristics and high reliability.

The oxide 230 has a curved surface between the side surface and the top surface. That is, an end portion of the side surface and an end portion of the top surface are preferably curved (hereinafter also referred to as a round shape). The radius of curvature of the curved surface at an end portion of the oxide 230*c* is greater than or equal to 3 nm and less than or equal to 10 nm, preferably greater than or equal to 5 nm and less than or equal to 6 nm, for example.

A material similar to that for the oxide 230 described in Embodiment 1 can be used for the oxide 230.

Here, the region 234 of the oxide 230 will be described.

The region 234 preferably has a stacked-layer structure of oxides which differ in the atomic ratio of metal elements. Specifically, in the case of the stacked-layer structure of the oxide 230*a*, the oxide 230*b*, and the oxide 230*c*, the atomic ratio of the element M to constituent elements in the metal oxide used as the oxide 230*a* is preferably greater than the atomic ratio of the element M to constituent elements in the metal oxide used as the oxide 230*b*. Moreover, the atomic ratio of the element M to constituent elements in the metal oxide used as the oxide 230*b* is preferably greater than the atomic ratio of the element M to constituent elements in the metal oxide used as the oxide 230*c*. Furthermore, the atomic ratio of the element M to In in the metal oxide used as the oxide 230*a* is preferably greater than the atomic ratio of the element M to In in the metal oxide used as the oxide 230*b*. Furthermore, the atomic ratio of the element M to In in the metal oxide used as the oxide 230*b* is preferably greater than the atomic ratio of the element M to In in the metal oxide used as the oxide 230*c*. Moreover, the atomic ratio of In to the element M in the metal oxide used as the oxide 230*b* is preferably greater than the atomic ratio of In to the element M in the metal oxide used as the oxide 230*a*. Furthermore, the atomic ratio of In to the element M in the metal oxide used as the oxide 230*c* is preferably greater than the atomic ratio of In to the element M in the metal oxide used as the oxide 230*b*. As the oxide 230*d*, a metal oxide which can be used as the oxide 230*a*, the oxide 230*b*, or the oxide 230*c* can be used.

As the oxide 230*a* and the oxide 230*b*, for example, a metal oxide having a composition of In:Ga:Zn=1:3:4, In:Ga:Zn=1:3:2, or In:Ga:Zn=1:1:1 can be used. As the oxide 230*c*, for example, a metal oxide having a composition of In:Ga:Zn=4:2:3, In:Ga:Zn=1:1:1, or In:Ga:Zn=5:1:6 can be used. As the oxide 230*d*, for example, a metal oxide having a composition of In:Ga:Zn=1:3:4, In:Ga:Zn=1:3:2, In:Ga:Zn=4:2:3, or In:Ga:Zn=1:1:1 can be used. Note that the above composition represents the atomic ratio of an oxide formed over a substrate or the atomic ratio of a sputtering target.

A combination of a metal oxide having a composition of In:Ga:Zn=1:3:4 as the oxide 230*a*, a metal oxide having a composition of In:Ga:Zn=1:1:1 as the oxide 230*b*, a metal oxide having a composition of In:Ga:Zn=4:2:3 as the oxide 230*c*, and a metal oxide having a composition of In:Ga:Zn=1:1:1 as the oxide 230*d* is particularly preferable because the oxide 230*c* can be interposed between the oxide 230*a*, the oxide 230*b*, and the oxide 230*d* each having a wider energy gap. Here, each of the oxide 230*a*, the oxide 230*b*, and the oxide 230*d* having a wide energy gap is referred to as a wide gap, and the oxide 230*c* having a relatively narrow energy gap is referred to as a narrow gap in some cases.

Next, the region 231 of the oxide 230 is described.

The region 231 is a region whose resistance is reduced by addition of a metal atom such as indium, a rare gas such as helium or argon, or impurities such as hydrogen and nitrogen to a metal oxide provided as the oxide 230. Note that each region 231 has higher conductivity than at least the oxide 230*c* in the region 234. Note that for addition of a metal atom, a rare gas, or impurities to the region 231, for example, a dopant which is at least one of a metal element, a rare gas, and impurities is added by plasma treatment, an ion implantation method by which an ionized source gas is subjected to mass separation and then added, an ion doping method by which an ionized source gas is added without mass separation, a plasma immersion ion implantation method, or plasma treatment.

That is, when the content of a metal atom such as indium in the region 231 of the oxide 230 is increased, the electron mobility can be increased and the resistance can be reduced.

Furthermore, when the insulator 274 containing impurity elements is deposited in contact with the oxide 230, impurities can be added to the region 231.

That is, the resistance of the region 231 to which an element that forms an oxygen vacancy or an element trapped by an oxygen vacancy is added is reduced. Typical examples of the element are hydrogen, boron, carbon, nitrogen, fluorine, phosphorus, sulfur, chlorine, titanium, and a rare gas. Typical examples of the rare gas element are helium, neon, argon, krypton, and xenon. Accordingly, the region 231 is made to contain one or more of the above elements.

Alternatively, as the insulator 274, a film which extracts and absorbs oxygen in the region 231 may be used. When oxygen is extracted, oxygen vacancies are generated in the region 231. Hydrogen, boron, carbon, nitrogen, fluorine, phosphorus, sulfur, chlorine, titanium, a rare gas, or the like is trapped by oxygen vacancies, whereby the resistance of the region 231 is reduced.

The width of the region 232 in the channel length direction can be controlled by the widths of the insulator 272 and the insulator 273.

Thus, by appropriately selecting the area of the region 232, a transistor having electrical characteristics necessary for the circuit design can be easily provided.

The insulator 250 functions as a gate insulating film. The insulator 250 is preferably placed in contact with a top surface of the oxide 230*d*. The insulator 250 is preferably formed using an insulator from which oxygen is released by heating. The insulator 250 is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy analysis (TDS analysis), for example. Note that the temperature of the film surface in the TDS analysis is preferably in a range higher than or equal to 100° C. and lower than or equal to 700° C., or higher than or equal to 100° C. and lower than or equal to 500° C.

For example, the insulator 250 may have a stacked-layer structure including the insulator 250*a* and the insulator 250*b*. When an insulator from which oxygen is released by heating is provided as the insulator 250*a* in contact with the top surface of the oxide 230*d*, oxygen can be effectively supplied to the region 234 of the oxide 230*c*. Furthermore, as in the insulator 224, the concentration of impurities such as water and hydrogen in the insulator 250*a* is preferably reduced. The thickness of the insulator 250*a* is greater than or equal to 1 nm and less than or equal to 20 nm, preferably greater than or equal to 5 nm and less than or equal to 10 nm.

The insulator 250*b* is preferably an insulator that can supply oxygen to the insulator 250*a* at or after the formation of the insulator 250*b*. Such an insulator can be formed in an atmosphere containing oxygen or using a target containing oxygen. For example, aluminum oxide is formed in an atmosphere containing oxygen by a sputtering method. The thickness of the insulator 250*b* is greater than or equal to 1 nm and less than or equal to 20 nm, preferably greater than or equal to 5 nm and less than or equal to 10 nm.

The insulator 250*b* is provided over the insulator 250*a*, whereby a larger amount of oxygen, that is, excess oxygen can be contained in the insulator 250*a*.

The conductor 260 functioning as the first gate electrode includes the conductor 260*a* and the conductor 260*b* over the conductor 260*a*. Titanium nitride or the like is preferably used for the conductor 260*a*. Moreover, a metal with high conductivity such as tungsten can be used for the conductor 260*b*, for example.

In the case where potentials are applied to the conductor 260 and the conductor 205, the channel formation region formed in the oxide 230 can be covered with an electric field generated from the conductor 260 and an electric field generated from the conductor 205.

That is, the channel formation region in the region 234 can be electrically surrounded by the electric field of the conductor 260 functioning as the first gate electrode and the electric field of the conductor 205 functioning as the second gate electrode.

The insulator 272 functioning as a barrier film is provided in contact with the side surface of the insulator 250 and the side surface of the conductor 260. The insulator 270 functioning as a barrier film is provided over the conductor 260.

Here, a material similar to that for the insulator 270 described in Embodiment 1 and a material similar to that for the insulator 272 described in Embodiment 1 can be used for the insulator 270 and the insulator 272, respectively.

In the case where the transistor is miniaturized and formed so that a channel length is approximately greater than or equal to 10 nm and less than or equal to 30 nm, impurity elements in the structure bodies provided in the vicinity of the transistor 202 might be diffused, and the region 231*a* and the region 231*b*, or the region 232*a* and the region 232*b* might be electrically connected to each other.

In view of the above, the insulator 272 and the insulator 273 are formed as described in this embodiment so that impurities such as hydrogen and water can be inhibited from entering the insulator 250 and the conductor 260, and oxygen in the insulator 250 can be prevented from being diffused to the outside. Accordingly, when a first gate voltage is 0 V, the source region and the drain region can be prevented from being electrically connected to each other directly or through the region 232 or the like.

The insulator 273 preferably has a lower permittivity than the insulator 272. When a material with a low permittivity is used for an interlayer film, the parasitic capacitance generated between the conductor 130 and the conductor 260, which is described later, can be reduced. A material similar to that for the insulator 212 and the insulator 216 can be used for the insulator 273.

The insulator 274 is provided to cover at least the oxide 230, the insulator 271, the insulator 272, and the insulator 273.

Moreover, for the insulator 274, an insulating material having a function of inhibiting passage of oxygen and impurities such as water and hydrogen is preferably used. For example, for the insulator 274, silicon nitride, silicon nitride oxide, silicon oxynitride, aluminum nitride, or aluminum nitride oxide is preferably used. When such an insulator 274 is formed, entry of oxygen through the insulator 274 and supply of oxygen to oxygen vacancies in the region 231*a* and the region 231*b*, which decrease the carrier density, can be prevented. Furthermore, impurities such as water and hydrogen can be prevented from passing through the insulator 274 and being diffused into the region 234.

Note that when the region 231 is provided by deposition of the insulator 274, the insulator 274 preferably contains at least one of hydrogen and nitrogen. When an insulator including impurities such as hydrogen and nitrogen is used as the insulator 274, impurities such as hydrogen and nitrogen are added to the oxide 230, so that the resistance of the region 231 can be reduced in the oxide 230.

The insulator 280 functioning as an interlayer film is preferably provided over the insulator 274. As in the insulator 224 or the like, the concentration of impurities such as water and hydrogen in the insulator 280 is preferably reduced. Note that the insulator 280 may have a stacked-layer structure of similar insulators.

[Capacitor 101]

As illustrated in FIG. 23, the capacitor 101 shares some components with the transistor 202. This embodiment shows an example in which part of the region 231*b* provided in the oxide 230 of the transistor 202 functions as one electrode of the capacitor 101.

The capacitor 101 includes part of the region 231*b* of the oxide 230, the insulator 274, and the conductors 130 (a conductor 130*a* and a conductor 130*b*) over the insulator 274. Furthermore, at least part of the conductor 130 is preferably placed to overlap with part of the region 231*b*.

The part of the region 231*b* of the oxide 230 functions as one electrode of the capacitor 101 and the conductor 130 functions as the other electrode of the capacitor 101. That is, the region 231*b* functions as both one of the source and the drain of the transistor 202 and one electrode of the capacitor 101. Part of the insulator 274 functions as a dielectric of the capacitor 101.

Here, the side surface of the conductor 260 functioning as a first gate electrode of the transistor 202 is provided with the insulator 272 and the insulator 273. Since the insulator 272 and the insulator 273 are provided between the conductor 260 and the conductor 130, the parasitic capacitance between the conductor 260 and the conductor 130 can be reduced.

The conductor 130 preferably has a stacked-layer structure including the conductor 130*a* and the conductor 130*b* placed over the conductor 130*a*. For example, a conductive material containing titanium, titanium nitride, tantalum, or tantalum nitride as its main component is preferably used for the conductor 130a, and a conductive material containing tungsten, copper, or aluminum as its main component is preferably used for the conductor 130b. The conductor 130 may have a single-layer structure or a stacked-layer structure of three or more layers.

[Cell 601]

The semiconductor device of one embodiment of the present invention includes the transistor 202, the capacitor 101, and the insulator 280 functioning as an interlayer film. Furthermore, the conductor 252 (the conductor 252a, the conductor 252b, the conductor 252c, and the conductor 252d) functioning as a plug that is electrically connected to the transistor 202 and the capacitor 101 is included.

As a plug electrically connected to the conductor 130 functioning as the electrode of the capacitor 101, the conductor 252b may be provided. The conductor 130 can function as the electrodes of the capacitors 101 of a plurality of cells 601. Thus, the conductor 252b is not necessarily provided in each cell 601 and the number of plugs to be provided in the plurality of cells may be smaller than the number of cells. For example, in a cell array in which the cells 601 are arranged in a matrix, one plug may be provided for each row or one plug may be provided for each column.

The conductor 252 is formed in contact with an inner wall of an opening in the insulator 280. Here, the top surface of the conductor 252 can be substantially level with the top surface of the insulator 280. Note that although the conductor 252 in FIG. 23 has a two-layer structure, the present invention is not limited thereto. For example, the conductor 252 may be a single layer or have a stacked-layer structure of three or more layers.

The insulator 280 is preferably provided to cover the insulator 274 and the conductor 130. As in the insulator 224 or the like, the concentration of impurities such as water and hydrogen in the insulator 280 is preferably reduced. Note that the insulator 280 may have a stacked-layer structure of similar insulators.

The insulator 280 preferably has a lower permittivity than the insulator 210. In the case where a material with a low permittivity is used for an interlayer film, the parasitic capacitance generated between wirings can be reduced.

For example, for the insulator 280 functioning as an interlayer film, a single layer or stacked layers of any of insulators such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

Furthermore, the conductor 252a, the conductor 252b, the conductor 252c, and the conductor 252d are placed in the openings formed in the insulator 280 and the like. Note that the top surfaces of the conductor 252a, the conductor 252b, the conductor 252c, and the conductor 252d may be substantially level with the top surface of the insulator 280.

The conductor 252a is in contact with the region 233 functioning as one of a source region and a drain region of the transistor 202 through the opening formed in the insulator 280 and the insulator 274. Since the resistance of the region 233 is reduced, the contact resistance between the conductor 252a and the region 233 can be reduced. The conductor 252b is in contact with the conductor 130 that is one electrode of the capacitor 101 through the opening formed in the insulator 280. The conductor 252c is in contact with the conductor 260 functioning as the first gate electrode of the transistor 202 through the opening formed in the insulator 280, the insulator 274, the insulator 271, and the insulator 270. The conductor 252d is in contact with the conductor 207 through the opening formed in the insulator 280, the insulator 274, the insulator 222, and the insulator 220, and is electrically connected to the conductor 205 functioning as the second gate electrode of the transistor 202 through the conductor 209.

Here, the conductor 252a is in contact with at least the top surface of the oxide 230, preferably also in contact with the side surface of the oxide 230. It is particularly preferable that the conductor 252a be in contact with one or both of the side surface on the C side and the side surface on the D side, which intersect with the channel width direction of the oxide 230. Moreover, the conductor 252a may be in contact with the side surface on the A side, which intersects with the channel length direction of the oxide 230. When the conductor 252a is in contact with the side surface of the oxide 230 in addition to the top surface of the oxide 230 as described above, the contact area of the contact portion of the conductor 252a and the oxide 230 can be increased without an increase in the area of the top surface of the contact portion, so that the contact resistance between the conductor 252a and the oxide 230 can be reduced. Accordingly, miniaturization of the source electrode and the drain electrode of the transistor can be achieved and, in addition, the on-state current can be increased.

For the conductor 252, a conductive material containing tungsten, copper, or aluminum as its main component is preferably used. The conductor 252 may have a stacked-layer structure, and for example, stacked layers of titanium, titanium nitride, and any of the above conductive materials may be used.

In the case where the conductor 252 has a stacked-layer structure, a conductive material having a function of inhibiting passage of impurities such as water and hydrogen is preferably used for a conductor in contact with the insulator 274 and the insulator 280, as in the conductor 205a or the like. For example, tantalum, tantalum nitride, titanium, titanium nitride, ruthenium, or ruthenium oxide is preferably used. The conductive material having a function of inhibiting passage of impurities such as water and hydrogen may be a single layer or stacked layers. When the conductive material is used, impurities such as hydrogen and water can be inhibited from entering the oxide 230 through the conductor 252 from a layer above the insulator 280.

An insulator having a function of inhibiting passage of impurities such as water and hydrogen may be provided in contact with the inner wall of the opening in the insulator 274 and the insulator 280 in which the conductor 252 is embedded. As such an insulator, an insulator which can be used as the insulator 210, such as aluminum oxide is preferably used, for example. Accordingly, impurities such as hydrogen and water can be inhibited from entering the oxide 230 through the conductor 252 from the insulator 280 or the like. Moreover, for example, the insulator can be deposited with good coverage by using an ALD method or a CVD method.

Although not illustrated, conductors functioning as wirings may be placed in contact with the top surface of the conductor 252. A conductive material containing tungsten, copper, or aluminum as its main component is preferably used for the conductors functioning as the wirings.

Structure Example 4 of Semiconductor Device

FIG. 25(A), FIG. 25(B), FIG. 25(C), and FIG. 25(D) are a top view and cross-sectional views of a transistor 204 of one embodiment of the present invention, a capacitor 102, and the periphery of the transistor 204. Note that in this specification, a semiconductor device including one capacitor and at least one transistor is referred to as a cell.

Figure 25:
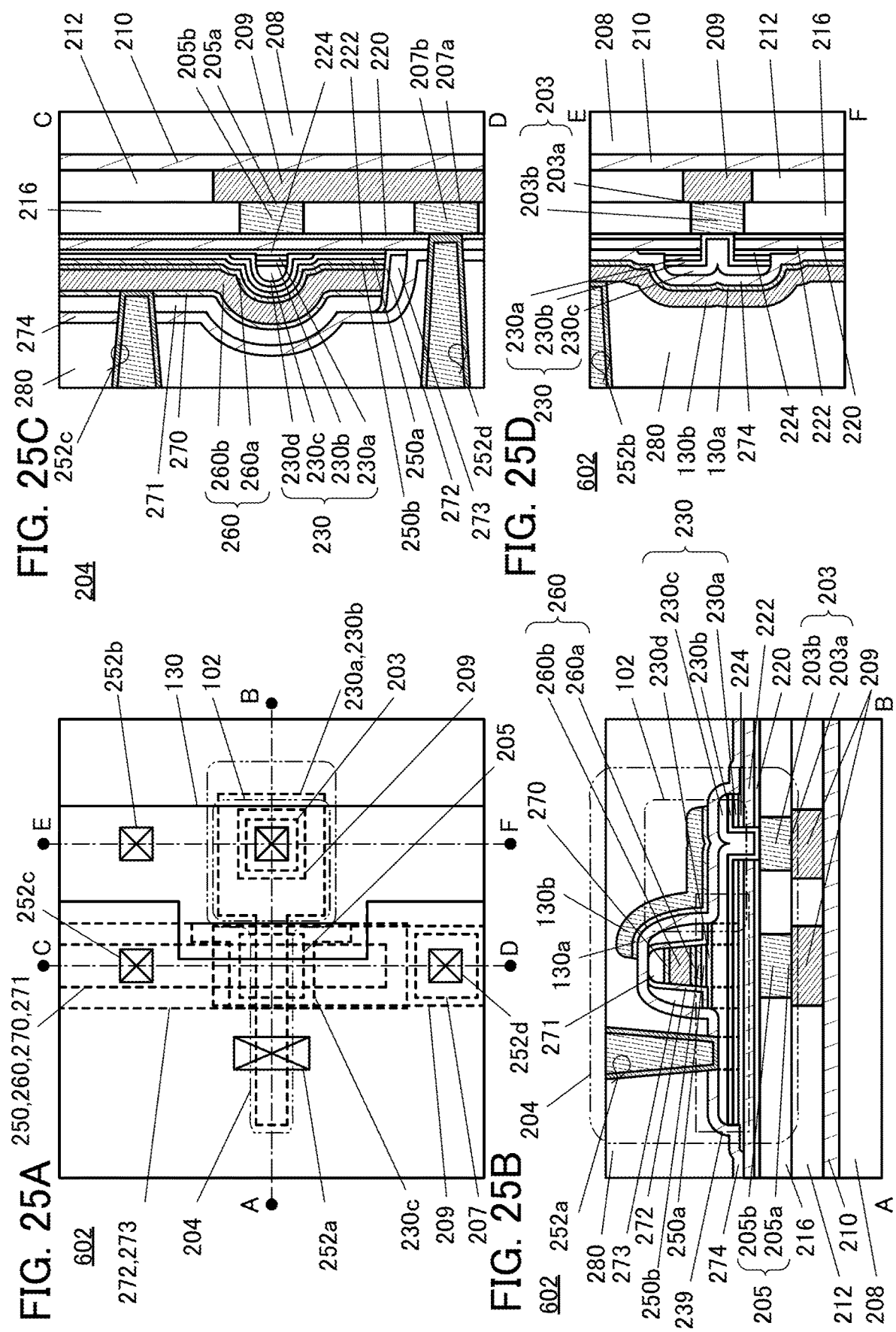
FIGS. 25A-25D A top view and cross-sectional views of a semiconductor device of one embodiment of the present invention.

A cell 602 illustrated in FIG. 25 includes the transistor 204 and the capacitor 102, and is different from the transistor 202 described above in the structures of the conductor 203 and the conductor 205. In addition, the shapes of the insulator 250, the conductor 260, the insulator 270, and the insulator 271 are different from those of the transistor 202.

The conductor 203 and the conductor 205 are provided over the conductor 209 and the insulator 212. The conductor 203 and the conductor 205 can be formed using a material and a method similar to those for the conductor 209. However, in the case where a defect in the shape of the conductor 209 might be caused in processing the conductor 203 and the conductor 205, a material different from that for the conductor 209 is preferably used for the conductor 203 and the conductor 205. The insulator 216 can be formed using a material and a method similar to those for the insulator 212.

The side surfaces of the insulator 250, the conductor 260, the insulator 270, and the insulator 271 are tapered. At least the side surfaces of the insulator 250 and the conductor 260 are provided with the insulator 272 and the insulator 273, the side surfaces of the insulator 250 and the conductor 260 are preferably perpendicular to the surface of the substrate or the surfaces of the insulator 220 and the insulator 222. In contrast, when an insulating film to be the insulator 272 and the insulator 273 is formed, the side surfaces of the insulator 250 and the conductor 260 are preferably tapered because coverage is improved. The taper angle of the side surfaces of the insulator 250 and the conductor 260 can be adjusted as appropriate in consideration of the ease of the fabrication in the process.

An example is shown in which the cell 602 illustrated in FIG. 25 is different from the transistor 202 in the structures of the conductor 203 and the conductor 205 and the shapes of the insulator 250, the conductor 260, the insulator 270, and the insulator 271; however, either the structures of the conductor 203 and the conductor 205 or the shapes of the insulator 250, the conductor 260, the insulator 270, and the insulator 271 may be different from those of the transistor 202.

Structure Example 5 of Semiconductor Device

FIG. 26(A), FIG. 26(B), FIG. 26(C), and FIG. 26(D) are a top view and cross-sectional views of a transistor 206 of one embodiment of the present invention, a capacitor 103, and the periphery of the transistor 206. Note that in this specification, a semiconductor device including one capacitor and at least one transistor is referred to as a cell.

Figure 26:
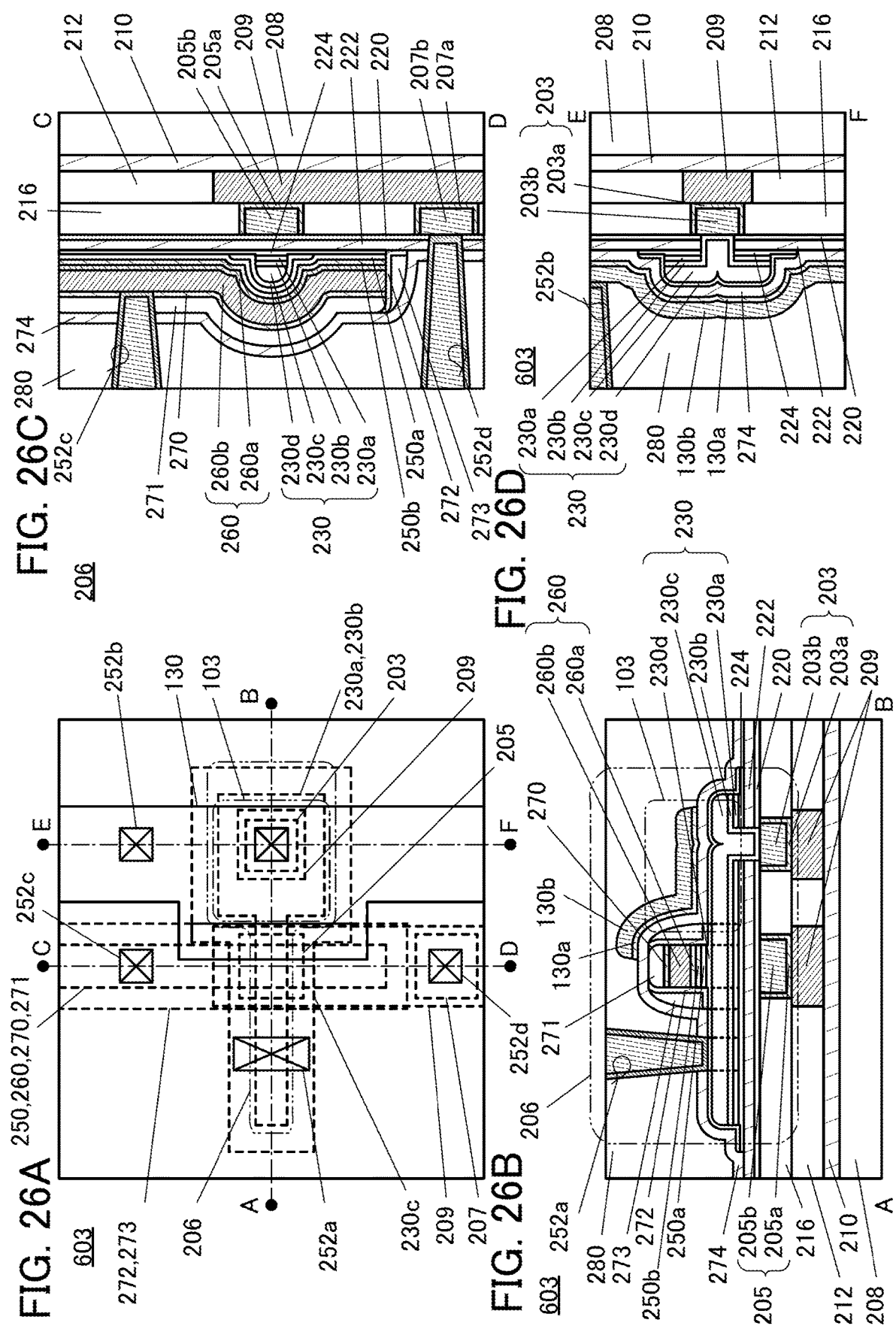
FIGS. 26A-26D A top view and cross-sectional views of a semiconductor device of one embodiment of the present invention.

A cell 603 illustrated in FIG. 26 includes the transistor 206 and the capacitor 103, and is different from the transistor 202 described above in that the oxide 230d is not etched and remains over the region 231 and the region 233.

In that case, an end portion of the oxide 230c is covered with the oxide 230d, so that entry of impurities into the oxide 230, release of oxygen from the oxide 230, or the like can be inhibited, which is preferable.

Alternatively, the conductor 203 and the conductor 205 may have a structure illustrated in FIG. 25. Alternatively, the insulator 250, the conductor 260, the insulator 270, and the insulator 271 may have a shape illustrated in FIG. 25.

<Structure of Cell Array>

Figure 27:
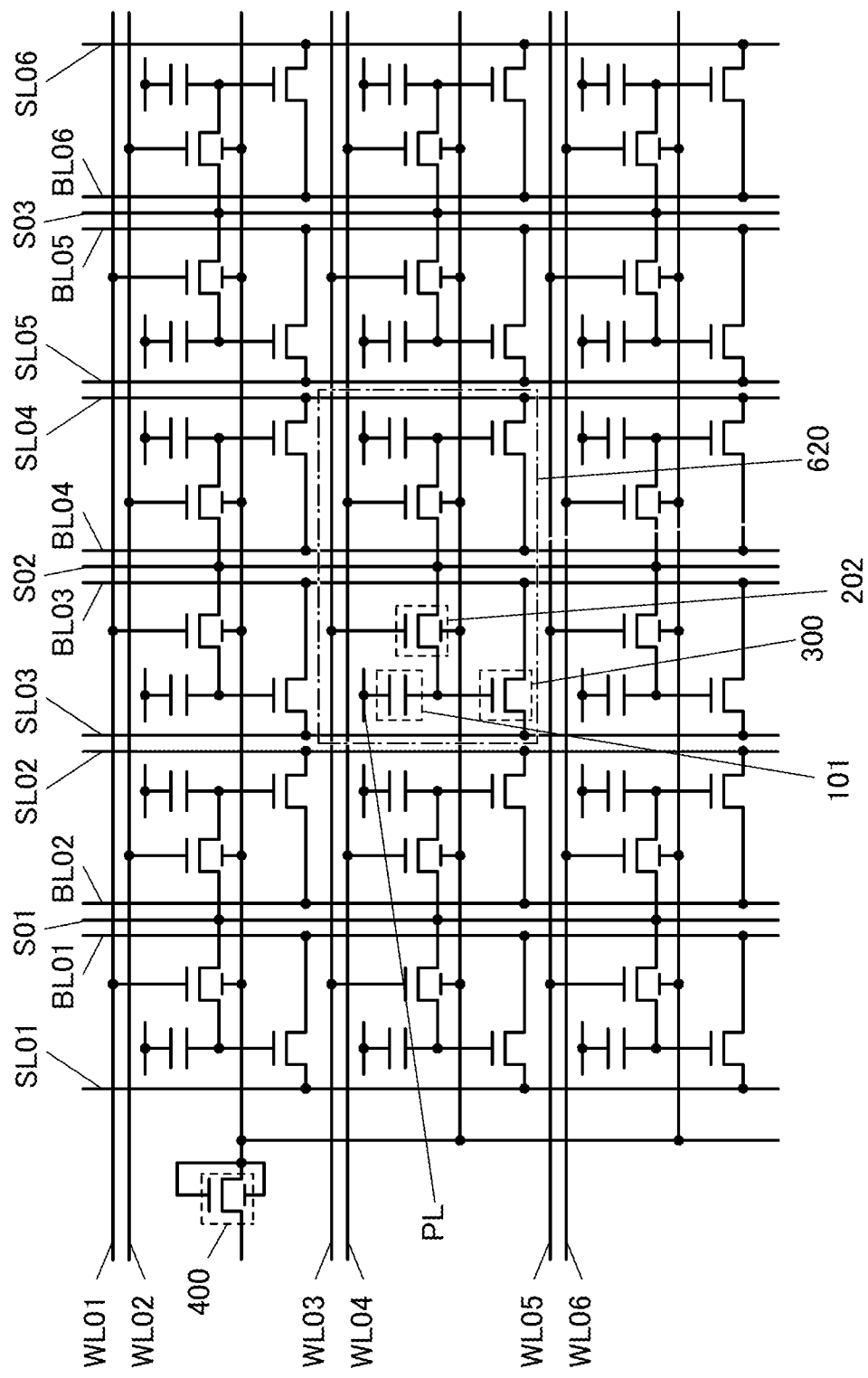
FIG. 27 A circuit diagram of a semiconductor device of one embodiment of the present invention.

Here, FIG. 27 and FIG. 28 illustrate examples of a cell array of this embodiment. The cells 601 each including the transistor 202 and the capacitor 101, which are illustrated in FIG. 23, and transistors 300 electrically connected to the cells 601 are arranged in a matrix, for example, whereby a cell array can be formed.

Figure 28A:
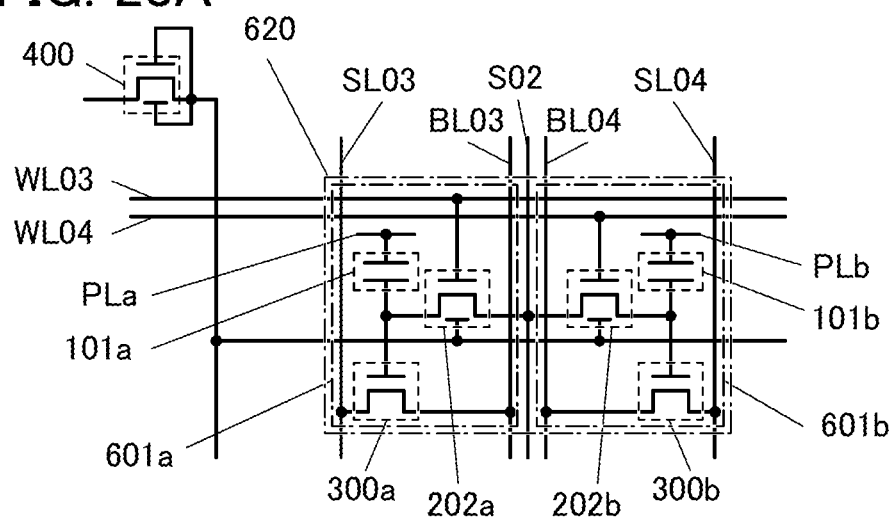
FIGS. 28A and 28B A circuit diagram and a cross-sectional view of a semiconductor device of one embodiment of the present invention.
Figure 28B:
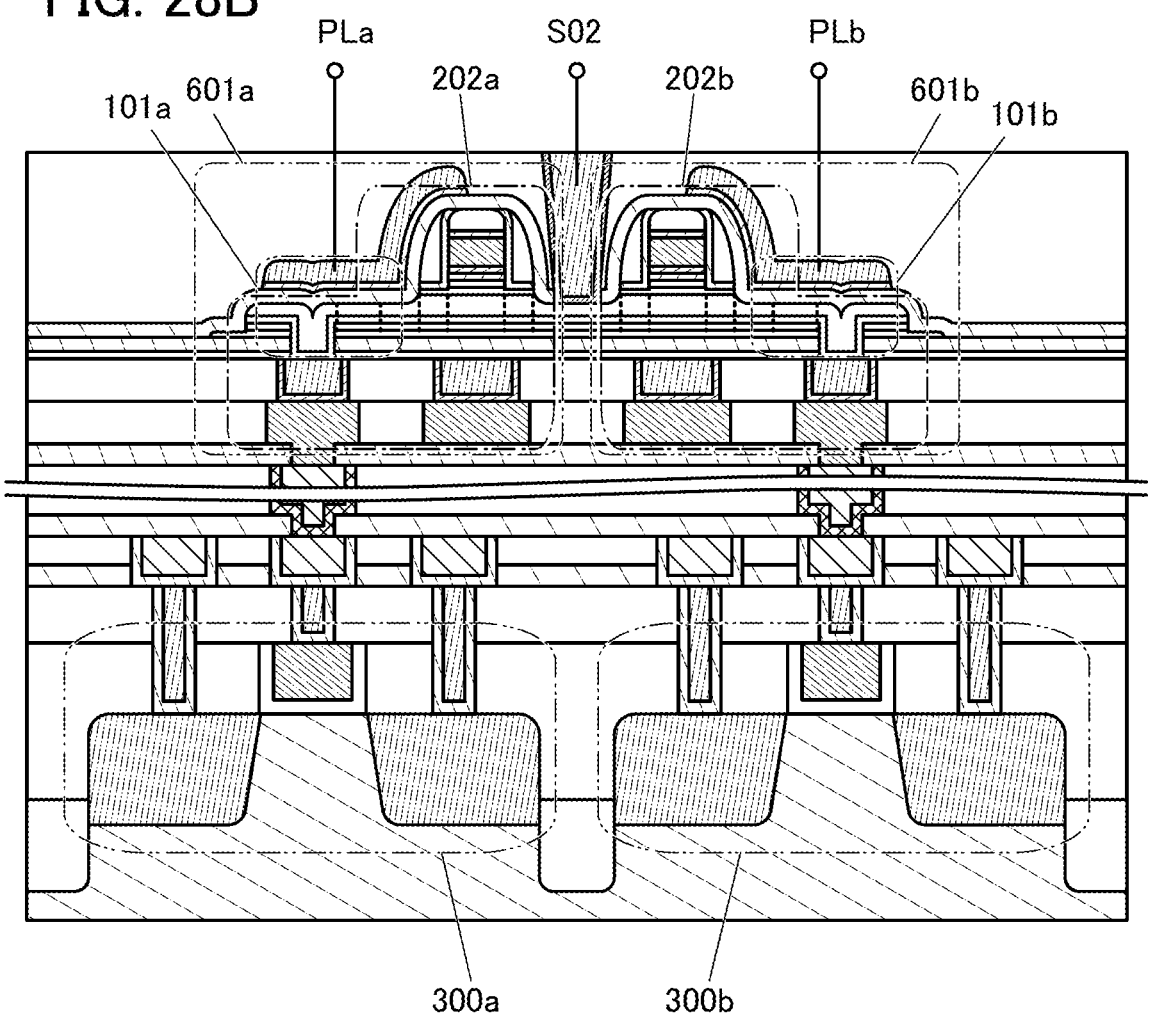

FIG. 27 is a circuit diagram showing one embodiment of a cell array in which the cells 601 illustrated in FIG. 23 and the transistors 300 electrically connected to the cells 601 are arranged in a matrix. FIG. 28(A) is a circuit diagram of a circuit 620 extracted from the cell array, and FIG. 28(B) is a schematic cross-sectional view of the cell 601 and the transistor 300 and corresponds to the cell array.

A transistor provided on a semiconductor substrate can be used as the transistor 300. The semiconductor substrate preferably includes a semiconductor such as a silicon-based semiconductor, and preferably contains single crystal silicon. Alternatively, a semiconductor substrate containing Ge (germanium), SiGe (silicon germanium), GaAs (gallium arsenide), GaAlAs (gallium aluminum arsenide), or the like may be used. In this case, the transistor 300 is of either a p-channel type or an n-channel type. Like the transistor 202, the transistor 300 can be a transistor including an oxide semiconductor.

In FIG. 27, one of the source and the drain of each of the transistors 202 included in the cells 601 which are adjacent in the row direction is electrically connected to common wirings (S01, S02, and S03). Furthermore, the wirings are also electrically connected to one of the source and the drain of each of the transistors 202 included in the cells arranged in the column direction. In contrast, the first gates of the transistors 202 included in the cells 601 which are adjacent in the row direction are electrically connected to different wirings WL (WL01 to WL06). Furthermore, the second gates of the transistors 202 included in the cells 601 may be electrically connected to a transistor 400. By a potential applied to the second gate of the transistor 202 through the transistor 400, the threshold voltage of the transistor can be controlled.

The first electrode of the capacitor 101 included in the cell 601 is electrically connected to the other of the source and the drain of the transistor 202 and a gate of the transistor 300. At this time, the first electrode of the capacitor 101 is formed using part of components of the transistor 202 in some cases. In addition, the second electrode of the capacitor 101 included in the cell 601 is electrically connected to a wiring PL. The potential of the wiring PL electrically connected to the second electrode of the capacitor 101 may be the same or different between the cells 601. For example, the wiring PL may have a common potential per column or may have a common potential per row.

One of a source and a drain of the transistor 300 is electrically connected to a wiring SL (SL01 to SL06), and the other of the source and the drain of the transistor 300 is electrically connected to a wiring BL (BL01 to BL06).

As illustrated in FIG. 28(B), a cell 601a includes a transistor 202a and a capacitor 101a, and is electrically connected to a gate of a transistor 300a. A cell 601b includes a transistor 202b and a capacitor 101b, and is electrically connected to a gate of a transistor 300b.

One of a source and a drain of the transistor 202a and one of a source and a drain of the transistor 202b are electrically connected to the S02.

One of the source and the drain of the transistor 202 is electrically connected to the gate of the transistor 300 and a first electrode of the capacitor 101a, whereby a desired potential can be applied to and retained in the gate of the transistor 300. The transistor 202 including an oxide semiconductor in a channel formation region has an extremely low leakage current in a non-conduction state. Thus, the potential applied to the gate electrode of the transistor 300 can be retained for a long time.

Such a cell array can be used for a memory device or an arithmetic circuit.

[Transistor 400]

Figure 29:
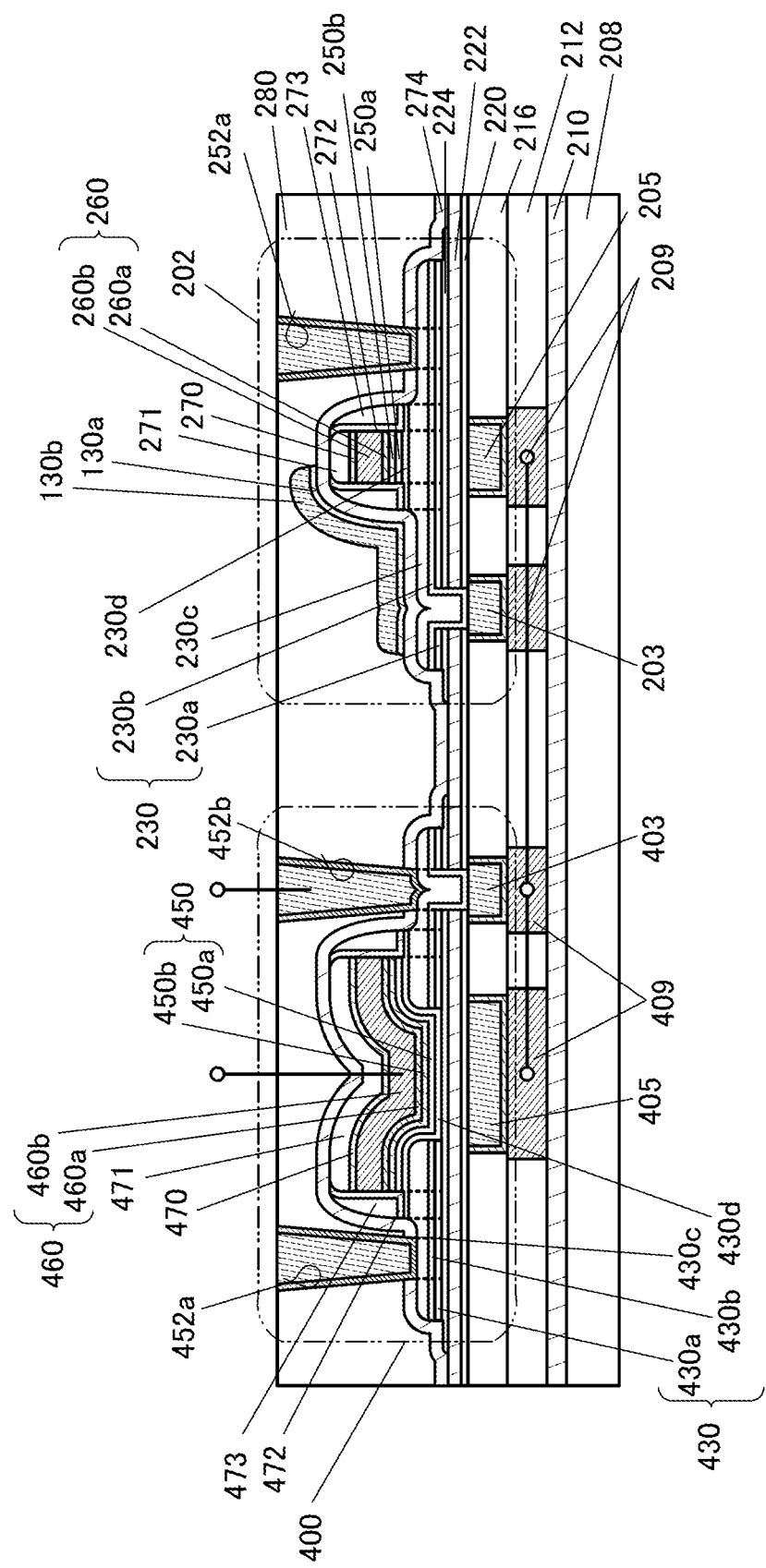
FIG. 29 A cross-sectional view of a semiconductor device of one embodiment of the present invention.
Figure 30C:
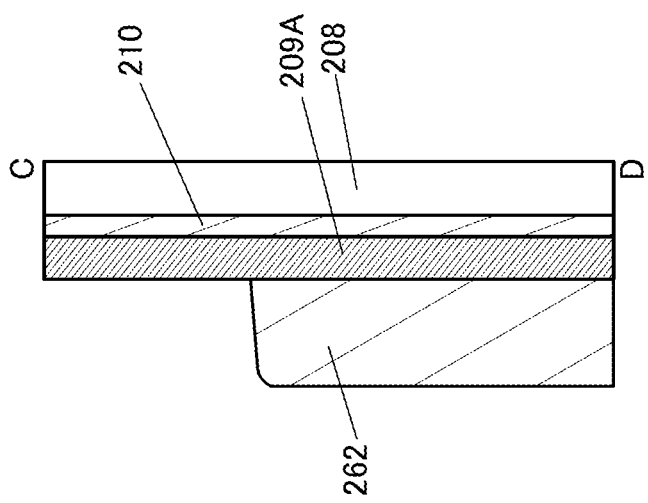
FIGS. 30A-30D A top view and cross-sectional views illustrating a method for manufacturing a semiconductor device of one embodiment of the present invention.
Figure 30D:
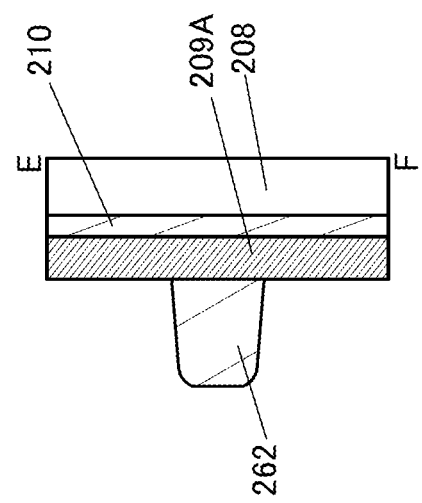
Figure 30A:
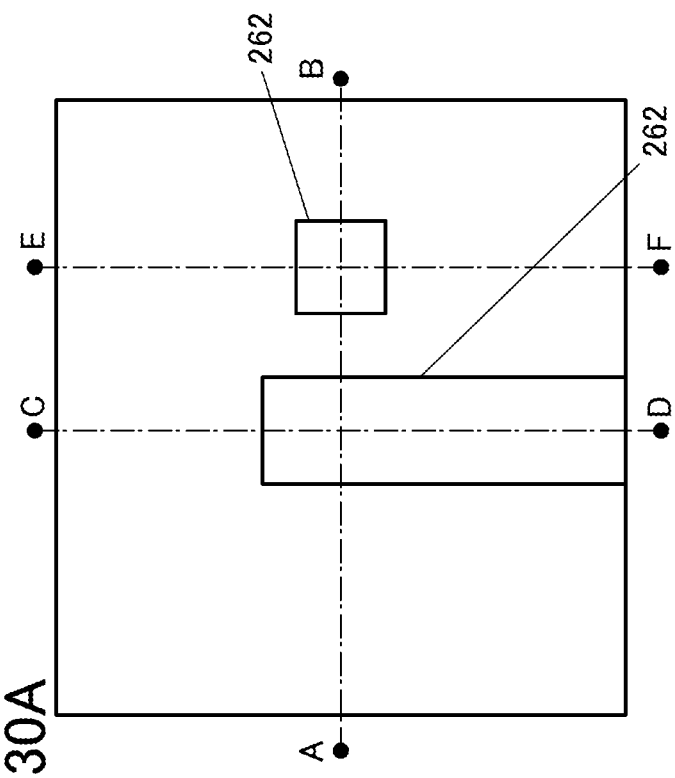
Figure 30B:
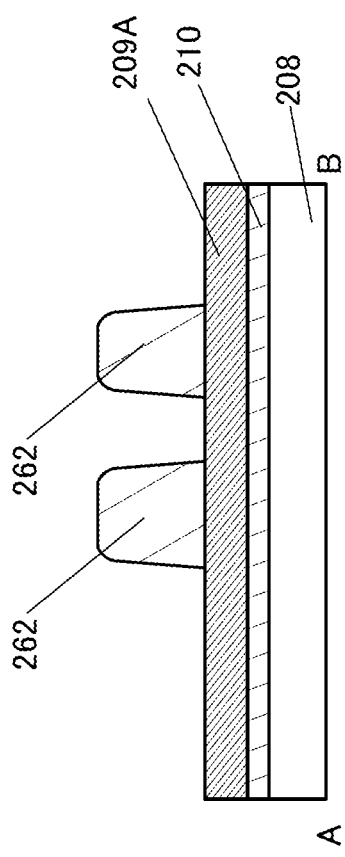
Figure 31C:
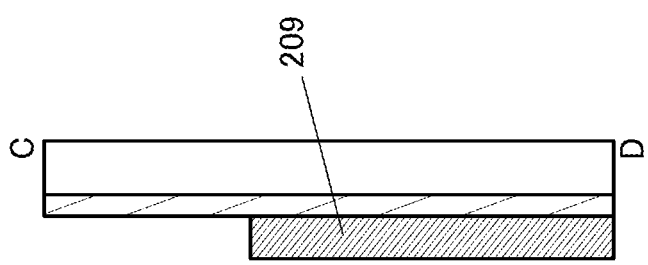
FIGS. 31A-31D A top view and cross-sectional views illustrating a method for manufacturing a semiconductor device of one embodiment of the present invention.
Figure 31D:
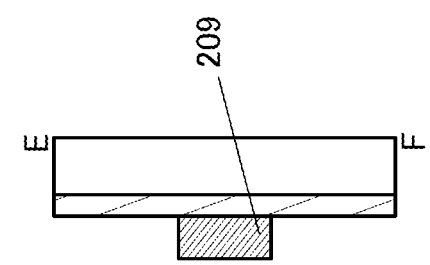
Figure 31A:
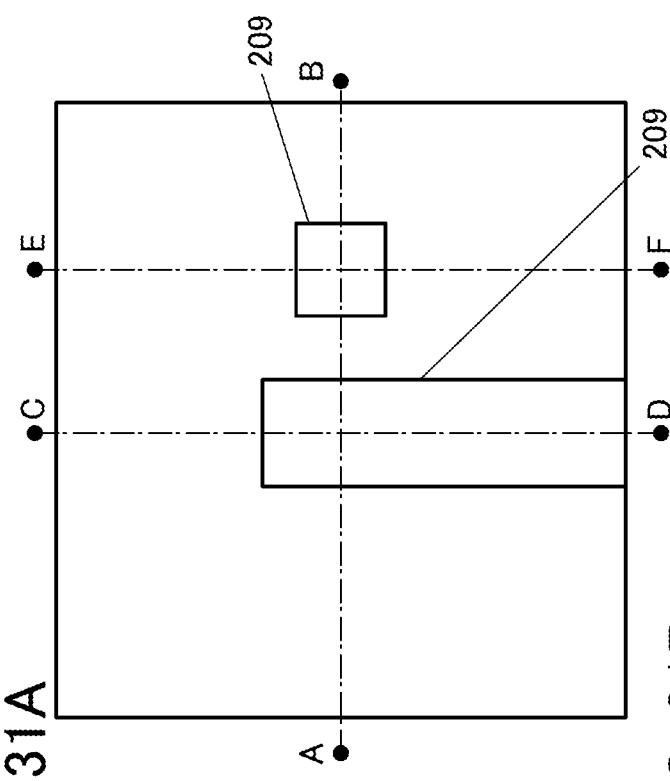
Figure 31B:
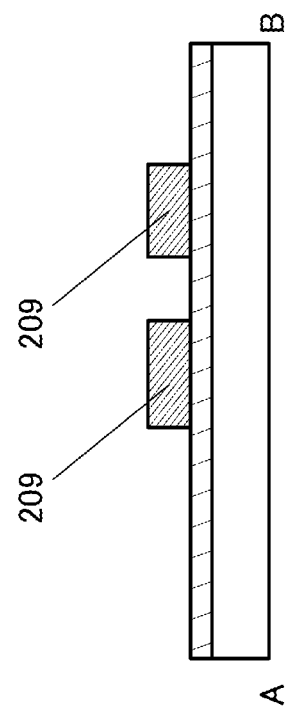
Figure 32C:
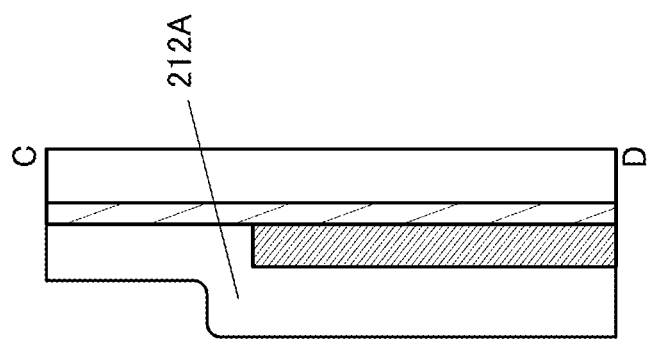
FIGS. 32A-32D A top view and cross-sectional views illustrating a method for manufacturing a semiconductor device of one embodiment of the present invention.
Figure 32D:
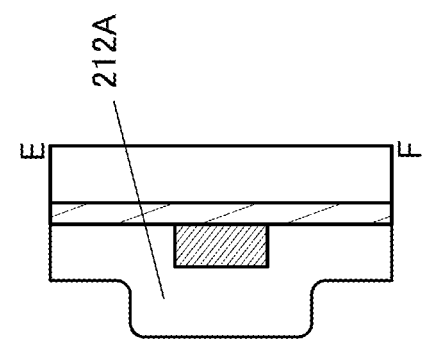
Figure 32A:
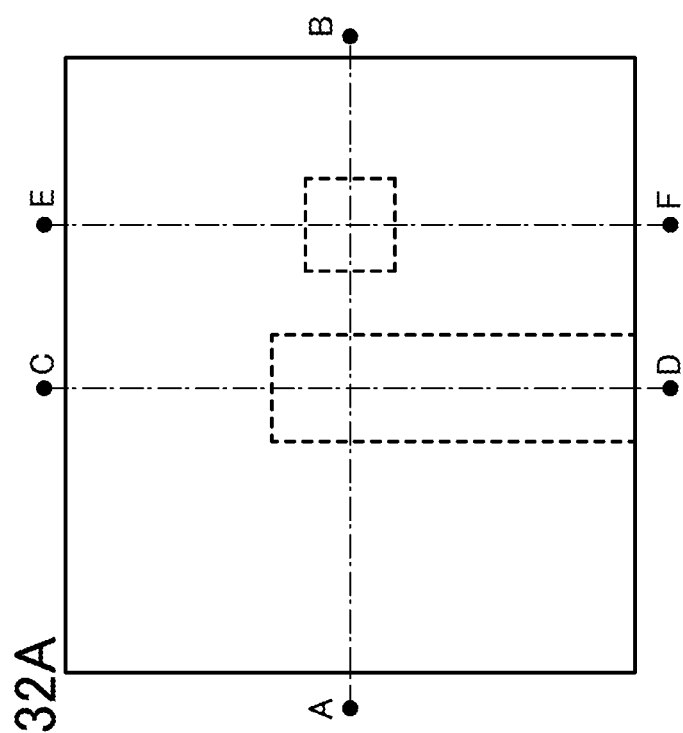
Figure 32B:
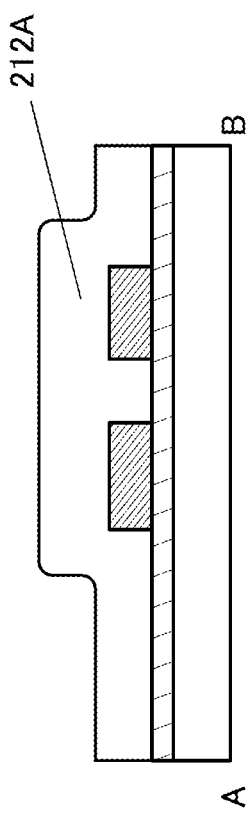
Figure 35C:
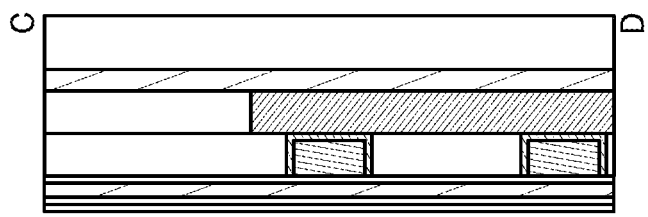
FIGS. 35A-35D A top view and cross-sectional views illustrating a method for manufacturing a semiconductor device of one embodiment of the present invention.
Figure 35D:
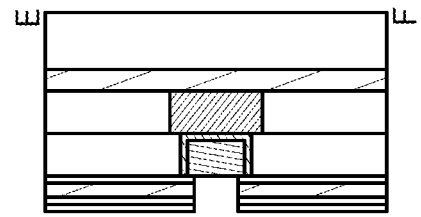
Figure 35A:
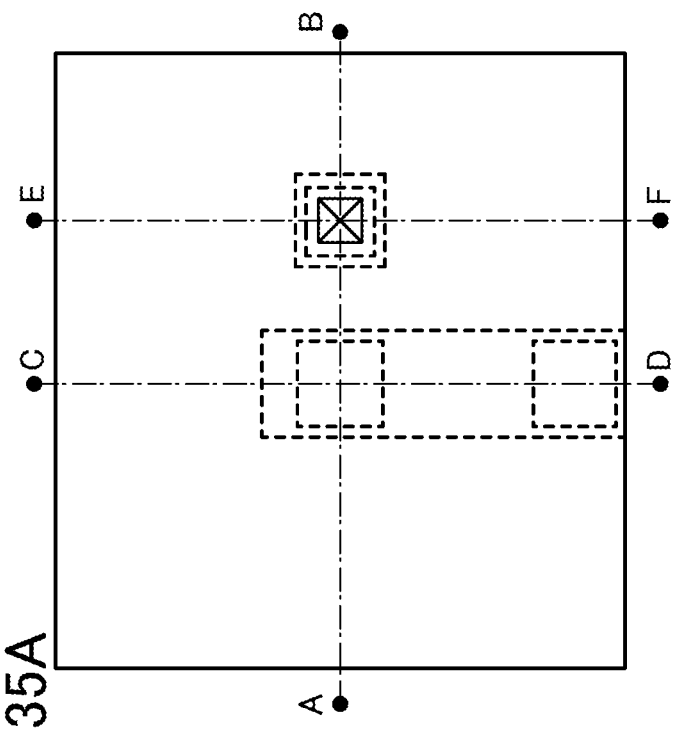
Figure 35B:
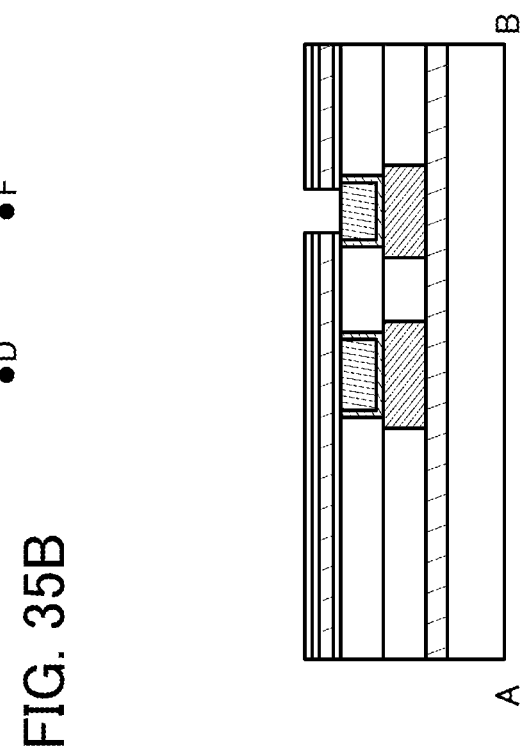
Figure 36C:
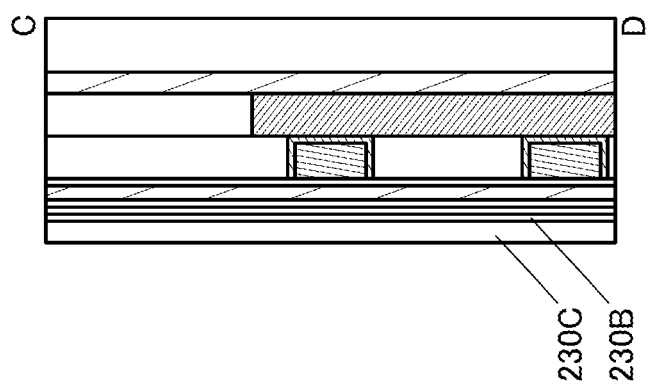
FIGS. 36A-36D A top view and cross-sectional views illustrating a method for manufacturing a semiconductor device of one embodiment of the present invention.
Figure 36D:
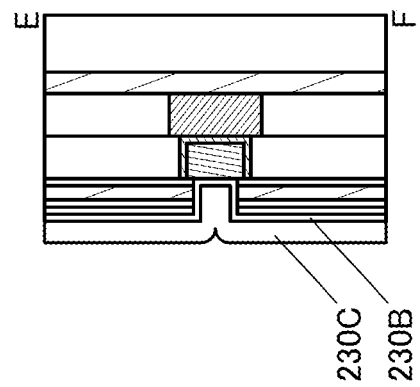
Figure 36A:
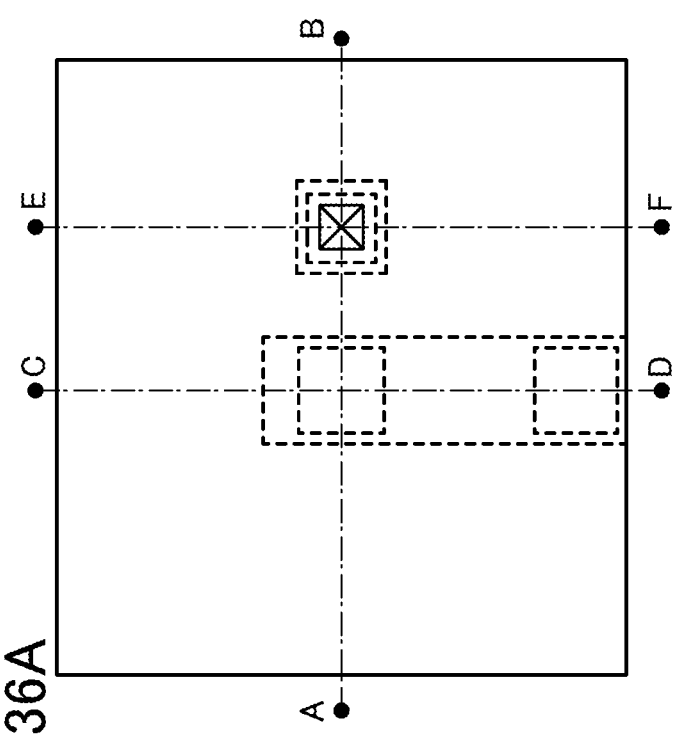
Figure 36B:
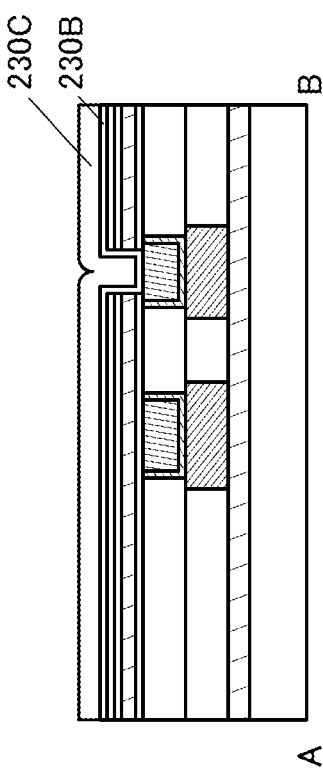

FIG. 29 is a schematic cross-sectional view illustrating one embodiment of the transistor 400. The transistor 400 may have a structure different from that of the transistor 202.

The transistor 400 is preferably formed using the same material as that for the transistor 202.

A conductor 409 can be formed using a material similar to that for the conductor 209 in the same step as the conductor 209. A conductor 403 and a conductor 405 can be formed using a material similar to that for the conductor 203 and the conductor 205 in the same step as those conductors. The conductor 405 can function as a second gate electrode of the transistor 400.

An oxide 430a, an oxide 430b, an oxide 430c, and an oxide 430d can be formed using a material similar to that for the oxide 230a, the oxide 230b, the oxide 230c, and the oxide 230d in the same step as those oxides. In the transistor 400, part of the oxide 430d functions as a channel formation region, and the oxide 430a, the oxide 430b, the oxide 430c, and the oxide 430d each include, like the oxide 230, a low-resistance region functioning as a source region or a drain region. Furthermore, a contact region having a lower resistance is preferably provided in each of the oxide 430a, the oxide 430b, and the oxide 430c.

An insulator 450a and an insulator 450b can be formed using a material similar to that for the insulator 250a and the insulator 250b in the same step as those insulators, and an insulator 450 including the insulator 450a and the insulator 450b can function as a gate insulating film. A conductor 460a and a conductor 460b can be formed using a material similar to that for the conductor 260a and the conductor 260b in the same step as those conductors, and a conductor 460 including the conductor 460a and the conductor 460b can function as a first gate electrode.

An insulator 470 can be formed using a material similar to that for the insulator 270 in the same step as the insulator 270. An insulator 471 can be formed using a material similar to that for the insulator 271 in the same step as the insulator 271. An insulator 472 can be formed using a material similar to that for the insulator 272 in the same step as the insulator 272. An insulator 473 can be formed using a material similar to that for the insulator 273 in the same step as the insulator 273.

Opening portions are provided in the insulator 280 and the insulator 274, and a conductor 452a and a conductor 452b, which are connected to the oxide 430, are placed.

In the transistor 400, one of a source region and a drain region is electrically connected to the conductor 403 through an opening provided in the oxide 430a, the insulator 224, the insulator 222, and the insulator 220. The conductor 403 is electrically connected to the conductor 405 functioning as the second gate electrode through the conductor 409. One of the source region and the drain region is electrically connected to the conductor 460 functioning as the second gate electrode through the conductor 452b. In other words, one of the source region and the drain region, the first gate electrode, and the second gate electrode are electrically connected to each other, whereby a diode connection is formed in the transistor 400.

One of the source and the drain of the diode-connected transistor 400 is electrically connected to the second gate electrode of the transistor 202 through the conductor 409, the conductor 209, and the like. Thus, the potential of the second gate electrode of the transistor 202 can be controlled by the transistor 400. A channel formation region is provided in the oxide 430d; therefore, the transistor 400 has an extremely low leakage current in a non-conduction state. Thus, when a negative potential is applied to the second gate electrode of the transistor 202, for example, the potential of the second gate electrode of the transistor 202 can be retained for a long time even without supply of power to the transistor 400.

The transistor 400 is not necessarily provided in each cell 601 and a plurality of cells may be provided with a smaller number of transistors 400 than that of the cells. For example, in a cell array in which the cells 601 are arranged in a matrix, one transistor 400 may be provided in the cell array, one transistor 400 may be provided in each row, or one transistor 400 may be provided in each column.

<Method for Manufacturing Semiconductor Device>

Next, a method for manufacturing a semiconductor device including the transistor 202 of the present invention will be described with reference to FIG. 30 to FIG. 50. In FIG. 30 to FIG. 50, (A) of each drawing is a top view. Moreover, (B) of each drawing is a cross-sectional view corresponding to a portion denoted by dashed-dotted line A-B in (A). Furthermore, (C) of each drawing is a cross-sectional view corresponding to a portion denoted by dashed-dotted line C-D in (A). Furthermore, (D) of each drawing is a cross-sectional view corresponding to a portion denoted by dashed-dotted line E-F in (A).

In the method for manufacturing the semiconductor device of this embodiment, materials, a manufacturing method, and a manufacturing apparatus similar to those in Embodiment 1 can be used for components with the same reference numerals as those in the method for manufacturing the semiconductor device in Embodiment 1. Unless otherwise specified, the components formed in this embodiment can obtain structural characteristics and effects similar to those of the components described in Embodiment 1, and description thereof is omitted.

First, a substrate (not illustrated) is prepared, and the insulator 208 is deposited over the substrate. The insulator 208 can be deposited by a sputtering method, a CVD method, an MBE method, a PLD method, an ALD method, or the like.

In this embodiment, as the insulator 208, silicon oxide is deposited by a CVD method.

Next, the insulator 210 is formed over the insulator 208. In this embodiment, aluminum oxide is deposited as the insulator 210 by a sputtering method. The insulator 210 may have a multilayer structure. For example, aluminum oxide may be deposited by a sputtering method and aluminum oxide may be deposited over the aluminum oxide by an ALD method. Alternatively, aluminum oxide may be deposited by an ALD method and aluminum oxide may be deposited over the aluminum oxide by a sputtering method.

Then, a conductive film 209A is formed over the insulator 210. The conductive film 209A can be formed by a sputtering method, a CVD method, an MBE method, a PLD method, an ALD method, or the like. In this embodiment, as the conductive film 209A, tungsten is deposited by a sputtering method. Note that as the conductive film 209A, a conductor such as aluminum or copper can be used as well as tungsten. The conductive film 209A may have a stacked-layer structure, and a conductor containing titanium or tantalum may be stacked over the conductor. For example, a metal nitride such as titanium nitride or tantalum nitride can be stacked over the conductor.

Next, the masks 262 are formed over the conductive film 209A by a lithography method (see FIG. 30).

Then, the conductive film 209A is processed using the masks 262, so that the conductor 209 is formed (see FIG. 31).

For the processing, a dry etching method or a wet etching method can be employed. A dry etching method is suitable for microfabrication.

As a dry etching apparatus, a dry etching apparatus such as a CCP etching apparatus or an ICP etching apparatus can be used.

In the case where a hard mask is used for etching of the conductive film 209A, the etching treatment may be performed after the resist mask used for formation of the hard mask is removed or with the resist mask left. In the latter case, the resist mask is removed during the etching in some cases. The hard mask may be removed by etching after the etching of the conductive film. In contrast, the hard mask does not need to be removed in the case where the hard mask material does not affect the following process or can be utilized in the following process.

Next, an insulating film 212A is formed over the insulator 210 and the conductor 209 (see FIG. 32). The insulating film 212A can be formed by a sputtering method, a CVD method, an MBE method, a PLD method, an ALD method, or the like. In this embodiment, as the insulating film 212A, silicon oxide is formed by a CVD method.

Next, part of the insulating film 212A is removed by CMP treatment, so that the conductor 209 is exposed. As a result, the insulator 212 remains between the conductors 209 and around these conductors. In this way, the insulator 212 and the conductor 209 with flat top surfaces can be formed (see FIG. 33). Note that by the CMP treatment, the conductor 209 is partly removed in some cases.

Next, the insulator 216 is deposited over the insulator 212 and the conductor 209. The insulator 216 can be deposited by a sputtering method, a CVD method, an MBE method, a PLD method, an ALD method, or the like. In this embodiment, as the insulator 216, silicon oxide is deposited by a CVD method.

Then, openings are formed in the insulator 216. Examples of the openings include grooves and slits. Regions where the openings are formed may be referred to as opening portions. The openings can be formed by wet etching; however, dry etching is preferable for microfabrication. In the case where openings are formed in the insulator 216, the conductor 209 may be used as an etching stopper film in forming the groove by etching the insulator 216.

After formation of the openings, a conductive film to be the conductor 203a and the conductor 205a is deposited. The conductive film desirably includes a conductor that has a function of inhibiting passage of oxygen. For example, tantalum nitride, tungsten nitride, or titanium nitride can be used. Alternatively, a stacked film including tantalum, tungsten, titanium, molybdenum, aluminum, copper, or a molybdenum-tungsten alloy can be used. A conductor to be the conductor 203a and the conductor 205a can be deposited by a sputtering method, a CVD method, an MBE method, a PLD method, an ALD method, or the like.

In this embodiment, as the conductive film to be the conductor 203a and the conductor 205a, tantalum nitride or a film in which titanium nitride is stacked over tantalum nitride is deposited by a sputtering method. Even when a metal that is easily diffused, such as copper, is used for the conductor 203b and the conductor 205b to be described later, the use of such a metal nitride as the conductor 203a and the conductor 205a can prevent the metal from being diffused to the outside of the conductor 203a and the conductor 205a.

Next, a conductive film to be the conductor 203b and the conductor 205b is deposited over the conductive film to be the conductor 203a and the conductor 205a. The conductive film can be deposited by a sputtering method, a CVD method, an MBE method, a PLD method, an ALD method, or the like. In this embodiment, as the conductive film to be the conductor 203b and the conductor 205b, a low-resistant conductive material such as tungsten or copper is deposited.

Next, by CMP treatment, the conductive film to be the conductor 203a and the conductor 205a and the conductive film to be the conductor 203b and the conductor 205b are partly removed to expose the insulator 216. As a result, the conductive film to be the conductor 203a and the conductor 205a and the conductive film to be the conductor 203b and the conductor 205b remain only in the opening portions. Thus, the conductor 203 including the conductor 203a and the conductor 203b, which have a flat top surface, and the conductor 205 including the conductor 205a and the conductor 205b, which have a flat top surface, can be formed (see FIG. 34). Note that the insulator 216 is partly removed by the CMP treatment in some cases.

Next, the insulator 220, the insulator 222, and the insulator 224 are deposited over the insulator 216, the conductor 203, and the conductor 205. The insulator 220, the insulator 222, and the insulator 224 can be formed using a method and a material similar to those in Embodiment 1 (see FIG. 34).

Subsequently, heat treatment is preferably performed. For the heat treatment, the method described in Embodiment 1 can be used. By the above heat treatment, impurities such as hydrogen and water in the insulator 224 can be removed, for example. Note that first heat treatment is not necessarily performed in some cases.

This heat treatment can also be performed after deposition of the insulator 220 and after deposition of the insulator 222. Although the heat treatment can be performed under the above-described heat treatment conditions, heat treatment after deposition of the insulator 220 is preferably performed in an atmosphere containing nitrogen.

In this embodiment, as the heat treatment, treatment is performed in a nitrogen atmosphere at 400° C. for one hour after deposition of the insulator 224.

Next, the oxide film 230A to be the oxide 230a is formed over the insulator 224.

The oxide film 230A can be formed using a method and a material similar to those in Embodiment 1.

Next, an opening reaching the conductor 203 is formed in the insulator 220, the insulator 222, the insulator 224, and the oxide film 230A by a lithography method. First, the mask 263 is formed over the oxide film 230A (see FIG. 34). The mask 263 used for forming the opening may be a resist mask or a hard mask.

Next, the insulator 220, the insulator 222, the insulator 224, and the oxide film 230A are processed using the mask 263 to expose the surface of the conductor 203, so that the opening is formed (see FIG. 35). For the processing, a dry etching method or a wet etching method can be employed.

A dry etching method is suitable for microfabrication. Note that the insulator 220, the insulator 222, and the insulator 224 are processed through the oxide film 230A. Specifically, when the surface of the conductor 203 is partly exposed, a mask formed of a resist mask, a hard mask, or the like is formed over the oxide film 230A, and then the insulator 220, the insulator 222, the insulator 224, and the oxide film 230A are processed. In other words, the mask is not formed on a surface of the insulator (the insulator 220, the insulator 222, and the insulator 224) functioning as the gate insulating film. Therefore, the mask is not attached to the surface of the insulator functioning as the gate insulating film; thus, the gate insulating film can be prevented from being contaminated and damaged by an impurity in the resist mask and the like, a component in the hard mask, and components in plasma and a chemical solution used for removal of the mask. Through such a process, a method for manufacturing a highly reliable semiconductor device can be provided.

Next, the oxide film 230B and the oxide film 230C are formed over the oxide film 230A (see FIG. 36). At this time, the oxide film 230B and the oxide film 230C are also formed in the opening and electrically connected to the conductor 203 through the opening. When the oxide 230b and the oxide 230c are connected to the conductor 203 without through the oxide 230a, the series resistance and the contact resistance can be reduced. With such a structure, a semiconductor device with favorable electrical characteristics can be obtained. Specifically, a transistor with an increased on-state current and a semiconductor device including the transistor are obtained.

The oxide film 230B and the oxide film 230C can be formed by a sputtering method, a CVD method, an MBE method, a PLD method, an ALD method, or the like.

After the formation of the oxide film 230B, the oxide film 230C is preferably formed successively without exposure to an air atmosphere. When a multi-chamber deposition apparatus is used for the formation of the oxide film 230B and the formation of the oxide film 230C, the oxide film 230C can be formed over the oxide film 230B without exposure of the surface of the oxide film 230B to an air atmosphere. By performing the formation of the oxide film 230B and the formation of the oxide film 230C successively, contamination of the interface between the oxide film 230B and the oxide film 230C can be prevented, and the semiconductor device using such oxide films can have favorable characteristics and high reliability.

In the case where the oxide film 230B and the oxide film 230C are formed by a sputtering method, for example, oxygen or a mixed gas of oxygen and a rare gas is used as a sputtering gas. By increasing the proportion of oxygen in the sputtering gas, the amount of excess oxygen in the oxide film to be deposited can be increased. In the case where the oxide films are formed by a sputtering method, the above-described In-M-Zn oxide target can be used.

In the case where the oxide film 230B and the oxide film 230C are formed by a sputtering method and the proportion of oxygen in the sputtering gas is higher than or equal to 1% and lower than or equal to 30%, preferably higher than or equal to 5% and lower than or equal to 20% an oxygen-deficient oxide semiconductor is formed. A transistor including an oxygen-deficient oxide semiconductor can have relatively high field-effect mobility.

In this embodiment, the oxide film 230B is deposited using a target of In:Ga:Zn=1:1:1 [atomic ratio] by a sputtering method, and the oxide film 230C is deposited using a target of In:Ga:Zn=4:2:4.1 [atomic ratio] by a sputtering method. The oxide film 230B and the oxide film 230C are successively formed without exposure to an air atmosphere by using a multi-chamber sputtering apparatus. Note that the oxide films are preferably formed by appropriate selection of deposition conditions and an atomic ratio to have characteristics required for the oxide 230.

Next, heat treatment may be performed. For the heat treatment, the above-described heat treatment conditions can be used. By the heat treatment, impurities such as water and hydrogen in the oxide film 230A, the oxide film 230B, and the oxide film 230C can be removed, for example. In this embodiment, treatment is performed in a nitrogen atmosphere at 400° C. for one hour, and treatment is successively performed in an oxygen atmosphere at 400° C. for one hour.

Next, the oxide film 230A, the oxide film 230B, and the oxide film 230C are processed into island shapes to form the oxide 230a, the oxide 230b, and the oxide 230c (see FIG. 37).

Figure 37A:
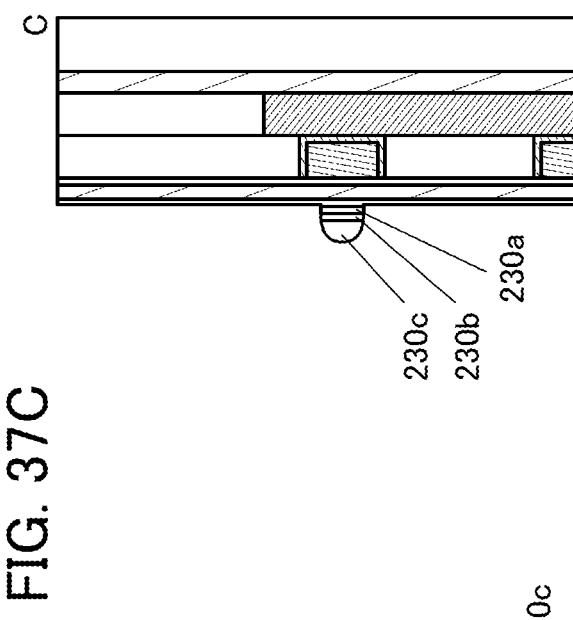
FIGS. 37A-37D A top view and cross-sectional views illustrating a method for manufacturing a semiconductor device of one embodiment of the present invention.
Figure 37C:
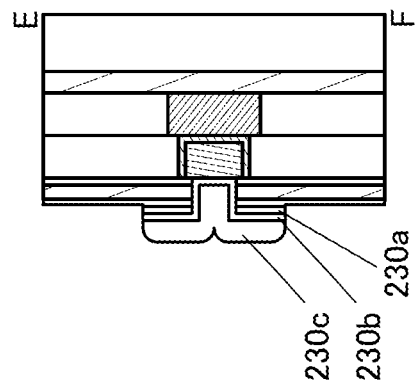
Figure 37B:
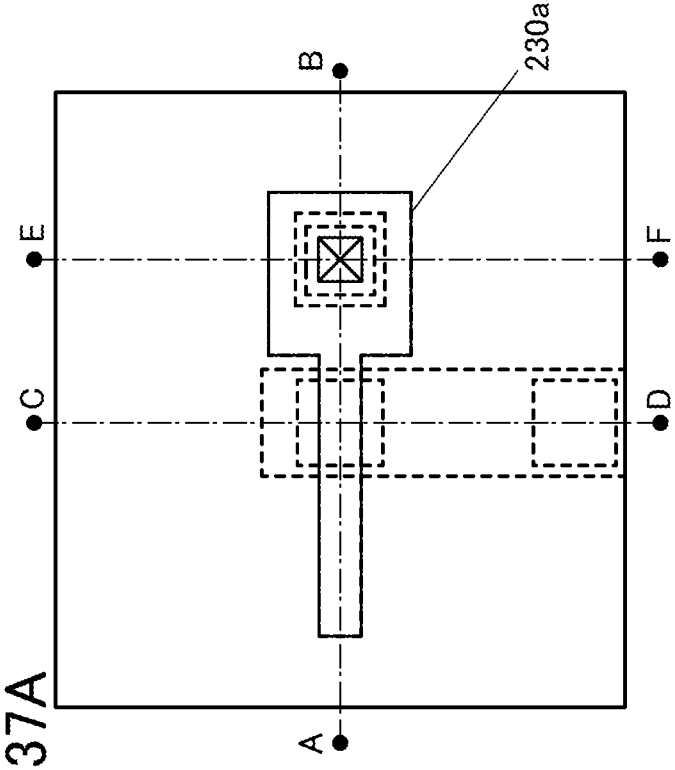
Figure 37D:
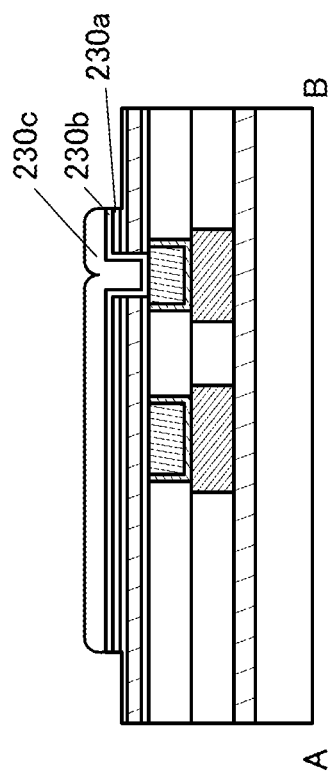
Figure 38C:
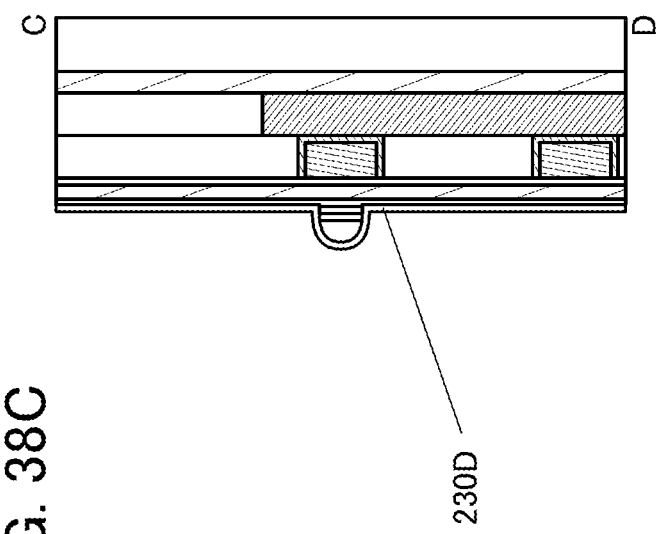
FIGS. 38A-38D A top view and cross-sectional views illustrating a method for manufacturing a semiconductor device of one embodiment of the present invention.
Figure 38D:
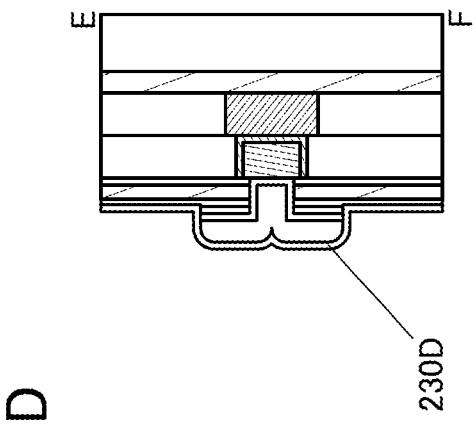
Figure 38A:
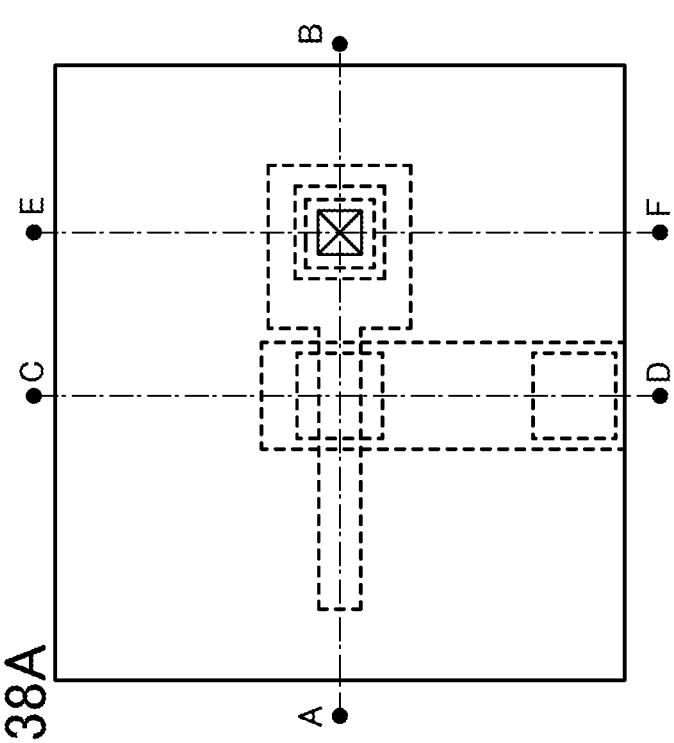
Figure 38B:
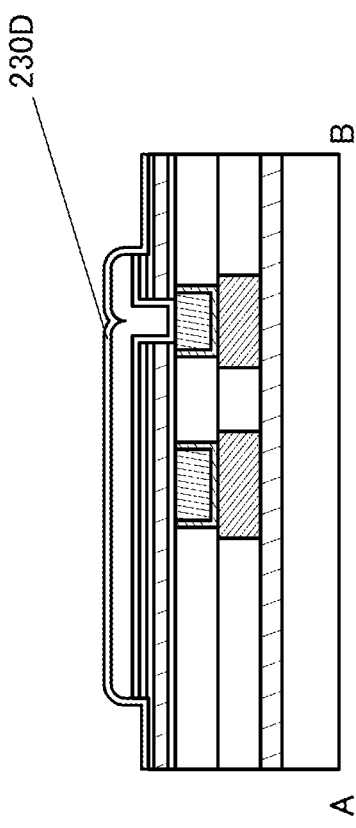
Figure 40C:
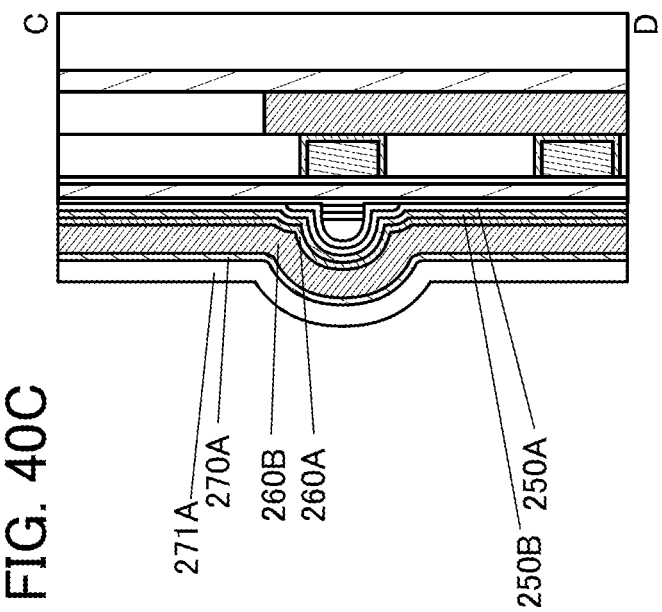
FIGS. 40A-40D A top view and cross-sectional views illustrating a method for manufacturing a semiconductor device of one embodiment of the present invention.
Figure 40D:
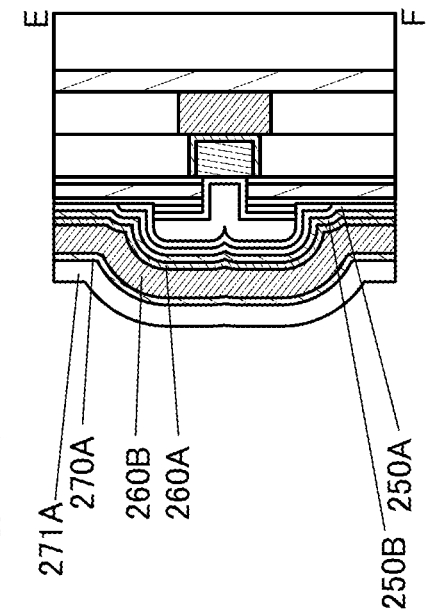
Figure 40A:
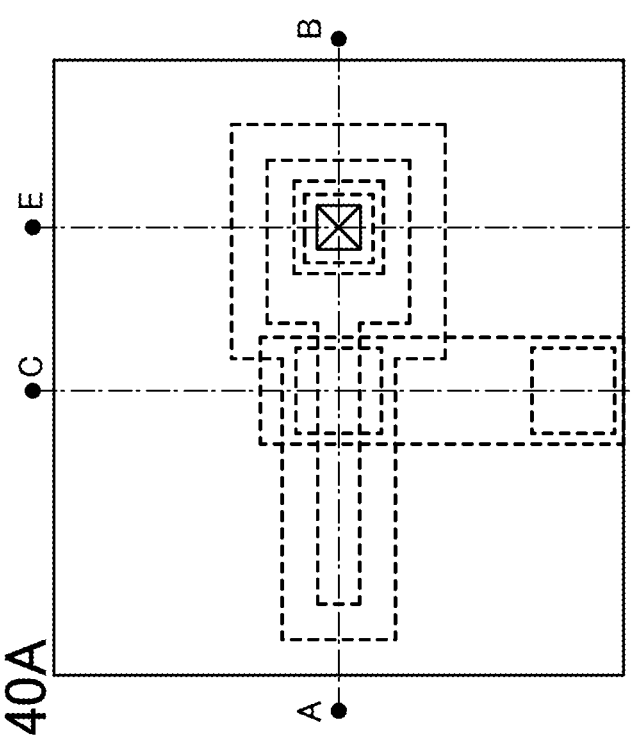
Figure 40B:
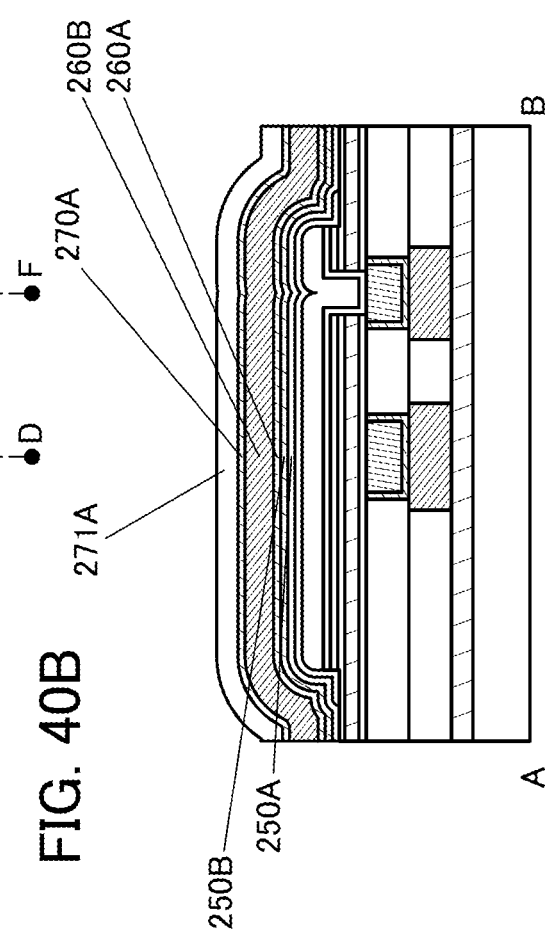
Figure 42A:
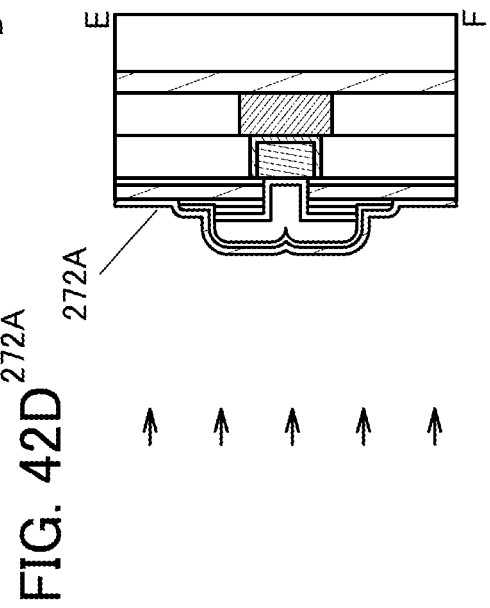
FIGS. 42A-42D A top view and cross-sectional views illustrating a method for manufacturing a semiconductor device of one embodiment of the present invention.
Figure 42C:
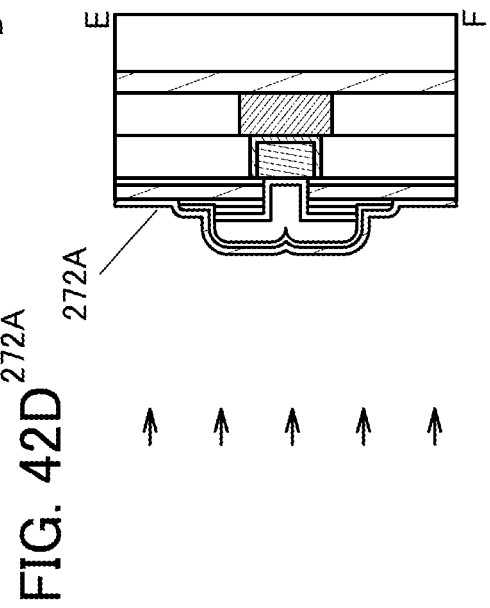
Figure 42B:
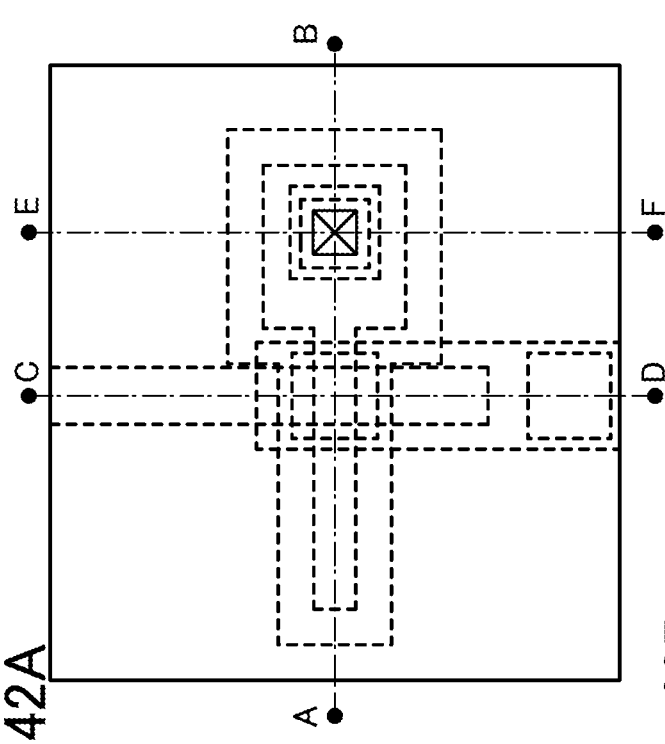
Figure 42D:
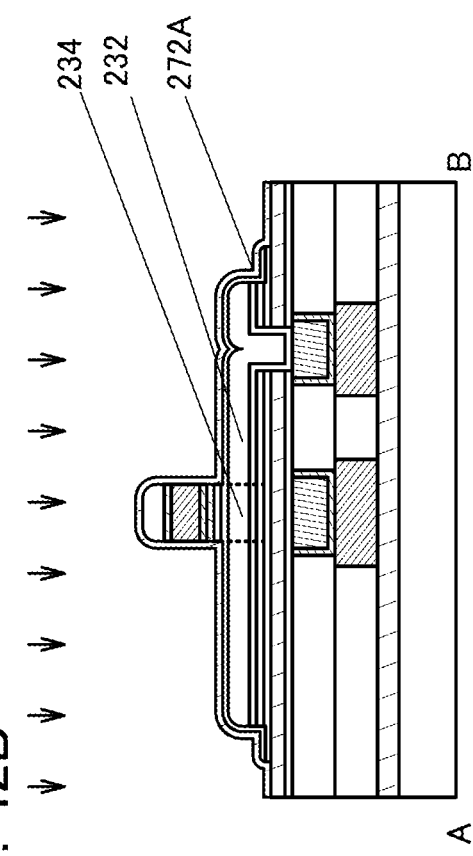
Figure 43C:
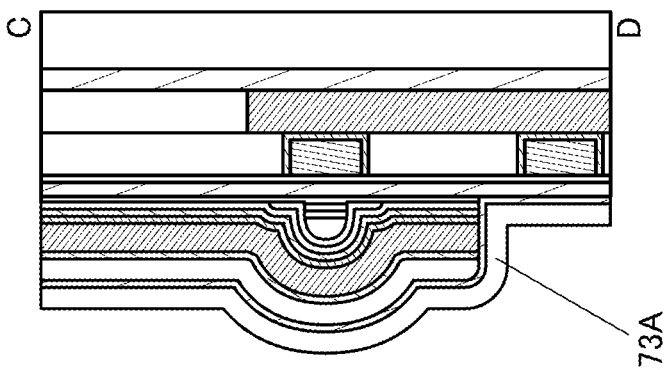
FIGS. 43A-43D A top view and cross-sectional views illustrating a method for manufacturing a semiconductor device of one embodiment of the present invention.
Figure 43D:
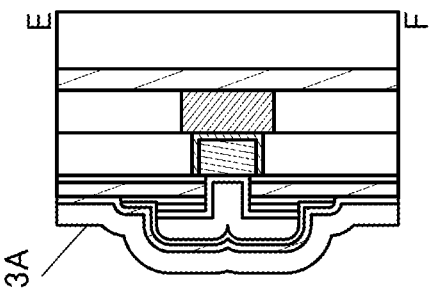
Figure 43A:
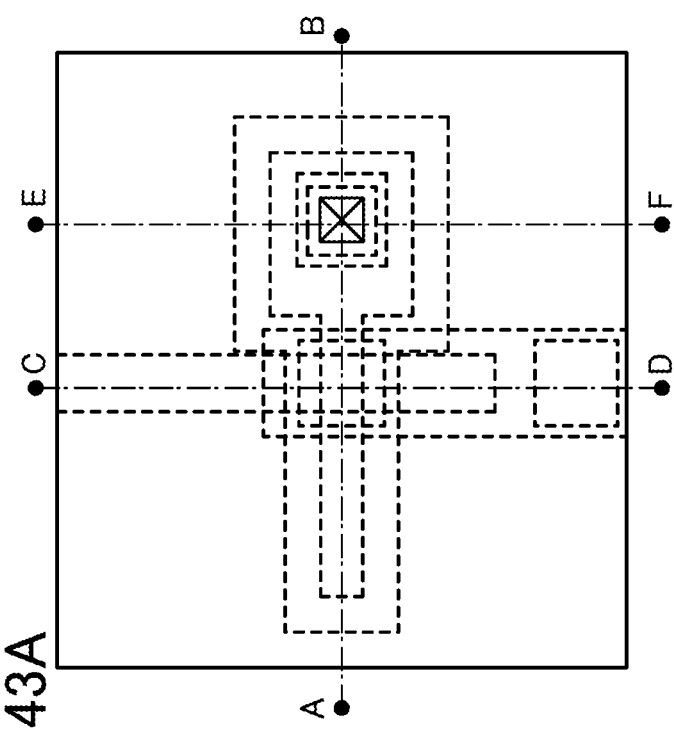
Figure 43B:
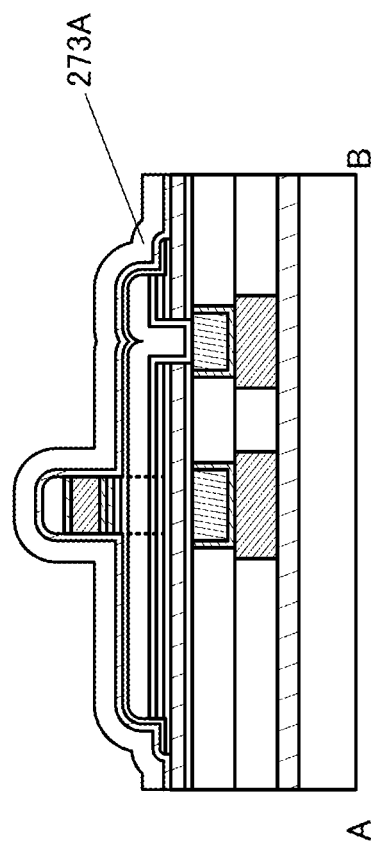
Figure 44C:
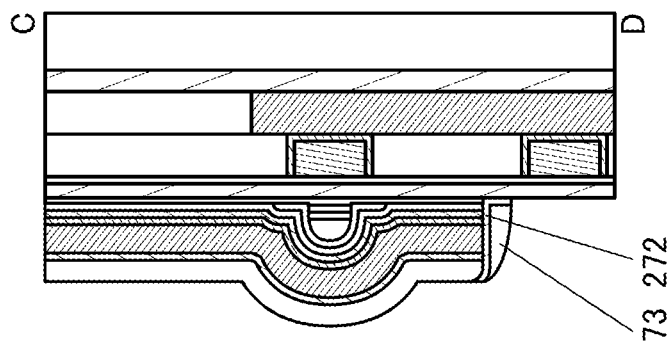
FIGS. 44A-44D A top view and cross-sectional views illustrating a method for manufacturing a semiconductor device of one embodiment of the present invention.
Figure 44D:
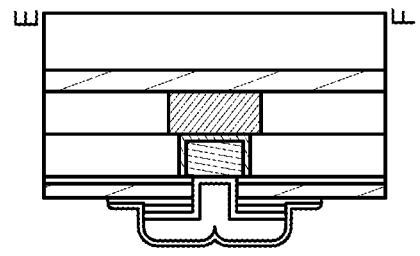
Figure 44A:
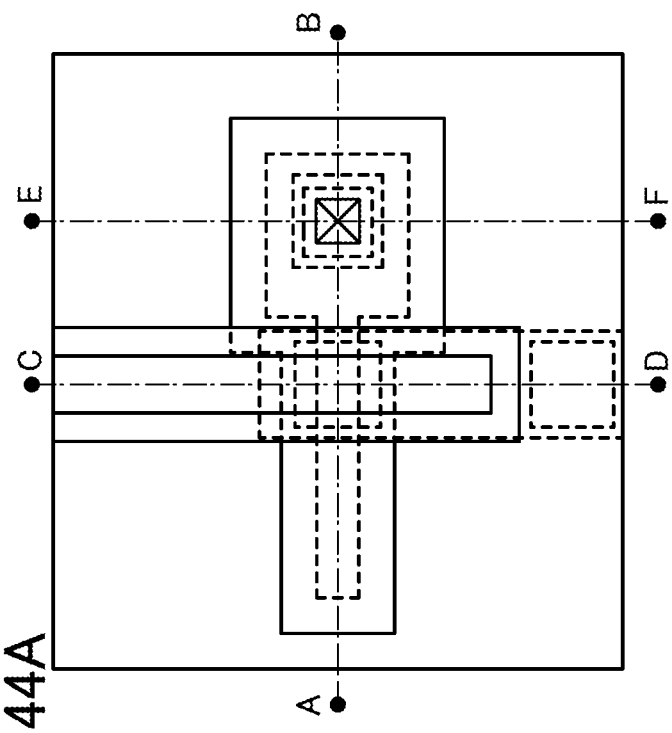
Figure 44B:
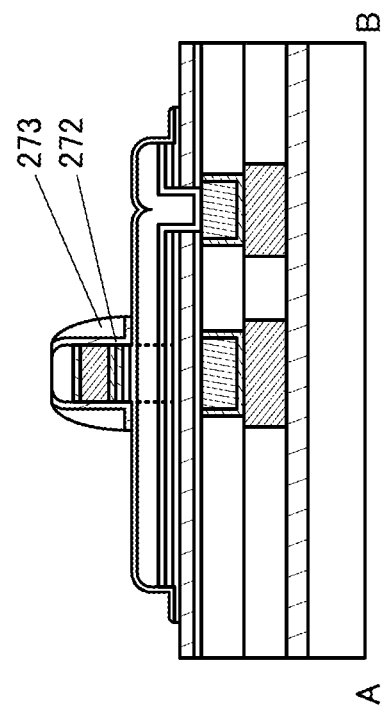
Figure 45C:
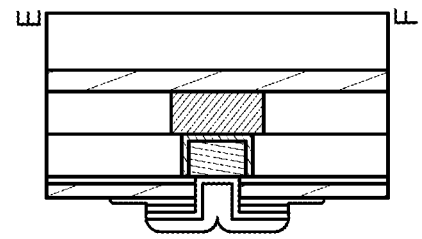
FIGS. 45A-45D A top view and cross-sectional views illustrating a method for manufacturing a semiconductor device of one embodiment of the present invention.
Figure 45D:
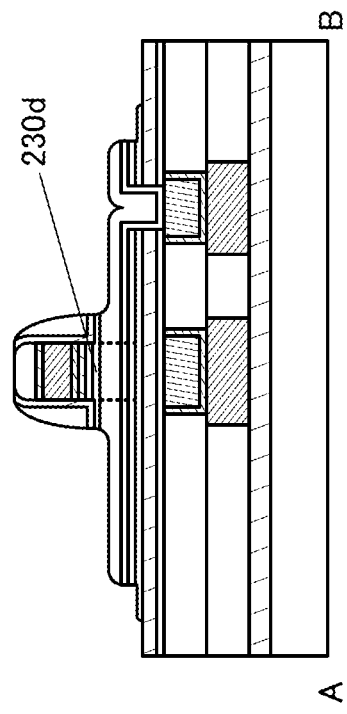
Figure 45A:
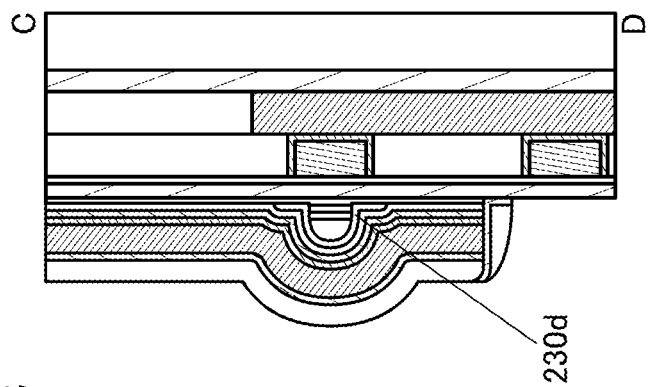
Figure 45B:
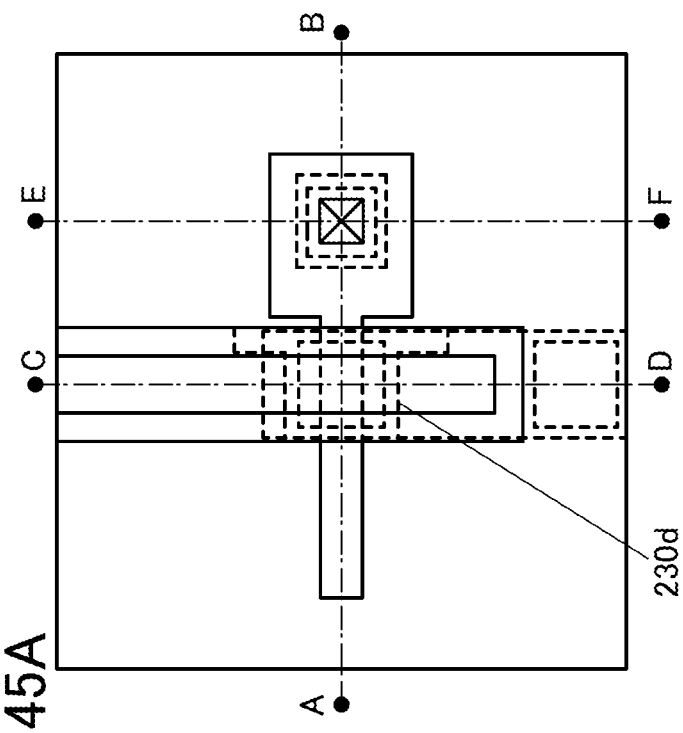

As illustrated in FIG. 37(A) and FIG. 37(D), the oxide 230a, the oxide 230b, and the oxide 230c are each preferably formed to have a wider width in the E-F direction than the opening in the region overlapping with the opening formed in the insulator 220, the insulator 222, the insulator 224, and the oxide 230a. Therefore, the widths of the oxide 230a, the oxide 230b, and the oxide 230c in the E-F direction in that region may be wider than the widths of the oxide 230a, the oxide 230b, and the oxide 230c in the C-D direction in a region where a channel is formed or a region on the A side. With such a structure, contact between the oxides 230b and 230c and the conductor 203 can be assured. Furthermore, the area of the capacitor 101 can be increased, and an increase in the capacity of the capacitor 101 can be expected.

Note that in the above step, the insulator 224 may be processed into an island shape. Furthermore, the insulator 224 may be subjected to half-etching. In the case where the insulator 224 is subjected to half-etching, the insulator 224 remains also under the oxide 230d to be formed in a later step. Note that the insulator 224 can be processed into an island shape when the conductive film 260A and the conductive film 260B or the insulating film 272A is processed in a later step. In this case, the insulator 222 may be used as an etching stopper film.

Here, the oxide 230a, the oxide 230b, and the oxide 230c are formed to at least partly overlap with the conductor 205. It is preferable that the side surface of the oxide 230b and a side surface of the oxide 230c be on the same plane as the side surface of the oxide 230a. It is also preferable that the side surfaces of the oxide 230a, the oxide 230b, and the oxide 230c be substantially perpendicular to the insulator 222. At this time, the end portion of the oxide 230b and the end portion of the oxide 230c are substantially aligned with the end portion of the oxide 230a. When the side surfaces of the oxide 230a, the oxide 230b, and the oxide 230c are substantially perpendicular to the insulator 222, a plurality of transistors 202 can be provided in a small area with high density. Note that an angle formed by the side surfaces of the oxide 230a, the oxide 230b, and the oxide 230c and the top surface of the insulator 222 may be an acute angle. In that case, the angle formed by the side surfaces of the oxide 230a, the oxide 230b, and the oxide 230c and the top surface of the insulator 222 is preferably larger.

There is a curved surface between the side surfaces of the oxide 230a, the oxide 230b, and the oxide 230c and the top surface of the oxide 230c. That is, an end portion of the side surface and an end portion of the top surface are preferably curved (hereinafter also referred to as a round shape). The radius of curvature of the curved surface at the end portions of the oxide 230a, the oxide 230b, and the oxide 230c is greater than or equal to 3 nm and less than or equal to 10 nm, preferably greater than or equal to 5 nm and less than or equal to 6 nm, for example.

Note that when the end portions are not angular, the coverage with films in the later deposition process is improved.

Note that processing of the oxide films and washing for removing impurities attached at the time of the processing can be performed by the methods described in Embodiment 1.

Next, heat treatment may be performed. As the conditions for the heat treatment, the above-described heat treatment conditions can be used.

Next, an oxide film 230D to be the oxide 230d is deposited over the insulator 224, the oxide 230a, the oxide 230b, and the oxide 230c (see FIG. 38).

The oxide film 230D can be formed by a sputtering method, a CVD method, an MBE method, a PLD method, an ALD method, or the like. The oxide film 230D is deposited by a deposition method similar to that of the oxide film 230A, the oxide film 230B, or the oxide film 230C in accordance with characteristics required for the oxide 230d. In this embodiment, the oxide film 230D is deposited using a target of In:Ga:Zn=1:3:4 [atomic ratio] by a sputtering method.

The oxide film 230D may be processed into an island shape as illustrated in FIG. 39. When the oxide film 230D is processed before the formation of the insulator 250 and the conductor 260, part of the oxide film 230D positioned below the insulator 250 and the conductor 260, which are formed in a later process, can be removed. Thus, the oxide film 230D for adjacent cells 601 is divided and leakage through the oxide film 230D between the cells 601 can be prevented, which is preferable.

The oxide film 230D can be processed by dry etching or wet etching. The method used for processing the oxide film 230A, the oxide film 230B, and the oxide film 230C may also be used.

Then, the insulating film 250A, an insulating film 250B, the conductive film 260A, the conductive film 260B, the insulating film 270A, and the insulating film 271A are formed sequentially over the insulator 224 and the oxide film 230D (see FIG. 40).

The insulating film 250A and the insulating film 250B can be deposited by a sputtering method, a CVD method, an MBE method, a PLD method, an ALD method, or the like.

In this embodiment, silicon oxynitride is formed by a CVD method as the insulating film 250A, and aluminum oxide is formed by a sputtering method as the insulating film 250B. The insulating film 250A has a thickness of greater than or equal to 1 nm and less than or equal to 20 nm, preferably greater than or equal to 5 nm and less than or equal to 10 nm. The insulating film 250B has a thickness of greater than or equal to 1 nm and less than or equal to 20 nm, preferably greater than or equal to 5 nm and less than or equal to 10 nm. The insulating film 250B is preferably formed by a sputtering method in an atmosphere containing oxygen, in which case, a larger amount of oxygen, that is, excess oxygen can be contained in the insulating film 250A.

Furthermore, heat treatment may be performed. For the heat treatment, the above-described heat treatment conditions can be used. The heat treatment can reduce the moisture concentration and the hydrogen concentration in the insulating film 250A and the insulating film 250B.

The conductive film 260A can be deposited by a sputtering method, a CVD method, an MBE method, a PLD method, an ALD method, or the like. In this embodiment, as the conductive film 260A, titanium nitride is formed by a sputtering method.

The conductive film 260B can be deposited by a sputtering method, a CVD method, an MBE method, a PLD method, an ALD method, or the like. When a low-resistance metal film is stacked as the conductive film 260B, a transistor with a low driving voltage can be provided. In this embodiment, as the conductive film 260B, tungsten is formed by a sputtering method.

Subsequently, heat treatment can be performed. For the heat treatment, the above-described heat treatment conditions can be used. Note that the heat treatment is not necessarily performed in some cases. In this embodiment, the treatment is performed in a nitrogen atmosphere at 400° C. for one hour.

The insulating film 270A and the insulating film 271A can be formed using a method and a material similar to those in Embodiment 1.

The insulator 271 functions as a hard mask. The provision of the insulator 271 makes it possible for a side surface of the insulator 250a, a side surface of the insulator 250b, the side surface of the conductor 260a, the side surface of the conductor 260b, and the side surface of the insulator 270 to be formed substantially perpendicular to the substrate.

Next, the insulating film 271A is etched to form the insulator 271. Then, using the insulator 271 as a mask, the insulating film 250A, the insulating film 250B, the conductive film 260A, the conductive film 260B, and the insulating film 270A are etched to form the insulator 250 (the insulator 250a and the insulator 250b), the conductor 260 (the conductor 260a and the conductor 260b), and the insulator 270 (see FIG. 41). Note that after the processing, the following process may be performed without removal of the hard mask. The hard mask can also function as a hard mask used for adding a dopant, which is to be performed in the following process.

An upper portion of the oxide film 230D in a region not overlapping with the insulator 250 may be etched by the above etching. In that case, the oxide film 230D may be thicker in a region overlapping with the insulator 250 than in the region not overlapping with the insulator 250.

A region of the insulator 224 not overlapping with the oxide film 230D may be etched by the above etching. In this case, the insulator 222 is exposed in a region not overlapping with the oxide film 230D or the conductor 260.

Subsequently, heat treatment can be performed. For the heat treatment, the above-described heat treatment conditions can be used. Note that the heat treatment is not necessarily performed in some cases. In this embodiment, the treatment is performed in a nitrogen atmosphere at 400° C. for one hour.

Next, the insulating film 272A is deposited to cover the oxide film 230D, the insulator 250, the conductor 260, the insulator 270, and the insulator 271 (see FIG. 42).

Next, a rare gas is added to the oxide 230 using the insulator 250, the conductor 260, the insulator 270, and the insulator 271, which are covered with the insulating film 272A, as masks. For the addition of the rare gas, for example, an ion implantation method by which an ionized source gas is subjected to mass separation and then added, an ion doping method by which an ionized source gas is added without mass separation, a plasma immersion ion implantation method, or plasma treatment can be used. By addition of a rare gas, the region 234 and the region 232 are provided in the oxide 230 (see FIG. 42).

Next, an insulating film 273A is deposited to cover the insulating film 272A (see FIG. 43). For the insulating film 273A, a material with a low permittivity is preferably used, and a material similar to that for the insulator 212 and the insulator 216 can be used.

Next, the insulating film 273A and the insulating film 272A are subjected to anisotropic etching treatment, whereby the insulator 272 functioning as a barrier and the insulator 273 functioning as a sidewall are formed in contact with the side surfaces of the insulator 250, the conductor 260, and the insulator 270 (see FIG. 44). Dry etching treatment is preferably performed as the anisotropic etching treatment. In this manner, the insulator 272 and the insulator 273 can be formed in a self-aligned manner.

The insulator 271 is formed over the insulator 270 here, whereby the insulator 270 can be left even when the insulating film 273A and the insulating film 272A in a portion above the insulator 270 are removed. The height of a structure body composed of the insulator 250, the conductor 260, the insulator 270, and the insulator 271 is made greater than the total height of the oxide 230a, the oxide 230b, the oxide 230c, and the oxide film 230D, whereby the insulating film 273A and the insulating film 272A, which are deposited on the side surfaces of the oxide 230a, the oxide 230b, and the oxide 230c with the oxide film 230D therebetween, can be removed. Furthermore, when the end portions of the oxide 230a, the oxide 230b, and the oxide 230c have a round shape, time taken to remove the insulating film 273A and the insulating film 272A, which are deposited on the side surfaces of the oxide 230a, the oxide 230b, and the oxide 230c with the oxide film 230D therebetween, can be shortened, leading to easier formation of the insulator 272 and the insulator 273.

Next, the oxide film 230D is etched using the insulator 250, the conductor 260, the insulator 270, the insulator 271, the insulator 272, and the insulator 273 as masks to remove part of the oxide film 230D, so that the oxide 230d is formed (see FIG. 45). Note that through the present process, the top surface and the side surfaces of the oxide 230c and the side surfaces of the oxide 230a and the oxide 230b are partly removed in some cases.

Here, the region 231 may be formed in the oxide 230a, the oxide 230b, the oxide 230c, and the oxide 230d. The region 231 is a region whose resistance is reduced by addition of a metal atom such as indium or impurities to metal oxides provided as the oxide 230a, the oxide 230b, the oxide 230c, and the oxide 230d. Note that each region 231 has higher conductivity than at least the oxide 230b in the region 234.

In order to reduce the resistance of the region 231 and the region 232, a dopant which is at least one of a metal atom such as indium, a rare gas such as helium or argon, and an impurity such as hydrogen and nitrogen is added, for example.

Note that a dopant and an addition method similar to those in Embodiment 1 can be used for addition of a dopant.

Alternatively, a dopant may be added by plasma treatment. In that case, the plasma treatment can be performed with a plasma CVD apparatus, a dry etching apparatus, or an ashing apparatus to add a dopant to the oxide 230a, the oxide 230b, the oxide 230c, and the oxide 230d.

Furthermore, in the case where an impurity is added as a dopant, a film containing a dopant may be formed in contact with the oxide 230. For example, the insulator 274 containing hydrogen, boron, carbon, nitrogen, fluorine, or phosphorus as a dopant is deposited in contact with the oxide 230 positioned outward from the oxide 230d, the insulator 272, and the insulator 273, whereby the region 231 is formed (see FIG. 46). Owing to the deposition of the insulator 274 or the heat treatment after the deposition, the resistance of the region 231 is reduced. It is considered that the dopant in the insulator 274 is diffused into the region 231 and the resistance of the region is reduced. The dopant in the insulator 274 may also be diffused into the region 232, and the resistance of the region 232 may become lower than the resistance reduced by the above-described addition of the rare gas.

When the indium content in the oxide 230a, the oxide 230b, the oxide 230c, and the oxide 230d is increased, the carrier density can be increased and the resistance can be reduced. Accordingly, a metal element that improves the carrier density of the oxide 230a, the oxide 230b, the oxide 230c, and the oxide 230d, such as indium, can be used as a dopant.

That is, when the content of a metal atom such as indium in the oxide 230a, the oxide 230b, the oxide 230c, and the oxide 230d is increased in the region 231 and the region 232, the electron mobility can be increased and the resistance can be reduced.

In that case, the atomic ratio of indium to the element M at least in the region 231 is larger than the atomic ratio of indium to the element M in the region 234.

When the region 232 is provided in the transistor 202, a high-resistance region is not formed between the region 231 functioning as the source region or the drain region and the region 234 where a channel is formed, so that the on-state current and the mobility of the transistor can be increased. Since the gate does not overlap with the source region and the drain region in the channel length direction owing to the region 232, formation of unnecessary capacitance can be inhibited. Furthermore, leakage current in a non-conduction state can be reduced by including the region 232.

Thus, by appropriately selecting the areas of the region 231a and the region 231b, a transistor having electrical characteristics required in the circuit design can be easily provided.

In this embodiment, the insulator 274 is deposited to cover the insulator 224, the oxide 230, the insulator 271, the insulator 272, and the insulator 273 (see FIG. 46).

The insulator 274 can be formed using a method and a material similar to those in Embodiment 1. Accordingly, oxygen vacancies are formed mainly in regions not overlapping with the insulator 250, of the oxide 230c and the oxide 230d and the oxygen vacancies and impurity elements such as nitrogen and hydrogen are bonded to each other, leading to an increase in carrier density. In this manner, the region 231a and the region 231b with reduced resistance can be formed.

As described in Embodiment 1, the insulator 274 may have a single-layer structure or a stacked-layer structure of two or more insulators.

Accordingly, the source region and the drain region can be formed in a self-aligned manner owing to the deposition of the insulator 274. Thus, minute or highly integrated semiconductor devices can also be manufactured with high yield.

Here, the top surfaces and the side surfaces of the conductor 260 and the insulator 250 are covered with the insulator 270 and the insulator 272, whereby impurity elements such as nitrogen and hydrogen can be prevented from entering the conductor 260 and the insulator 250. Thus, the impurity elements such as nitrogen and hydrogen can be prevented from entering the region 234 functioning as the channel formation region of the transistor 202 through the conductor 260 and the insulator 250. Accordingly, the transistor 202 having favorable electrical characteristics can be provided.

Note that although the region 231 is formed by the reduction in the resistance of the oxide 230 owing to the deposition of the insulator 274 in the above, this embodiment is not limited thereto. For example, each region and the like may be formed by dopant addition treatment or plasma treatment, or the combination of these treatments.

For example, plasma treatment may be performed on the oxide 230 using the insulator 250, the conductor 260, the insulator 272, the insulator 273, the insulator 270, and the insulator 271 as masks. The plasma treatment is performed in, for example, an atmosphere containing the above-described element forming an oxygen vacancy or the above-described element trapped by an oxygen vacancy. For example, the plasma treatment is performed using an argon gas and a nitrogen gas.

Subsequently, heat treatment can be performed. For the heat treatment, the above-described heat treatment conditions can be used. The heat treatment allows diffusion of the added dopant into the region 231 of the oxide 230, resulting in an increase in on-state current. Furthermore, the added dopant may be diffused into the region 232 by this heat treatment.

Next, the conductive film 130A and a conductive film 130B are formed to cover the insulator 274 (see FIG. 46). The conductive film 130A and the conductive film 130B can be deposited by a sputtering method, a CVD method, an MBE method, a PLD method, an ALD method, or the like. In this embodiment, titanium nitride is formed by a sputtering method as the conductive film 130A, and tungsten is formed by a sputtering method as the conductive film 130B.

Next, the conductive film 130A and the conductive film 130B are processed by a lithography method to form the conductor 130 (the conductor 130a and the conductor 130b) (see FIG. 47). For processing the conductive film 130A and the conductive film 130B, a method similar to that for processing the conductive film 130A described in Embodiment 1 can be used.

Figure 47A:
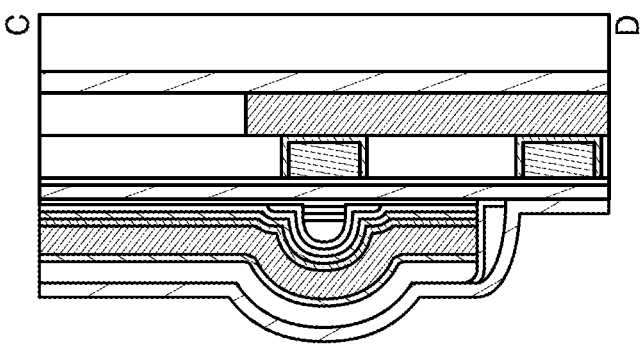
FIGS. 47A-47D A top view and cross-sectional views illustrating a method for manufacturing a semiconductor device of one embodiment of the present invention.
Figure 47C:
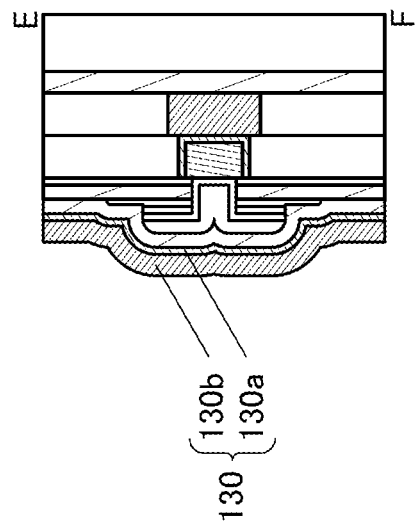
Figure 47B:
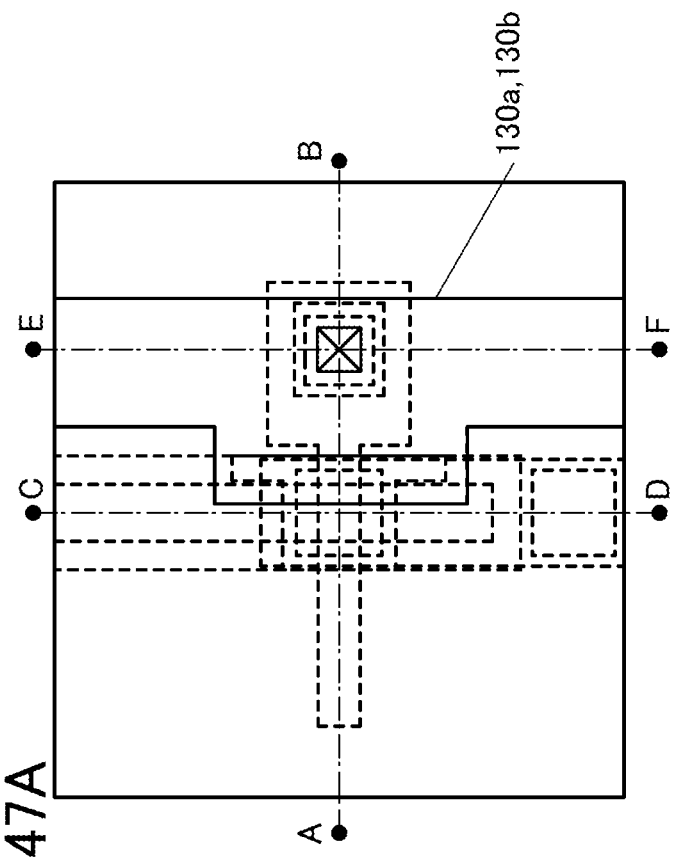
Figure 47D:
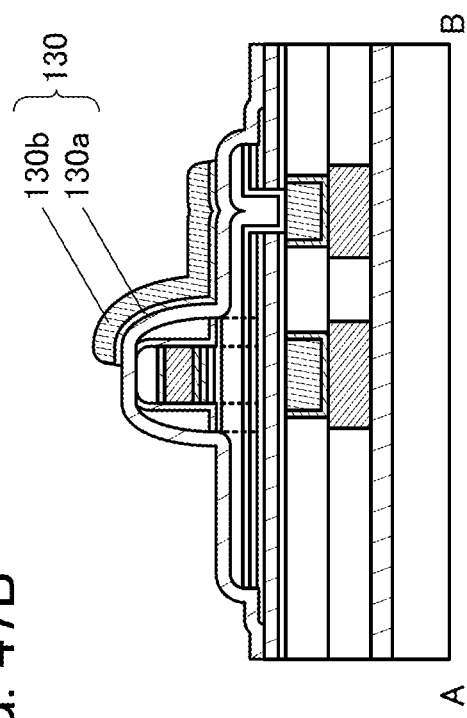
Figure 50A:
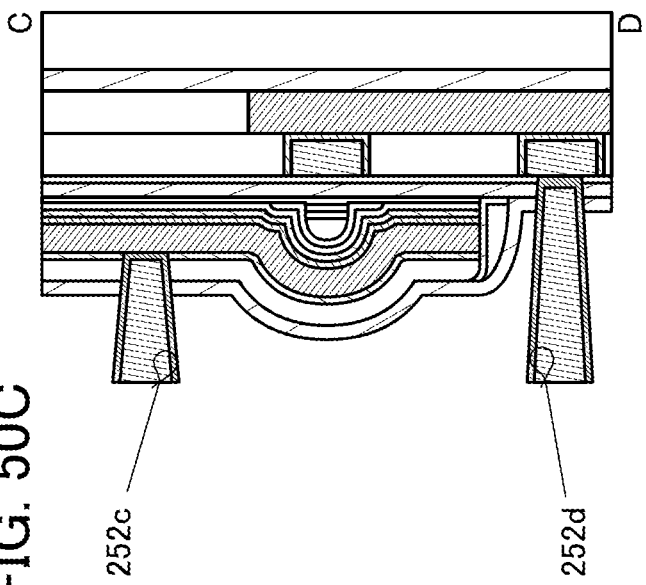
FIGS. 50A-50D A top view and cross-sectional views illustrating a method for manufacturing a semiconductor device of one embodiment of the present invention.
Figure 50C:
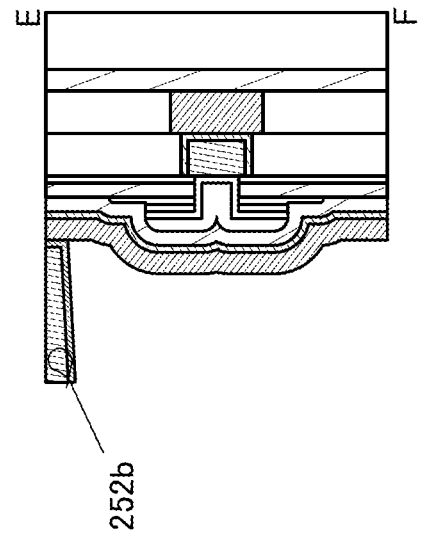
Figure 50B:
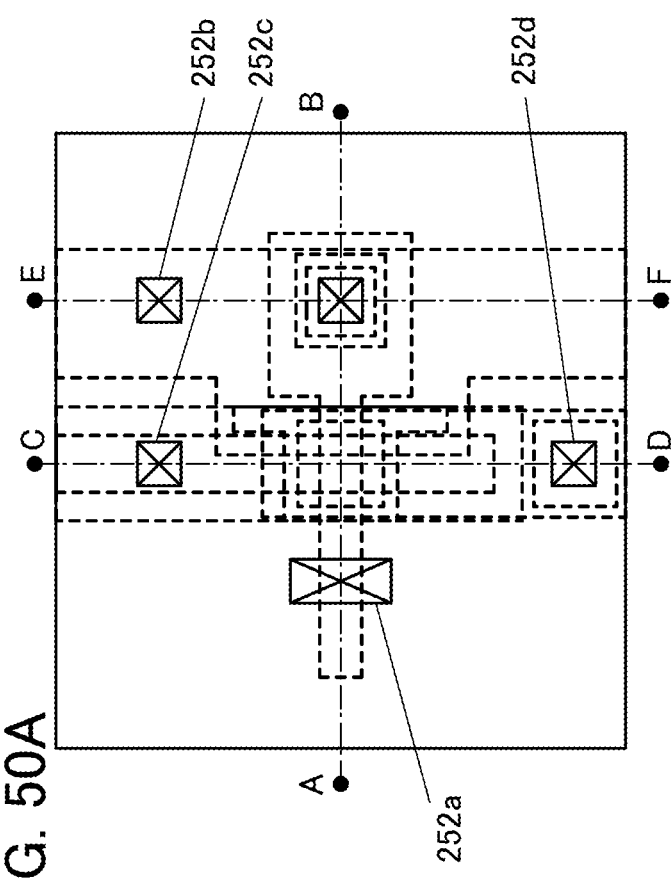
Figure 50D:
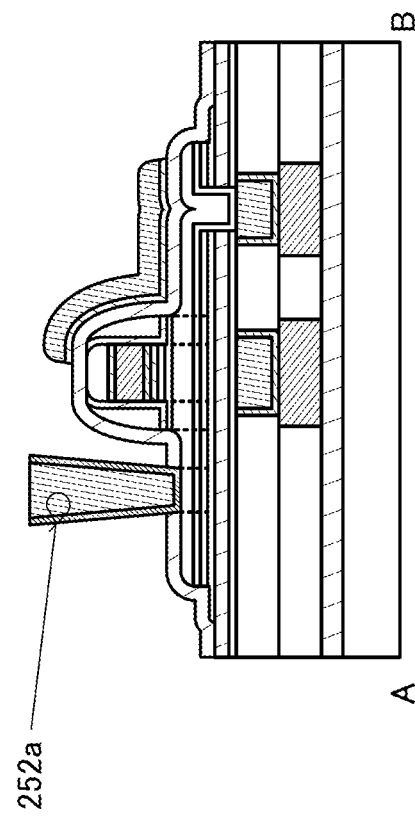

In this embodiment, as illustrated in FIG. 47(B) and FIG. 47(D), part of the conductor 130 provided over the oxide 230 is provided to extend outward from the oxide 230. Specifically, the conductor 130 is provided to extend beyond the oxide 230 to the E side and the F side in FIG. 47(D).

Such a shape is preferable because the capacitor 101 can form capacitance not only between the top surface of the oxide 230 and the conductor 130 but also between the side surface of the oxide 230 and the conductor 130. Therefore, in FIG. 47(B), the conductor 130 may be provided to extend beyond the oxide 230 to the B side. In contrast, when there is a limitation on the area occupied by the cell 601, the conductor 130 is formed so as to extend beyond the oxide 230 as little as possible; thus, the cell 601 can be miniaturized, so that the semiconductor device can be highly integrated.

The conductor 130 may be formed to be connected to the conductor 130 of the adjacent cell 601.

Then, the insulator 280 is deposited over the insulator 274 and the conductor 130 (see FIG. 48). The insulator 280 can be formed using a method and a material similar to those in Embodiment 1.

Then, an opening reaching the region 231 of the oxide 230, an opening reaching the conductor 130, an opening reaching the conductor 260, and an opening reaching the conductor 205 are formed in the insulator 280 and the insulator 274, in the insulator 280, in the insulator 280, the insulator 274, the insulator 271, and the insulator 270, and in the insulator 280, the insulator 274, the insulator 222, and the insulator 220, respectively. The openings are formed by a lithography method.

Note that in order that the conductor 252a may be provided in contact with the side surface of the oxide 230, the opening reaching the oxide 230 is formed such that the side surface of the oxide 230 is exposed in the opening.

Next, a rare gas is added to the oxide 230 exposed by forming the opening. Similar to the above, for the addition of the rare gas, for example, an ion implantation method by which an ionized source gas is subjected to mass separation and then added, an ion doping method by which an ionized source gas is added without mass separation, a plasma immersion ion implantation method, or plasma treatment can be used. By addition of a rare gas, the region 233 is provided in the region 231 of the oxide 230 (see FIG. 49).

Next, the conductor 252 (the conductor 252a, the conductor 252b, the conductor 252c, and the conductor 252d) is formed (see FIG. 50). A conductor electrically connected to the conductor 252 may be formed, as necessary.

Through the above process, the semiconductor device including the transistor 202 and the capacitor 101 can be manufactured. As illustrated in FIG. 30 to FIG. 50, by using the method for manufacturing a semiconductor device described in this embodiment, the transistor 202 and the capacitor 101 can be manufactured.

According to one embodiment of the present invention, a semiconductor device that can be miniaturized or highly integrated can be provided. Alternatively, according to one embodiment of the present invention, a semiconductor device with favorable electrical characteristics can be provided. Alternatively, according to one embodiment of the present invention, a semiconductor device with a low off-state current can be provided. Alternatively, according to one embodiment of the present invention, a transistor with a high on-state current can be provided. Alternatively, according to one embodiment of the present invention, a highly reliable semiconductor device can be provided. Alternatively, according to one embodiment of the present invention, a semiconductor device with low power consumption can be provided. Alternatively, according to one embodiment of the present invention, a semiconductor device with high productivity can be provided.

The structures, methods, and the like in this embodiment described above can be combined as appropriate with the structures, methods, and the like described in the other embodiments.

Embodiment 3

In this embodiment, one embodiment of a semiconductor device will be described with reference to FIG. 51 and FIG. 52.

[Memory Device 1]

Figure 51:
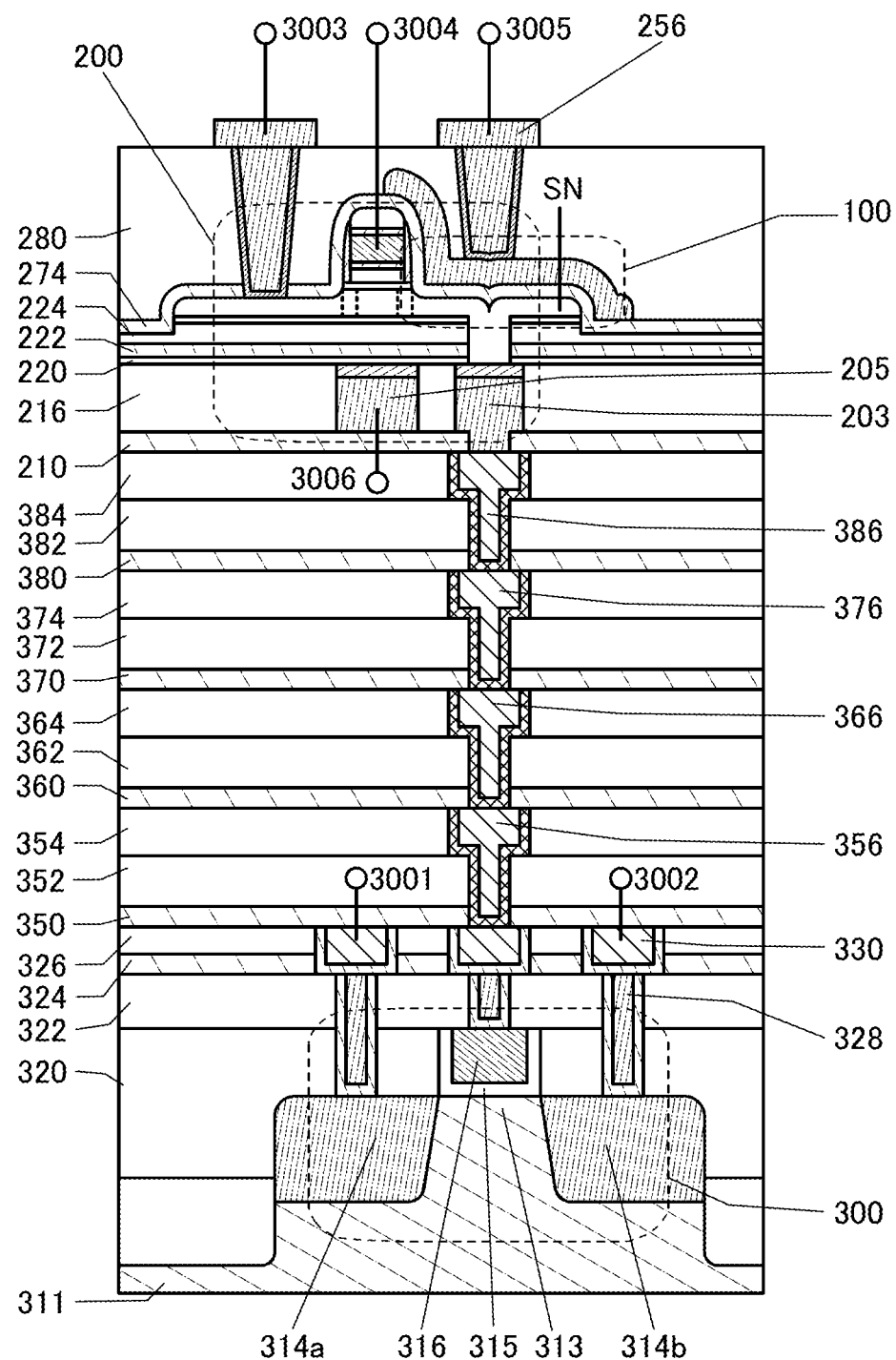
FIG. 51 A cross-sectional view illustrating a structure of a memory device of one embodiment of the present invention.

A memory device illustrated in FIG. 51 includes the transistor 200, the capacitor 100, and the transistor 300.

The transistor 200 is a transistor whose channel is formed in a semiconductor layer including an oxide semiconductor. Since the off-state current of the transistor 200 is low, a memory device using it can retain stored contents for a long time. In other words, since refresh operation is not required or frequency of refresh operation is extremely low, the power consumption of the memory device can be sufficiently reduced.

In the memory device illustrated in FIG. 51, a wiring 3001 is electrically connected to the source of the transistor 300, and a wiring 3002 is electrically connected to the drain of the transistor 300. A wiring 3003 is electrically connected to one of the source and the drain of the transistor 200, a wiring 3004 is electrically connected to the first gate of the transistor 200, and a wiring 3006 is electrically connected to the second gate of the transistor 200. The other of the source and the drain of the transistor 200 functions as one electrode of the capacitor 100, and is electrically connected to the gate of the transistor 300 through an opening formed in the insulator 220, the insulator 222, the insulator 224, and the oxide 230a. A wiring 3005 is electrically connected to the other electrode of the capacitor 100.

The memory device illustrated in FIG. 51 has a feature that the potential of the gate of the transistor 300 can be retained and thus enables writing, retaining, and reading of data as follows.

Writing and retaining of data are described. First, the potential of the fourth wiring 3004 is set to a potential at which the transistor 200 is brought into a conduction state, so that the transistor 200 is brought into a conduction state. Accordingly, the potential of the third wiring 3003 is supplied to a node SN where the gate of the transistor 300 and one electrode of the capacitor 100 are electrically connected to each other. That is, a predetermined charge is supplied to the gate of the transistor 300 (writing). Here, one of charges providing two different potential levels (hereinafter referred to as a Low-level charge and a High-level charge) is supplied. After that, the potential of the fourth wiring 3004 is set to a potential at which the transistor 200 is brought into a non-conduction state so that the transistor 200 is brought into a non-conduction state; thus, the charge is retained in the node SN (retaining).

In the case where the off-state current of the transistor 200 is low, the charge of the node SN is retained for a long time.

Next, reading of data is described. An appropriate potential (reading potential) is supplied to the fifth wiring 3005 in a state where a predetermined potential (constant potential) is supplied to the first wiring 3001, whereby the second wiring 3002 has a potential corresponding to the amount of charge retained in the node SN. This is because when the transistor 300 is of an n-channel type, an apparent threshold voltage $V_{th\_H}$ at the time when a High-level charge is supplied to the gate of the transistor 300 is lower than an apparent threshold voltage $V_{th\_L}$ at the time when a Low-level charge is supplied to the gate of the transistor 300. Here, an apparent threshold voltage refers to the potential of the fifth wiring 3005 which is needed to bring the transistor 300 into a "conduction state". Thus, the potential of the fifth wiring 3005 is set to a potential $V_0$ which is between $V_{th\_H}$ and $V_{th\_L}$, whereby the charge supplied to the node SN can be determined. For example, in the case where a High-level charge is supplied to the node SN in writing, when the potential of the fifth wiring 3005 is $V_0$ ($>V_{th\_H}$), the transistor 300 is brought into a "conduction state". Meanwhile, in the case where a Low-level charge is supplied to the node SN, the transistor 300 remains in a "non-conduction state" even when the potential of the fifth wiring 3005 is $V_0$ ($<V_{th\_L}$). Thus, the data retained in the node SN can be read by determining the potential of the second wiring 3002.

<Structure of Memory Device 1>

The memory device of one embodiment of the present invention includes the transistor 300, the transistor 200, and the capacitor 100 as illustrated in FIG. 51. The transistor 200 is provided above the transistor 300, and the capacitor 100 is provided in the same layer as the transistor 200.

The transistor 300 is provided on a substrate 311 and includes a conductor 316, an insulator 315, a semiconductor region 313 that is part of the substrate 311, and a low-resistance region 314a and a low-resistance region 314b functioning as a source region and a drain region.

The transistor 300 is of either a p-channel type or an n-channel type.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be a HEMT (High Electron Mobility Transistor) with GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

The insulator 315 functions as a gate insulating film of the transistor 300.

For the conductor 316 functioning as the gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that the work function is determined by a material of the conductor, whereby the threshold voltage can be adjusted. Specifically, it is preferable to use a material such as titanium nitride, tantalum nitride, or the like for the conductor. Furthermore, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 51 is only an example and the structure is not limited thereto; a transistor appropriate for a circuit configuration or a driving method is used.

An insulator 320, an insulator 322, an insulator 324, and an insulator 326 are stacked sequentially and provided to cover the transistor 300.

For the insulator 320, the insulator 322, the insulator 324, and the insulator 326, for example, silicon oxide, silicon oxynitride, silicon nitride oxide, silicon nitride, aluminum oxide, aluminum oxynitride, aluminum nitride oxide, or aluminum nitride is used.

The insulator 322 may function as a planarization film for eliminating a level difference caused by the transistor 300 or the like provided below the insulator 322. For example, a top surface of the insulator 322 may be planarized by planarization treatment using a chemical mechanical polishing (CMP) method to improve planarity.

For the insulator 324, a film having a barrier property that prevents hydrogen and impurities from being diffused from the substrate 311, the transistor 300, or the like into the region where the transistor 200 is provided is preferably used.

For the film having a barrier property against hydrogen, silicon nitride formed by a CVD method can be used, for example. Here, diffusion of hydrogen to a semiconductor element including an oxide semiconductor, such as the transistor 200, degrades the characteristics of the semiconductor element in some cases. Therefore, a film that inhibits hydrogen diffusion is preferably provided between the transistor 200 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in the range from 50° C. to 500° C., for example.

Note that the insulator 326 preferably has a lower permittivity than the insulator 324. For example, the relative permittivity of the insulator 326 is preferably lower than 4, further preferably lower than 3. The relative permittivity of the insulator 326 is, for example, preferably 0.7 or less times, further preferably 0.6 or less times the relative permittivity of the insulator 324. In the case where a material with a low permittivity is used for an interlayer film, the parasitic capacitance generated between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases, and part of the conductor functions as a plug in some cases.

As a material for each of the plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 51, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be provided using a material similar to those for the conductor 328 and the conductor 330.

Note that for example, as the insulator 350, an insulator having a barrier property against hydrogen is preferably used, as with the insulator 324. Furthermore, the conductor 356 preferably includes a conductor having a barrier property against hydrogen. In particular, the conductor having a barrier property against hydrogen is formed in an opening portion of the insulator 350 having a barrier property against hydrogen. With such a structure, the transistor 300 and the transistor 200 can be separated by a barrier layer, so that diffusion of hydrogen from the transistor 300 to the transistor 200 can be inhibited.

Note that as the conductor having a barrier property against hydrogen, tantalum nitride is preferably used, for example. By stacking tantalum nitride and tungsten having high conductivity, diffusion of hydrogen from the transistor 300 can be inhibited while the conductivity of a wiring is kept. In that case, a tantalum nitride layer having a barrier property against hydrogen is preferably in contact with the insulator 350 having a barrier property against hydrogen.

A wiring layer may be provided over the insulator 354 and the conductor 356. For example, in FIG. 51, an insulator 360, an insulator 362, and an insulator 364 are stacked sequentially. Furthermore, a conductor 366 is formed in the insulator 360, the insulator 362, and the insulator 364. The conductor 366 functions as a plug or a wiring. Note that the conductor 366 can be provided using a material similar to those for the conductor 328 and the conductor 330.

Note that for example, as the insulator 360, an insulator having a barrier property against hydrogen is preferably used, as with the insulator 324. Furthermore, the conductor 366 preferably includes a conductor having a barrier property against hydrogen. In particular, the conductor having a barrier property against hydrogen is formed in an opening portion of the insulator 360 having a barrier property against hydrogen. With such a structure, the transistor 300 and the transistor 200 can be separated by a barrier layer, so that diffusion of hydrogen from the transistor 300 to the transistor 200 can be inhibited.

A wiring layer may be provided over the insulator 364 and the conductor 366. For example, in FIG. 51, an insulator 370, an insulator 372, and an insulator 374 are stacked sequentially. Furthermore, a conductor 376 is formed in the insulator 370, the insulator 372, and the insulator 374. The conductor 376 functions as a plug or a wiring. Note that the conductor 376 can be provided using a material similar to those for the conductor 328 and the conductor 330.

Note that for example, as the insulator 370, an insulator having a barrier property against hydrogen is preferably used, as with the insulator 324. Furthermore, the conductor 376 preferably includes a conductor having a barrier property against hydrogen. In particular, the conductor having a barrier property against hydrogen is formed in an opening portion of the insulator 370 having a barrier property against hydrogen. With such a structure, the transistor 300 and the transistor 200 can be separated by a barrier layer, so that diffusion of hydrogen from the transistor 300 to the transistor 200 can be inhibited.

A wiring layer may be provided over the insulator 374 and the conductor 376. For example, in FIG. 51, an insulator 380, an insulator 382, and an insulator 384 are stacked sequentially. Furthermore, a conductor 386 is formed in the insulator 380, the insulator 382, and the insulator 384. The conductor 386 functions as a plug or a wiring. Note that the conductor 386 can be provided using a material similar to those for the conductor 328 and the conductor 330.

Note that for example, as the insulator 380, an insulator having a barrier property against hydrogen is preferably used, as with the insulator 324. Furthermore, the conductor 386 preferably includes a conductor having a barrier property against hydrogen. In particular, the conductor having a barrier property against hydrogen is formed in an opening portion of the insulator 380 having a barrier property against hydrogen. With such a structure, the transistor 300 and the transistor 200 can be separated by a barrier layer, so that diffusion of hydrogen from the transistor 300 to the transistor 200 can be inhibited.

The insulator 210 is provided over the insulator 384 and the conductor 386. A substance having a barrier property against oxygen and hydrogen is preferably used for the insulator 210.

The conductor 203, the conductor 205, and the insulator 216 are provided over the insulator 210.

For the insulator 210, for example, a film having a barrier property that prevents hydrogen and impurities from being diffused from the substrate 311 or a region where the transistor 300 is provided into the region where the transistor 200 is provided. Therefore, a material similar to that for the insulator 324 can be used.

For the film having a barrier property against hydrogen, silicon nitride formed by a CVD method can be used. Here, diffusion of hydrogen to a semiconductor element including an oxide semiconductor, such as the transistor 200, degrades the characteristics of the semiconductor element in some cases. Therefore, a film that inhibits hydrogen diffusion is preferably provided between the transistor 200 and the transistor 300. The film that inhibits hydrogen diffusion is specifically a film from which a small amount of hydrogen is released.

For the film having a barrier property against hydrogen used for the insulator 210, for example, a metal oxide such as aluminum oxide, hafnium oxide, or tantalum oxide is preferably used.

In particular, aluminum oxide has an excellent blocking effect that prevents passage of oxygen and impurities such as hydrogen and moisture which cause a change in electrical characteristics of the transistor. Accordingly, aluminum oxide can prevent entry of impurities such as hydrogen and moisture into the transistor 200 during a manufacturing process of the transistor and after the manufacturing. In addition, release of oxygen from the oxide included in the transistor 200 can be inhibited. Therefore, aluminum oxide is suitably used for a protective film of the transistor 200.

The transistor 200 and the capacitor 100 are provided over the insulator 210. Note that the structures of the transistor 200 and the capacitor 100 described in the above embodiments can be used as those of the transistor 200 and the capacitor 100. The transistor 200 illustrated in FIG. 51 is an example and the structure is not limited thereto; a transistor appropriate for a circuit configuration or a driving method is used.

Figure 52:
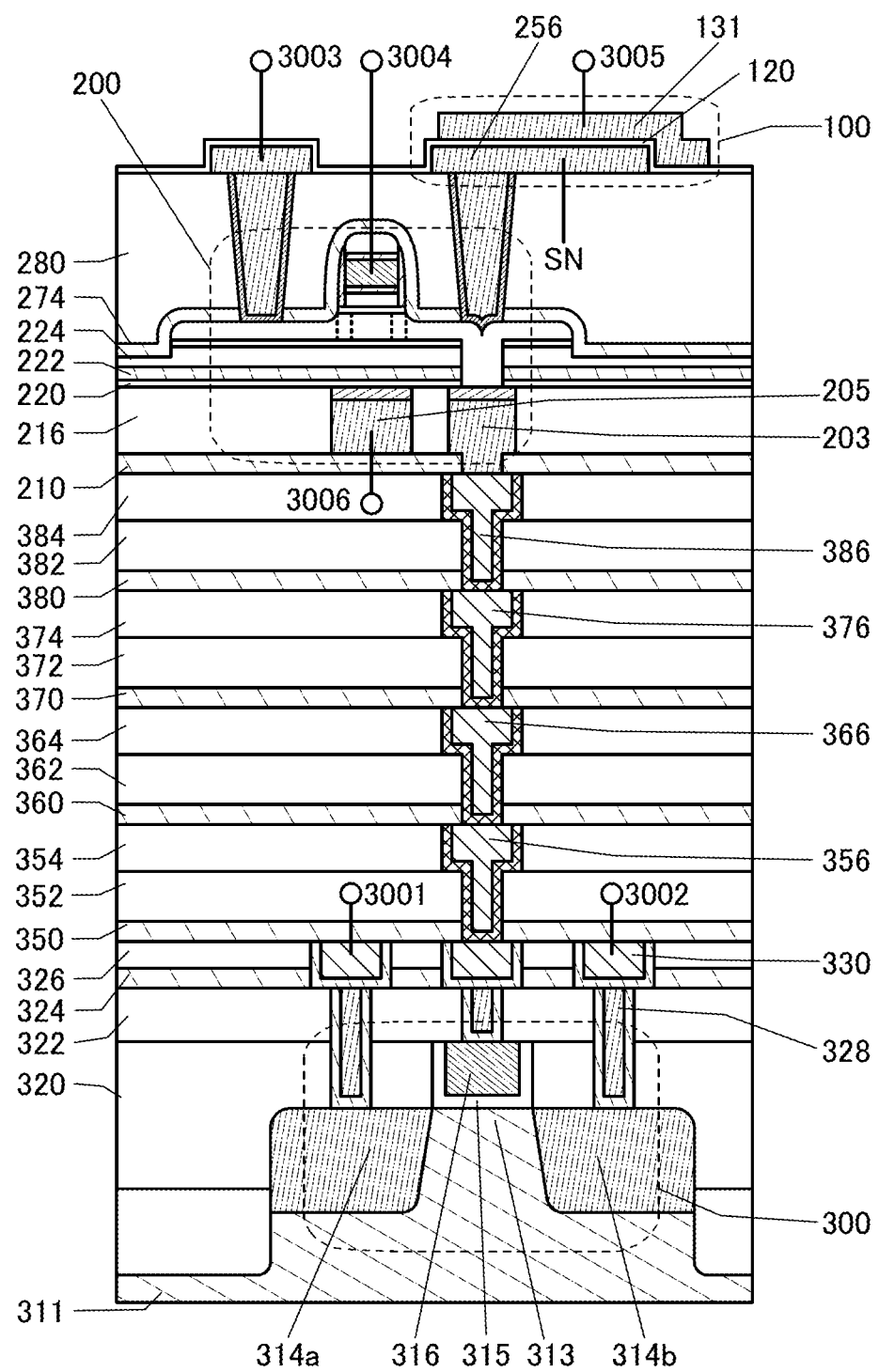
FIG. 52 A cross-sectional view illustrating a structure of a memory device of one embodiment of the present invention.

FIG. 52 illustrates an example in which the capacitor 100 is provided over the transistor 200. The conductor 256 electrically connected to the other of the source and the drain of the transistor 200 is used as one electrode of the capacitor 100. The conductor 256 is electrically connected to the gate of the transistor 300. An insulator 120 functioning as a dielectric of the capacitor 100 is provided over the conductor 256. A conductor 131 is provided to overlap with the conductor 256 with the insulator 120 interposed therebetween. The conductor 131 functions as the other electrode of the capacitor 100 and is electrically connected to the wiring 3005.

The insulator 120 may be provided to cover a side surface of the conductor 256. The conductor 131 may be provided on the side surface of the conductor 256 with the insulator 120 therebetween. Such a structure is preferable because the capacitor 100 can be formed of not only the top surface of the conductor 256 and the conductor 131 facing the top surface of the conductor 256 but also the side surface of the conductor 256 and the conductor 131 facing the side surface of the conductor 256 and thus the capacitance value can be increased without increasing the area of a top surface of the capacitor 100.

The above is the description of the structure example. With the use of this structure, a semiconductor device using a transistor including an oxide semiconductor can have a suppressed variation in electrical characteristics and improved reliability. Alternatively, a transistor including an oxide semiconductor with a high on-state current can be provided. Alternatively, a transistor including an oxide semiconductor with a low off-state current can be provided. Alternatively, a semiconductor device with low power consumption can be provided.

The structures, methods, and the like in this embodiment described above can be combined as appropriate with the structures, methods, and the like described in the other embodiments.

Embodiment 4

In this embodiment, one embodiment of a semiconductor device will be described with reference to FIG. 53 to FIG. 56.

In the semiconductor device of this embodiment, materials similar to those in Embodiment 1 to Embodiment 3 can be used for components with the same reference numerals as the semiconductor device in Embodiment 1 to Embodiment 3. Unless otherwise specified, the components formed in this embodiment can obtain structural characteristics and effects similar to those of the components described in Embodiment 1 to Embodiment 3, and description thereof is omitted.

[Memory Device 2]

Figure 53A:
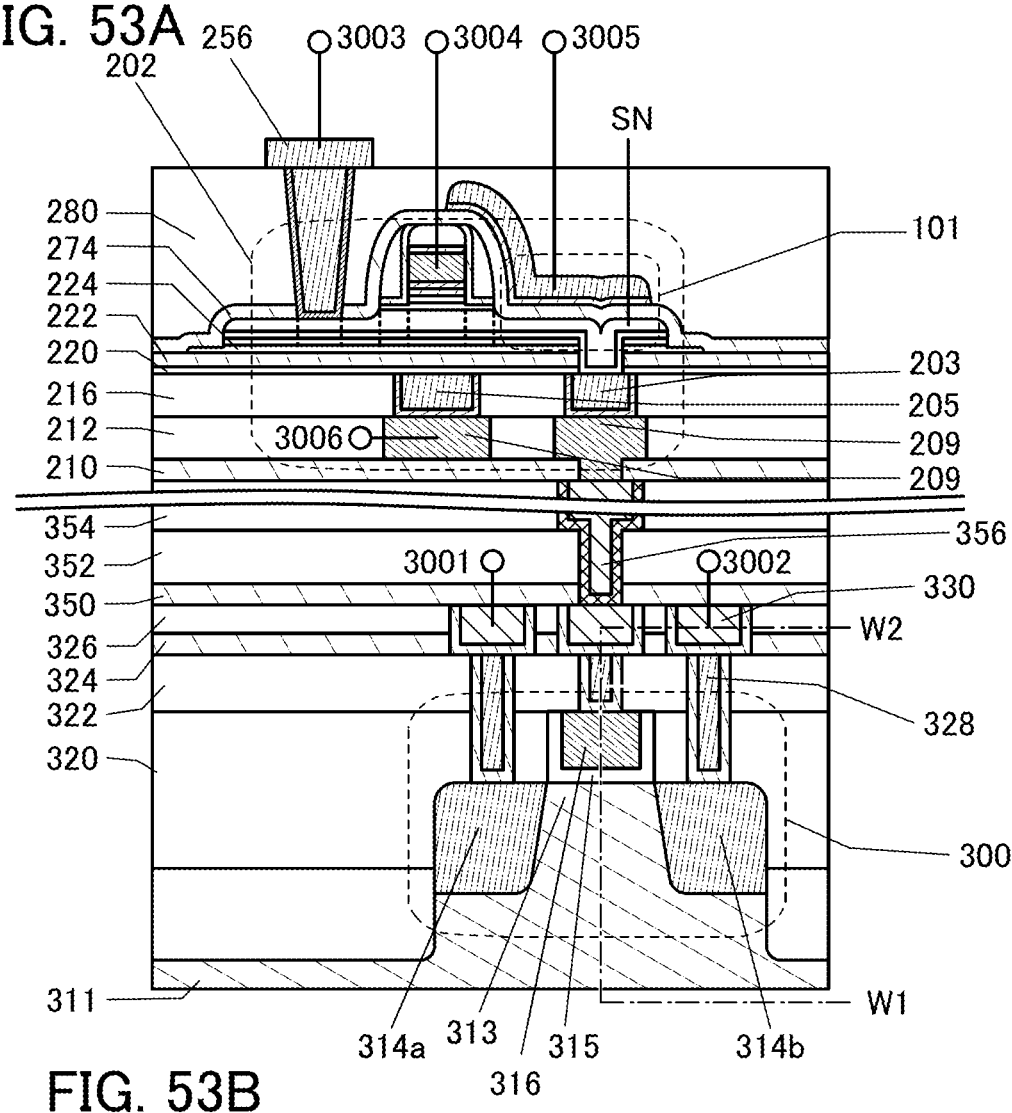
FIGS. 53A and 53B Cross-sectional views illustrating a structure of a memory device of one embodiment of the present invention.
Figure 54:
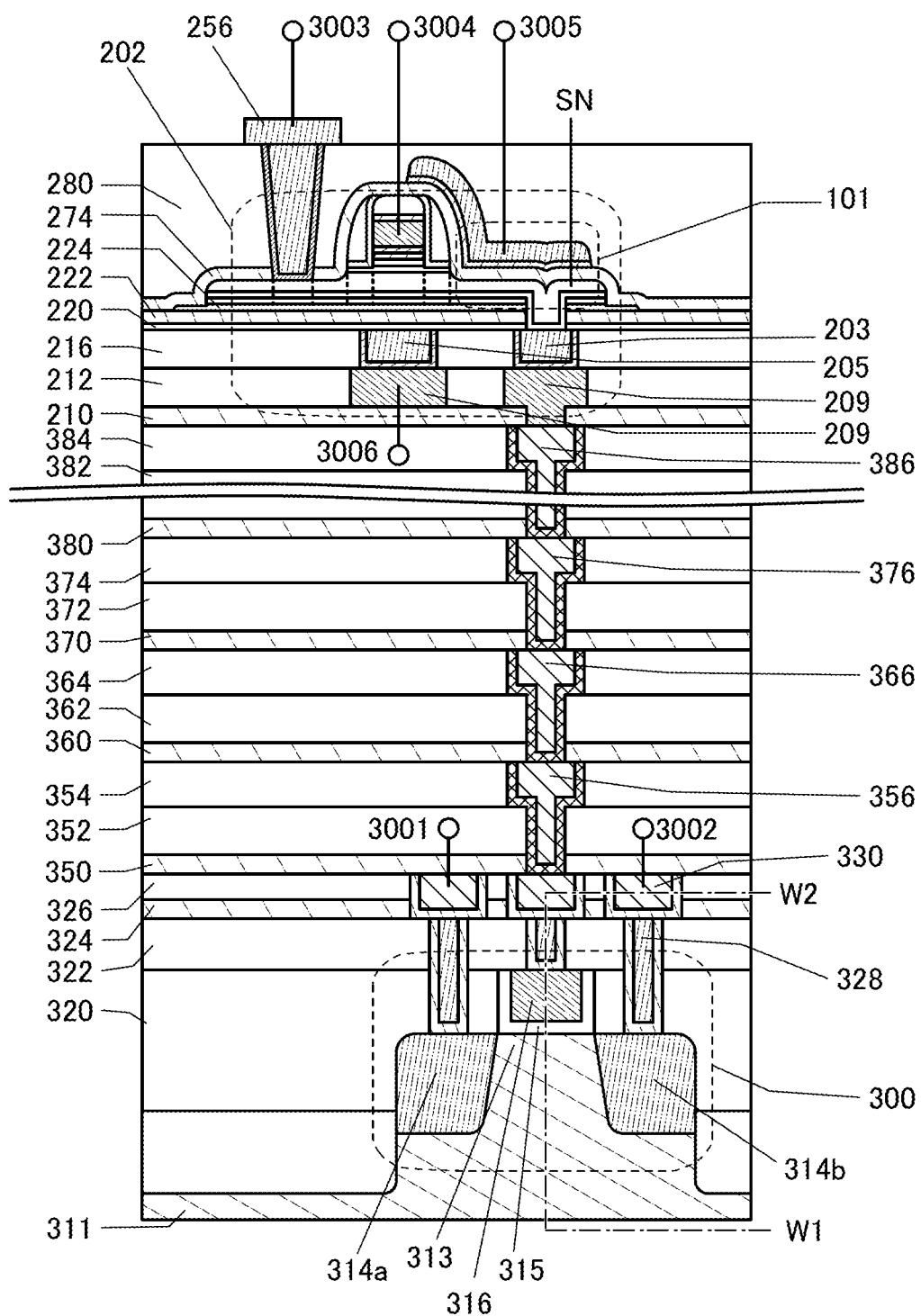
FIG. 54 A cross-sectional view illustrating a structure of a memory device of one embodiment of the present invention.

Memory devices illustrated in FIG. 53(A) and FIG. 54 each include the transistor 202, the capacitor 101, and the transistor 300, which are described in Embodiment 2.

<Structure of Memory Device 2>

The memory device illustrated in FIG. 53(A) includes the transistor 300; the insulator 350, the insulator 352, and the insulator 354 over the transistor 300 which are provided with the conductor 356; the insulator 210 over the insulator 354 and the conductor 356; and the transistor 202 and the capacitor 101 over the insulator 210.

The memory device illustrated in FIG. 54 includes the transistor 300; the insulator 350, the insulator 352, and the insulator 354 over the transistor 300 which are provided with the conductor 356; the insulator 360, the insulator 362, and the insulator 364 which are provided with the conductor 366; the insulator 370, the insulator 372, and the insulator 374 which are provided with the conductor 376; the insulator 380, the insulator 382, and the insulator 384 which are provided with the conductor 386; the insulator 210 over the insulator 384 and the conductor 386; and the transistor 202 and the capacitor 101 over the insulator 210.

The transistor 202 and the capacitor 101 illustrated in FIG. 53(A) and FIG. 54 have some components in common and thus have a small projected area, which enables miniaturization and high integration.

Writing, retaining, and reading of data in the memory devices illustrated in FIG. 53(A) and FIG. 54 are performed as in methods similar to those described in Embodiment 3, and description thereof is omitted.

Note that the transistor 300 illustrated in FIG. 53(A) and FIG. 54 is only an example and the structure is not limited thereto; a transistor appropriate for a circuit configuration or a driving method is used.

Figure 53B:
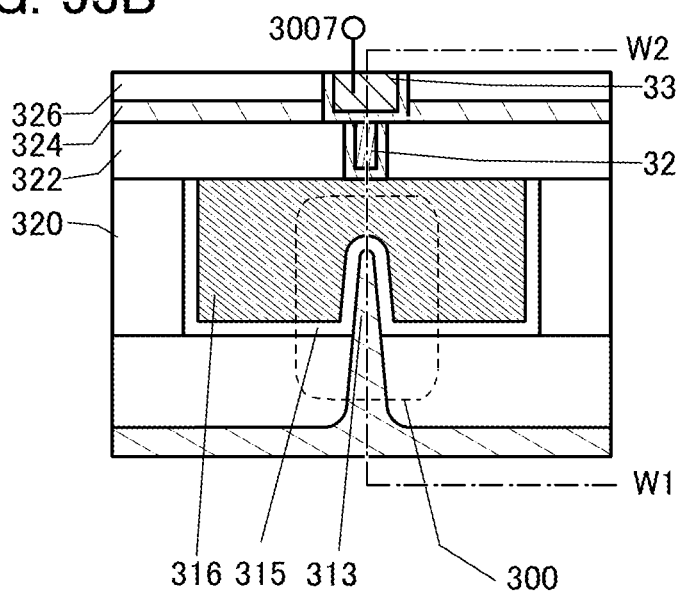

Here, FIG. 53(B) shows a cross-sectional view of the transistor 300 in the W width direction denoted by W1-W2 in FIG. 53(A) and FIG. 54. In the transistor 300, the semiconductor region 313 (part of the substrate 311) where a channel is formed has a convex shape as illustrated in FIG. 53(B). The conductor 316 is provided to cover side surfaces and a top surface of the semiconductor region 313 with the insulator 315 therebetween. Note that for the conductor 316, a material that adjusts the work function may be used. Such a transistor 300 is also referred to as a FIN-type transistor because it utilizes a convex portion of the semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

For the insulator 324, a film having a barrier property that prevents hydrogen and impurities from being diffused from the substrate 311, the transistor 300, or the like into the region where the transistor 202 is provided is preferably used.

The insulator 210, the insulator 212, and the insulator 216 are stacked sequentially and provided over the insulator 354 and the conductor 356. A substance having a barrier property against oxygen and hydrogen is preferably used for one of the insulator 210, the insulator 212, and the insulator 216.

For the insulator 210, the insulator 212, and the insulator 216, for example, a film having a barrier property that prevents hydrogen and impurities from being diffused from the substrate 311 or a region where the transistor 300 is provided into the region where the transistor 202 is provided. Therefore, a material similar to that for the insulator 324 can be used.

For the film having a barrier property against hydrogen used for the insulator 210, the insulator 212, and the insulator 216, for example, a metal oxide such as aluminum oxide, hafnium oxide, or tantalum oxide is preferably used.

For the insulator 212 and the insulator 216, for example, an interlayer film of a material with a relatively low permittivity is used, whereby the parasitic capacitance generated between wirings can be reduced. A silicon oxide film or a silicon oxynitride film can be used for the insulator 212 and the insulator 216, for example.

The conductor 209, the conductor 203, the conductor 205, and the like, which are conductors included in the transistor 202, are embedded in the insulator 210, the insulator 212, and the insulator 216. Note that the conductor 203 and the conductor 209 each function as a plug or a wiring that electrically connects the transistor 202 and the transistor 300. The conductor 209, the conductor 203, and the conductor 205 can be provided using a material similar to those for the conductor 328 and the conductor 330.

In particular, the conductor 209 in a region in contact with the insulator 210 and the insulator 212 is preferably a conductor having a barrier property against oxygen, hydrogen, and water. With such a structure, the transistor 300 and the transistor 202 can be separated by a layer having a barrier property against oxygen, hydrogen, and water, whereby diffusion of hydrogen from the transistor 300 to the transistor 202 can be inhibited.

The transistor 202 and the capacitor 101 are provided over the insulator 212. Note that the structures of the transistor 202 and the capacitor 101 described in the above embodiments can be used as those of the transistor 202 and the capacitor 101. The transistor 202 and the capacitor 101 illustrated in FIG. 53(A) are examples and the structures are not limited thereto; a transistor appropriate for a circuit configuration or a driving method is used.

Here, FIG. 54 illustrates an example in which the gate of the transistor 300 and the other of the source and the drain of the transistor 202 are electrically connected to each other through the four conductors: the conductor 356, the conductor 366, the conductor 376, and the conductor 386; however, this embodiment is not limited thereto. A conductor provided between the gate of the transistor 300 and the other of the source and the drain of the transistor 202 may be only the conductor 356, or two, three, or five or more conductors may be provided. Alternatively, the conductor 330 electrically connected to the gate of the transistor 300 and the conductor 209 electrically connected to the other of the source and the drain of the transistor 202 may be directly connected to each other.

The above is the description of the structure example. With the use of this structure, a semiconductor device using a transistor including an oxide semiconductor can have a suppressed variation in electrical characteristics and improved reliability. Alternatively, a transistor including an oxide semiconductor with a high on-state current can be provided. Alternatively, a transistor including an oxide semiconductor with a low off-state current can be provided. Alternatively, a semiconductor device with low power consumption can be provided.

<Modification Example of Memory Device 2>

Figure 55:
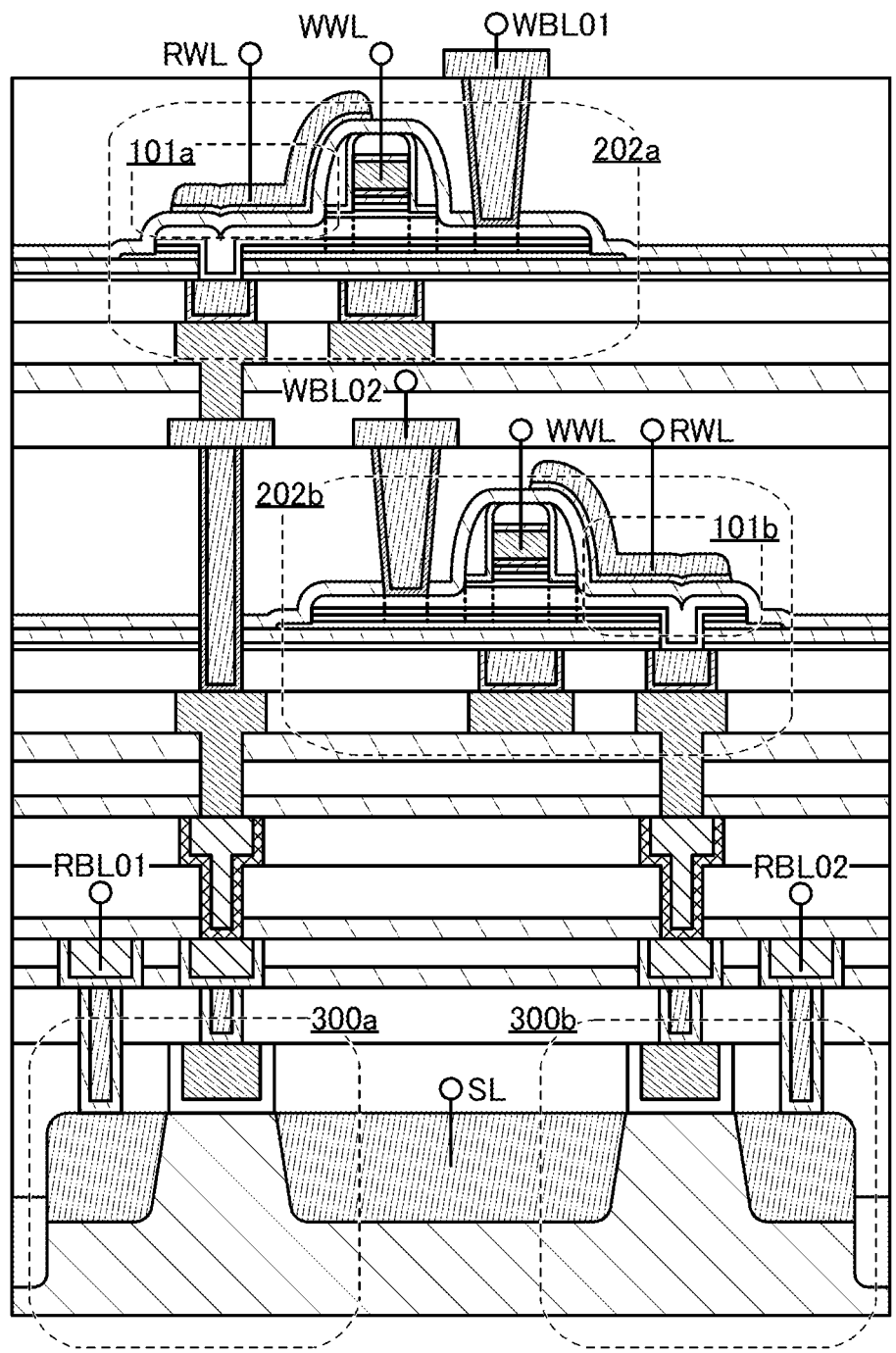
FIG. 55 A cross-sectional view illustrating a structure of a memory device of one embodiment of the present invention.
Figure 56:
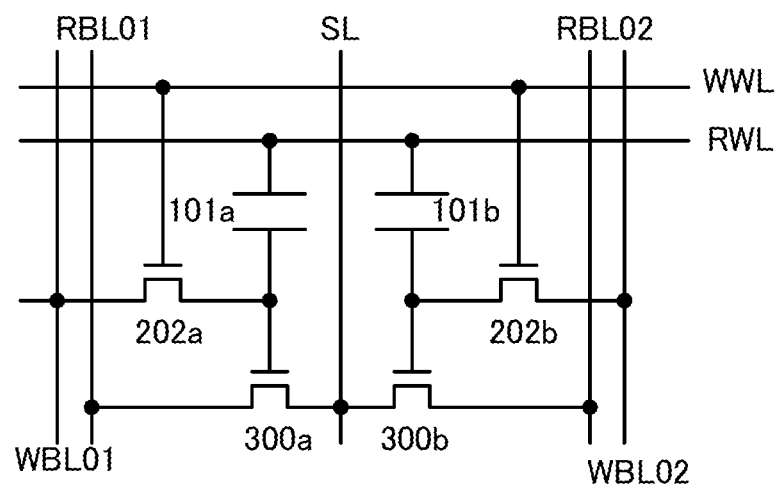
FIG. 56 A circuit diagram showing a configuration of a memory device of one embodiment of the present invention.

FIG. 55 and FIG. 56 show a modification example of this embodiment.

When memory devices illustrated in FIG. 55 are integrated as memory cells, a memory cell array can be formed. For example, in a circuit diagram shown in FIG. 56, a plurality of memory devices are provided so that memory cells are arranged in a matrix. FIG. 55 is an example of a cross-sectional view of a memory cell array in the case where the transistors 202 are integrated in the memory device illustrated in FIG. 53.

FIG. 55 and FIG. 56 illustrate a memory cell array including a memory device including the transistor 300a, the transistor 202a, and the capacitor 101a, a memory device including the transistor 300b, the transistor 202b, and the capacitor 101b, the wiring SL, wirings RBL (RBL01 and RBL02), wirings WBL (WBL01 and WBL02), a wiring WWL, and a wiring RWL.

For example, as illustrated in FIG. 55, the transistor 202a and the transistor 202b can be provided to overlap with each other. The wiring SL can be provided in common with the transistor 300a and the transistor 300b. For example, when the low-resistance region 314a is provided as the wiring SL in common with the transistor 300a and the transistor 300b, formation of a wiring or a plug is unnecessary; thus, the process can be shortened. This structure can also lead to a reduction in area, higher integration, and miniaturization of the semiconductor device.

The structures, methods, and the like in this embodiment described above can be combined as appropriate with the structures, methods, and the like described in the other embodiments.

Embodiment 5

In this embodiment, a NOSRAM will be described as an example of a memory device, which is one embodiment of the present invention, including a transistor in which an oxide is used for a semiconductor (hereinafter referred to as an OS transistor) and a capacitor with reference to FIG. 57 to FIG. 60. A NOSRAM (registered trademark) is an abbreviation of "Nonvolatile Oxide Semiconductor RAM", which indicates a RAM including a gain cell (2T or 3T) memory cell. Note that hereinafter, a memory device including an OS transistor, such as a NOSRAM, is referred to as an OS memory in some cases.

A memory device in which OS transistors are used in memory cells (hereinafter referred to as an "OS memory") is used in a NOSRAM. The OS memory is a memory including at least a capacitor and an OS transistor that controls charge and discharge of the capacitor. The OS memory has excellent retention characteristics because the OS transistor has an extremely low off-state current and thus can function as a nonvolatile memory.

<<NOSRAM>>

Figure 57:
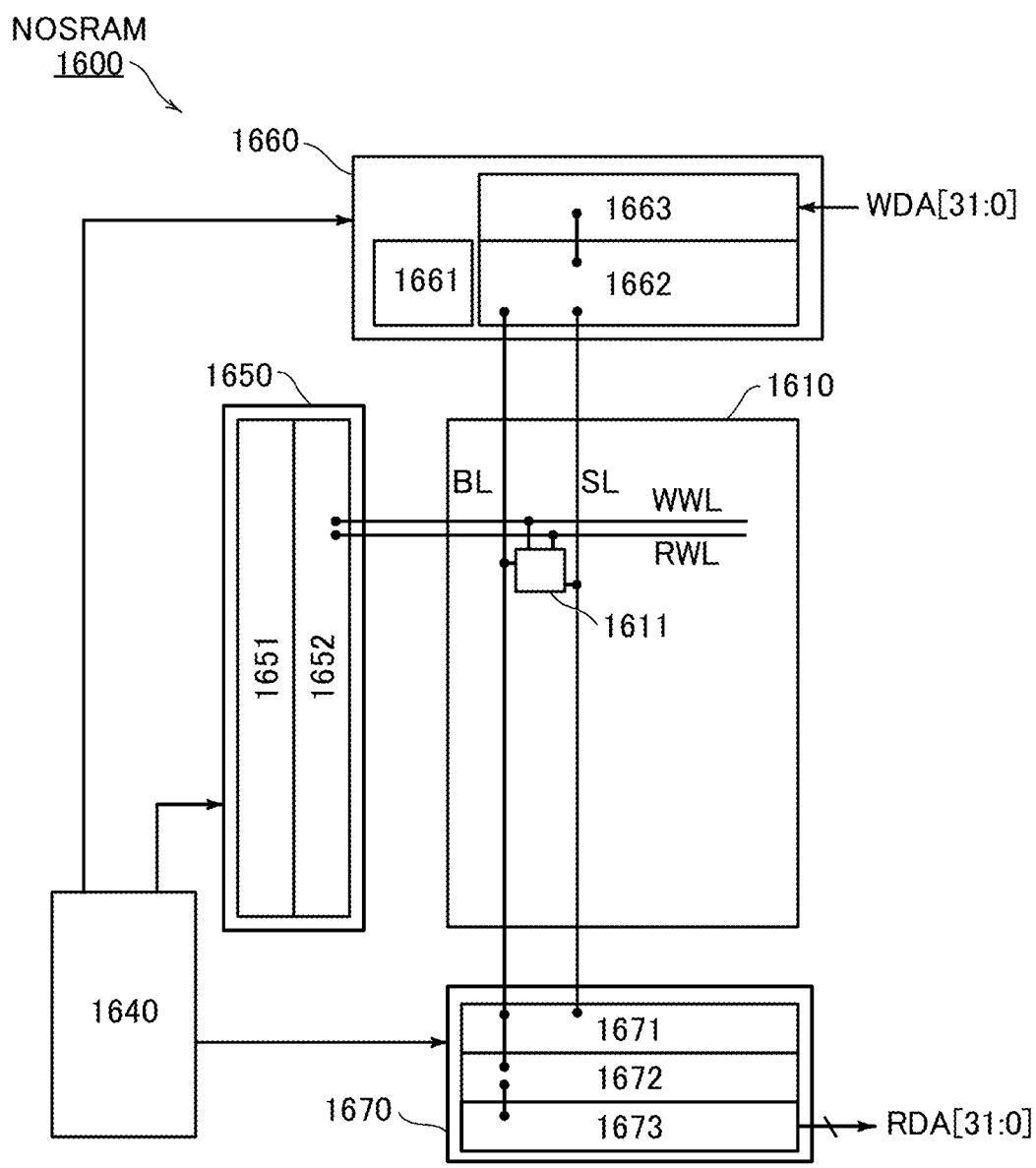
FIG. 57 A block diagram illustrating a structure example of a memory device of one embodiment of the present invention.

FIG. 57 illustrates a configuration example of a NOSRAM. A NOSRAM 1600 illustrated in FIG. 57 includes a memory cell array 1610, a controller 1640, a row driver 1650, a column driver 1660, and an output driver 1670. Note that the NOSRAM 1600 is a multilevel NOSRAM in which one memory cell stores multilevel data.

The memory cell array 1610 includes a plurality of memory cells 1611, a plurality of word lines WWL and RWL, bit lines BL, and source lines SL. The word lines WWL are write word lines and the word lines RWL are read word lines. In the NOSRAM 1600, one memory cell 1611 stores 3-bit (8-level) data.

The controller 1640 controls the NOSRAM 1600 as a whole and writes data WDA[31:0] and reads out data RDA[31:0]. The controller 1640 processes command signals from the outside (for example, a chip enable signal and a write enable signal) to generate control signals of the row driver 1650, the column driver 1660, and the output driver 1670.

The row driver 1650 has a function of selecting a row to be accessed. The row driver 1650 includes a row decoder 1651 and a word line driver 1652.

The column driver 1660 drives the source lines SL and the bit lines BL. The column driver 1660 includes a column decoder 1661, a write driver 1662, and a DAC (digital-analog converter circuit) 1663.

The DAC 1663 converts 3-bit digital data into an analog voltage. The DAC 1663 converts 32-bit data WDA[31:0] into an analog voltage per 3 bits.

The write driver 1662 has a function of precharging the source lines SL, a function of bringing the source lines SL into an electrically floating state, a function of selecting a source line SL, a function of inputting a writing voltage generated in the DAC 1663 to the selected source line SL, a function of precharging the bit lines BL, a function of bringing the bit lines BL into an electrically floating state, and the like.

The output driver 1670 includes a selector 1671, an ADC (analog-digital converter circuit) 1672, and an output buffer 1673. The selector 1671 selects a source line SL to be accessed and transmits the voltage of the selected source line SL to the ADC 1672. The ADC 1672 has a function of converting an analog voltage into 3-bit digital data. The voltage of the source line SL is converted into 3-bit data in the ADC 1672, and the output buffer 1673 retains the data output from the ADC 1672.

Note that the configuration of the row driver 1650, the column driver 1660, and the output driver 1670 described in this embodiment is not limited to the above. The arrangement of the drivers and wirings connected to the drivers may be changed or the functions of the drivers and the wirings connected to the drivers may be changed or added, depending on the configuration, the driving method, or the like of the memory cell array 1610. For example, the bit lines BL may have part of a function of the source lines SL.

Note that although the amount of data retained in each of the memory cells 1611 is 3 bits in the above description, the structure of the memory device described in this embodiment is not limited thereto. The amount of data retained in each of the memory cells 1611 may be 2 bits or less or 4 bits or more. In the case where the amount of data retained in each of the memory cells 1611 is one bit, for example, the DAC 1663 and the ADC 1672 is not necessarily provided.

<Memory Cell>

Figure 58A:
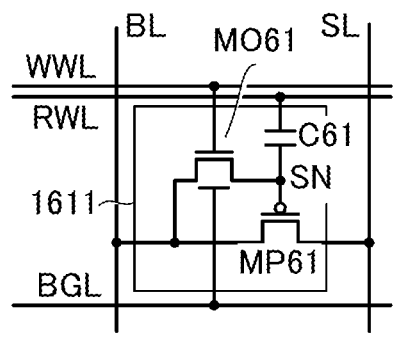
FIGS. 58A-58B Circuit diagrams illustrating configuration examples of memory devices of embodiments of the present invention.

FIG. 58(A) is a circuit diagram showing a configuration example of the memory cell 1611. The memory cell 1611 is a 2T gain cell and the memory cell 1611 is electrically connected to the word lines WWL and RWL, the bit line BL, the source line SL, and a wiring BGL. The memory cell 1611 includes a node SN, an OS transistor MO61, a transistor MP61, and a capacitor C61. The OS transistor MO61 is a write transistor. The transistor MP61 is a read transistor and is formed using a p-channel Si transistor, for example. The capacitor C61 is a storage capacitor for retaining the voltage of the node SN. The node SN is a node for data retaining and corresponds to a gate of the transistor MP61 here.

The write transistor of the memory cell 1611 is formed using the OS transistor MO61; thus, the NOSRAM 1600 can retain data for a long time.

Figure 58B:
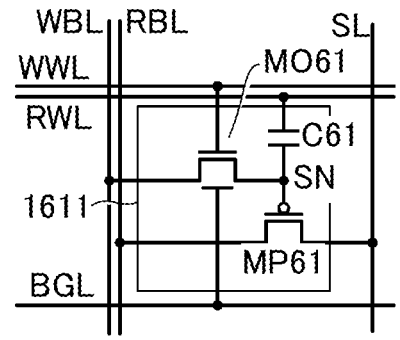

In the example of FIG. 58(A), write and read bit lines are a common bit line; however, as illustrated in FIG. 58(B), a bit line WBL functioning as a write bit line and a bit line RBL functioning as a read bit line may be provided.

Figure 58C:
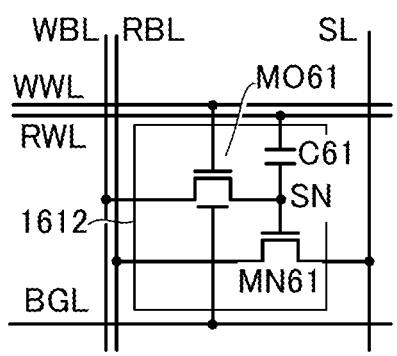
Figure 58D:
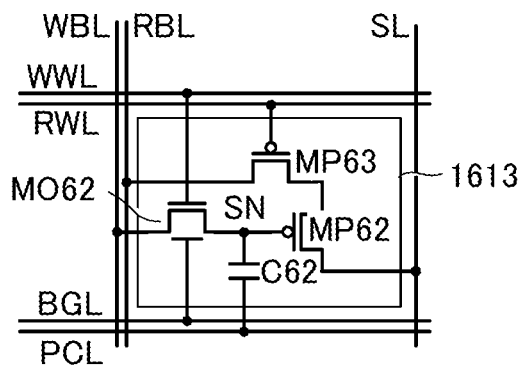
Figure 58E:
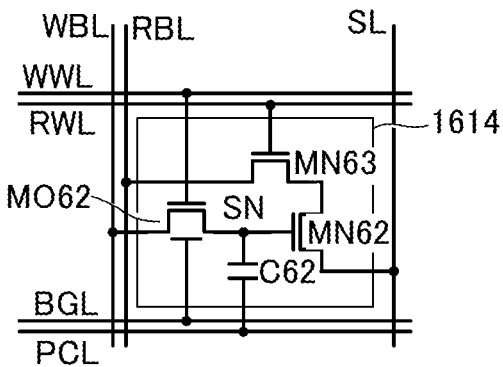

FIG. 58(C) to FIG. 58(E) show other configuration examples of the memory cell. FIG. 58(C) to FIG. 58(E) show examples where the write bit line WBL and the read bit line RBL are provided; however, as in FIG. 58(A), a bit line shared in writing and reading may be provided.

A memory cell 1612 illustrated in FIG. 58(C) is a modification example of the memory cell 1611 where the read transistor is changed into an n-channel transistor (MN61). The transistor MN61 may be an OS transistor or a Si transistor.

In the memory cells 1611 and 1612, the OS transistor MO61 may be an OS transistor with no back gate.

A memory cell 1613 illustrated in FIG. 58(D) is a 3T gain cell and is electrically connected to the word lines WWL and RWL, the bit lines WBL and RBL, the source line SL, the wirings BGL, and wirings PCL. The memory cell 1613 includes the node SN, an OS transistor MO62, a transistor MP62, a transistor MP63, and a capacitor C62. The OS transistor MO62 is a write transistor. The transistor MP62 is a read transistor and the transistor MP63 is a selection transistor.

A memory cell 1614 illustrated in FIG. 58(E) is a modification example of the memory cell 1613 where the read transistor and the selection transistor are changed into n-channel transistors (MN62 and MN63). The transistors MN62 and MN63 may be OS transistors or Si transistors.

The OS transistors provided in the memory cell 1611 to the memory cell 1614 may each be a transistor with no back gate or a transistor with a back gate.

A so-called NOR memory device in which the memory cells 1611 or the like are connected in parallel is described above, but the memory device of this embodiment is not limited thereto. For example, a so-called NAND memory device in which memory cells 1615 described below are connected in series may be provided.

Figure 59:
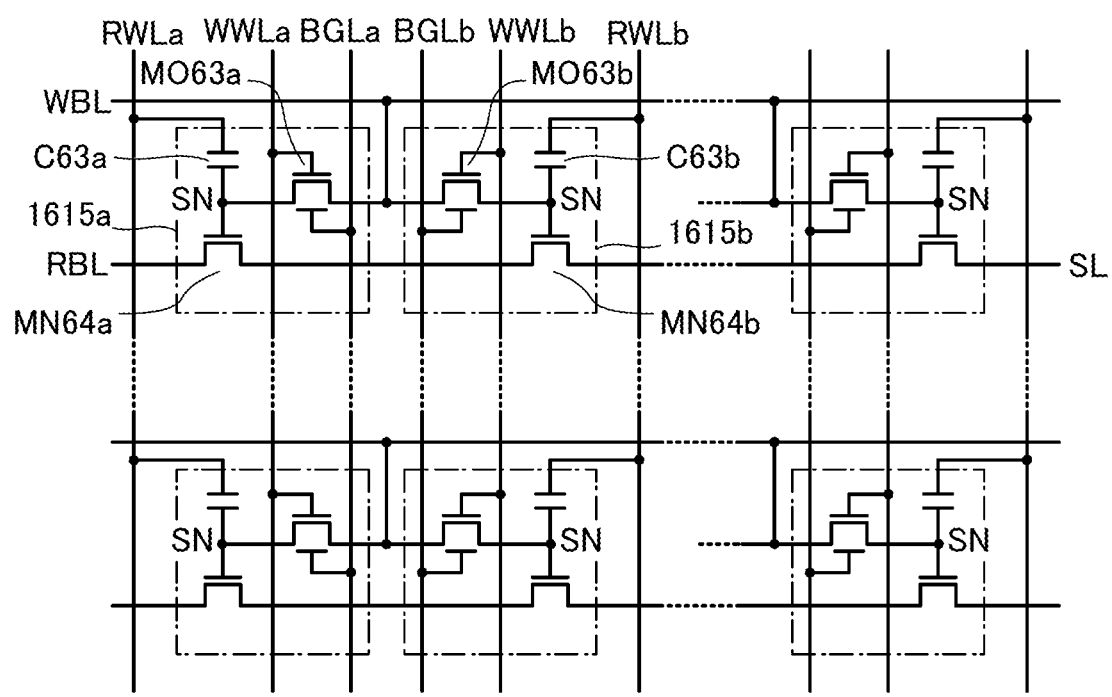
FIG. 59 A circuit diagram showing a configuration example of a memory device of one embodiment of the present invention.

FIG. 59 is a circuit diagram showing a configuration example of the NAND memory cell array 1610. The memory cell array 1610 illustrated in FIG. 59 includes the source line SL, the bit line RBL, the bit line WBL, the word line WWL, the word line RWL, the wiring BGL, and the memory cell 1615. The memory cell 1615 includes the node SN, an OS transistor MO63, a transistor MN64, and a capacitor C63. Here, the transistor MN64 is an n-channel Si transistor, for example. The transistor MN64 is not limited thereto and may be a p-channel Si transistor or an OS transistor.

A memory cell 1615a and a memory cell 1615b, which are illustrated in FIG. 59, are described below as examples. Here, the character "a" or "b" is added to the reference numerals of the wirings and circuit elements connected to the memory cell 1615a or the memory cell 1615b.

In the memory cell 1615a, a gate of a transistor MN64a, one of a source and a drain of a transistor MO63a, and one electrode of a capacitor C63a are electrically connected to each other. The bit line WBL and the other of the source and the drain of the transistor MO63a are electrically connected to each other. A word line WWLa and a gate of the transistor MO63a are electrically connected to each other. A wiring BGLa and a back gate of the transistor MO63a are electrically connected to each other. A word line RWLa and the other electrode of the capacitor C63a are electrically connected to each other.

The memory cell 1615b can be provided to be symmetric to the memory cell 1615a with the use of a contact portion to the bit line WBL as a symmetry axis. Therefore, circuit elements of the memory cell 1615b are connected to wirings in a manner similar to that for the memory cell 1615a.

A source of the transistor MN64a of the memory cell 1615a is electrically connected to a drain of a transistor MN64b of the memory cell 1615b. A drain of the transistor MN64a of the memory cell 1615a is electrically connected to the bit line RBL. A source of the transistor MN64b of the memory cell 1615b is electrically connected to the source line SL through the transistors MN64 of the plurality of memory cells 1615. As described here, the plurality of transistors MN64 are connected in series between the bit line RBL and the source line SL in the NAND memory cell array 1610.

Figure 60:
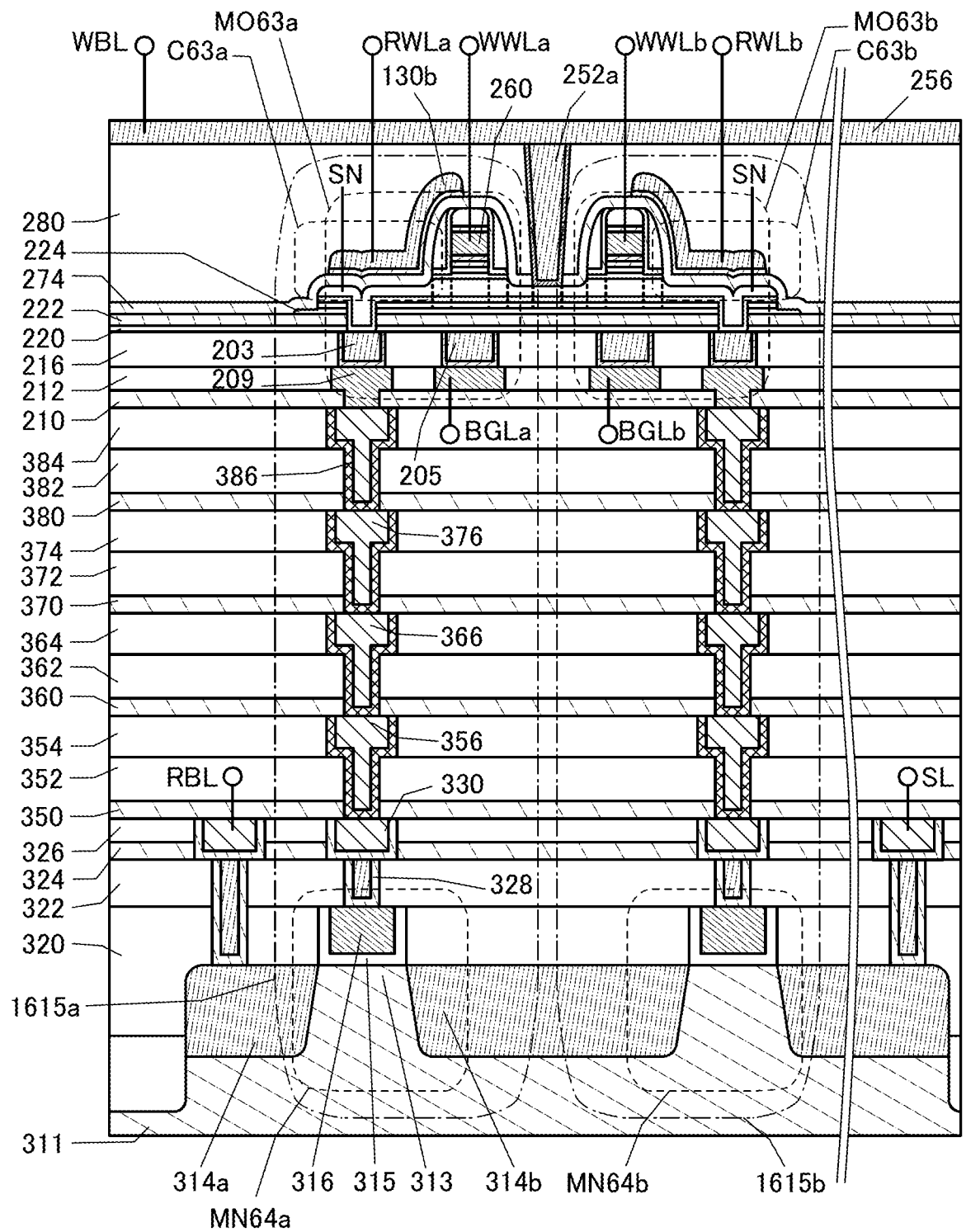
FIG. 60 A cross-sectional view illustrating a structure of a memory device of one embodiment of the present invention.

Here, FIG. 60 shows a cross-sectional view corresponding to the memory cell 1615a and the memory cell 1615b. The memory cell 1615a and the memory cell 1615b have a structure similar to that of the memory device illustrated in FIG. 29. That is, the capacitor C63a and a capacitor C63b have a structure similar to that of the capacitor 100, the OS transistor MO63a and an OS transistor MO63b have a structure similar to that of the transistor 200, and the transistor MN64a and the transistor MN64b have a structure similar to that of the transistor 300. Note that for the components illustrated in FIG. 60, which are given the same reference numerals as the components illustrated in FIG. 29, the description thereof can be referred to.

In the memory cell 1615a, the conductor 130b is provided to extend and functions as the word line RWLa, the conductor 260 is provided to extend and functions as the word line WWLa, and the conductor 209 in contact with a bottom surface of the conductor 205 is provided to extend and functions as the wiring BGLa. In the memory cell 1615b, a word line RWLb, a word line WWLb, and a wiring BGLb are provided in a manner similar to the above-described manner.

The low-resistance region 314b illustrated in FIG. 60 functions as the source of the transistor MN64a and the drain of the transistor MN64b. The low-resistance region 314a functioning as the drain of the transistor MN64a is electrically connected to the bit line RBL through the conductor 328 and the conductor 330. The source of the transistor MN64b is electrically connected to the source line SL through the transistors MN64 of the plurality of memory cells 1615, the conductor 328, and the conductor 330.

The conductor 256 is provided to extend and functions as the bit line WBL. Here, the conductor 252a functions as a contact portion to the word line WBL and is used in common with the transistor MO63a and the transistor MO63b. Since the contact portion to the bit line WBL is shared by the memory cell 1615a and the memory cell 1615b, the number of contact portions to the bit line WBL can be reduced and the area occupied by the memory cell 1615 when seen from the above can be reduced. Accordingly, the memory device of this embodiment can be further highly integrated and the storage capacity per unit area can be increased.

In a memory device including the memory cell array 1610 illustrated in FIG. 59, writing operation and reading operation are performed for every plurality of memory cells (hereinafter referred to as a memory cell column) connected to the same word line WWL (or the word line RWL). For example, the writing operation can be performed as follows. A potential at which the transistor MO63 is turned on is supplied to the word line WWL connected to a memory cell column on which writing is to be performed so that the transistors MO63 in the memory cell column on which writing is to be performed are turned on. Accordingly, the potential of the bit line WBL is supplied to the gates of the transistors MN64 and one electrode of the capacitors C63 in the selected memory cell column, whereby a predetermined charge is supplied to the gates. Thus, data can be written to the memory cells 1615 in the selected memory cell column.

For example, the reading operation can be performed as follows. First, a potential at which the transistor MN64 is turned on is supplied to the word lines RWL not connected to a memory cell column on which reading is to be performed regardless of a charge supplied to the gates of the transistors MN64, so that the transistors MN64 in memory cell columns other than the memory cell column on which reading is to be performed are turned on. Then, a potential (reading potential) at which an on state or an off state of the transistor MN64 is selected is supplied to the word line RWL connected to the memory cell column on which reading is to be performed in accordance with a charge of the gates of the transistors MN64. After that, a constant potential is supplied to the source line SL and a reading circuit connected to the bit line RBL is operated. Here, the plurality of transistors MN64 between the source line SL and the bit line RBL are turned on except the transistor MN64 in the memory cell column on which reading is to be performed; therefore, the conductance between the source line SL and the bit line RBL depends on the state (an on state or an off state) of the transistor MN64 in the memory cell column on which reading is to be performed. Since the conductance of the transistor varies depending on the charge of the gate of the transistor MN64 in the memory cell column on which reading is to be performed, the potential of the bit line RBL varies accordingly. By reading the potential of the bit line RBL with the reading circuit, data can be read from the memory cell 1615 in the selected memory cell column.

There is theoretically no limitation on the number of rewriting operations of the NOSRAM 1600 because data is rewritten by charging and discharging the capacitor C61, the capacitor C62, or the capacitor C63; and writing and reading of data can be performed with low energy. Furthermore, since data can be retained for a long time, the refresh rate can be reduced.

In the case where the semiconductor device described in any of the above embodiments is used for the memory cells 1611, 1612, 1613, 1614, and 1615, the transistors 200 can be used as the OS transistors MO61, MO62, and MO63, the capacitors 100 can be used as the capacitors C61, C62, and C63, and the transistors 300 can be used as the transistors MP61, MP62, MP63, MN61, MN62, MN63, and MN64. Thus, the area occupied by one set consisting of a transistor and a capacitor can be reduced when seen from the above, so that the memory device of this embodiment can be further highly integrated. As a result, storage capacity per unit area of the memory device of this embodiment can be increased.

The structure described in this embodiment can be used in appropriate combination with the structure described in the other embodiments.

Embodiment 6

Figure 61:
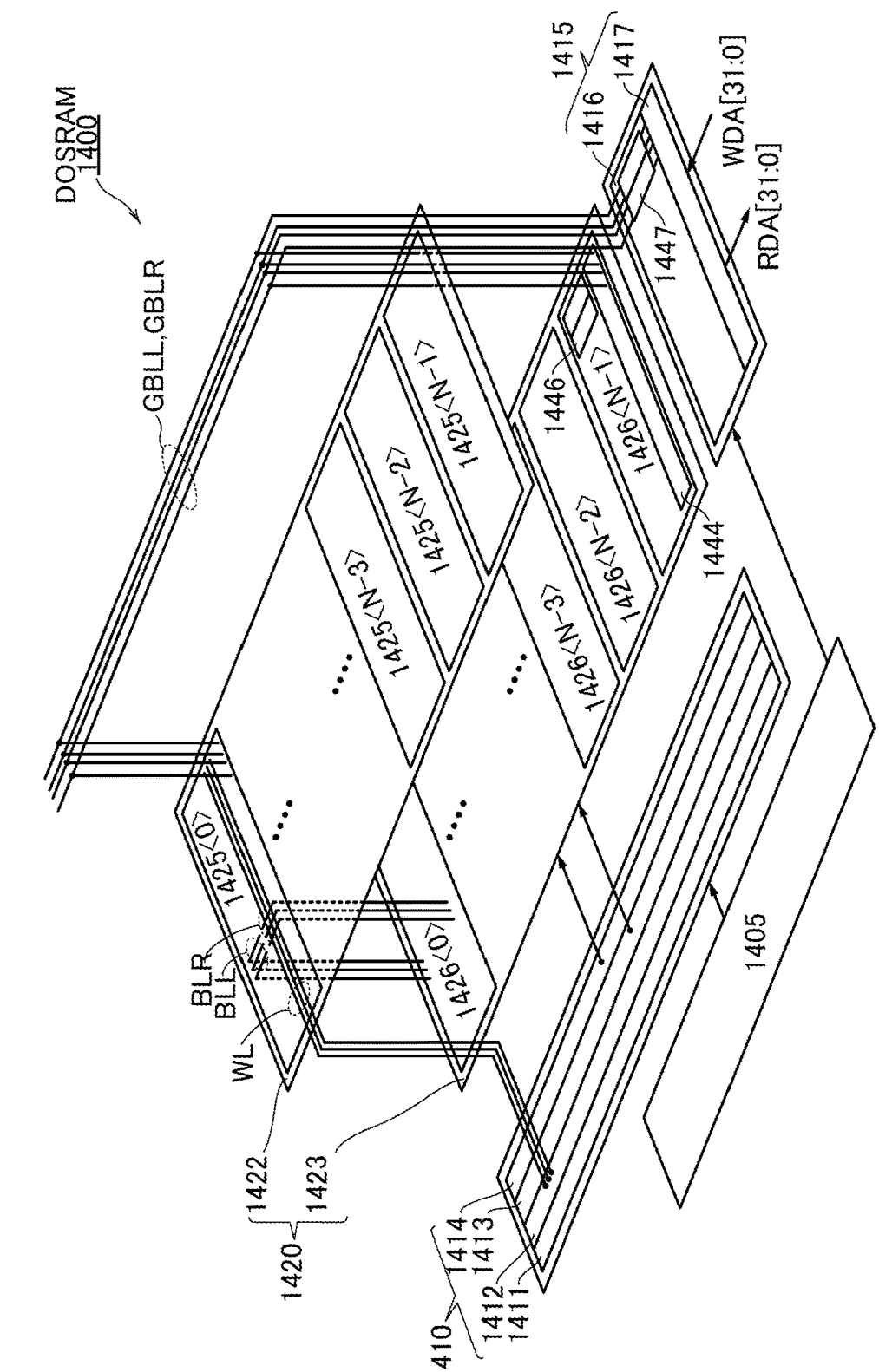
FIG. 61 A block diagram illustrating a configuration example of a memory device of one embodiment of the present invention.

In this embodiment, a DOSRAM is described as an example of the memory device of one embodiment of the present invention, which includes an OS transistor and a capacitor, with reference to FIG. 61 and FIG. 62. A DOSRAM (registered trademark) is an abbreviation for "Dynamic Oxide Semiconductor RAM", which is a RAM including a 1T (transistor) 1C (capacitor) memory cell. As in the NOSRAM, an OS memory is used in the DOSRAM.
<<DOSRAM 1400>>

FIG. 61 illustrates a configuration example of a DOSRAM. As illustrated in FIG. 61, a DOSRAM 1400 includes a controller 1405, a row circuit 1410, a column circuit 1415, and a memory cell and sense amplifier array 1420 (hereinafter referred to as an "MC-SA array 1420").

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.
(MC-SA array 1420)

The MC-SA array 1420 has a stacked-layer structure in which the memory cell array 1422 is stacked over the sense amplifier array 1423. The global bit lines GBLL and GBLR are stacked over the memory cell array 1422. The DOSRAM 1400 adopts, as the bit-line structure, a hierarchical bit line structure hierarchized with local bit lines and global bit lines.

Figure 62A:
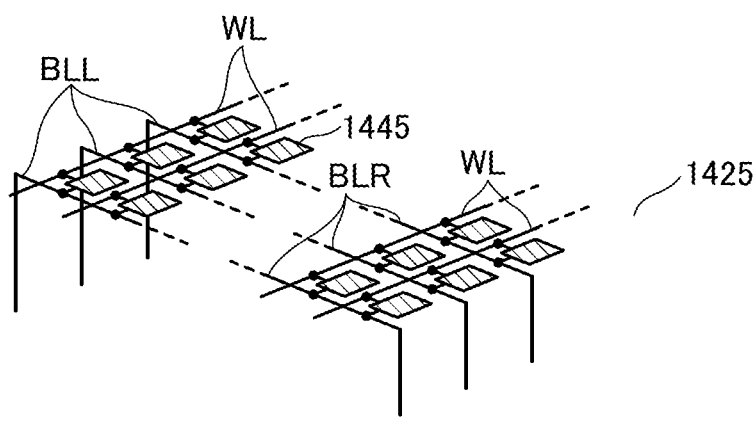
FIGS. 62A and 62B A block diagram and a circuit diagram showing a configuration example of a memory device of one embodiment of the present invention.

The memory cell array 1422 includes N local memory cell arrays 1425<0> to 1425<N−1> (N is an integer greater than or equal to 2). FIG. 62(A) illustrates a configuration example of the local memory cell array 1425. The local memory cell array 1425 includes a plurality of memory cells 1445, a plurality of word lines WL, and a plurality of bit lines BLL and BLR. In the example of FIG. 62(A), the local memory cell array 1425 has an open bit-line architecture but may have a folded bit-line architecture.

Figure 62B:
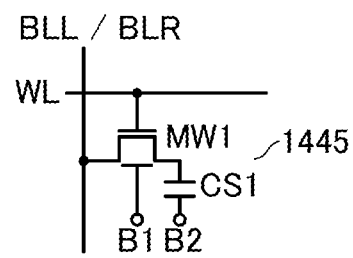

FIG. 62(B) illustrates a circuit configuration example of the memory cell 1445. The memory cell 1445 includes a transistor MW1, a capacitor CS1, and terminals B1 and B2. The transistor MW1 has a function of controlling charging and discharging of the capacitor CS1. A gate of the transistor MW1 is electrically connected to the word line WL, a first terminal of the transistor MW1 is electrically connected to the bit line (BLL or BLR), and a second terminal of the transistor MW1 is electrically connected to a first terminal of the capacitor CS1. A second terminal of the capacitor CS1 is electrically connected to the terminal B2. A constant voltage (for example, a low power supply voltage) is input to the terminal B2.

In the case where the semiconductor device described in any of the above embodiments is used in the memory cell 1445, the transistor 200 can be used as the transistor MW1, and the capacitor 100 can be used as the capacitor CS1. In this case, the area occupied by one set consisting of a transistor and a capacitor can be reduced when seen from the above; accordingly, the memory device of this embodiment can be highly integrated. As a result, storage capacity per unit area of the memory device of this embodiment can be increased.

The transistor MW1 includes a back gate, and the back gate is electrically connected to the terminal B1. This makes it possible to change the threshold voltage of the transistor MW1 with a voltage of the terminal B1. For example, the voltage of the terminal B1 may be a fixed voltage (for example, a negative constant voltage), or the voltage of the terminal B1 may be changed in response to the operation of the DOSRAM 1400.

The back gate of the transistor MW1 may be electrically connected to the gate, the first terminal, or the second terminal of the transistor MW1. Alternatively, the back gate is not necessarily provided in the transistor MW1.

The sense amplifier array 1423 includes N local sense amplifier arrays 1426<0> to 1426<N−1>. The local sense amplifier array 1426 includes one switch array 1444 and a plurality of sense amplifiers 1446. A bit line pair is electrically connected to the sense amplifier 1446. The sense amplifier 1446 has a function of precharging the bit line pair, a function of amplifying a voltage difference between the bit line pair, and a function of retaining the voltage difference. The switch array 1444 has a function of selecting a bit line pair and bringing the selected bit line pair and a global bit line pair into a conduction state.

Here, the bit line pair refers to two bit lines which are compared by the sense amplifier at the same time. The global bit line pair refers to two global bit lines which are compared by the global sense amplifier at the same time. The bit line pair can be referred to as a pair of bit lines, and the global bit line pair can be referred to as a pair of global bit lines. Here, the bit line BLL and the bit line BLR form one bit line pair. The global bit line GBLL and the global bit line GBLR form one global bit line pair. In the following description, the expressions "bit line pair (BLL, BLR)" and "global bit line pair (GBLL, GBLR)" are also used.
(Controller 1405)

The controller 1405 has a function of controlling the overall operation of the DOSRAM 1400. The controller 1405 has a function of performing logic operation on a command signal input from the outside and determining an operation mode, a function of generating control signals for the row circuit 1410 and the column circuit 1415 so that the determined operation mode is executed, a function of retaining an address signal input from the outside, and a function of generating an internal address signal.
(Row Circuit 1410)

The row circuit 1410 has a function of driving the MC-SA array 1420. The decoder 1411 has a function of decoding an address signal. The word line driver circuit 1412 generates a selection signal for selecting a word line WL of a target row to be accessed.

The column selector 1413 and the sense amplifier driver circuit 1414 are circuits for driving the sense amplifier array 1423. The column selector 1413 has a function of generating a selection signal for selecting a bit line of a target column to be accessed. With the selection signal from the column selector 1413, the switch array 1444 of each local sense amplifier array 1426 is controlled. With the control signal from the sense amplifier driver circuit 1414, the plurality of local sense amplifier arrays 1426 are independently driven.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

The global sense amplifier 1447 is electrically connected to the global bit line pair (GBLL, GBLR). The global sense amplifier 1447 has a function of amplifying a voltage difference between the global bit line pair (GBLL, GBLR), and a function of retaining the voltage difference. Data is written to and read from the global bit line pair (GBLL, GBLR) by the input/output circuit 1417.

The writing operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address signal, the data of the global bit line pair is written to the bit line pair of a target column. The local sense amplifier array 1426 amplifies and retains the written data. In the specified local memory cell array 1425, the word line WL of a target row is selected by the row circuit 1410, and the data retained at the local sense amplifier array 1426 is written to the memory cell 1445 of the selected row.

The reading operation of the DOSRAM 1400 is briefly described. One row of the local memory cell array 1425 is specified by an address signal. In the specified local memory cell array 1425, the word line WL of a target row is in a selected state, and data of the memory cell 1445 is written to the bit line. The local sense amplifier array 1426 detects and retains a voltage difference between the bit line pair of each column as data. Among the data retained at the local sense amplifier array 1426, the data of a column specified by the address signal is written to the global bit line pair by the switch array 1444. The global sense amplifier array 1416 detects and retains the data of the global bit line pair. The data retained at the global sense amplifier array 1416 is output to the input/output circuit 1417. Thus, the reading operation is completed.

There is theoretically no limitation on the number of rewriting operations of the DOSRAM 1400 because data is rewritten by charging and discharging of the capacitor CS1; and data can be written and read with low energy. In addition, the memory cell 1445 has a simple circuit configuration, and thus the capacity can be easily increased.

The transistor MW1 is an OS transistor. The extremely low off-state current of the OS transistor can inhibit charge leakage from the capacitor CS1. Therefore, the retention time of the DOSRAM 1400 is much longer than that of a DRAM. This allows less frequent refresh, which can reduce power needed for refresh operations. Thus, the DOSRAM 1400 is suitable for a memory device that rewrites a large volume of data with a high frequency, for example, a frame memory used for image processing.

Since the MC-SA array 1420 has a stacked-layer structure, the bit line can be shortened to a length that is close to the length of the local sense amplifier array 1426. A shorter bit line results in smaller bit line capacitance, which can reduce the storage capacitance of the memory cell 1445. In addition, providing the switch array 1444 in the local sense amplifier array 1426 can reduce the number of long bit lines. For the reasons described above, a driving load during access to the DOSRAM 1400 is reduced, enabling a reduction in power consumption.

The structure described in this embodiment can be used in appropriate combination with the structure described in the other embodiments.

Embodiment 7

In this embodiment, an FPGA (field-programmable gate array) is described as an example of a semiconductor device of one embodiment of the present invention in which an OS transistor and a capacitor are used, with reference to FIG. 63 to FIG. 66. In the FPGA of this embodiment, an OS memory is used for a configuration memory and a register. Here, such an FPGA is referred to as an "OS-FPGA".

<<OS-FPGA>>

Figure 63A:
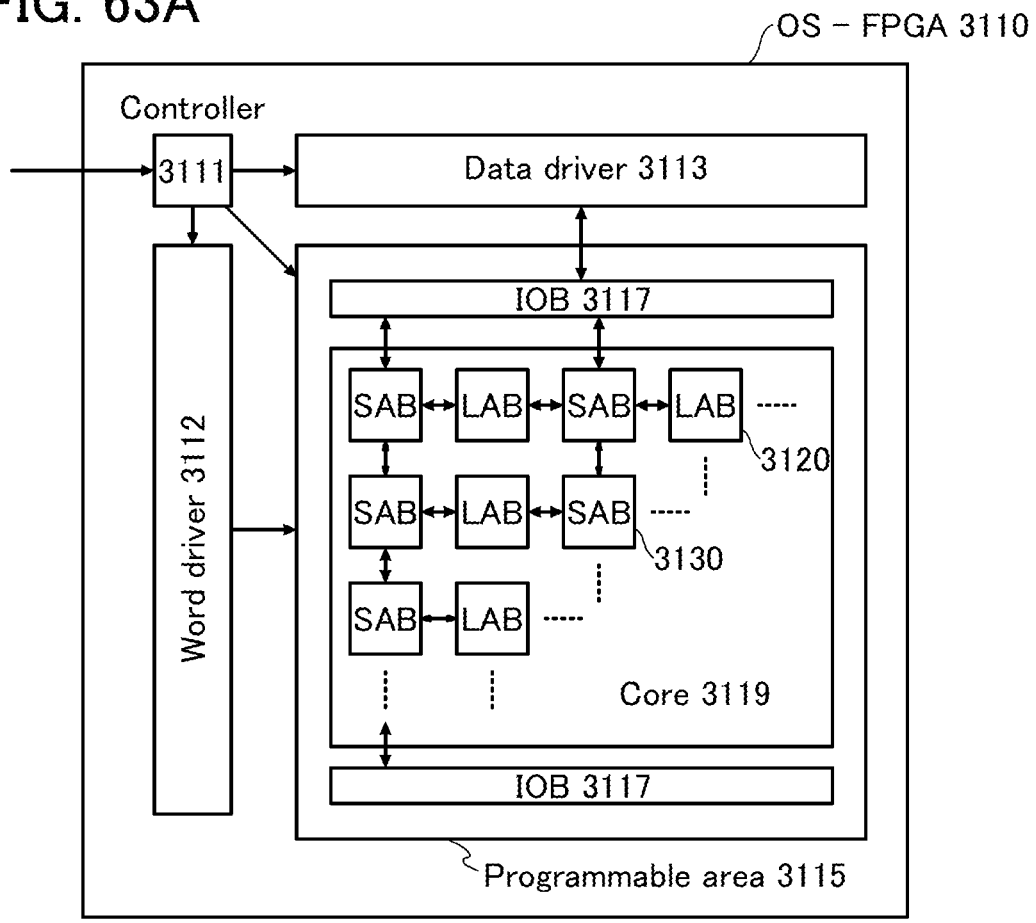
FIGS. 63A-63C Block diagrams illustrating a structure example of a semiconductor device of one embodiment of the present invention.

FIG. 63(A) illustrates a configuration example of an OS-FPGA. An OS-FPGA 3110 illustrated in FIG. 63(A) is capable of NOFF (normally-off) computing that executes context switching by a multi-context configuration and fine-grained power gating in each PLE. The OS-FPGA 3110 includes a controller 3111, a word driver 3112, a data driver 3113, and a programmable area 3115.

Figure 63B:
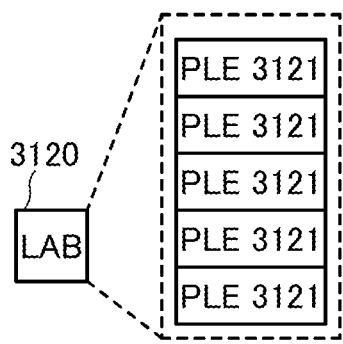
Figure 63C:
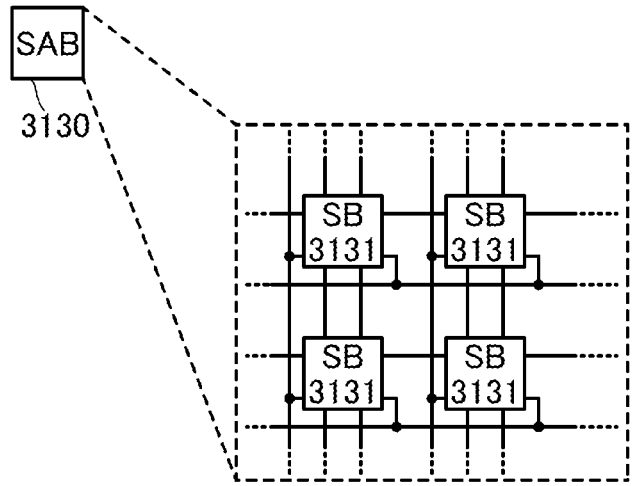

The programmable area 3115 includes two input/output blocks (IOBs) 3117 and a core 3119. The IOB 3117 includes a plurality of programmable input/output circuits. The core 3119 includes a plurality of logic array blocks (LABs) 3120 and a plurality of switch array blocks (SABs) 3130. The LAB 3120 includes a plurality of PLEs 3121. FIG. 63(B) illustrates an example in which the LAB 3120 includes five PLEs 3121. As illustrated in FIG. 63(C), the SAB 3130 includes a plurality of switch blocks (SBs) 3131 arranged in an array. The LAB 3120 is connected to the LABs 3120 in four directions (on the left, right, top, and bottom sides) through its input terminals and the SABs 3130.

Figure 64A:
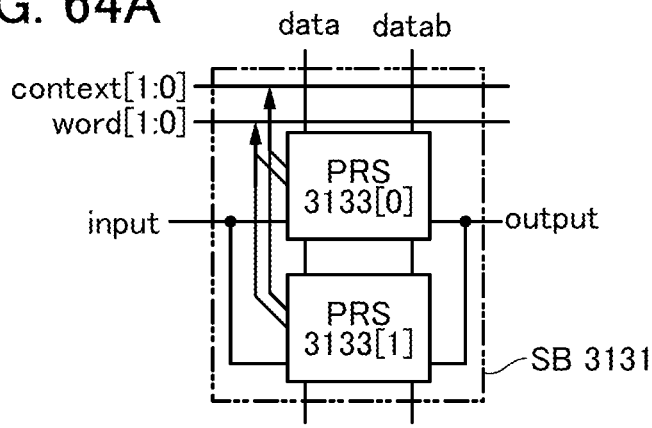
FIGS. 64A-64C A block diagram and a circuit diagram showing a configuration example of a semiconductor device of one embodiment of the present invention, and a timing chart illustrating an operation example of the semiconductor device.

The SB 3131 is described with reference to FIG. 64(A) to FIG. 64(C). To the SB 3131 illustrated in FIG. 64(A), data, datab, and signals context[1:0] and word[1:0] are input. The data and the datab are configuration data, and the logics of the data and the datab have a complementary relationship. The number of contexts in the OS-FPGA 3110 is two, and the signals context[1:0] are context selection signals. The signals word[1:0] are word line selection signals, and wirings to which the signals word[1:0] are input are each a word line.

The SB 3131 includes PRSs (programmable routing switches) 3133[0] and 3133[1]. The PRSs 3133[0] and 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 64B:
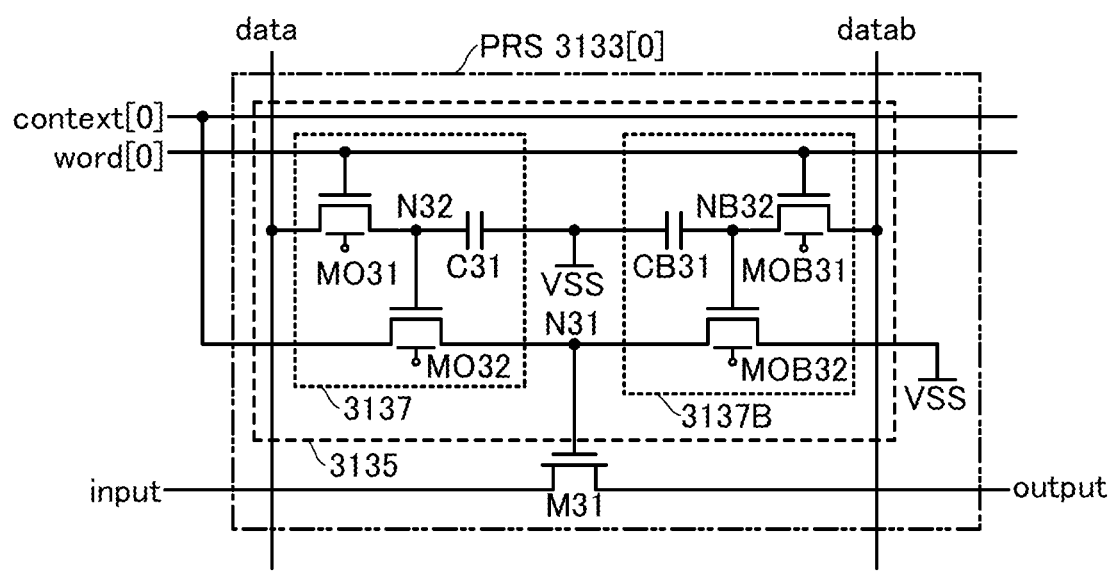
Figure 64C:
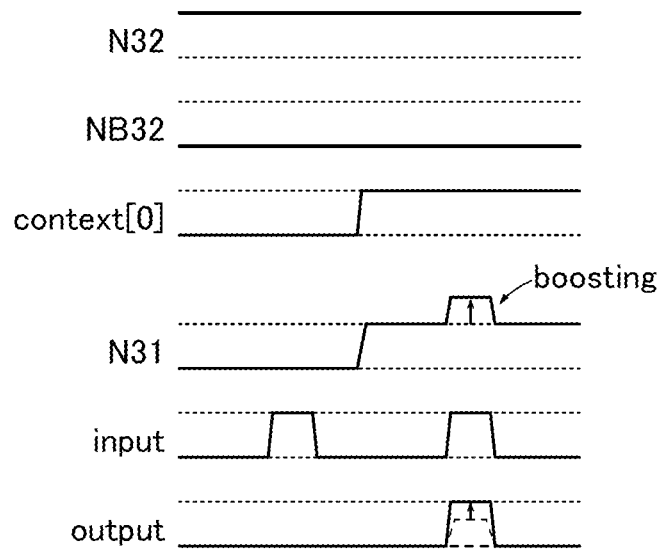

FIG. 64(B) illustrates a circuit configuration example of the PRS 3133[0]. The PRS 3133[0] and the PRS 3133[1] have the same circuit configuration. The PRS 3133[0] and the PRS 3133[1] are different from each other in a context selection signal and a word line selection signal that are input. The signals context[0] and word[0] are input to the PRS 3133[0], and the signals context[1] and word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes memory circuits 3137 and 3137B. The memory circuits 3137 and 3137B have the same circuit configuration. The memory circuit 3137 includes a capacitor C31 and OS transistors MO31 and MO32. The memory circuit 3137B includes a capacitor CB31 and OS transistors MOB31 and MOB32.

In the case where the semiconductor device described in any of the above embodiments is used in the SAB 3130, the transistor 200 can be used as the OS transistors MO31 and MOB31, and the capacitor 100 can be used as the capacitors C31 and CB31. In this case, the area occupied by one set consisting of a transistor and a capacitor can be reduced when seen from the above; accordingly, the semiconductor device of this embodiment can be highly integrated.

The OS transistors MO31, MO32, MOB31, and MOB32 each include a back gate, and each of these back gates are electrically connected to a power supply line that supplies a fixed voltage.

A gate of the Si transistor M31 corresponds to a node N31, a gate of the OS transistor MO32 corresponds to a node N32, and a gate of the OS transistor MOB32 corresponds to a node NB32. The nodes N32 and NB32 are each a charge retention node of the CM 3135. The OS transistor MO32 controls the conduction state between the node N31 and a signal line for the signal context[0]. The OS transistor MOB32 controls the conduction state between the node N31 and a low-potential power supply line VSS.

The logics of data retained at the memory circuits 3137 and 3137B have a complementary relationship. Thus, either the OS transistor MO32 or the OS transistor MOB32 is turned on.

The operation example of the PRS 3133[0] is described with reference to FIG. 64(C). In the PRS 3133[0], to which configuration data has already been written, the node N32 is at "H" and the node NB32 is at "L".

The PRS 3133[0] is inactive while the signal context[0] is at "L". During this period, even when an input terminal (input) of the PRS 3133[0] is transferred to "H", the gate of the Si transistor M31 is kept at "L" and an output terminal (output) of the PRS 3133[0] is also kept at "L".

The PRS 3133[0] is active while the signal context[0] is at "H". When the signal context[0] is transferred to "H", the gate of the Si transistor M31 is transferred to "H" by the configuration data stored in the CM 3135.

When the input terminal is transferred to "H" during the period when the PRS 3133[0] is active, the gate voltage of the Si transistor M31 is increased by boosting because the OS transistor MO32 of the memory circuit 3137 is a source follower. As a result, the OS transistor MO32 of the memory circuit 3137 loses the driving capability, and the gate of the Si transistor M31 is brought into a floating state.

In the PRS 3133 with a multi-context function, the CM 3135 also functions as a multiplexer.

Figure 65:
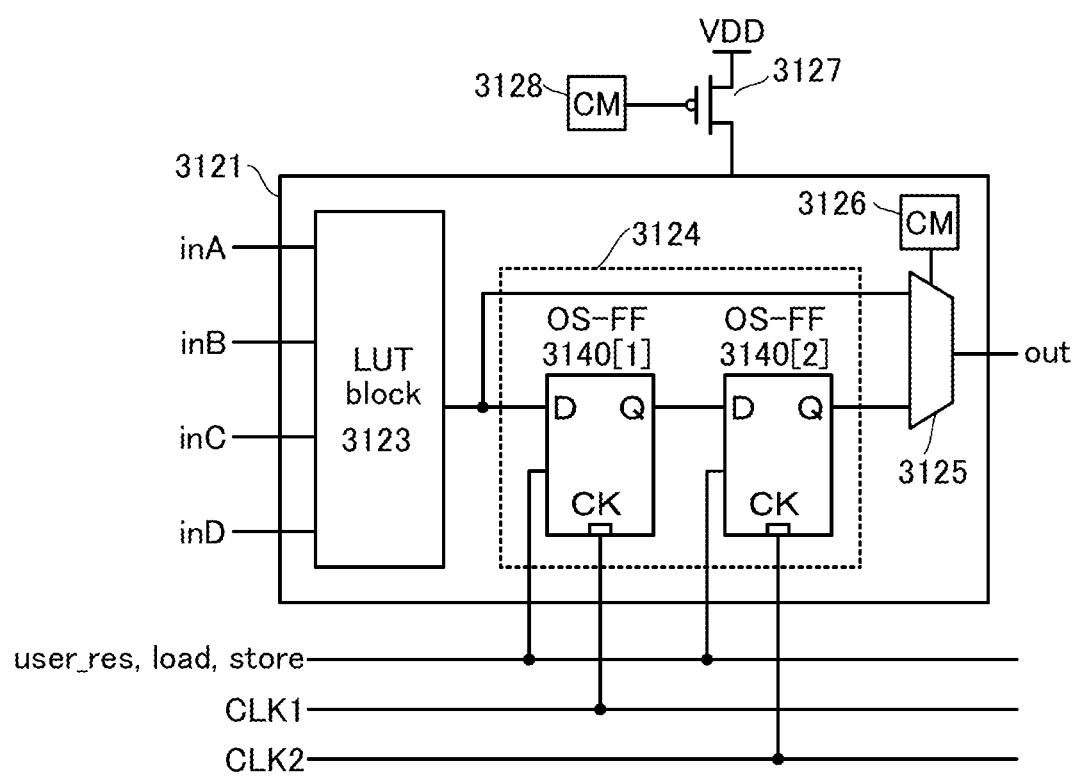
FIG. 65 A block diagram illustrating a structure example of a semiconductor device of one embodiment of the present invention.

FIG. 65 illustrates a configuration example of the PLE 3121. The PLE 3121 includes an LUT (lookup table) block 3123, a register block 3124, a selector 3125, and a CM 3126. The LUT block 3123 is configured to select and output data in accordance with inputs inA to inD. The selector 3125 selects an output of the LUT block 3123 or an output of the register block 3124 in accordance with the configuration data stored in the CM 3126.

The PLE 3121 is electrically connected to a power supply line for a voltage VDD through a power switch 3127. Whether the power switch 3127 is turned on or off is determined in accordance with the configuration data stored in a CM 3128. Providing the power switch 3127 for each PLE 3121 enables fine-grained power gating. The PLE 3121 that is not used after context switching can be power gated owing to the fine-grained power gating function; thus, standby power can be effectively reduced.

The register block 3124 is formed by nonvolatile registers to achieve NOFF computing. The nonvolatile registers in the PLE 3121 are each a flip-flop provided with an OS memory (hereinafter referred to as an [OS-FF]).

Figure 66A:
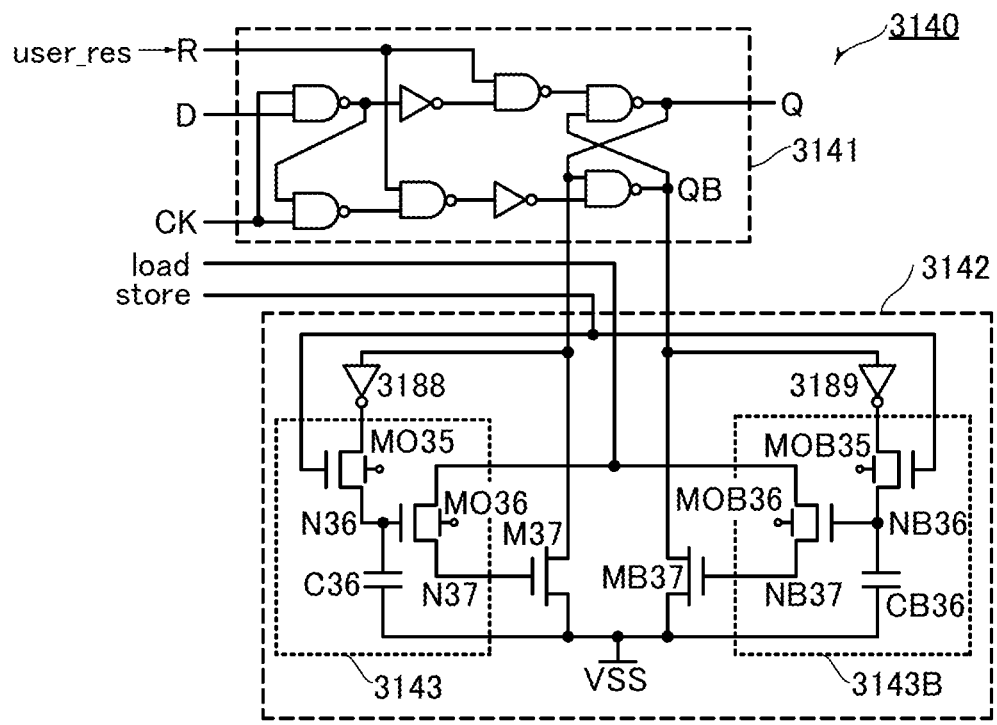
FIGS. 66A and 66B A circuit diagram showing a configuration example of a semiconductor device of one embodiment of the present invention, and a timing chart illustrating an operation example of the semiconductor device.

The register block 3124 includes OS-FFs 3140[1] and 3140[2]. Signals user_res, load, and store are input to the OS-FFs 3140[1] and 3140[2]. A clock signal CLK1 is input to the OS-FF 3140[1] and a clock signal CLK2 is input to the OS-FF 3140[2]. FIG. 66(A) illustrates a configuration example of the OS-FF 3140.

The OS-FF 3140 includes an FF 3141 and a shadow register 3142. The FF 3141 includes nodes CK, R, D, Q, and QB. A clock signal is input to the node CK. The signal user_res is input to the node R. The signal user_res is a reset signal. The node D is a data input node, and the node Q is a data output node. The logics of the node Q and the node QB have a complementary relationship.

The shadow register 3142 functions as a backup circuit of the FF 3141. The shadow register 3142 backs up data of the nodes Q and QB in accordance with the signal store and writes back the backed up data to the nodes Q and QB in accordance with the signal load.

The shadow register 3142 includes inverter circuits 3188 and 3189, Si transistors M37 and MB37, and memory circuits 3143 and 3143B. The memory circuits 3143 and 3143B have the same circuit configuration as the memory circuit 3137 of the PRS 3133. The memory circuit 3143 includes a capacitor C36 and OS transistors MO35 and MO36. The memory circuit 3143B includes a capacitor CB36 and OS transistors MOB35 and MOB36. A node N36 and a node NB36 correspond to a gate of the OS transistor MO36 and a gate of the OS transistor MOB36, respectively, and are each a charge retention node. A node N37 and a node NB37 correspond to a gate of the Si transistor M37 and a gate of the Si transistor MB37, respectively.

In the case where the semiconductor device described in any of the above embodiments is used in the LAB 3120, the transistor 200 can be used as the OS transistors MO35 and MOB35, and the capacitor 100 can be used as the capacitors C36 and CB36. In this case, the area occupied by one set consisting of a transistor and a capacitor can be reduced when seen from the above; accordingly, the semiconductor device of this embodiment can be highly integrated.

The OS transistors MO35, MO36, MOB35, and MOB36 each include a back gate, and each of these back gates are electrically connected to a power supply line that supplies a fixed voltage.

Figure 66B:
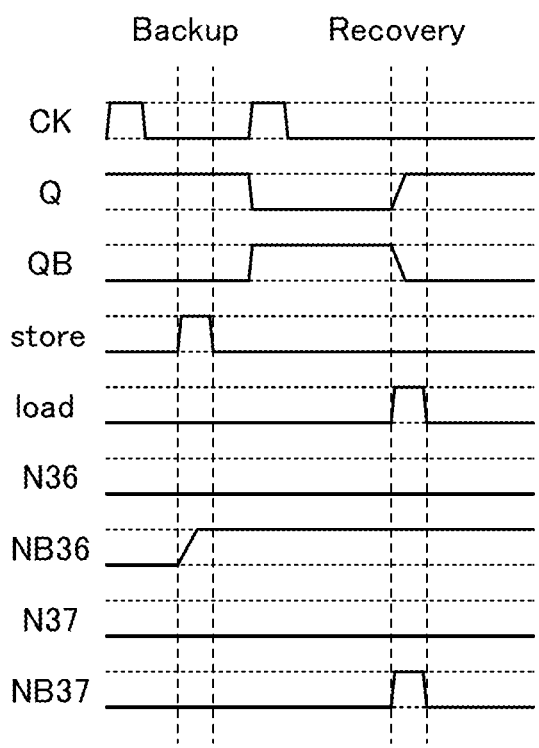

An example of an operation method of the OS-FF 3140 is described with reference to FIG. 66(B).

(Backup)

When the signal store at "H" is input to the OS-FF 3140, the shadow register 3142 backs up the data of the FF 3141. The node N36 becomes "L" when the data of the node Q is written thereto, and the node NB36 becomes "H" when the data of the node QB is written thereto. After that, power gating is performed and the power switch 3127 is turned off. Although the data of the nodes Q and QB of the FF 3141 are lost, the shadow register 3142 retains the backed up data even when power supply is stopped.

(Recovery)

The power switch 3127 is turned on to supply power to the PLE 3121. After that, when the signal load at "H" is input to the OS-FF 3140, the shadow register 3142 writes back the backed up data to the FF 3141. The node N37 is kept at "L"

because the node N36 is at "L", and the node NB37 becomes "H" because the node NB36 is at "H". Thus, the node Q becomes "H" and the node QB becomes "L". That is, the OS-FF 3140 is recovered to a state at the backup operation.

A combination of the fine-grained power gating and backup/recovery operation of the OS-FF 3140 allows power consumption of the OS-FPGA 3110 to be effectively reduced.

As an error that might occur in a memory circuit, a soft error due to entry of radiation is given. The soft error is a phenomenon in which a malfunction such as inversion of data stored in a memory is caused by electron-hole pair generation when a transistor is irradiated with a rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. An OS memory using an OS transistor has a high soft-error tolerance. Therefore, the OS-FPGA 3110 with high reliability can be provided when an OS memory is included therein.

The structure described in this embodiment can be used in appropriate combination with the structure described in the other embodiments.

Embodiment 8

In this embodiment, an AI system in which the semiconductor device of any of the above embodiments is used is described with reference to FIG. 67.

Figure 67:
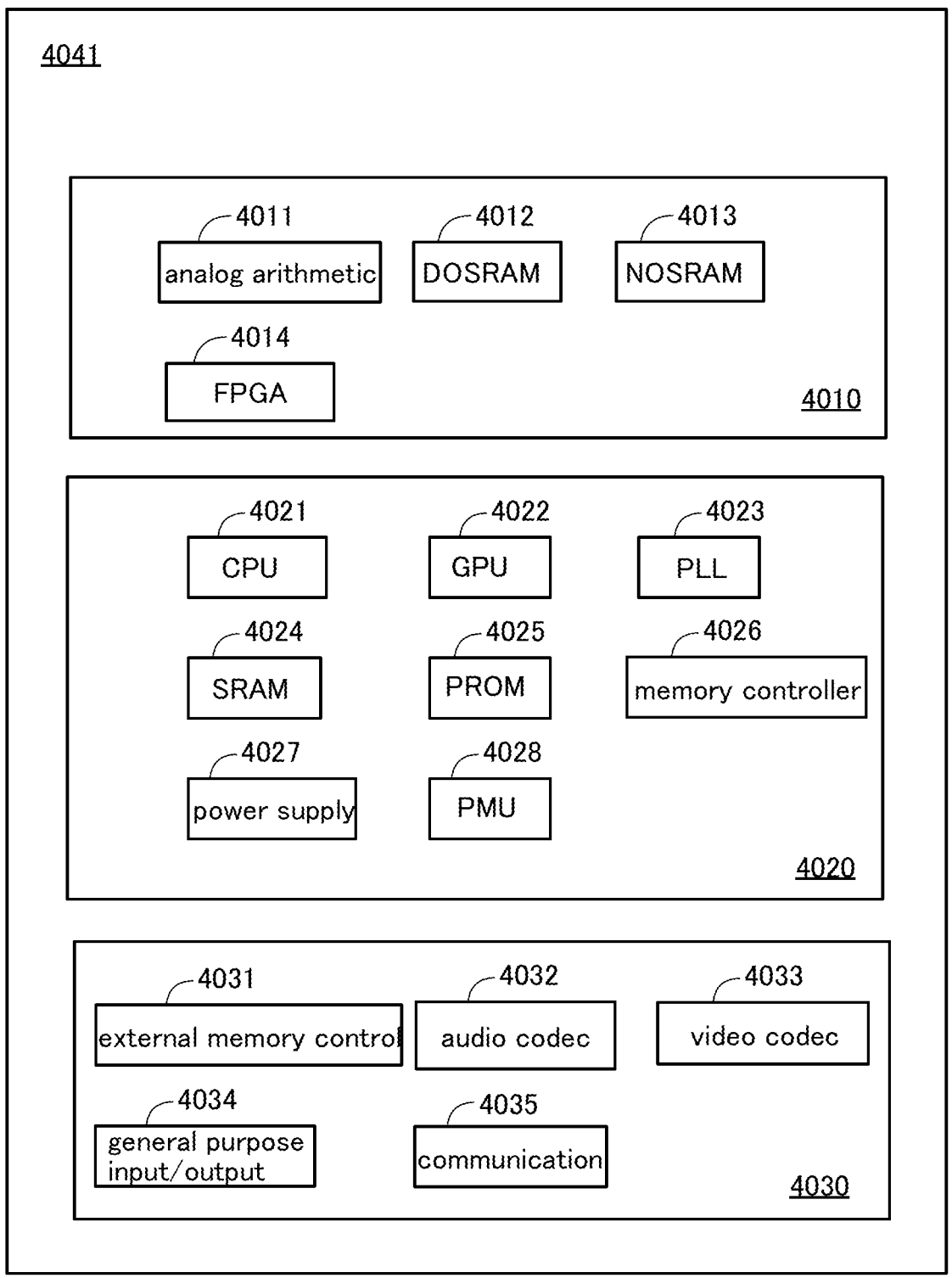
FIG. 67 A block diagram illustrating a structure example of an AI system of one embodiment of the present invention.

FIG. 67 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and an FPGA 4014. The DOSRAM 1400, the NOSRAM 1600, and the OS-FPGA 3110 described in the above embodiments can be used as the DOSRAM 4012, the NOSRAM 4013, and the FPGA 4014, respectively.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can execute learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 using an OS transistor includes an analog memory and can execute a product-sum operation necessary for the learning or inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in an SRAM, the input data have to be stored piece by piece because of the circuit area limitation and small storage capacity of the SRAM. The DOSRAM 4012 has a larger storage capacity than an SRAM because the memory cells can be highly integrated even in a limited circuit area. Therefore, the DOSRAM 4012 can efficiently store the input data.

The NOSRAM 4013 is a nonvolatile memory using an OS transistor. The NOSRAM 4013 consumes less power in writing data than the other nonvolatile memories such as a flash memory, a ReRAM (Resistive Random Access Memory), and an MRAM (Magnetoresistive Random Access Memory). Furthermore, unlike a flash memory and a ReRAM in which elements deteriorate by data writing, the NOSRAM has no limitation on the number of times of data writing.

Furthermore, the NOSRAM 4013 can store multilevel data of two or more bits as well as one-bit binary data. The multilevel data storage in the NOSRAM 4013 leads to a reduction in the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data is included in the analog data in some cases.

Data and parameters used in the neural network calculation can be once stored in the NOSRAM 4013. The data and parameters may be stored in a memory provided outside the AI system 4041 via the CPU 4021; however, the NOSRAM 4013 provided inside the AI system 4041 can store the data and parameters more quickly with lower power consumption. Furthermore, the NOSRAM 4013 enables a longer bit line than the DOSRAM 4012 and thus can have an increased storage capacity.

The FPGA 4014 is an FPGA using an OS transistor. With the use of the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), or a deep belief network (DBN) described later, with a hardware. Establishing the connection of the neural network with a hardware enables higher speed performance.

The FPGA 4014 is an FPGA including an OS transistor. An OS-FPGA can have a smaller memory area than an FPGA including an SRAM. Thus, addition of a context switching function only causes a small increase in area. Moreover, an OS-FPGA can transmit data and parameters at high speed by boosting.

In the AI system 4041, the analog arithmetic circuit 4011, the DOSRAM 4012, the NOSRAM 4013, and the FPGA 4014 can be provided on one die (chip). Thus, the AI system 4041 can execute calculation of the neural network quickly with low power consumption. In addition, the analog arithmetic circuit 4011, the DOSRAM 4012, the NOSRAM 4013, and the FPGA 4014 can be fabricated through the same manufacturing process. Therefore, the AI system 4041 can be fabricated at low cost.

Note that the arithmetic portion 4010 does not necessarily include all of the following: the DOSRAM 4012, the NOSRAM 4013, and the FPGA 4014. One or more memories selected from the DOSRAM 4012, the NOSRAM 4013, and the FPGA 4014 are provided in accordance with a problem that is desired to be solved by the AI system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for executing at least one of these methods. Furthermore, part or the whole of the program may be stored in the NOSRAM 4013.

Most of the existing programs used as libraries are premised on processing with a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, the learning and inference can be executed at high speed.

The power supply circuit 4027 generates not only a low power supply potential for a logic circuit but also a potential for an analog operation. The power supply circuit 4027 may use an OS memory. When a reference potential is stored in the OS memory, the power consumption of the power supply circuit 4027 can be reduced.

The PMU 4028 has a function of temporarily stopping the power supply to the AI system 4041.

The CPU 4021 and the GPU 4022 preferably include OS memories as registers. By including the OS memories, the CPU 4021 and the GPU 4022 can retain data (logic values) in the OS memories even when power supply is stopped. As a result, the AI system 4041 can save the power.

The PLL 4023 has a function of generating a clock. The AI system 4041 performs an operation on the basis of the clock generated by the PLL 4023. The PLL 4023 preferably includes an OS memory. By including the OS memory, the PLL 4023 can retain an analog potential with which the clock oscillation frequency is controlled.

The AI system 4041 may store data in an external memory such as a DRAM. For this reason, the AI system 4041 preferably includes the memory controller 4026 functioning as an interface with the external DRAM. Furthermore, the memory controller 4026 is preferably positioned near the CPU 4021 or the GPU 4022. Thus, data transmission can be performed at high speed.

Some or all of the circuits illustrated in the control portion 4020 can be formed on the same die as the arithmetic portion 4010. Thus, the AI system 4041 can execute the neural network calculation at high speed with low power consumption.

Data used for the neural network calculation is stored in an external storage device (such as an HDD (Hard Disk Drive) or an SSD (Solid State Drive)) in many cases. Therefore, the AI system 4041 preferably includes the external memory control circuit 4031 functioning as an interface with the external storage device.

Because the neural network often deals with audio and video for learning and inference, the AI system 4041 includes the audio codec 4032 and the video codec 4033. The audio codec 4032 encodes and decodes audio data, and the video codec 4033 encodes and decodes video data.

The AI system 4041 can perform learning or inference using data obtained from an external sensor. For this reason, the AI system 4041 includes the general-purpose input/output module 4034. The general-purpose input/output module 4034 includes a USB (Universal Serial Bus) or an I2C (Inter-Integrated Circuit), for example.

The AI system 4041 can perform learning or inference using data obtained via the Internet. For this reason, the AI system 4041 preferably includes the communication module 4035.

The analog arithmetic circuit 4011 may use a multi-level flash memory as an analog memory. However, the flash memory has a limitation on the number of rewriting times. In addition, it is extremely difficult to embed the multi-level flash memory (to form the arithmetic circuit and the memory on the same die).

Alternatively, the analog arithmetic circuit 4011 may use a ReRAM as an analog memory. However, the ReRAM has a limitation on the number of rewriting times and also has a problem in storage accuracy. Moreover, the ReRAM is a two-terminal element, and thus has a complicated circuit design for separating data writing and data reading.

Further alternatively, the analog arithmetic circuit 4011 may use an MRAM as an analog memory. However, the MRAM has a problem in storage accuracy because of its low magnetoresistive ratio.

In consideration of the above, the analog arithmetic circuit 4011 preferably uses an OS memory as an analog memory.

The structure described in this embodiment can be used in appropriate combination with the structure described in the other embodiments.

Embodiment 9

<Application Example of AI System>

In this embodiment, application examples of the AI system described in the above embodiment is described with reference to FIG. 68.

Figure 68A:
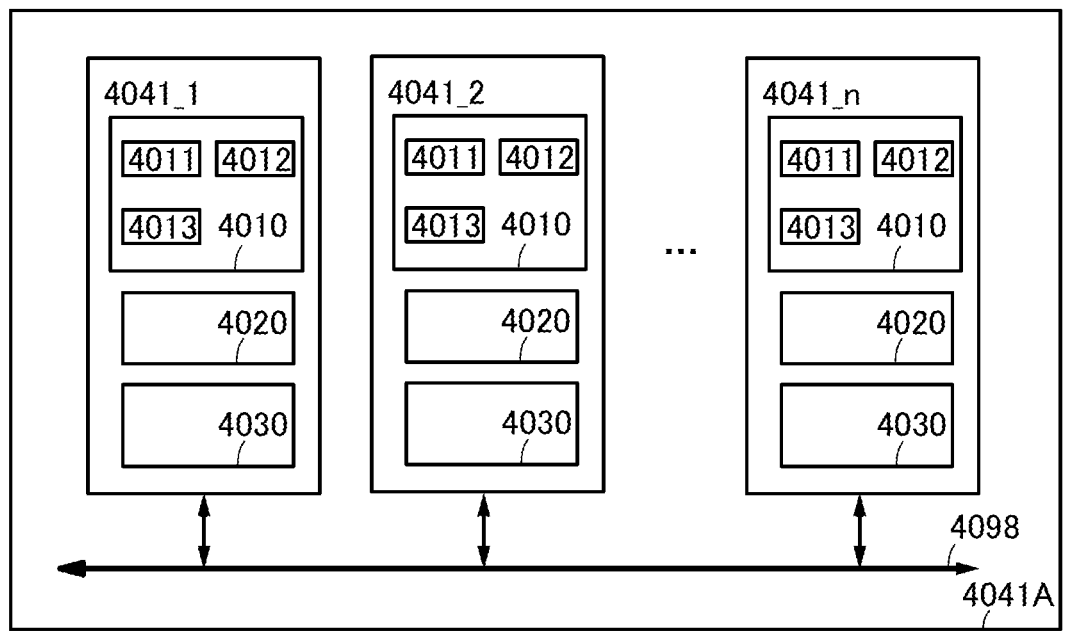
FIGS. 68A and 68B Block diagrams illustrating application examples of an AI system of embodiments of the present invention.

FIG. 68(A) is an AI system 4041A in which the AI systems 4041 described with FIG. 67 are arranged in parallel and a signal can be transmitted between the systems via a bus line.

The AI system 4041A illustrated in FIG. 68(A) includes a plurality of AI systems 4041_1 to 4041_n (n is a natural number). The AI system 4041_1 to the AI system 4041_n are connected to each other via a bus line 4098.

Figure 68B:
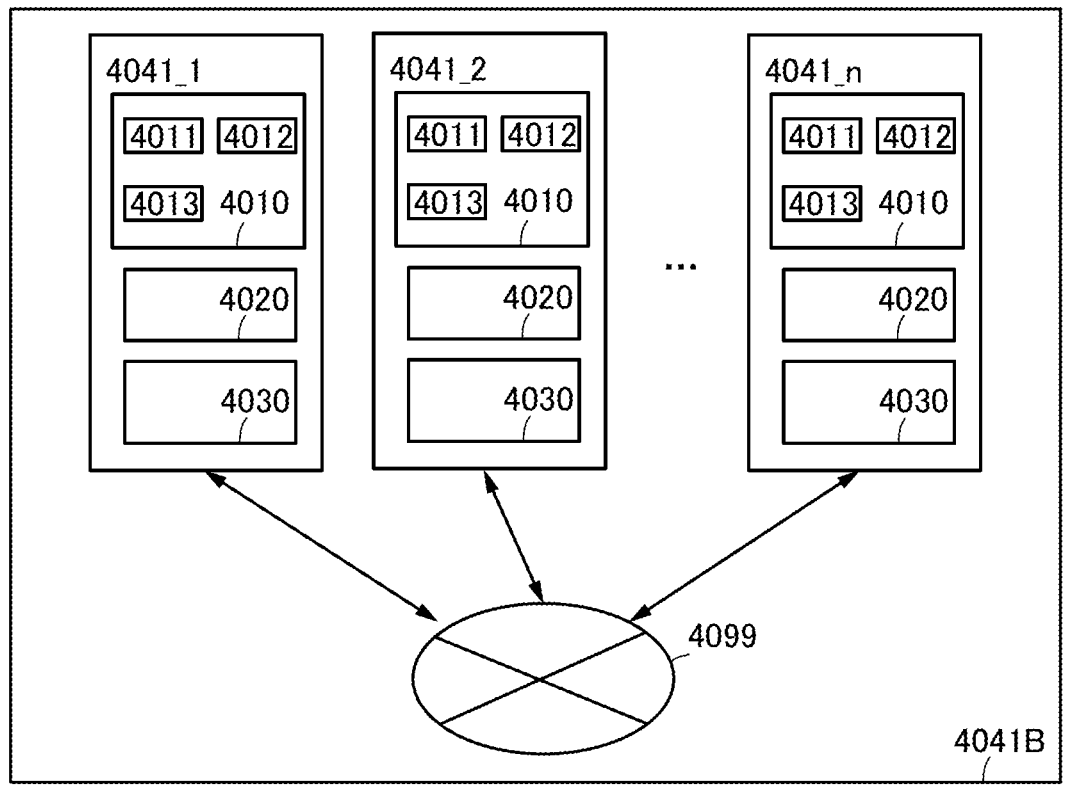

FIG. 68(B) is an AI system 4041B in which the AI systems 4041 described with FIG. 67 are arranged in parallel as in FIG. 68(A) and a signal can be transmitted between the systems via a network.

The AI system 4041B illustrated in FIG. 68(B) includes the plurality of AI systems 4041_1 to 4041_n. The AI system 4041_1 to the AI system 4041_n are connected to each other via a network 4099.

A structure may be employed in which a communication module is provided in each of the AI system 4041_1 to the AI system 4041_n to perform wireless or wired communication via the network 4099. A communication module can perform communication via an antenna. For example, the communication can be performed in such a manner that an electronic device is connected to a computer network such as the Internet that is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a communications standard developed by IEEE such as Wi-Fi (registered trademark), Bluetooth (registered trademark), or ZigBee (registered trademark).

With the structure illustrated in FIG. 68(A) or 68(B), analog signals obtained with external sensors or the like can be processed by different AI systems. For example, biological information such as brain waves, a pulse, blood pressure, and body temperature is obtained with a variety of sensors such as a brain wave sensor, a pulse wave sensor, a blood pressure sensor, and a temperature sensor, and analog signals can be processed by different AI systems. When the signal processing or learning is performed by different AI systems, the amount of information processed by each AI system can be reduced. Accordingly, the signal processing or learning can be performed with a smaller amount of arithmetic processing. As a result, recognition accuracy can be increased. The information obtained with each AI system is expected to enable instant understanding of collective biological information that irregularly changes.

The structure described in this embodiment can be used in appropriate combination with the structure described in the other embodiments.

Embodiment 10

In this embodiment, an example of an IC incorporating the AI system described in the above embodiment is described.

In the AI system described in the above embodiment, a digital processing circuit such as a CPU that includes a Si transistor, an analog arithmetic circuit that uses an OS transistor, an OS-FPGA, and an OS memory such as a DOSRAM or a NOSRAM can be integrated into one die.

Figure 69:
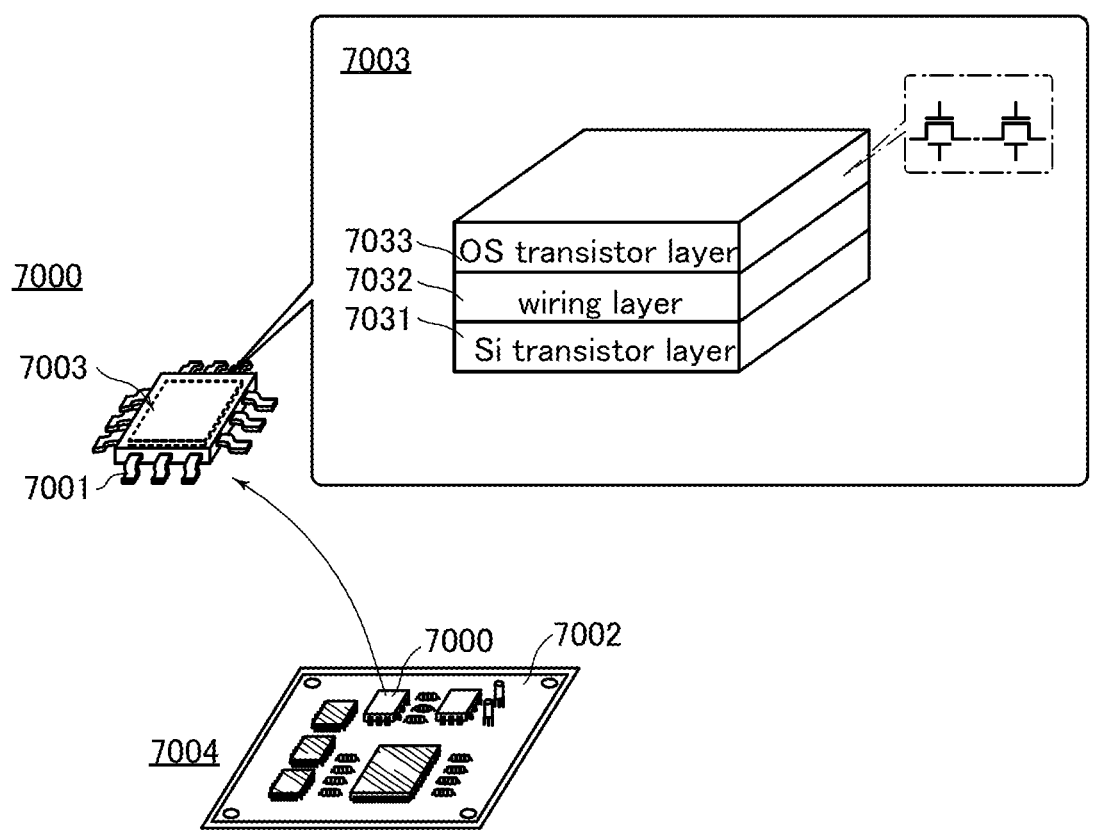
FIG. 69 A schematic perspective view illustrating a structure example of an IC incorporating an AI system of one embodiment of the present invention.

FIG. 69 illustrates the example of the IC incorporating the AI system. An AI system IC 7000 illustrated in FIG. 69 includes a lead 7001 and a circuit portion 7003. The AI system IC 7000 is mounted on a printed circuit board 7002, for example. A plurality of such IC chips are combined and electrically connected to each other on the printed circuit board 7002; thus, a board on which electronic components are mounted (a circuit board 7004) is completed. In the circuit portion 7003, the various circuits described in the above embodiment are provided on one die. The circuit portion 7003 has a stacked-layer structure, which is broadly divided into a Si transistor layer 7031, a wiring layer 7032, and an OS transistor layer 7033. Since the OS transistor layer 7033 can be provided to be stacked over the Si transistor layer 7031, the size of the AI system IC 7000 can be easily reduced.

Although a QFP (Quad Flat Package) is used as a package of the AI system IC 7000 in FIG. 69, the embodiment of the package is not limited thereto.

The digital processing circuit such as a CPU, the analog arithmetic circuit that uses an OS transistor, the OS-FPGA, and the OS memory such as a DOSRAM or a NOSRAM can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly the AI system can be incorporated into the IC at low cost.

The structure described in this embodiment can be used in appropriate combination with the structure described in the other embodiments.

Embodiment 11

<Electronic Device>

A semiconductor device of one embodiment of the present invention can be used for a variety of electronic devices. FIG. 70 illustrates specific examples of electronic devices including the semiconductor device of one embodiment of the present invention.

Figure 70A:
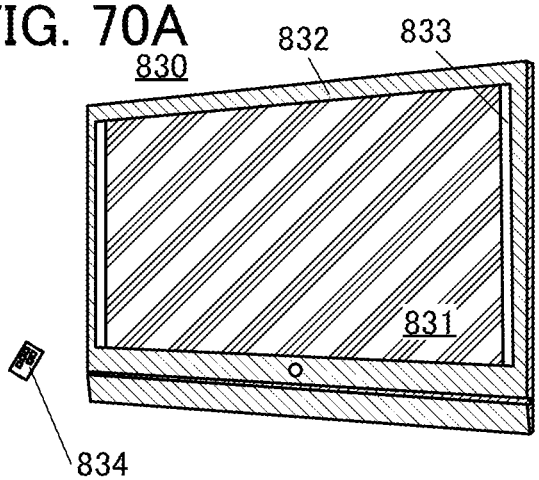
FIGS. 70A-70F Diagrams illustrating electronic devices of embodiments of the present invention.

FIG. 70(A) illustrates a monitor 830. The monitor 830 includes a display portion 831, a housing 832, a speaker 833, and the like. The monitor 830 can also include an LED lamp, operation keys (including a power switch or an operation switch), a connection terminal, a variety of sensors, a microphone, and the like. The monitor 830 can be controlled with a remote controller 834.

The monitor 830 can function as a television device by receiving airwaves.

Examples of airwaves that the monitor 830 can receive include a ground wave and a radio wave transmitted from a satellite. Examples of airwaves also include airwaves for analog broadcasting, digital broadcasting, image-and-sound broadcasting, and sound-only broadcasting. For example, the monitor 830 can receive airwaves transmitted in a certain frequency band in a UHF band (higher than or equal to 300 MHz and lower than or equal to 3 GHz) or a VHF band (higher than or equal to 30 MHz and lower than or equal to 300 MHz). With the use of a plurality of pieces of data received in a plurality of frequency bands, the transfer rate can be increased and more information can thus be obtained, for example. Accordingly, the display portion 831 can display an image with a resolution higher than the full high definition. For example, an image with a resolution of 4K2K, 8K4K, 16K8K, or more can be displayed.

An image to be displayed on the display portion 831 may be generated using broadcasting data transmitted with a technology for transmitting data via a computer network such as the Internet, a LAN (Local Area Network), or Wi-Fi (registered trademark). In that case, the monitor 830 does not need to include a tuner.

The monitor 830 can be used as a computer monitor when connected to a computer. Several people can see the monitor 830 connected to a computer at the same time; thus, the monitor 830 can be used for a conference system. The monitor 830 can also be used for a videoconference system by displaying data in a computer via a network or being directly connected to a network.

Alternatively, the monitor 830 can be used as a digital signage.

The semiconductor device of one embodiment of the present invention can be used for, for example, a driver circuit or an image processing portion of the display portion. When the semiconductor device of one embodiment of the present invention is used for a driver circuit or an image processing portion of the display portion, high-speed operation or high-speed signal processing can be achieved with low power consumption.

When an AI system including the semiconductor device of one embodiment of the present invention is used for the image processing portion of the monitor 830, image processing such as noise removal processing, grayscale conversion processing, tone correction processing, or luminance correction processing can be performed. Furthermore, pixel interpolation processing due to resolution up-conversion, frame interpolation processing due to frame frequency up-conversion, or the like can be performed. In the grayscale conversion processing, not only change of the number of grayscale levels of an image but also interpolation of the gray value in the case of increasing the number of grayscale levels can be performed. In addition, high-dynamic range (HDR) processing for increasing a dynamic range is also included in the grayscale conversion processing.

Figure 70B:
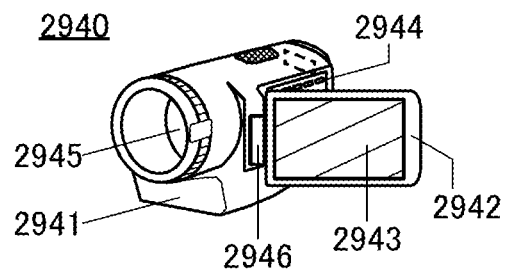

A video camera 2940 illustrated in FIG. 70(B) includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. The housing 2941 and the housing 2942 are connected to each other with the joint 2946, and the angle between the housing 2941 and the housing 2942 can be changed with the joint 2946. Depending on the angle between the housing 2941 and the housing 2942, the orientation of an image displayed on the display portion 2943 can be changed or display and non-display of an image can be switched.

The semiconductor device of one embodiment of the present invention can be used for, for example, a driver circuit or an image processing portion of the display portion. When the semiconductor device of one embodiment of the present invention is used for a driver circuit or an image processing portion of the display portion, high-speed operation or high-speed signal processing can be achieved with low power consumption.

When an AI system including the semiconductor device of one embodiment of the present invention is used for the image processing portion of the video camera 2940, imaging appropriate for the surroundings of the video camera 2940 can be performed. Specifically, imaging can be performed with optimal exposure for the surrounding brightness. In the case of performing imaging with backlighting or imaging under different brightness conditions such as indoors and outdoors at the same time, high-dynamic-range (HDR) imaging can be performed.

Furthermore, the AI system can learn user's habit and assist the user in performing imaging. Specifically, the AI system can learn user's camera shaking habit and cancel the camera shaking during imaging, so that blurring of the obtained image associated with camera shaking can be reduced as much as possible. In the case of using a zoom function during imaging, the orientation of a lens or the like can be controlled such that a subject is positioned at the center of an image all the time.

Figure 70C:
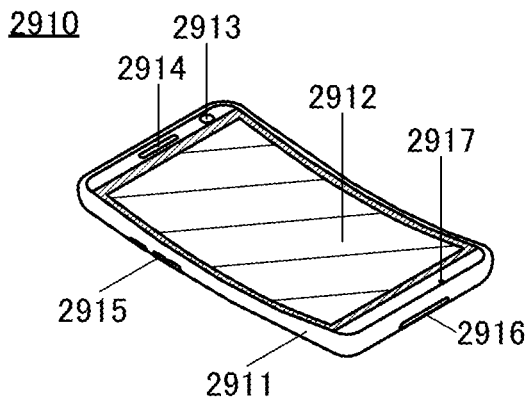

An information terminal 2910 illustrated in FIG. 70(C) includes a housing 2911, a display portion 2912, a microphone 2917, a speaker portion 2914, a camera 2913, an external connection portion 2916, operation switches 2915, and the like. A touch screen and a display panel formed using flexible substrates are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

A memory device including the semiconductor device of one embodiment of the present invention can retain control data or a control program of the information terminal 2910 for a long time, for example.

When an AI system including the semiconductor device of one embodiment of the present invention is used for an image processing portion of the information terminal 2910, image processing such as noise removal processing, grayscale conversion processing, tone correction processing, or luminance correction processing can be performed. Furthermore, pixel interpolation processing due to resolution up-conversion, frame interpolation processing due to frame frequency up-conversion, or the like can be performed. In the grayscale conversion processing, not only change of the number of grayscale levels of an image but also interpolation of the gray value in the case of increasing the number of grayscale levels can be performed. In addition, high-dynamic range (HDR) processing for increasing a dynamic range is also included in the grayscale conversion processing.

Furthermore, the AI system can learn user's habit and assist the user in operating the information terminal 2910. The information terminal 2910 incorporating the AI system can predict touch input from the motion of user's fingers, eyes, or the like.

Figure 70D:
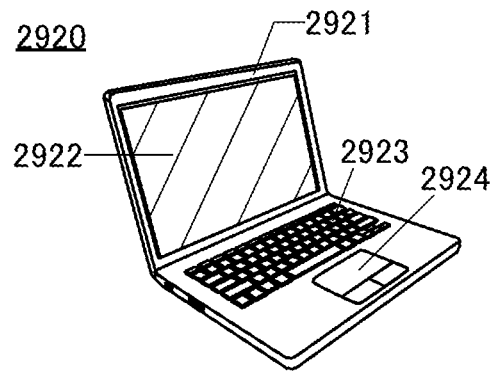

A laptop personal computer 2920 illustrated in FIG. 70(D) includes a housing 2921, a display portion 2922, a keyboard 2923, a pointing device 2924, and the like. The laptop personal computer 2920 also includes an antenna, a battery, and the like inside the housing 2921.

A memory device including the semiconductor device of one embodiment of the present invention can retain control data or a control program of the laptop personal computer 2920 for a long time, for example.

When an AI system including the semiconductor device of one embodiment of the present invention is used for an image processing portion of the laptop personal computer 2920, image processing such as noise removal processing, grayscale conversion processing, tone correction processing, or luminance correction processing can be performed. Furthermore, pixel interpolation processing due to resolution up-conversion, frame interpolation processing due to frame frequency up-conversion, or the like can be performed. In the grayscale conversion processing, not only change of the number of grayscale levels of an image but also interpolation of the gray value in the case of increasing the number of grayscale levels can be performed. In addition, high-dynamic range (HDR) processing for increasing a dynamic range is also included in the grayscale conversion processing.

Furthermore, the AI system can learn user's habit and assist the user in operating the laptop personal computer 2920. The laptop personal computer 2920 incorporating the AI system can predict touch input to the display portion 2922, from the motion of user's fingers, eyes, or the like. In inputting text, the AI system predicts input from the past input text data or a text or a diagram such as a photograph around the text to be input, to assist conversion. Accordingly, input mistakes and conversion mistakes can be reduced as much as possible.

Figure 70E:
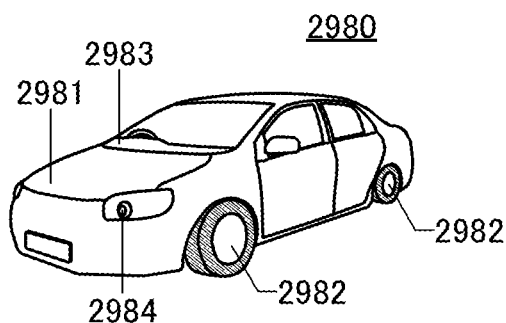
Figure 70F:
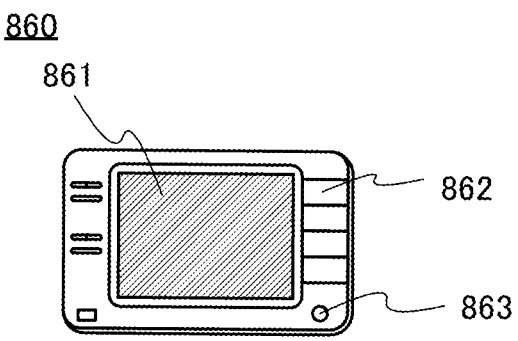

FIG. 70(E) is an external view illustrating an example of an automobile, and FIG. 70(F) illustrates a navigation device 860. An automobile 2980 includes a car body 2981, wheels 2982, a dashboard 2983, lights 2984, and the like. The automobile 2980 also includes an antenna, a battery, and the like. The navigation device 860 includes a display portion 861, operation buttons 862, and an external input terminal 863. The automobile 2980 and the navigation device 860 can be independent of each other; however, it is preferable that the navigation device 860 be incorporated into and linked to the automobile 2980.

A memory device including the semiconductor device of one embodiment of the present invention can retain control data or a control program of the automobile 2980 or the navigation device 860 for a long time, for example. When an AI system including the semiconductor device of one embodiment of the present invention is used for a control device or the like of the automobile 2980, the AI system can learn driver's driving skill and habit and assist the driver in safe driving or driving involving efficient use of fuel such as gasoline or a battery. To assist the driver in safe driving, the AI system learns not only driver's driving skill and habit, but also learns the behavior of the automobile such as the speed and movement of the automobile 2980, road information saved in the navigation device 860, and the like complexly; thus, driving lane departure and collision with other automobiles, pedestrians, objects, and the like can be prevented. Specifically, when there is a sharp curve ahead, the navigation device 860 transmits the road information to the automobile 2980 so that the speed of the automobile 2980 can be controlled and steering can be assisted.

This embodiment can be implemented in an appropriate combination with the structures described in the other embodiments, examples, and the like.

REFERENCE NUMERALS

100 capacitor, 130 conductor, 200 transistor, 203 conductor, 203*a* conductor, 203*b* conductor, 205 conductor, 205*a* conductor, 205*b* conductor, 208 insulator, 210 insulator, 216 insulator, 220 insulator, 222 insulator, 224 insulator, 230 oxide, 230*a* oxide, 230*b* oxide, 230*c* oxide, 231 region, 231*a* region, 231*b* region, 232 region, 232*a* region, 232*b* region, 234 region, 239 region, 250 insulator, 250*a* insulator, 252 conductor, 252*a* conductor, 252*b* conductor, 252*c* conductor, 252*d* conductor, 256 conductor, 260 conductor, 260*a* conductor, 260*b* conductor, 270 insulator, 271 insulator, 272 insulator, 274 insulator, 280 insulator, 600 cell

The invention claimed is:

1. A semiconductor device comprising:
   a first conductor;
   a second conductor over the first conductor;
   a first insulator covering the second conductor;
   a first oxide over the first insulator; and
   a second oxide over the first oxide,
   wherein an opening overlapping with at least part of the first conductor is provided in the first oxide and the first insulator, and
   wherein the second oxide is electrically connected to the first conductor through the opening.

2. The semiconductor device according to claim 1, wherein an end portion of the second oxide is substantially aligned with an end portion of the first oxide.

3. The semiconductor device according to claim 1, further comprising:
   a third conductor;
   a fourth conductor over the third conductor;
   a third oxide over the second oxide;
   a second insulator over the third oxide; and
   a fifth conductor over the second insulator,
   wherein the fourth conductor is covered with the first insulator, and
   wherein the fifth conductor overlaps with the third conductor and the fourth conductor with the first insulator, the first oxide, the second oxide, the third oxide, and the second insulator interposed therebetween.

4. The semiconductor device according to claim 3,
   wherein the first conductor and the third conductor contain the same material, and
   wherein the second conductor and the fourth conductor contain the same material.

5. The semiconductor device according to claim 1, wherein the second conductor includes a metal nitride.

6. The semiconductor device according to claim 5, wherein the metal nitride is titanium nitride or tantalum nitride.

7. A method for manufacturing a semiconductor device, comprising:
   forming a first conductive film over an insulating surface;
   forming a second conductive film over the first conductive film;
   patterning the second conductive film and the first conductive film to form a first conductor and a second conductor over the first conductor;
   forming a first insulating film to cover the first conductor and the second conductor;
   processing the first insulating film to expose the second conductor so that the first insulator is formed;
   forming a second insulator over the first insulator and the second conductor;
   forming a first oxide film over the second insulator;
   forming an opening overlapping with at least part of the first conductor in the first oxide film and the second insulator;
   forming a second oxide film over the first oxide film and the first conductor; and
   patterning the second oxide film and the first oxide film to form a first oxide and a second oxide over the first oxide.

8. The method for manufacturing a semiconductor device, according to claim 7, comprising:
   patterning the second conductive film and the first conductive film to further form a third conductor and a fourth conductor over the third conductor;
   forming a third oxide film over the second oxide;
   forming a second insulating film over the third oxide film;
   forming a third conductive film over the second insulating film;
   patterning the third conductive film to form a fifth conductor;
   patterning the second insulating film to form a third insulator; and
   patterning the third oxide film to form a third oxide,
   wherein the fifth conductor overlaps with the third conductor and the fourth conductor with the second insulator, the first oxide, the second oxide, the third oxide, and the third insulator interposed therebetween.

9. The method for manufacturing a semiconductor device, according to claim 7, wherein the second conductive film includes a metal nitride.

10. The method for manufacturing a semiconductor device, according to claim 9, wherein the metal nitride is titanium nitride or tantalum nitride.

11. A semiconductor device comprising:
    a first conductor;
    a first insulator over the first conductor;
    a first oxide over the first insulator;
    a second oxide over the first oxide;
    a third oxide over the second oxide;
    a second insulator over the third oxide;
    a second conductor over the second insulator;

a third insulator provided on a side surface of the second insulator and a side surface of the second conductor; and a fourth insulator provided on a side surface of the third insulator, wherein an opening overlapping with part of the first conductor is provided in the first oxide and the first insulator, and wherein the second oxide is electrically connected to the first conductor through the opening.

12. The semiconductor device according to claim 11, wherein a side surface of the second oxide and a side surface of the third oxide are on the same plane as a side surface of the first oxide.

13. The semiconductor device according to claim 11, wherein an end portion of the second oxide and an end portion of the third oxide are substantially aligned with an end portion of the first oxide.

14. The semiconductor device according to claim 11, further comprising:

a third conductor; and a fourth oxide, wherein the fourth oxide is provided between the third oxide and the second insulator, and wherein the third conductor overlaps with the second conductor with the first insulator, the first oxide, the second oxide, the third oxide, the fourth oxide, and the second insulator interposed therebetween.

15. The semiconductor device according to claim 14, wherein the first conductor and the third conductor contain the same material.

16. A method for manufacturing a semiconductor device, comprising:

forming a first insulating film over a first conductor and a second conductor;

forming a first oxide film over the first insulating film;

forming an opening overlapping with at least part of the first conductor in the first oxide film and the first insulating film;

forming a second oxide film over the first oxide film and the first conductor;

forming a third oxide film over the second oxide film;

patterning the third oxide film, the second oxide film, and the first oxide film to form a first oxide, a second oxide over the first oxide, and a third oxide over the second oxide;

forming a second insulating film to cover the first oxide, the second oxide, and the third oxide;

forming a first conductive film over the second insulating film;

patterning the first conductive film and the second insulating film to form a third conductor and a first insulator;

forming a third insulating film to cover the third conductor and the first insulator;

forming a fourth insulating film over the third insulating film; and processing the fourth insulating film and the third insulating film by etching to form a second insulator on a side surface of the third conductor and a side surface of the first insulator, and a third insulator on a side surface of the second insulator.

17. The method for manufacturing a semiconductor device, according to claim 16, wherein the third conductor overlaps with the second conductor with the first insulating film, the first oxide, the second oxide, the third oxide, and the first insulator interposed therebetween.

\* \* \* \* \*